(12) United States Patent
Jeong et al.

(10) Patent No.: US 10,707,280 B2
(45) Date of Patent: Jul. 7, 2020

(54) DISPLAY DEVICE AND METHOD OF MANUFACTURING THE SAME

(71) Applicant: Samsung Display Co., Ltd., Yongin-Si, Gyeonggi-Do (KR)

(72) Inventors: Hwan-hee Jeong, Cheonan-si (KR); Wonkyu Kwak, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 198 days.

(21) Appl. No.: 15/845,439

(22) Filed: Dec. 18, 2017

(65) Prior Publication Data

US 2018/0308903 A1     Oct. 25, 2018

(30) Foreign Application Priority Data

Apr. 24, 2017  (KR) .................. 10-2017-0052493

(51) Int. Cl.
  *G06F 3/044*  (2006.01)
  *H01L 27/32*  (2006.01)
  *H01L 51/52*  (2006.01)
  *G06F 3/041*  (2006.01)

(52) U.S. Cl.
  CPC ............ *H01L 27/323* (2013.01); *G06F 3/044* (2013.01); *G06F 3/0418* (2013.01); *H01L 27/3223* (2013.01); *H01L 27/3276* (2013.01); *H01L 51/5256* (2013.01); *H01L 51/5281* (2013.01); *G06F 3/0412* (2013.01); *G06F 2203/04102* (2013.01); *G06F 2203/04103* (2013.01); *G06F 2203/04111* (2013.01); *G06F 2203/04112* (2013.01); *H01L 2227/323* (2013.01)

(58) Field of Classification Search
  CPC ....... G06F 3/044; G06F 3/0412; G06F 3/0416
  See application file for complete search history.

(56) References Cited

U.S. PATENT DOCUMENTS

| | | | |
|---|---|---|---|
| 7,864,503 B2 | 1/2011 | Chang | |
| 7,920,129 B2 | 4/2011 | Hotelling et al. | |
| 8,274,488 B2 * | 9/2012 | Bae .................. | G06F 3/044 345/156 |
| 8,358,284 B2 | 1/2013 | Jeong et al. | |
| 8,461,760 B1 | 6/2013 | Oh et al. | |

(Continued)

FOREIGN PATENT DOCUMENTS

| | | |
|---|---|---|
| KR | 101022155 B1 | 3/2011 |
| KR | 101133492 B1 | 4/2012 |

(Continued)

*Primary Examiner* — Olga V Merkoulova
(74) *Attorney, Agent, or Firm* — Cantor Colburn LLP

(57) ABSTRACT

A display device includes a display panel and an input sensing unit disposed on the display panel. The display panel includes a base layer, a first signal line, a light emitting element, a first encapsulation inorganic layer, and a signal pad. The first signal line overlaps a display area and a non-display area and is connected to a transistor disposed in the display area. The first encapsulation inorganic layer is disposed on a second electrode of the light emitting element and overlaps the display area and the non-display area. The signal pad is electrically connected to the first signal line and disposed in the non-display area. The signal pad is connected to the first signal line through a first contact hole defined through the first encapsulation inorganic layer.

37 Claims, 110 Drawing Sheets

(56) References Cited

U.S. PATENT DOCUMENTS

| | | | |
|---|---|---|---|
| RE44,866 E | 4/2014 | Kang et al. | |
| 8,698,768 B2* | 4/2014 | Lee | G06F 3/044 345/173 |
| 8,730,191 B2 | 5/2014 | Kim et al. | |
| 8,946,690 B2 | 2/2015 | Lee et al. | |
| 9,001,079 B2 | 4/2015 | Kang et al. | |
| 9,035,907 B2 | 5/2015 | Hotelling et al. | |
| 9,046,952 B2 | 6/2015 | Kim et al. | |
| 9,128,569 B2 | 9/2015 | Kang et al. | |
| 9,239,654 B2 | 1/2016 | Jang | |
| 9,335,881 B2 | 5/2016 | Jeong | |
| 9,515,131 B2 | 12/2016 | Mathew et al. | |
| 10,268,238 B2* | 4/2019 | Hamburgen | G06F 1/1616 |
| 2008/0277259 A1* | 11/2008 | Chang | G06F 3/044 200/600 |
| 2010/0182250 A1* | 7/2010 | Kang | G06F 3/044 345/173 |
| 2011/0285661 A1* | 11/2011 | Hotelling | G06F 3/0418 345/174 |
| 2013/0002569 A1* | 1/2013 | Kang | G06F 3/044 345/173 |
| 2013/0147727 A1* | 6/2013 | Lee | G06F 3/0412 345/173 |
| 2013/0278513 A1* | 10/2013 | Jang | G06F 3/044 345/173 |
| 2014/0028599 A1* | 1/2014 | Jeong | G06F 3/047 345/173 |
| 2014/0078108 A1* | 3/2014 | Hotelling | G06F 3/0416 345/174 |
| 2014/0078692 A1* | 3/2014 | Park | H05K 7/02 361/749 |
| 2014/0217373 A1* | 8/2014 | Youn | H01L 23/4985 257/40 |
| 2014/0217382 A1* | 8/2014 | Kwon | H01L 51/0097 257/40 |
| 2014/0217397 A1* | 8/2014 | Kwak | H01L 27/1218 257/43 |
| 2014/0232956 A1* | 8/2014 | Kwon | G02F 1/133305 349/12 |
| 2014/0256070 A1 | 9/2014 | Chen et al. | |
| 2015/0193058 A1 | 7/2015 | Kang et al. | |
| 2016/0093685 A1* | 3/2016 | Kwon | H01L 51/5237 257/40 |
| 2016/0306472 A1* | 10/2016 | Park | G06F 3/0412 |
| 2016/0315284 A1* | 10/2016 | Jeon | H01L 51/5256 |

FOREIGN PATENT DOCUMENTS

| | | |
|---|---|---|
| KR | 1020130072635 A | 7/2013 |
| KR | 101373044 B1 | 3/2014 |
| KR | 101596968 B1 | 2/2016 |
| KR | 1020160124319 A | 10/2016 |
| KR | 1020160127873 A | 11/2016 |
| KR | 1020180014378 A | 2/2018 |

* cited by examiner

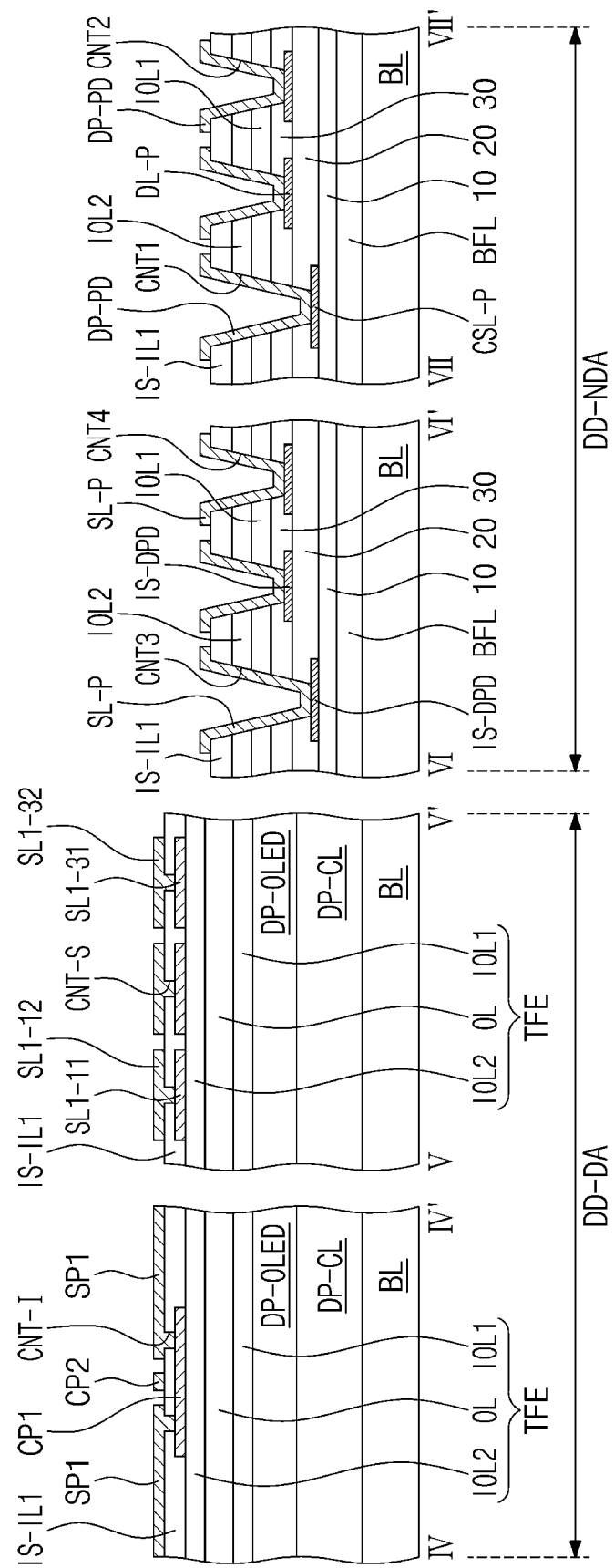

DISPLAY DEVICE AND METHOD OF MANUFACTURING THE SAME

This application claims priority to Korean Patent Application No. 10-2017-0052493, filed on Apr. 24, 2017, the content of which in its entirety is herein incorporated by reference.

BACKGROUND

1. Field

Exemplary embodiments of the invention relate to a display device and a method of manufacturing the same. More particularly, exemplary embodiments of the invention relate to a display device capable of reducing defects caused by moisture and a method of manufacturing the display device.

2. Description of the Related Art

Various display devices, which are applied to a multimedia device, such as a television set, a mobile phone, a tablet computer, a navigation unit, a game unit, etc., have been developed. As an input device of the display devices, a keyboard or a mouse is widely used. In addition, recently, a touch panel is used as an input device in the display devices.

SUMMARY

Exemplary embodiments of the invention provide a display device capable of reducing defects caused by moisture.

Exemplary embodiments of the invention provide a method of manufacturing the display device including an input sensing unit disposed on a display panel.

Exemplary embodiments of the invention provide a display device including a display panel including a display area and a non-display area and an input sensing unit disposed on the display panel. The display panel includes a base layer, a first signal line overlapped with the display area and the non-display area and connected to a transistor disposed in the display area, a light emitting element, a first encapsulation inorganic layer disposed on the light emitting element and overlapped with the display area and the non-display area, and a signal pad electrically connected to the first signal line and disposed in the non-display area. The light emitting element includes a first electrode, a second electrode disposed on the first electrode, and a light emitting layer disposed between the first electrode and the second electrode. The signal pad is connected to the first signal line through a first contact hole defined through the first encapsulation inorganic layer.

In an exemplary embodiment, the input sensing unit is directly disposed on the display panel. The input sensing unit includes a sensing electrode, a second signal line connected to the sensing electrode, and at least one insulating layer overlapped with the display area and the non-display area.

In an exemplary embodiment, the display panel further includes a dummy pad disposed in the non-display area. The second signal line includes a line part overlapped with the display area and the non-display area and a pad part connected to the line part and overlapped with the dummy pad. The at least one insulating layer is disposed between the dummy pad and the pad part of the second signal line.

In an exemplary embodiment, the pad part of the second signal line is connected to the dummy pad through a second contact hole defined through the first encapsulation inorganic layer and the at least one insulating layer.

In an exemplary embodiment, the dummy pad is disposed in a same layer as the first signal line.

In an exemplary embodiment, the at least one insulating layer is disposed between the signal pad and the first signal line, and the first contact hole further penetrates through the at least one insulating layer.

In an exemplary embodiment, the signal pad is disposed in a same layer as the second signal line.

In an exemplary embodiment, the sensing electrode includes a first sensing electrode and a second sensing electrode crossing the first sensing electrode.

In an exemplary embodiment, each of the first sensing electrode and the second sensing electrode includes sensor parts and connection parts each of which connects the sensor parts adjacent to each other.

In an exemplary embodiment, the connection parts of the first sensing electrode are connected to the adjacent sensor parts of the first sensing electrode through second contact holes defined through the at least one insulating layer.

In an exemplary embodiment, the display panel further includes a dummy pad disposed in the non-display area. The second signal line includes a line part overlapped with the display area and the non-display area and a pad part connected to the line part and overlapped with the dummy pad. The pad part of the second signal line is connected to the dummy pad through a second contact hole defined through the first encapsulation inorganic layer, and the at least one insulating layer is not overlapped with the pad part of the second signal line.

In an exemplary embodiment, the sensing electrode has a mesh shape.

In an exemplary embodiment, the display device further includes an anti-reflection unit to reduce a reflectance of an external light. The anti-reflection unit is disposed on the first encapsulation inorganic layer.

In an exemplary embodiment, the sensing electrode includes a first sensing electrode and a second sensing electrode crossing the first sensing electrode, and the at least one insulating layer is disposed between the first sensing electrode and the second sensing electrode.

In an exemplary embodiment, the input sensing unit further includes a dummy electrode overlapped with the sensing electrode.

In an exemplary embodiment, the sensing electrode includes first sensing electrodes and second sensing electrodes respectively corresponding to the first sensing electrodes, each of the second sensing electrodes includes a plurality of sensor parts disposed in a same layer as the first sensing electrodes and disposed to be spaced apart from each other.

In an exemplary embodiment, the second signal line includes first line parts disposed in a same layer as the first sensing electrodes and connected to the first sensing electrodes and the sensor parts and second line parts disposed on a different layer from the first sensing electrodes and connected to some first line parts connected to the sensor parts among the first line parts through second contact holes defined through the at least one insulating layer.

In an exemplary embodiment, the sensing electrode is disposed in a same layer as the second signal line, and the at least one insulating layer directly covers the sensing electrode and the second signal line.

In an exemplary embodiment, the first encapsulation inorganic layer is entirely disposed on the base layer.

In an exemplary embodiment, the display panel further includes a second encapsulation inorganic layer disposed on the first encapsulation inorganic layer and an encapsulation organic layer overlapped with the display area and disposed between the first encapsulation inorganic layer and the second encapsulation inorganic layer.

In an exemplary embodiment, the input sensing unit includes a first sensing electrode and a second sensing electrode. The first sensing electrode includes first sensor parts and first connection parts connecting the first sensor parts. The first sensing electrode is disposed on a base surface defined on the display panel. The second sensing electrode includes second sensor parts and second connection parts connecting the second sensor parts. The second sensing electrode is disposed on the base surface defined on the display panel. The first sensor parts are disposed in a same layer as the second sensor parts, one of the first connection parts and the second connection parts are disposed in a same layer as the first sensor parts, and the first connection parts cross the second connection parts such that an insulating layer is disposed between the first connection parts and the second connection parts.

In an exemplary embodiment, the input sensing unit is directly disposed on the display panel. The input sensing unit includes a sensing electrode having a mesh shape and a second signal line connected to the sensing electrode. The second signal line includes a layer including a same material as that of the sensing electrode.

In an exemplary embodiment, the input sensing unit includes at least one insulating layer, first sensing electrodes, and second sensing electrodes insulated from the first sensing electrodes while crossing the first sensing electrodes. The at least one insulating layer insulates the first sensing electrodes from the second sensing electrodes. The at least one insulating layer includes a polymer.

In an exemplary embodiment, the display device further includes a polarizing film disposed on the display panel. The input sensing unit includes a base film and sensing electrodes disposed on at least one surface of the base film. The polarizing film is disposed between the display panel and the input sensing unit.

In an exemplary embodiment, the display device further includes a polarizing film disposed on the display panel. The input sensing unit includes a base film and sensing electrodes disposed on at least one surface of the base film. The input sensing unit is disposed between the display panel and the polarizing film.

In an exemplary embodiment, the display device further includes a polarizing film disposed on the display panel. The input sensing unit includes a base film and sensing electrodes disposed on a lower surface of the base film. The polarizing film is disposed between the display panel and the input sensing unit.

In an exemplary embodiment, the display device further includes a polarizing film disposed on the display panel. The input sensing unit includes a base film, a base insulating layer disposed on the base film, and sensing electrodes disposed on the base insulating layer. The input sensing unit is disposed between the display panel and the polarizing film.

In an exemplary embodiment, the display device further includes a polarizing film disposed on the display panel. The input sensing unit includes a base film, sensing electrodes disposed on a lower surface of the base film, and signal lines connected to the sensing electrodes. The input sensing unit is disposed between the display panel and the polarizing film, and pad parts of the signal lines are electrically connected to input pads of the display panel by a conductive member.

In an exemplary embodiment, the input sensing unit includes a sensing electrode disposed on a base surface defined on the display panel and an insulating layer disposed on one side of an upper side or a lower side of the sensing electrode. The insulating layer includes a high-refractive index insulating layer and a low-refractive index insulating layer, and the low-refractive index insulating layer is disposed more adjacent to the sensing electrode than the high-refractive index insulating layer.

Exemplary embodiments of the invention provide a display device including a display panel including a first area, a second area, and a third area disposed between the first area and the second area and having a curvature and an input sensing unit disposed on the display panel. The display panel includes a base layer, a first signal line, a light emitting element, an encapsulation inorganic layer, and a signal pad. The base layer overlaps the first area, the second area, and the third area. The first signal line overlaps the first area, the second area, and the third area and is connected to a transistor disposed in the first area. The light emitting element is disposed in the first area and includes a first electrode, a second electrode disposed on the first electrode, and a light emitting layer disposed between the first electrode and the second electrode. The encapsulation inorganic layer is disposed on the second electrode and overlapped with the first area and the second area. The signal pad is electrically connected to the first signal line and disposed in the second area. The signal pad is connected to the first signal line through a contact hole defined through the encapsulation inorganic layer.

In an exemplary embodiment, the input sensing unit includes a sensing electrode disposed in the first area, a second signal line connected to the sensing electrode and overlapped with the first area, the second area, and the third area and at least one insulating layer overlapped with the first area, the second area, and the third area. The input sensing unit is directly disposed on the display panel.

In an exemplary embodiment, the display panel further includes a bank disposed in the third area and including a plurality of organic insulating patterns stacked one another. The bank extends in a direction substantially parallel to a bending axis defined in the third area. An opening area is defined through the encapsulation inorganic layer to correspond to the bank.

In an exemplary embodiment, the first area includes a display area and a non-display area disposed adjacent to the display area. The display panel further includes a dam part disposed in the non-display area, and the display area is disposed inside the dam part.

In an exemplary embodiment, the display panel further includes crack dam parts disposed outside the dam part. The crack dam parts extend in a direction in which the first signal line extends, and an opening area is defined through the encapsulation inorganic layer to overlap the crack dam parts.

Exemplary embodiments of the invention provide a method of manufacturing a display device including forming a first conductive pattern on an encapsulation inorganic layer of a display panel including the encapsulation inorganic layer overlapped with a display area and a non-display area, forming an insulating layer on the encapsulation inorganic layer to overlap the display area and the non-display area and cover the first conductive pattern, forming a first contact hole to expose the first conductive pattern, forming a second contact hole disposed in the non-display area of the display panel to expose a dummy pad disposed under the encapsulation inorganic layer, and forming a second conductive pattern on the insulating layer to be connected to the first conductive pattern and the dummy pad.

In an exemplary embodiment, the forming the first contact hole and the forming the second contact hole are performed by a same process.

In an exemplary embodiment, the second conductive pattern includes a signal pad connected to the dummy pad through the second contact hole in the forming of the second conductive pattern.

In an exemplary embodiment, the forming the first contact hole includes removing a portion of the insulating layer, which overlaps the first conductive pattern. The forming the second contact hole includes removing a portion of the insulating layer, which overlaps the dummy pad, and removing a portion of the encapsulation inorganic layer, which overlaps the dummy pad.

In an exemplary embodiment, the removing of the portion of the insulating layer, which overlaps the first conductive pattern, and the removing of the portion of the insulating layer, which overlaps the dummy pad, are performed by a same process.

In an exemplary embodiment, the first conductive pattern includes first connection parts. The second conductive pattern includes first sensor parts each being connected to corresponding first connection parts of the first connection parts through the first contact hole, second connection parts crossing the first connection parts, and second sensor parts connected to the second connection parts.

According to the above, the at least one encapsulation inorganic layer is entirely deposited on the display panel. The entirely-deposited encapsulation layer has the uniform thickness and the dense film density. Accordingly, the encapsulation inorganic layer has a large coupling force with respect to the organic layer disposed therebelow. Thus, the moisture may be prevented from infiltrating into between the encapsulation inorganic layer and the organic layer disposed under the encapsulation inorganic layer, and the encapsulation inorganic layer may be prevented from being separated.

In an exemplary embodiment, the at least one encapsulation inorganic layer that is entirely deposited provides a more planarized base surface. The input sensing unit is disposed on the base surface. The signal lines of the input sensing unit are disposed in the non-display area in which a step difference is reduced, and thus the input sensing unit may have a uniform thickness. Accordingly, a stress applied to the area overlapped with the step difference of the signal lines of the input sensing unit may be reduced. In addition, the encapsulation inorganic layer that is entirely deposited provides the planarized base surface to the input sensing unit, and thus sensitivity and mechanical stability of the input sensing unit successively formed on or attached to the display panel may be improved.

Since the encapsulation inorganic layer is formed without using a mask, a manufacturing cost may be reduced, and a manufacturing time may be shortened.

BRIEF DESCRIPTION OF THE DRAWINGS

The above and other exemplary embodiments, features and advantages of the invention will become readily apparent by reference to the following detailed description when considered in conjunction with the accompanying drawings, in which:

FIGS. 14A to 14E are cross-sectional views showing an exemplary embodiment of a method of manufacturing a display device according to the invention;

DETAILED DESCRIPTION

Figure 1:
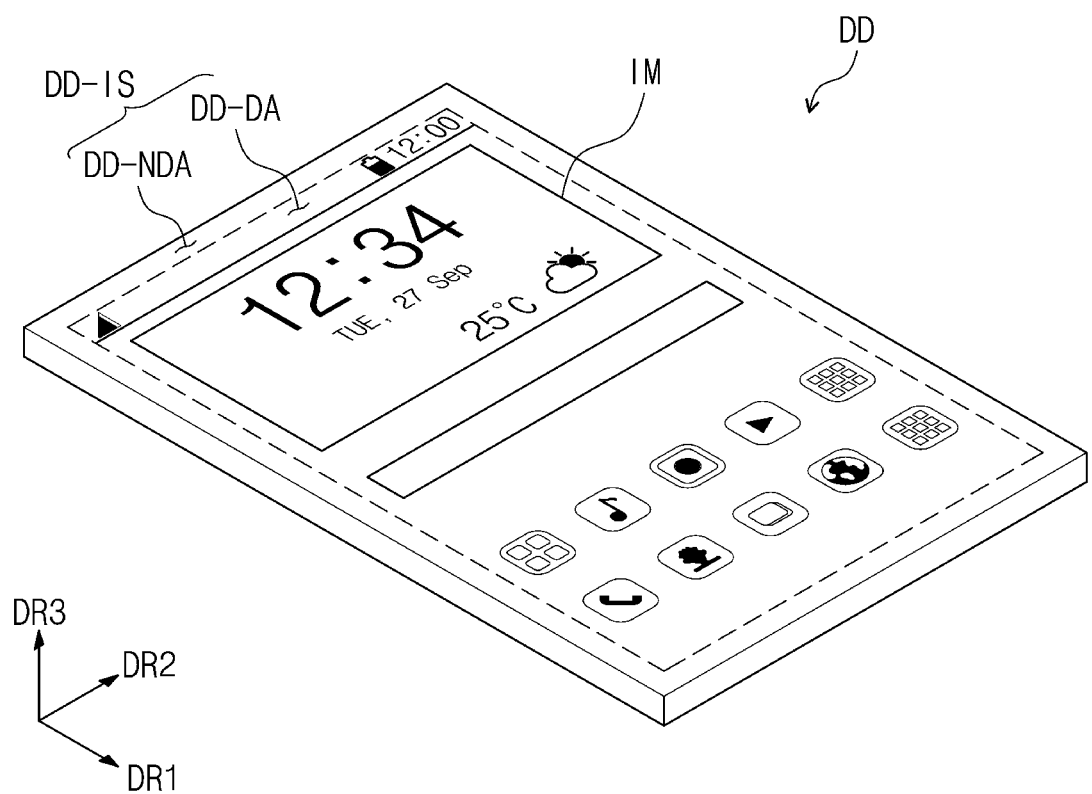
FIG. 1 is a perspective view showing an exemplary embodiment of a display device according to the invention.

Like numbers refer to like elements throughout. In the drawings, the thickness, ratio, and size of each element are exaggerated for clarity. As used herein, the term "and/or" includes any and all combinations of one or more of the associated listed items.

The use of the terms first, second, etc. do not denote any order or importance, but rather the terms first, second, etc. are used to distinguish one element from another. Thus, a first element, component, region, layer or section discussed below could be termed a second element, component, region, layer or section without departing from the teachings of the invention. It is to be understood that the singular forms "a," "an," and "the" include plural referents unless the context clearly dictates otherwise.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a perspective view showing a display device DD according to an exemplary embodiment of the invention. As shown in FIG. 1, the display device DD may display an image IM through a display surface DD-IS. The display surface DD-IS is substantially parallel to a surface defined by a first directional axis DR1 and a second directional axis DR2. A normal line direction of the display surface DD-IS, i.e., a thickness direction of the display device DD, indicates a third directional axis DR3.

In each of members or units, a front surface (or an upper surface) is distinguished from a rear surface (or a lower surface) by the third directional axis DR3. However, the first to third directional axes DR1 to DR3 are relative to each other, and thus directions indicated by the first to third directional axes DR1 to DR3 may be changed to any other directions. Hereinafter, first to third directions correspond to directions respectively indicated by the first to third directional axes DR1 to DR3, and thus the first to third directions are assigned with the same reference numerals as the first to third directional axes DR1 to DR3.

In the exemplary embodiment of the invention, the display device DD includes a flat display surface, but it should not be limited thereto or thereby. The display device DD may include a curved type display surface or a three-dimensional ("3D") type display surface. The 3D type display surface may include a plurality of display areas indicating different directions from each other. In an exemplary embodiment, the 3D type display surface may be a polygonal column type display surface.

In the illustrated exemplary embodiment, the display device DD may be a rigid display device. According to exemplary embodiments, the display device DD may be a flexible display device. In the illustrated exemplary embodiment, the display device DD that may be applied to a mobile phone terminal will be described as a representative example. Although not shown in the drawings, electronic modules disposed (e.g., mounted) on a main board, a camera module, and a power supply module are arranged in a bracket/case together with the display device DD to form the mobile phone terminal. The display device DD according to the illustrated exemplary embodiment may be applied to a large-sized electronic item, such as a television set, a monitor, etc., and a small and medium-sized electronic item, such as a tablet, a car navigation unit, a game unit, a smart watch, etc., but it should not be limited thereto or thereby.

As shown in FIG. 1, the display surface DD-IS includes a display area DD-DA in which the image IM is displayed and a non-display area DD-NDA disposed adjacent to the display area DD-DA. The image IM is not displayed in the non-display area DD-NDA. FIG. 1 shows icon images as an example of the image IM.

As shown in FIG. 1, the display area DD-DA may have a quadrangular shape, for example. The non-display area DD-NDA is disposed to surround the display area DD-DA. However, according to other exemplary embodiments, the shape of the display area DD-DA and the shape of the non-display area DD-NDA may be designed relative to each other.

FIGS. 2A to 2F are cross-sectional views showing a display device DD according to an exemplary embodiment of the invention. FIGS. 2A to 2F show cross-sections defined by the second directional axis DR2 and the third directional axis DR3. In FIGS. 2A to 2F, the display device DD is shown simply to illustrate a stacking relationship of a functional panel and/or functional units included in the display device DD.

The display device DD according to the exemplary embodiment of the invention may include a display panel, an input sensing unit, an anti-reflection unit, and a window unit. At least one or more of the display panel, the input sensing unit, the anti-reflection unit, and the window unit may be provided by a continuous process or attached to each other by an adhesive member. FIGS. 2A to 2F show an optically clear adhesive member OCA as the adhesive member. The adhesive member used hereinafter may include a conventional adhesive or pressure sensitive adhesive. In the exemplary embodiment of the invention, the anti-reflection unit and the window unit may be replaced with other elements or omitted.

In FIGS. 2A to 2F, a unit provided with other units by the continuous process among the input sensing unit, the anti-reflection unit, and the window unit will be referred to as a "layer". Among the input sensing unit, the anti-reflection unit, and the window unit, a unit provided with other units by the adhesive member will be will be referred to as a "panel". The panel includes a base layer providing a base surface, e.g., a synthetic resin film, a composite material film, a glass substrate, etc., but the base layer may be omitted from the unit that is expressed using the term of "layer". In other words, the units expressed using the term of "layer" are disposed on the base surface provided by other units.

The input sensing unit, the anti-reflection unit, and the window unit may be respectively referred to as an input sensing panel ISP, an anti-reflection panel RPP, and a window panel WP or as an input sensing layer ISL, an anti-reflection layer RPL, and a window layer WL.

Figure 2A:
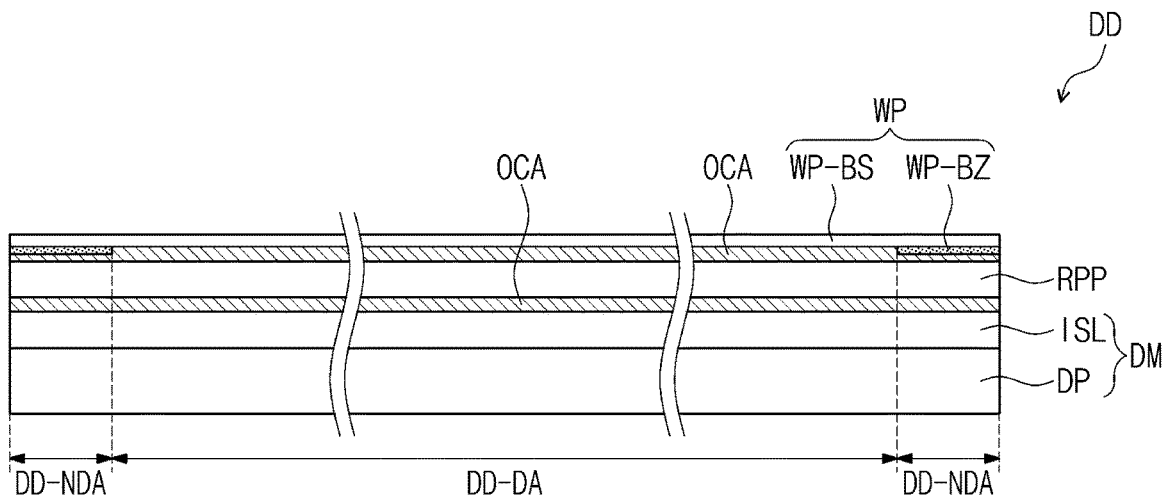
FIGS. 2A to 2F are cross-sectional views showing an exemplary embodiment of a display device according to the invention.

Referring to FIG. 2A, the display device DD may include the display panel DP, the input sensing layer ISL, the anti-reflection panel RPP, and the window panel WP. The input sensing layer ISL is directly disposed on the display panel DP. In the invention, an expression that an element B is directly disposed on an element A means that there are no intervening adhesive layers/adhesive members present between the element A and the element B. The element B is disposed on a base surface provided by the element A by a continuous process after the element A is provided.

The display panel DP and the input sensing layer ISL directly disposed on the display panel DP may be defined as a display module DM. The optically clear adhesive member OCA is disposed between the display module DM and the anti-reflection panel RPP and between the anti-reflection panel RPP and the window panel WP.

The display panel DP generates an image and the input sensing layer ISL obtains coordinate information of an external input, e.g., a touch event. Although not shown in the drawings, the display module DM according to the exemplary embodiment may further include a protective member disposed on a lower surface of the display panel DP. The protective member and the display panel DP may be coupled with each other by the adhesive member. Display devices DD shown in FIGS. 2B to 2F may further include the protective member.

The display panel DP according to the exemplary embodiment of the invention may be a light emitting type display panel, but it should not be limited thereto or thereby. In an exemplary embodiment, the display panel DP may be an organic light emitting display panel or a quantum dot light emitting display panel, for example. A light emitting layer of the organic light emitting display panel may include an organic light emitting material. In an exemplary embodiment, a light emitting layer of the quantum dot light emitting display panel may include a quantum dot, a quantum rod, and the like. Hereinafter, the organic light emitting display panel will be described as the display panel DP.

The anti-reflection panel RPP reduces a reflectivity of an external light incident from above the window panel WP. The anti-reflection panel RPP according to the exemplary embodiment of the invention may include a retarder and a polarizer. In an exemplary embodiment, the retarder may be provided in a film or liquid crystal coating form and may include a $\lambda/2$ retarder and/or a $\lambda/4$ retarder, for example. The polarizer may be provided in a film or liquid crystal coating form. The film type retarder or polarizer may include a stretch-type synthetic resin film, and the liquid crystal coating type retarder or polarizer may include liquid crystals arranged in a predetermined direction. The retarder and the polarizer may further include a protective film. The retarder and the polarizer or the protective film may be defined as a base layer of the anti-reflection panel RPP.

The anti-reflection panel RPP according to the exemplary embodiment of the invention may include color filters. The color filters have a predetermined arrangement. The arrangement of the color filters may be determined by taking into account colors of pixels included in the display panel DP. The anti-reflection panel RPP may further include a black matrix adjacent to the color filters.

The anti-reflection panel RPP according to the exemplary embodiment of the invention may include a destructive interference structure. In an exemplary embodiment, the destructive interference structure may include a first reflective layer and a second reflective layer, which are disposed on different layers from each other, for example. A first reflective light reflected by the first reflective layer and a second reflective light reflected by the second reflective layer may destructively interfere with each other, and thus the reflectivity of the external light is reduced.

The window panel WP according to the exemplary embodiment of the invention includes a base film WP-BS and a light blocking pattern WP-BZ. The base film WP-BS may include a glass substrate and/or a synthetic resin film. The base film WP-BS should not be limited to a single-layer structure. The base film WP-BS may include two or more films coupled with each other by an adhesive member.

The light blocking pattern WP-BZ partially overlaps the base film WP-BS. The light blocking pattern WP-BZ is disposed on a rear surface of the base film WP-BS to define a bezel area of the display device DD, i.e., the non-display area DD-NDA of the display device DD (refer to FIG. 1).

The light blocking pattern WP-BZ may be a colored organic layer provided by a coating method. Although not shown in the drawings, the window panel WP may further include a functional coating layer disposed on a front surface of the base film WP-BS. The functional coating layer may include various layers, such as an anti-fingerprint layer, an anti-reflection layer, a hard coating layer, etc. In FIGS. 2B to 2F, the window panel WP and the window layer WL are simply shown without distinguishing the base film WP-BS from the light blocking pattern WP-BZ.

Figure 2B:
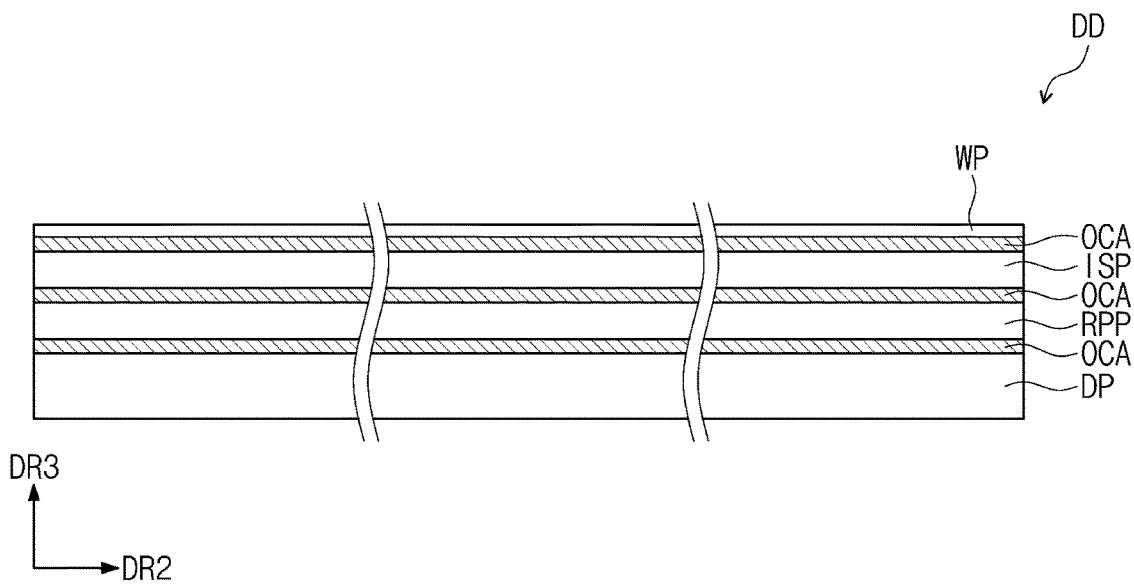
Figure 2C:
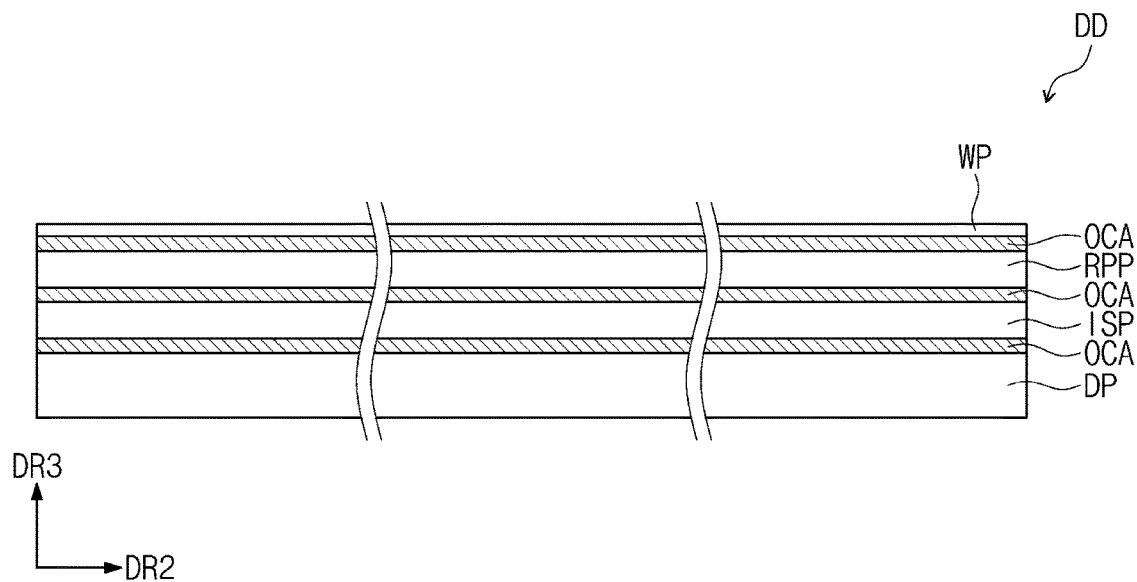

As shown in FIGS. 2B and 2C, a display device DD may include a display panel DP, an input sensing panel ISP, an anti-reflection panel RPP, and a window panel WP. The stacking order of the input sensing panel ISP and the anti-reflection panel RPP may be changed.

Figure 2D:
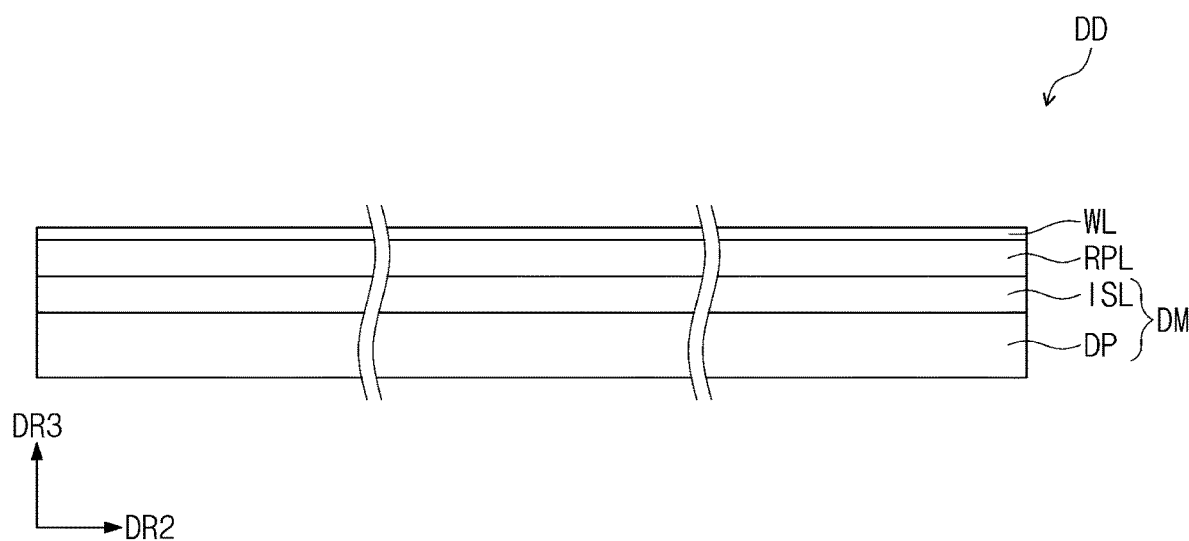

As shown in FIG. 2D, a display device DD may include a display panel DP, an input sensing layer ISL, an anti-reflection layer RPL, and a window layer WL. The adhesive members may be removed from the display device DD, and the input sensing layer ISL, the anti-reflection layer RPL, and the window layer WL may be disposed on the base surface provided by the display panel DP by a continuous process. The stacking order of the input sensing layer ISL and the anti-reflection layer RPL may be changed.

Figure 2E:
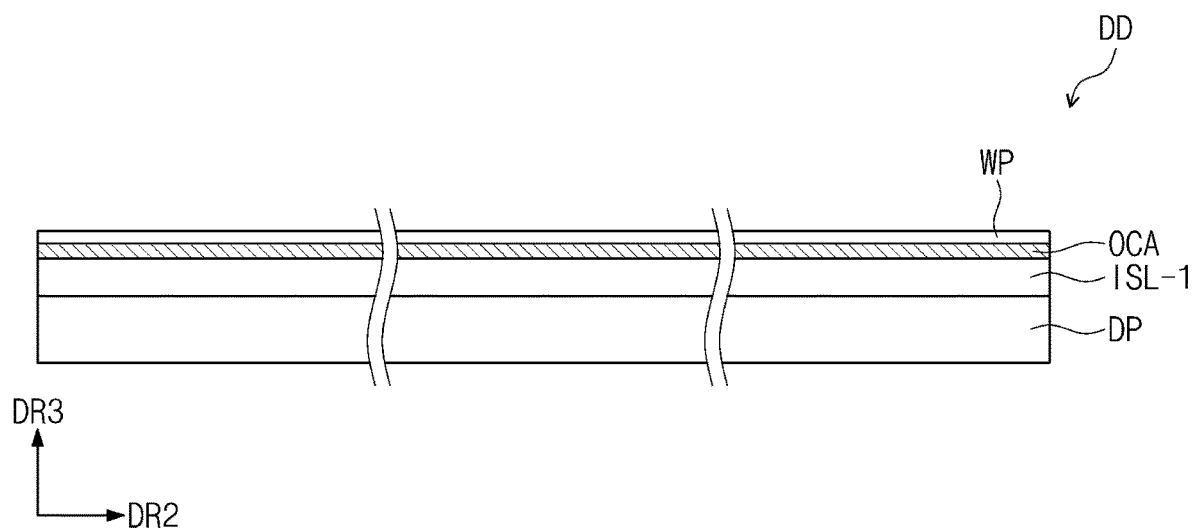
Figure 2F:
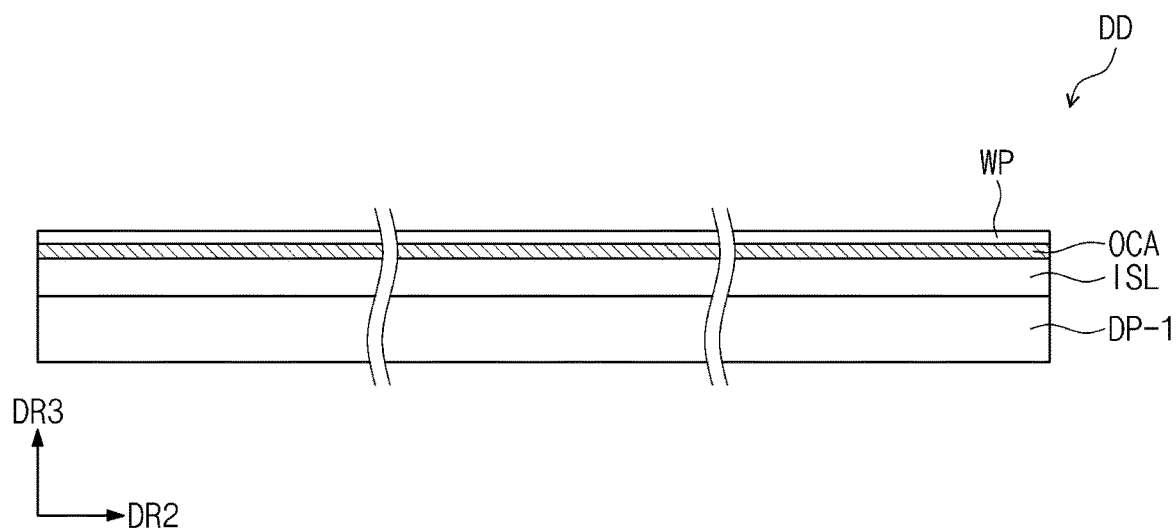

As shown in FIGS. 2E and 2F, a display device DD may not include an anti-reflection unit separately.

As shown in FIG. 2E, a display device DD may include a display panel DP, an input sensing layer ISL-1, and a window panel WP. Different from the input sensing panel ISP or the input sensing layer ISL shown in FIGS. 2A to 2D, the input sensing layer ISL-1 according to the illustrated exemplary embodiment may further include an anti-reflection function.

As shown in FIG. 2F, a display device DD may include a display panel DP-1, an input sensing layer ISL, and a window panel WP. Different from the display panel DP shown in FIGS. 2A to 2E, the display panel DP-1 according to another exemplary embodiment may further include an anti-reflection function.

Detailed descriptions on the input sensing layer ISL-1 and the display panel DP-1, each having the anti-reflection function, will be described later. The input sensing panel ISP provided through the exemplary embodiment of the invention may have the anti-reflection function for the same reason as the input sensing layer ISL-1, and details thereof will be described later.

In FIGS. 2A to 2F, the input sensing unit entirely overlaps the display panel. As shown in FIG. 2A, the input sensing unit may entirely overlap the display area DD-DA.

However, in the exemplary embodiment of the invention, the input sensing unit may overlap a portion of the display area DD-DA or with only the non-display area DD-NDA. The input sensing unit may be, but not limited to, a touch sensing panel that senses a touch event by a user or a fingerprint sensing panel that senses fingerprint information of a user's fingerprint. Sensing electrodes described hereinafter may have a pitch and a width, which are changed depending on the use of the input sensing unit. The sensing electrodes of the touch sensing panel may have a few millimeters to tens of millimeters, and the sensing electrodes of the fingerprint sensing panel may have tens of micrometers to hundreds of micrometers.

Figure 3:
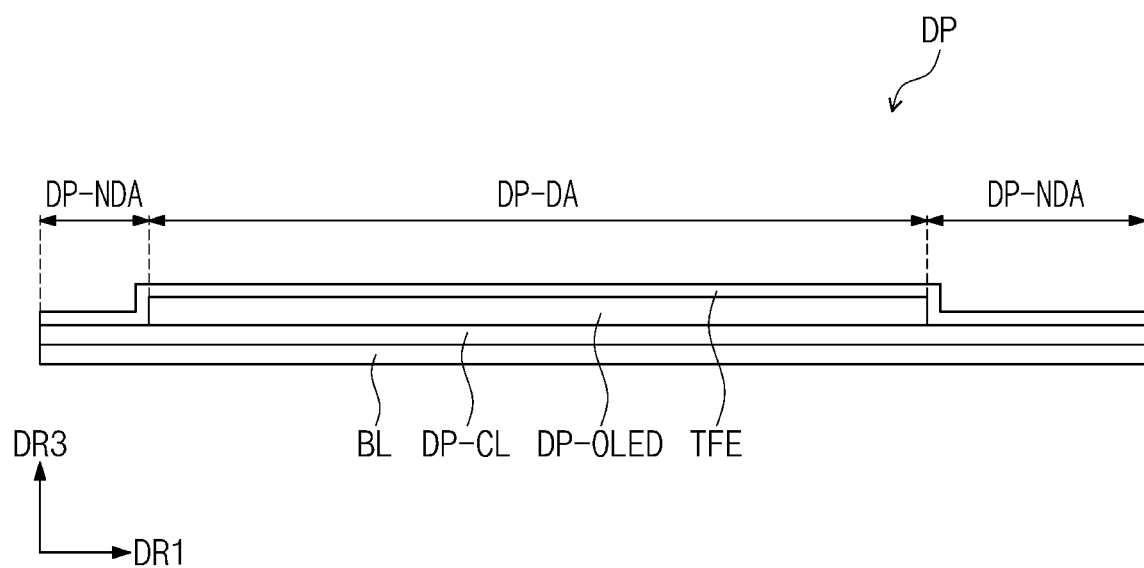
FIG. 3 is a cross-sectional view showing an exemplary embodiment of a display panel according to the invention.
Figure 4A:
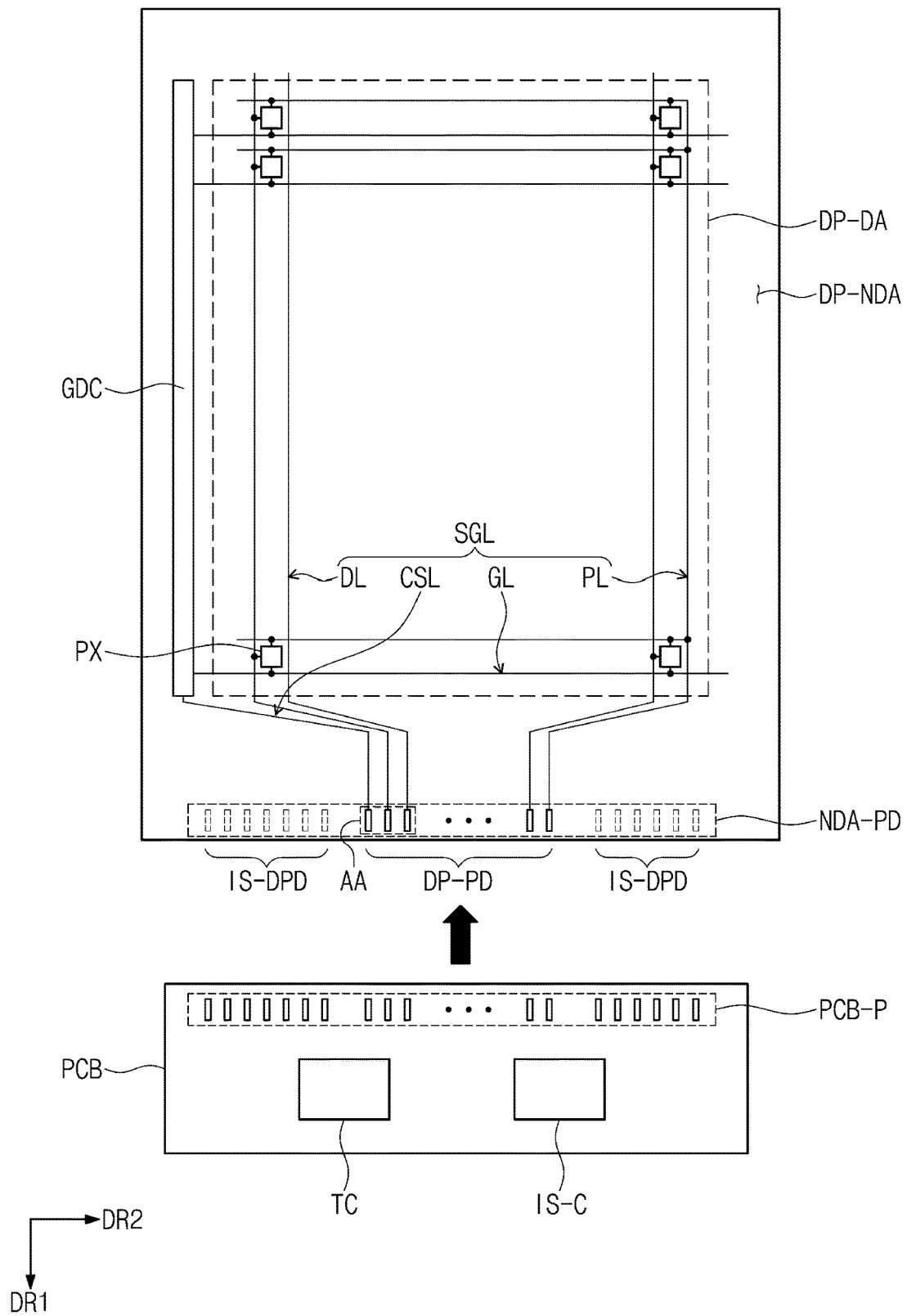
FIGS. 4A and 4B are plan views showing an exemplary embodiment of a display panel according to the invention.
Figure 4B:
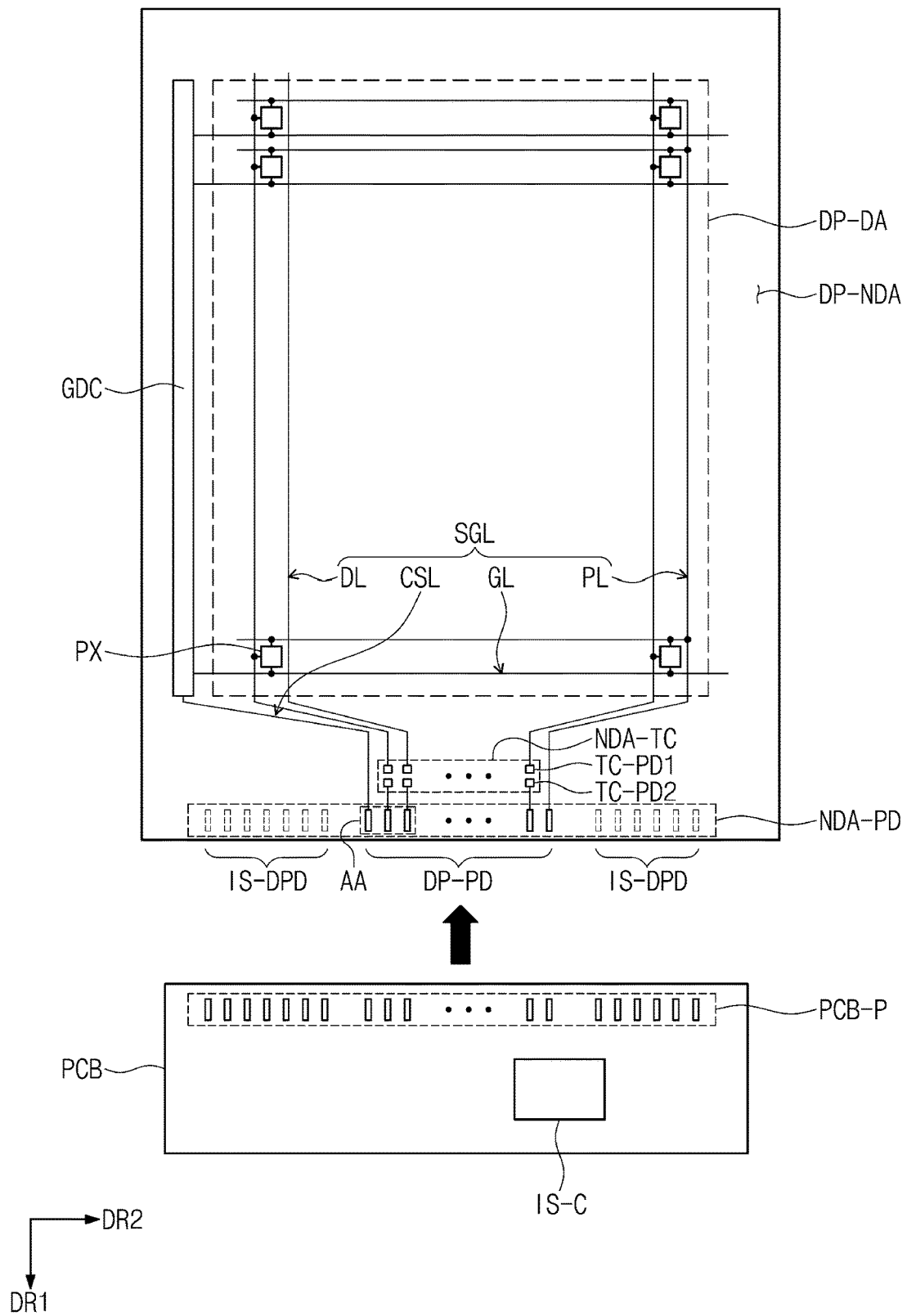
Figure 5:
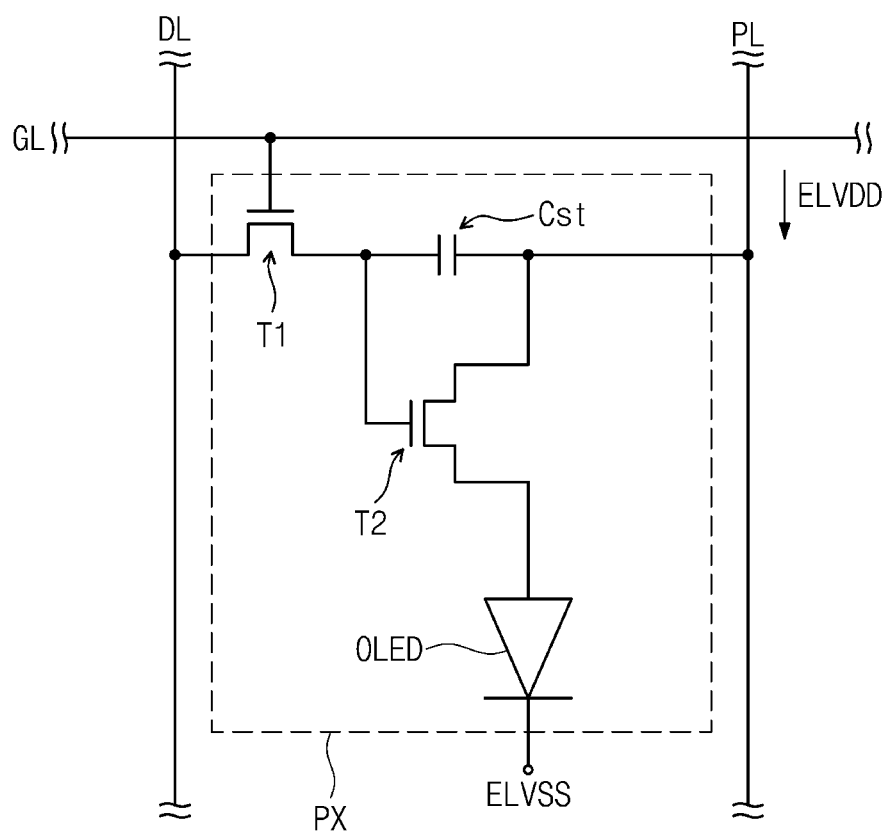
FIG. 5 is an equivalent circuit diagram showing an exemplary embodiment of a pixel according to the invention.
Figure 6:
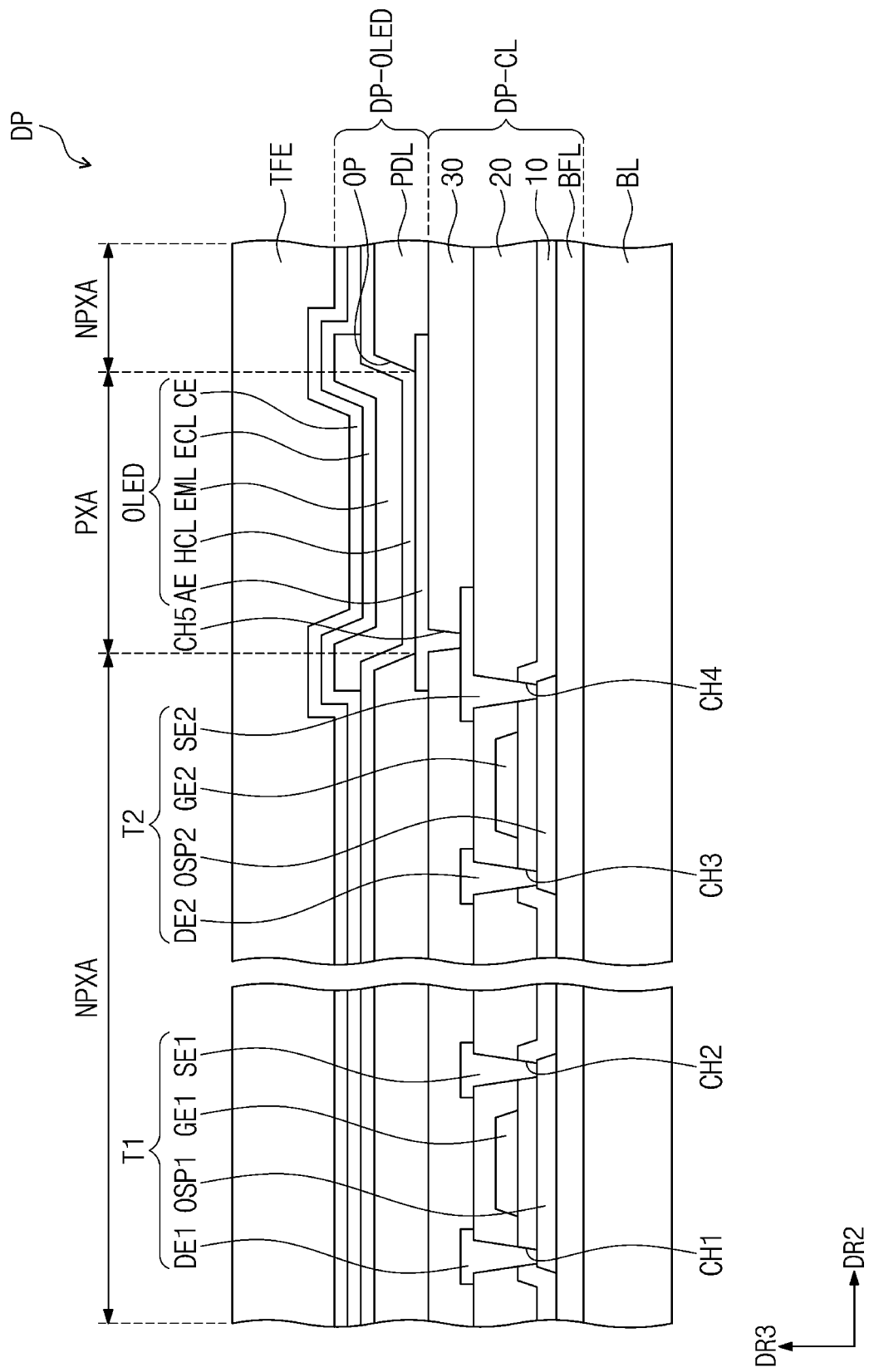
FIG. 6 is an enlarged cross-sectional view showing an exemplary embodiment of a display panel according to the invention.

FIG. 3 is a cross-sectional view showing a display panel DP according to an exemplary embodiment of the invention. FIGS. 4A and 4B are plan views showing a display panel DP according to an exemplary embodiment of the invention. FIG. 5 is an equivalent circuit diagram showing a pixel PX according to an exemplary embodiment of the invention. FIG. 6 is an enlarged cross-sectional view showing a display panel DP according to an exemplary embodiment of the invention. The display panel DP described hereinafter may be applied to the display devices DD described with reference to FIGS. 2A to 2F.

Referring to FIG. 3, the display panel DP includes a base layer BL, a circuit element layer DP-CL disposed on the base layer BL, a display element layer DP-OLED, and a thin film encapsulation layer TFE. Although not shown separately, the display panel DP may further include functional layers, such as an anti-reflection layer, a refractive index control layer, etc.

The base layer BL may include a synthetic resin film. A synthetic resin layer is disposed on a working substrate used to manufacture the display panel DP. Then, a conductive layer and an insulating layer are disposed on the synthetic resin layer. When the working substrate is removed, the synthetic resin layer corresponds to the base layer BL. In an exemplary embodiment, the synthetic resin layer may be a polyimide-based resin layer, but it should not be limited thereto or thereby. In an exemplary embodiment, the base layer BL may include a glass substrate, a metal substrate, or an organic-inorganic composite material substrate.

The circuit element layer DP-CL includes at least one insulating layer and a circuit element. Hereinafter, the insulating layer included in the circuit element layer DP-CL will be referred to as an intermediate insulating layer. The intermediate insulating layer includes at least one intermediate inorganic layer and at least one intermediate organic layer. The circuit element includes a signal line, a driving circuit of the pixel, and the like. In an exemplary embodiment, the circuit element layer DP-CL may be provided by processes, e.g., a coating process, a deposition process, etc., for the insulating layer, the semiconductor layer, and the conductive layer, and processes of patterning the insulating layer, the semiconductor layer, and the conductive layer using a photolithography process.

The display element layer DP-OLED includes a light emitting element. The display element layer DP-OLED may include organic light emitting diodes. The light emitting element may include organic light emitting diode. The display element layer DP-OLED may further include an organic layer like a pixel definition layer.

The thin film encapsulation layer TFE encapsulates the display element layer DP-OLED. The thin film encapsulation layer TFE includes at least one insulating layer. The thin film encapsulation layer TFE according to the exemplary embodiment of the invention may include at least one inorganic layer (hereinafter, referred to as an "encapsulation inorganic layer"). The thin film encapsulation layer TFE according to the exemplary embodiment of the invention may include at least one organic layer (hereinafter, referred to as an "encapsulation organic layer") and at least one encapsulation inorganic layer.

The encapsulation inorganic layer protects the display element layer DP-OLED from moisture and oxygen, and the encapsulation organic layer protects the display element layer DP-OLED from a foreign substance such as dust. In an exemplary embodiment, the encapsulation inorganic layer may include a silicon nitride layer, a silicon oxynitride layer, a silicon oxide layer, a titanium oxide layer, or an aluminum oxide layer, for example, but it should not be limited thereto or thereby. In an exemplary embodiment, the encapsulation organic layer may include an acryl-based organic layer, but it should not be limited thereto or thereby.

Referring to FIG. 4A, the display panel DP includes a display area DP-DA and a non-display area DP-NDA when viewed in a plan view. In the illustrated exemplary embodiment, the non-display area DP-NDA may be defined along an edge of the display area DP-DA. The display area DP-DA and the non-display area DP-NDA of the display panel DP correspond to the display area DD-DA and the non-display area DD-NDA shown in FIGS. 1 and 2A, respectively.

The display panel DP may include a driving circuit GDC, a plurality of signal lines SGL (hereinafter, referred to as signal lines), a plurality of signal pads DP-PD (hereinafter, referred to as signal pads), and a plurality of pixels PX (hereinafter, referred to as pixels). The pixels PX are arranged in the display area DP-DA. Each of the pixels PX includes an organic light emitting diode and a pixel driving circuit connected to the organic light emitting diode. The driving circuit GDC, the signal lines SGL, the signal pads DP-PD, and the pixel driving circuit may be included in the circuit element layer DP-CL shown in FIG. 3.

The driving circuit GDC may include a scan driving circuit. The scan driving circuit generates a plurality of scan signals (hereinafter, referred to as scan signals) and sequentially applies the scan signals to a plurality of scan lines GL (hereinafter, referred to as scan lines) described later. The scan driving circuit may further apply a control signal to the driving circuit of the pixels PX.

The scan driving circuit may include a plurality of thin film transistors provided by the same process, e.g., a low temperature polycrystalline silicon process or a low temperature polycrystalline oxide process, as the driving circuit.

The signal lines SGL include the scan lines GL, data lines DL, a power line PL, and a control signal line CSL. Each of the scan lines GL is connected to a corresponding pixel among the pixels PX, and each of the data lines DL is connected to a corresponding pixel among the pixels PX. The power line PL is connected to the pixels PX. The control signal line CSL may apply control signals to the scan driving circuit.

The signal lines SGL overlap the display area DP-DA and the non-display area DP-NDA. The signal lines SGL may include a pad part and a line part. The line part overlaps the display area DP-DA and the non-display area DP-NDA. The pad part is connected to an end of the line part. The pad part is disposed in the non-display area DP-NDA and overlaps a corresponding signal pad among the signal pads DP-PD. Details thereof will be described later. In the non-display area DP-NDA, an area in which the signal pads DP-PD are arranged may be referred to as a pad area NDA-PD.

The line part connected to the pixel PX substantially forms most of the signal lines SGL. The line part is connected to transistors T1 and T2 (refer to FIG. 5) of the pixel PX. The line part may have a single-layer or multi-layer structure, may be provided in a single body, and may include two or more parts. The two or more parts may be disposed on different layers from each other and connected to each other via a contact hole defined through an insulating layer disposed between the two or more parts.

The display panel DP may further include dummy pads IS-DPD disposed in the pad area NDA-PD. Since the dummy pads IS-DPD are defined through the same process as the signal lines SGL, the dummy pads IS-DPD may be disposed in the same layer as the signal lines SGL. The dummy pads IS-DPD may be selectively included in the display device DD including the input sensing layer ISL or ISL-1 as shown in FIGS. 2A and 2D to 2F and omitted from the display device DD including the input sensing unit ISU (refer to FIG. 9), e.g., input sensing panel ISP, as shown in FIGS. 2B and 2C.

The dummy pads IS-DPD may overlap the pad part of the signal lines arranged on the input sensing layers ISL and ISL-1 shown in FIGS. 2A and 2D to 2F. The dummy pads IS-DPD may be floating electrodes. The dummy pads IS-DPD may be electrically insulated from the signal lines SGL of the display panel. This will be described in detail later.

FIG. 4A further shows a circuit substrate PCB electrically connected to the display panel DP. The circuit substrate PCB may be a rigid circuit substrate or a flexible circuit substrate. The circuit substrate PCB may be directly coupled with the display panel DP or connected to the display panel DP through another circuit substrate.

The circuit substrate PCB may include a timing control circuit TC disposed thereon to control an operation of the display panel DP. In addition, the circuit substrate PCB may include an input sensing circuit IS-C disposed thereon to control the input sensing unit ISU or the input sensing layer ISL. Each of the timing control circuit TC and the input sensing circuit IS-C may be directly mounted on the circuit substrate PCB in the form of an integrated chip ("IC"). In the exemplary embodiment of the invention, each of the timing control circuit TC and the input sensing circuit IS-C may be disposed (e.g., mounted) on the circuit substrate PCB in one IC. The circuit substrate PCB may include circuit substrate pads PCB-P electrically connected to the display panel DP. Although not shown in the drawings, the circuit substrate PCB further includes signal lines to electrically connect the circuit substrate pads PCB-P, the timing control circuit TC, and/or the input sensing circuit IS-C.

As shown in FIG. 4B, the display panel DP according to the exemplary embodiment of the invention may further include a chip mounting area NDA-TC disposed in the non-display area DP-NDA. The timing control circuit TC (refer to FIG. 4A, hereinafter, referred to as a "control circuit chip") having the chip form is disposed in the chip mounting area NDA-TC.

First chip pads TC-PD1 and second chip pads TC-PD2 may be arranged in the chip mounting area DA-TC. The first chip pads TC-PD1 are connected to the data lines DL, and the second chip pads TC-PD2 are connected to the signal pads DP-PD through the signal lines. Terminals of the control circuit chip TC may be connected to the first chip pads TC-PD1 and the second chip pads TC-PD2. Consequently, the data lines DL may be electrically connected to the signal pads DP-PD through the control circuit chip.

In the exemplary embodiment of the invention, one or more of the control signal line CSL and the power line PL may be connected to the control circuit chip TC. Although not shown in the drawings, a cross-section structure of the first chip pads TC-PD1 and the second chip pads TC-PD2 may be substantially the same as that of one of signal pads described later with reference to FIGS. 8A to 8G and 13A to 13C.

FIG. 5 shows one scan line GL, one data line DL, the power line PL, and the pixel PX connected to the scan line GL, the data line DL, and the power line PL. However, a configuration of the pixel PX should not be limited to that shown in FIG. 5.

The organic light emitting diode OLED may be a front surface light emitting type or a rear surface light emitting type. The pixel PX includes a first transistor T1 (or a switching transistor), a second transistor T2 (or a driving transistor), and a capacitor Cst as a pixel driving circuit that drives the organic light emitting diode OLED. A first source voltage ELVDD is applied to the second transistor T2, and a second source voltage ELVSS is applied to the organic light emitting diode OLED. The second source voltage ELVSS may be lower than the first source voltage ELVDD.

The first transistor T1 outputs a data signal applied to the data line DL in response to a scan signal applied to the scan line GL. The capacitor Cst is charged with a voltage corresponding to the data signal provided from the first transistor T1. The second transistor T2 is connected to the organic light emitting diode OLED. The second transistor T2 controls a driving current flowing through the organic light emitting diode OLED in response to an amount of electric charge held in the capacitor Cst.

However, the configuration of the pixel PX should not be limited to the equivalent circuit diagram shown in FIG. 5. That is, the pixel PX may further include a plurality of transistors and a plurality of capacitors. In an exemplary embodiment, the organic light emitting diode OLED may be connected to between the power line PL and the second transistor T2.

FIG. 6 is an enlarged cross-sectional view showing a portion of the display panel DP corresponding to the equivalent circuit diagram shown in FIG. 5.

Referring to FIG. 6, the circuit element layer DP-CL, the display element layer DP-OLED, and the thin film encapsulation layer TFE are sequentially stacked on the base layer BL. In the illustrated exemplary embodiment, the circuit element layer DP-CL includes a buffer layer BFL of an inorganic layer, a first intermediate inorganic layer 10, a second intermediate inorganic layer 20, and an intermediate organic layer 30 of an organic layer. The inorganic and organic layers should not be limited to a specific material, and the buffer layer BFL of the illustrated exemplary embodiment may be selectively disposed or omitted.

A semiconductor pattern OSP1 (hereinafter, referred to as a "first semiconductor pattern") of the first transistor T1 and a semiconductor pattern OSP2 (hereinafter, referred to as a "second semiconductor pattern") of the second transistor T2 are disposed on the buffer layer BFL. In an exemplary embodiment, the first and second semiconductor patterns OSP1 and OSP2 may include at least one of amorphous silicon, polysilicon, and metal oxide material, for example.

The first intermediate inorganic layer 10 is disposed on the first semiconductor pattern OSP1 and the second semiconductor pattern OSP2. A control electrode GE1 (hereinafter, referred to as a "first control electrode") of the first transistor T1 and a control electrode GE2 (hereinafter, referred to as a "second control electrode") of the second transistor T2 are disposed on the first intermediate inorganic layer 10. The first control electrode GE1 and the second control electrode GE2 may be manufactured by the same photography process as the scan lines GL (refer to FIG. 5).

The second intermediate inorganic layer 20 is disposed on the first intermediate inorganic layer 10 to cover the first control electrode GE1 and the second control electrode GE2. An input electrode DE1 (hereinafter, referred to as a "first input electrode") and an output electrode SE1 (hereinafter, referred to as a "first output electrode") of the first transistor T1 and an input electrode DE2 (hereinafter, referred to as a "second input electrode") and an output electrode SE2 (hereinafter, referred to as a "second output electrode") of the second transistor T2 are disposed on the second intermediate inorganic layer 20.

The first input electrode DE1 and the first output electrode SE1 are connected to the first semiconductor pattern OSP1 respectively through a first contact hole CH1 and a second contact hole CH2, which are defined through the first intermediate inorganic layer 10 and the second intermediate inorganic layer 20. The second input electrode DE2 and the second output electrode SE2 are connected to the second semiconductor pattern OSP2 respectively through a third contact hole CH3 and a fourth contact hole CH4, which are defined through the first intermediate inorganic layer 10 and the second intermediate inorganic layer 20. According to another exemplary embodiment of the invention, a portion of the first transistor T1 and the second transistor T2 may vary to have a bottom gate structure.

The intermediate organic layer 30 is disposed on the second intermediate inorganic layer 20 to cover the first input electrode DE1, the second input electrode DE2, the first output electrode SE1, and the second output electrode SE2. The intermediate organic layer may provide a flat surface.

The display element layer DP-OLED is disposed on the intermediate organic layer 30. The display element layer DP-OLED may include the pixel definition layer PDL and the organic light emitting diode OLED. The pixel definition layer PDL may include an organic material. A first electrode AE is disposed on the intermediate organic layer 30. The first electrode AE is connected to the second output electrode SE2 through a fifth contact hole CH5 defined through the intermediate organic layer 30. An opening OP is defined through the pixel definition layer PDL. At least a portion of the first electrode AE is exposed through the opening OP of the pixel definition layer PDL. However, the invention is not limited thereto, and the pixel definition layer PDL may be omitted in another exemplary embodiment of the invention.

The pixel PX may be disposed in the display area DP-DA (refer to FIG. 4B). The display area DP-DA may include a light emitting area PXA and a non-light emitting area NPXA adjacent to the light emitting area PXA. The non-light emitting area NPXA may surround the light emitting area PXA. In the illustrated exemplary embodiment, the light emitting area PXA is defined to correspond to the portion of the first electrode AE, which is exposed through the opening OP.

In the exemplary embodiment of the invention, the light emitting area PXA may overlap at least one of the first and second transistors T1 and T2. The opening OP may expand, and the first electrode AE and a light emitting layer EML, which is described later, may expand.

A hole control layer HCL may be disposed in common in the light emitting area PXA and the non-light emitting area NPXA. Although not shown separately, a common layer like the hole control layer HCL may be commonly defined in the pixels PX (refer to FIG. 4A).

The light emitting layer EML is disposed on the hole control layer HCL. The light emitting layer EML may be disposed in an area corresponding to the opening OP. That is, the light emitting layer EML may be provided in each pixel PX after being divided into plural parts. The light emitting layer EML may include an organic material and/or an inorganic material. The light emitting layer EML may generate a predetermined color light.

In the illustrated exemplary embodiment, the light emitting layer EML that is patterned is shown as a representative example, but the light emitting layer EML may be commonly disposed in the pixels PX. In this case, the light emitting layer EML may generate a white light, for example. In an exemplary embodiment, the light emitting layer EML may have a multi-layer structure called a tandem, for example.

An electron control layer ECL is disposed on the light emitting layer EML. Although not shown separately, the electron control layer ECL may be commonly provided in the pixels PX (refer to FIG. 4A). A second electrode CE is disposed on the electron control layer ECL. The second electrode CE may be commonly disposed in the pixels PX.

The thin film encapsulation layer TFE is disposed on the second electrode CE. The thin film encapsulation layer TFE is commonly disposed in the pixels PX. In the illustrated exemplary embodiment, the thin film encapsulation layer TFE directly covers the second electrode CE. In an exemplary embodiment, a capping layer may be further disposed between the thin film encapsulation layer TFE and the second electrode CE to cover the second electrode CE. In this case, the thin film encapsulation layer TFE may directly cover the capping layer.

In the exemplary embodiment of the invention, the organic light emitting diode OLED may further include a resonant structure to control a resonant distance of a light generated by the light emitting layer EML. The resonant structure is disposed between the first electrode AE and the second electrode CE and has a thickness, taken along a vertical direction in FIG. 6, determined depending on a wavelength of the light generated by the light emitting layer EML.

FIGS. 7A to 7D are cross-sectional views showing a thin film encapsulation layer TFE according to an exemplary embodiment of the invention. FIGS. 7E to 7G are views showing processes of forming a thin film encapsulation layer TFE according to a comparison embodiment. FIGS. 7H and 7I are views showing processes of forming a thin film encapsulation layer TFE according to an exemplary embodiment of the invention. The descriptions on the thin film encapsulation layer TFE described with reference to FIG. 3 may be applied to the following descriptions.

Figure 7A:
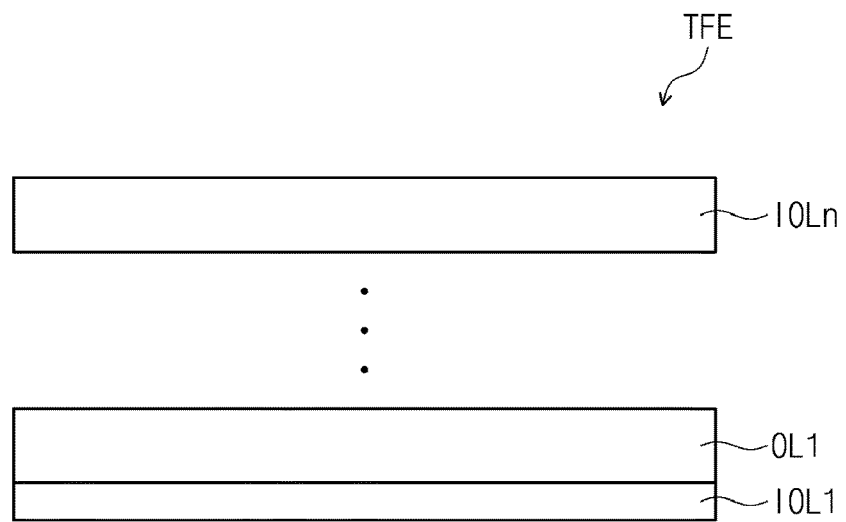
FIGS. 7A to 7D are cross-sectional views showing an exemplary embodiment of a thin film encapsulation layer according to the invention.

Referring to FIG. 7A, the thin film encapsulation layer TFE according to the exemplary embodiment of the invention may include n (n is a natural number equal to or greater than 2) encapsulation inorganic layers IOL1 to IOLn including a first encapsulation inorganic layer IOL1 contacting the second electrode CE (refer to FIG. 6).

The thin film encapsulation layer TFE may include n−1 encapsulation organic layers OL1, and the n−1 encapsulation organic layers OL1 may be alternately arranged with the n encapsulation inorganic layers IOL1 to IOLn. The n−1 encapsulation organic layers OL1 may have an average thickness greater than that of the n encapsulation inorganic layers IOL1 to IOLn.

Each of the n encapsulation inorganic layers IOL1 to IOLn may have a single-layer structure of one material or a multi-layer structure of different materials from each other. The n−1 encapsulation organic layers OL1 may be provided by depositing organic monomers. In an exemplary embodiment, the organic monomers may include an acrylic-based monomer, for example, but they should not be limited thereto or thereby.

In the exemplary embodiment, the thin film encapsulation layer TFE may include a silicon oxynitride layer/an organic monomer layer/a silicon nitride layer, for example, which are sequentially stacked on the second electrode CE. Another inorganic layer may be disposed on the silicon nitride layer, and the silicon nitride layer may have a multi-layer structure (e.g., a two-layer structure) deposited in different conditions.

Figure 7B:
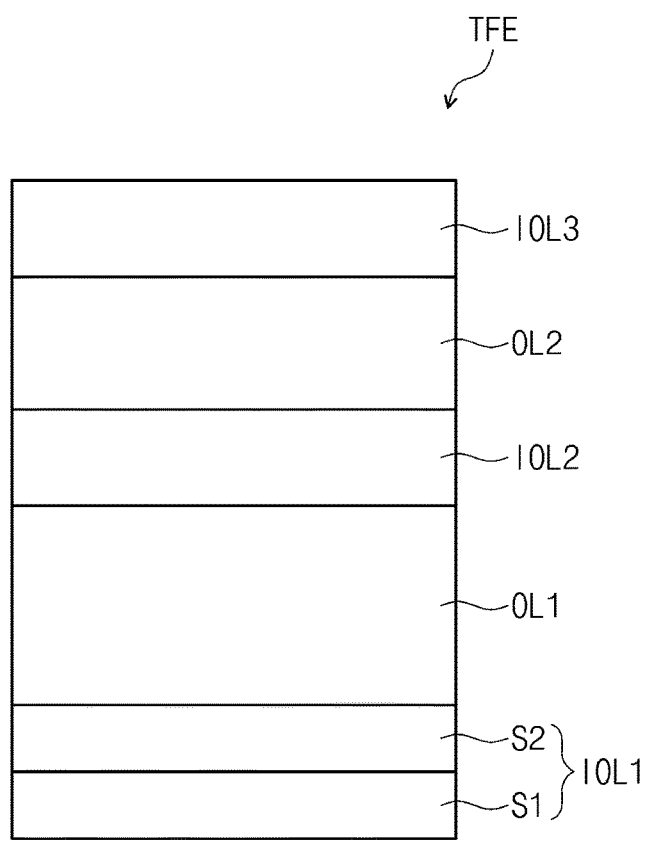

As shown in FIG. 7B, the thin film encapsulation layer TFE may include a first encapsulation inorganic layer IOL1, a first encapsulation organic layer OL1, a second encapsulation inorganic layer IOL2, a second encapsulation organic layer OL2, and a third encapsulation inorganic layer IOL3.

The first encapsulation inorganic layer IOL1 may have a two-layer structure of a first sub-layer S1 and a second sub-layer S2. In an exemplary embodiment, the first sub-layer S1 may be a lithium fluoride layer, and the second sub-layer S2 may be an aluminum oxide layer, for example. In an exemplary embodiment, the first encapsulation organic layer OL1 may be a first organic monomer layer, the second encapsulation inorganic layer IOL2 may be a first silicon nitride layer, the second encapsulation organic layer OL2 may be a second organic monomer layer, and the third encapsulation inorganic layer IOL3 may be a second silicon nitride layer, for example.

Figure 7C:
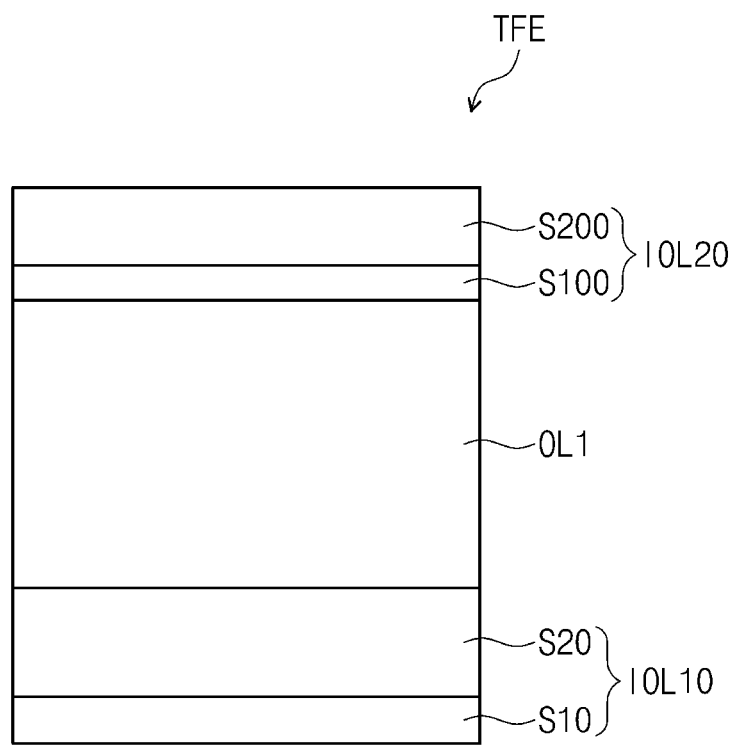

As shown in FIG. 7C, the thin film encapsulation layer TFE may include a first encapsulation inorganic layer IOL10, a first encapsulation organic layer OL1, and a second encapsulation inorganic layer IOL20. Each of the first encapsulation inorganic layer IOL10 and the second encapsulation inorganic layer IOL20 may have a two-layer structure. In an exemplary embodiment, a first sub-layer S10 may be a lithium fluoride layer, and a second sub-layer S20 may be a silicon oxide layer, for example. The second encapsulation inorganic layer IOL20 may include a first sub-layer S100 and a second sub-layer S200, which are deposited in different conditions from each other. The first sub-layer S100 may be deposited in a low power condition, and the second sub-layer S200 may be deposited in a high power condition. Each of the first sub-layer S100 and the second sub-layer S200 may be a silicon nitride layer, for example.

Figure 7D:
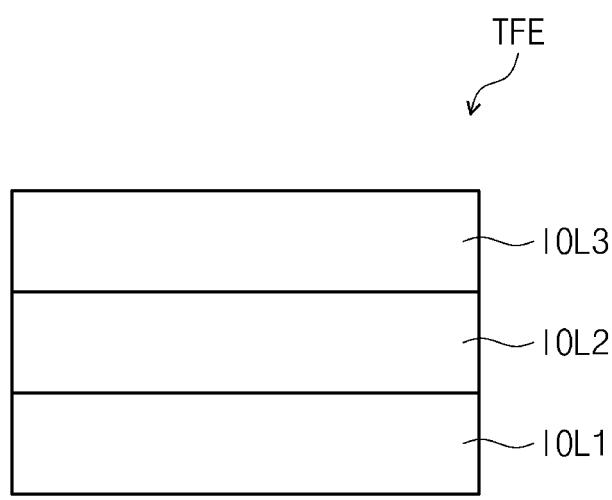
Figure 7E:
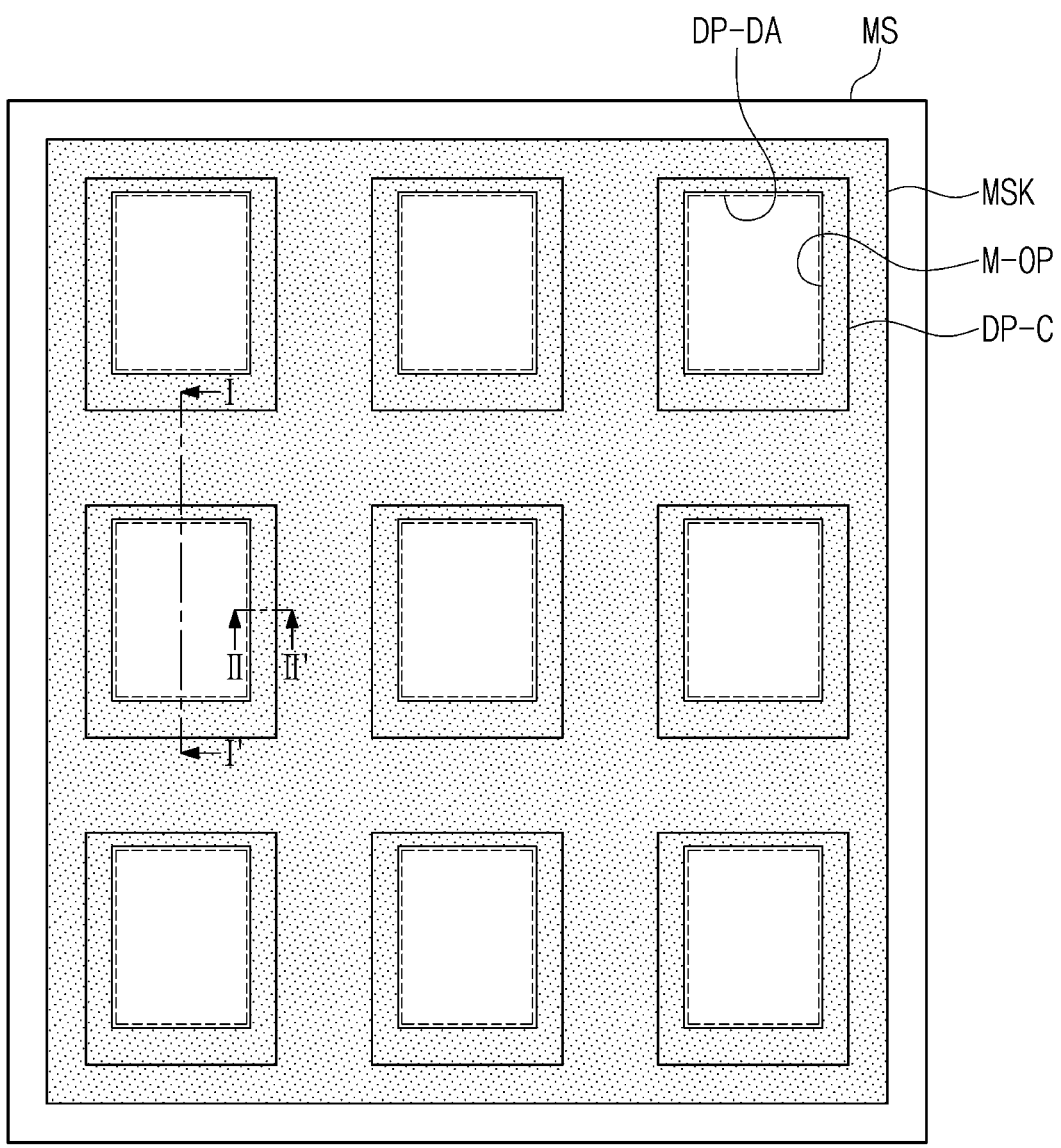
FIGS. 7E to 7G are views showing processes of forming a comparison embodiment a thin film encapsulation layer.
Figure 7F:
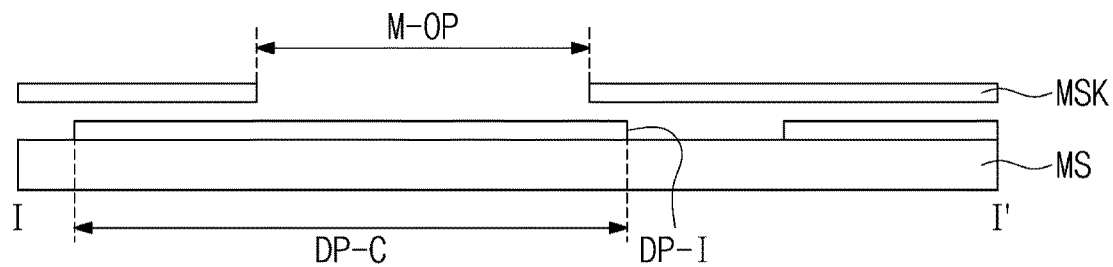
Figure 7G:
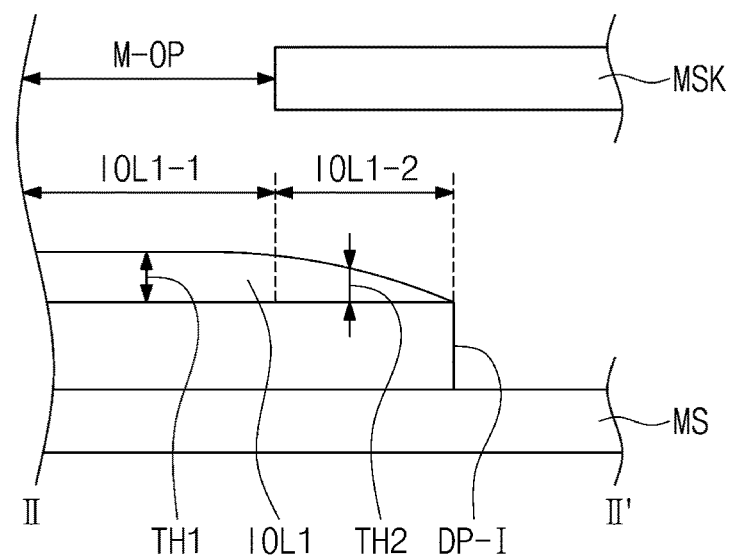
Figure 7H:
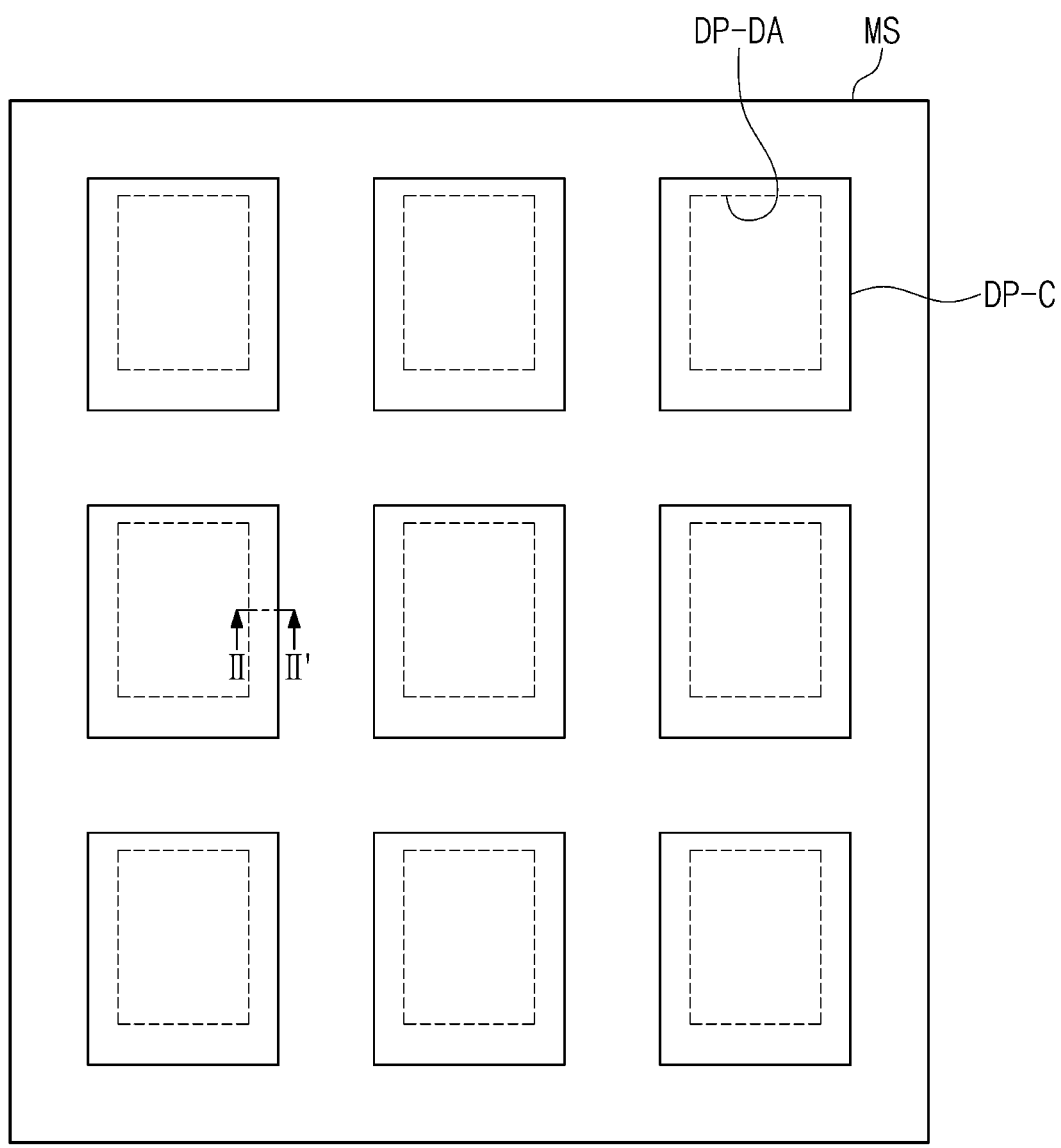
FIGS. 7H and 7I are views showing processes of forming an exemplary embodiment of a thin film encapsulation layer according to the invention.
Figure 7I:
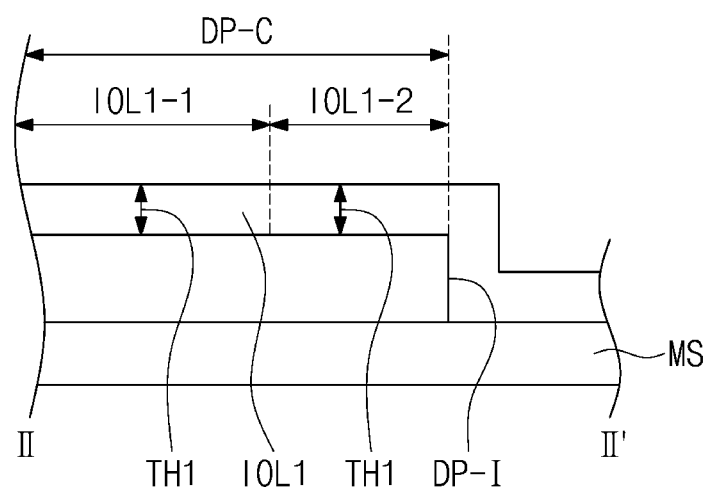

As shown in FIG. 7D, the thin film encapsulation layer TFE may include a plurality of encapsulation inorganic layers sequentially stacked one after another. The thin film encapsulation layer TFE may include a first encapsulation inorganic layer IOL1, a second encapsulation inorganic layer IOL2, and a third encapsulation inorganic layer IOL3. Among the encapsulation inorganic layers, at least one encapsulation inorganic layer may include a silicon nitride layer, a silicon oxynitride layer, a silicon oxide layer, a titanium oxide layer, or an aluminum oxide layer, for example. In an exemplary embodiment, the first encapsulation inorganic layer IOL1 and the third encapsulation inorganic layer IOL3 may include the silicon nitride layer, the silicon oxynitride layer, the silicon oxide layer, the titanium oxide layer, or the aluminum oxide layer, for example.

Among the encapsulation inorganic layers, at least one encapsulation inorganic layer may be a hexamethyldisiloxane ("HMDSO") layer. The HMDSO layer may absorb a stress. The second encapsulation inorganic layer IOL2 may be the HMDSO layer. The second encapsulation inorganic layer IOL2 may absorb the stress of the first encapsulation layer IOL1 and the third encapsulation inorganic layer IOL3. Accordingly, the thin film encapsulation layer TFE may become flexible.

In a case that the thin film encapsulation layer TFE includes only the encapsulation inorganic layers, consecutive deposition processes may be carried out in one chamber, and thus processes of forming the thin film encapsulation layer may be simplified. This is because a process of transferring a mother substrate (not shown) for the thin film encapsulation layer TFE between chambers is desired at least once in a case that the thin film encapsulation layer TFE includes the encapsulation organic layer and the encapsulation inorganic layer. In a case that one of the encapsulation inorganic layers is the HMDSO layer, the thin film encapsulation layer TFE may have a flexibility.

Hereinafter, the processes of forming the thin film encapsulation layers TFE according to the comparison embodiment and according to the exemplary embodiment of the invention will be described with reference to FIGS. 7E to 7I. The thin film encapsulation layer TFE including the first encapsulation inorganic layer IOL1, the encapsulation organic layer OL1, and the second encapsulation inorganic layer IOL2 will be described as a representative example.

As shown in FIGS. 7E and 7H, the same process is performed on a plurality of cell areas DP-C (hereinafter, referred to as cell areas) defined in the mother substrate MS to form the display panel DP (refer to FIGS. 2A to 2F) or the display module DM (refer to FIGS. 2A to 2F) in each of the cell areas DP-C. After the manufacturing process is completed, the mother substrate MS is cut to separate the display panels DP or the display modules DM provided in the cell areas DP-C.

The first encapsulation inorganic layer IOL1, the encapsulation organic layer OL1, and the second encapsulation inorganic layer IOL2 may be provided by a deposition process. In an exemplary embodiment, the encapsulation organic layer OL1 may be provided by an inkjet method, for example. Hereinafter, the first encapsulation inorganic layer IOL1 provided by the deposition process will be described as a representative example.

Referring to FIGS. 7E and 7F, a mask MSK through which a plurality of openings M-OP (hereinafter, referred to as openings) is defined is aligned with the mother substrate MS. Each of the openings M-OP may correspond to the display area DP-DA shown in FIGS. 3 and 4A or an area slightly wider than the display area DP-DA. An inorganic material is deposited on the mother substrate MS after the mother substrate MS with which the mask MSK is aligned is loaded into a deposition chamber.

A preliminary display panel DP-I shown in FIG. 7F has a structure in which the display element layer DP-OLED of the display panel DP shown in FIG. 3 is provided. Since a predetermined gap is defined between the mask MSK and the preliminary display panel DP-I, the inorganic material is deposited in an area wider than an area corresponding to the opening M-OP. That is, the inorganic material may be deposited not only in the display area DP-DA but also in the non-display area DP-NDA (refer to FIG. 4B). Accordingly, the first encapsulation inorganic layer IOL1 having the shape shown in FIG. 7G is provided.

Referring to FIG. 7G, since a second area IOL1-2 of the first encapsulation inorganic layer IOL1 overlaps the mask MSK, an amount of the inorganic material deposited in the second area IOL1-2 is relatively smaller than that in a first area IOL1-1 of the first encapsulation inorganic layer IOU. The second area IOL1-2 has a second thickness TH2 smaller than a first thickness TH1 of the first area IOL1-1. The second thickness TH2 of the second area IOL1-2 becomes smaller as a distance from the first area IOL1-1 increases.

In addition, the second area IOL1-2 has a film density smaller than that of the first area IOL1-1. This is because an ashing gas (e.g., $N_2O$), which is used to remove residual organic material before the encapsulation inorganic layer is deposited, exists around the mask MSK and interferes with the deposition of the inorganic material.

The second area IOL1-2 having substantially thin thickness and substantially small film density has a relatively weak coupling force with respect to a lower layer thereof compared to that of the first area IOL1-1. When a moisture infiltrates into between the first encapsulation inorganic layer IOL1 and the lower layer, the first encapsulation inorganic layer IOL1 may be separated from the lower layer. In a case that the lower layer is an organic layer, the first encapsulation inorganic layer IOL1 may be easily separated from the lower layer. The first encapsulation inorganic layer IOL1 may be more easily separated from the lower layer than the second encapsulation inorganic layer IOL2 since the intermediate organic layer 30 or the pixel definition layer PDL is disposed under the first encapsulation inorganic layer IOU.

According to the illustrated exemplary embodiment, at least one encapsulation inorganic layer of the thin film encapsulation layer TFE is entirely disposed on the display panel DP to prevent the encapsulation inorganic layer from being separated. As shown in FIG. 7H, the inorganic layer may be entirely deposited on the mother substrate MS without using the mask. The inorganic layer is provided not only in the cell areas DP-C but also in a boundary area between the cell areas DP-C. Consequently, the encapsulation inorganic layer may be deposited in the display area DP-DA and the non-display area DP-NDA at a uniform thickness, e.g., the first thickness TH1, of the preliminary display panel DP-I. In the illustrated exemplary embodiment, the first encapsulation inorganic layer IOL1 is described as a representative example, but one or more of the first encapsulation inorganic layer IOL1 and the second encapsulation inorganic layer IOL2 are desired to be deposited on an entire surface of the display panel DP. Hereinafter, a cross-sectional structure of the pad area NDA-PD according to the deposited structure of the encapsulation inorganic layers IOL1 and IOL2 with reference to FIGS. 8A to 8G.

Figure 8A:
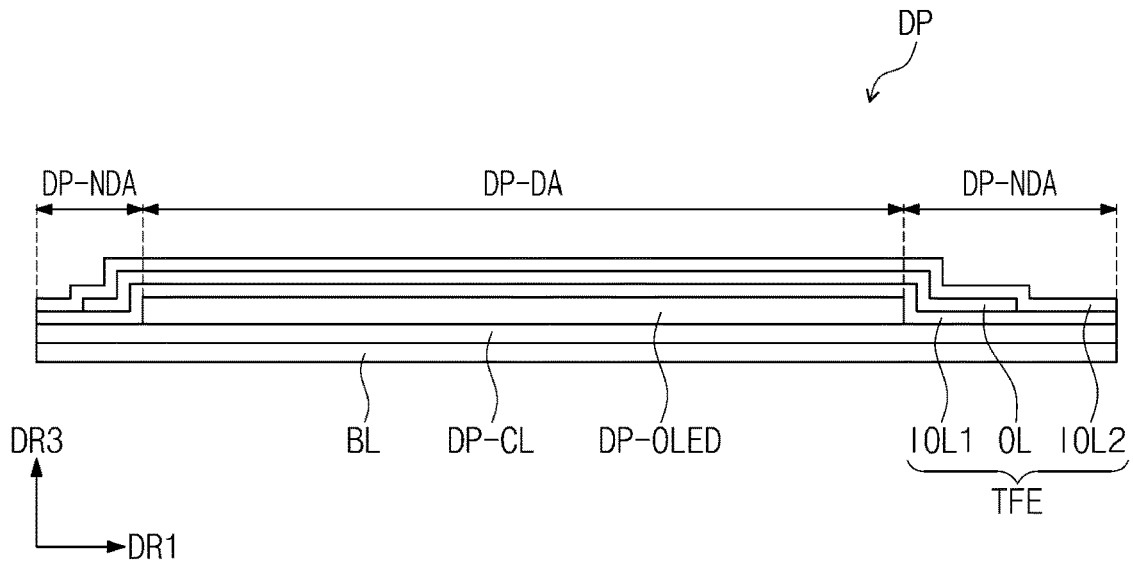
FIG. 8A is an enlarged cross-sectional view showing an exemplary embodiment of a portion of a display panel according to the invention.
Figure 8B:
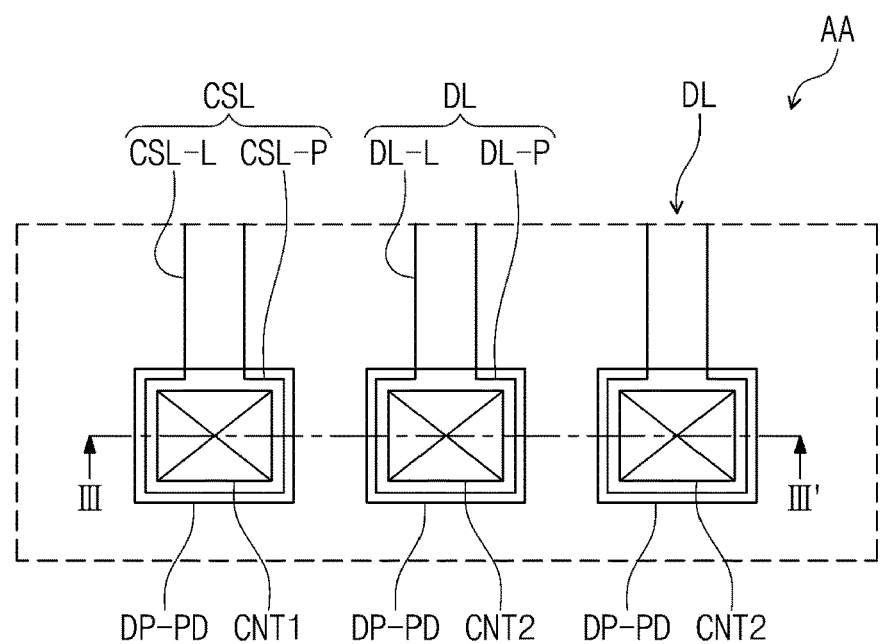
FIG. 8B is an enlarged plan view showing an exemplary embodiment of a pad area of a display panel according to the invention.
Figure 8C:
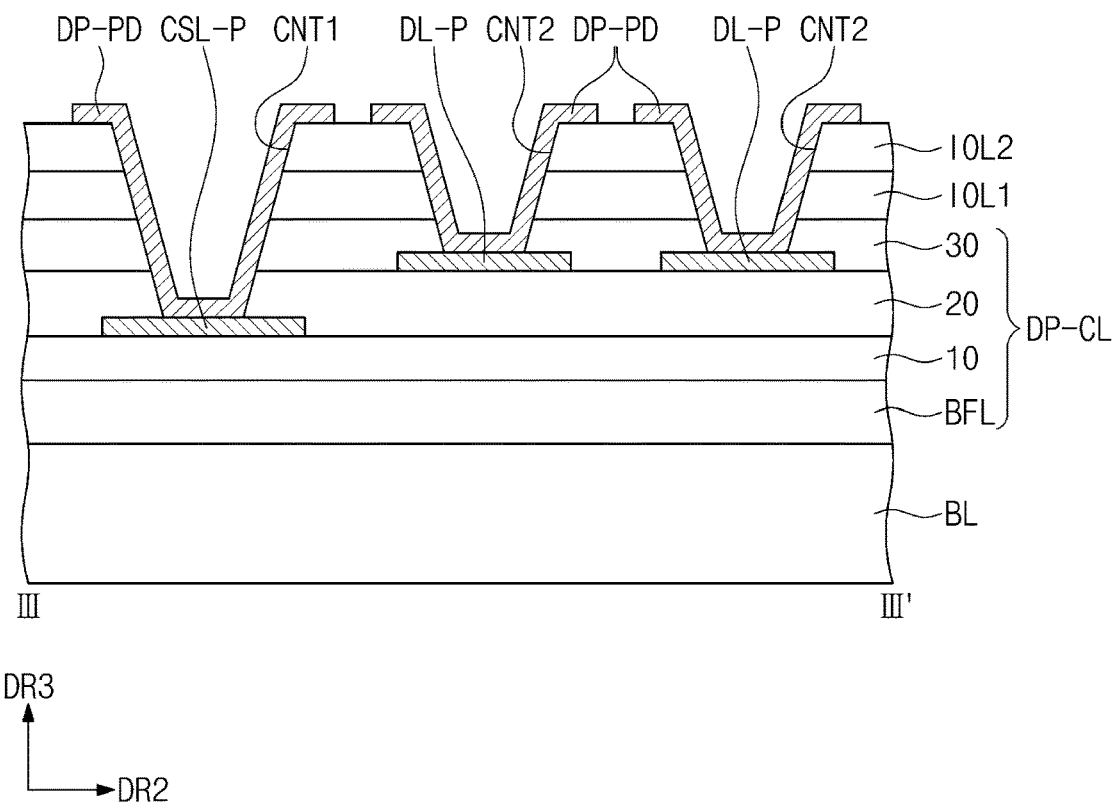
FIG. 8C is a cross-sectional view taken along line of FIG. 8B.
Figure 8D:
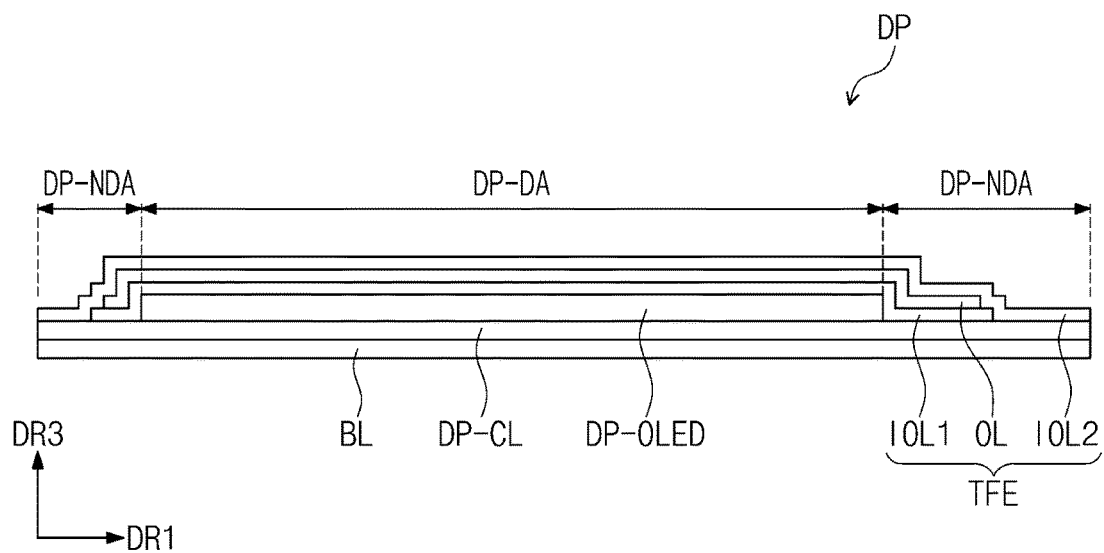
FIG. 8D is an enlarged cross-sectional view showing an exemplary embodiment of a portion of a display panel according to the invention.
Figure 8E:
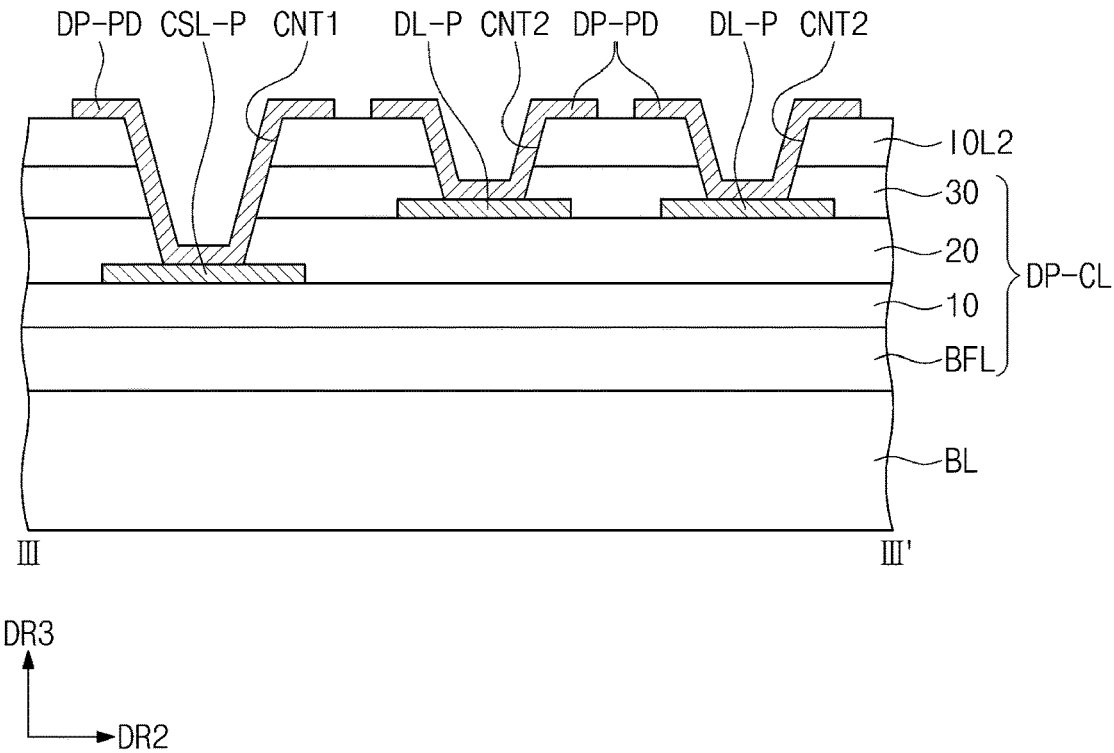
FIG. 8E is a cross-sectional view showing an exemplary embodiment of a pad area of a display panel according to the invention.
Figure 8F:
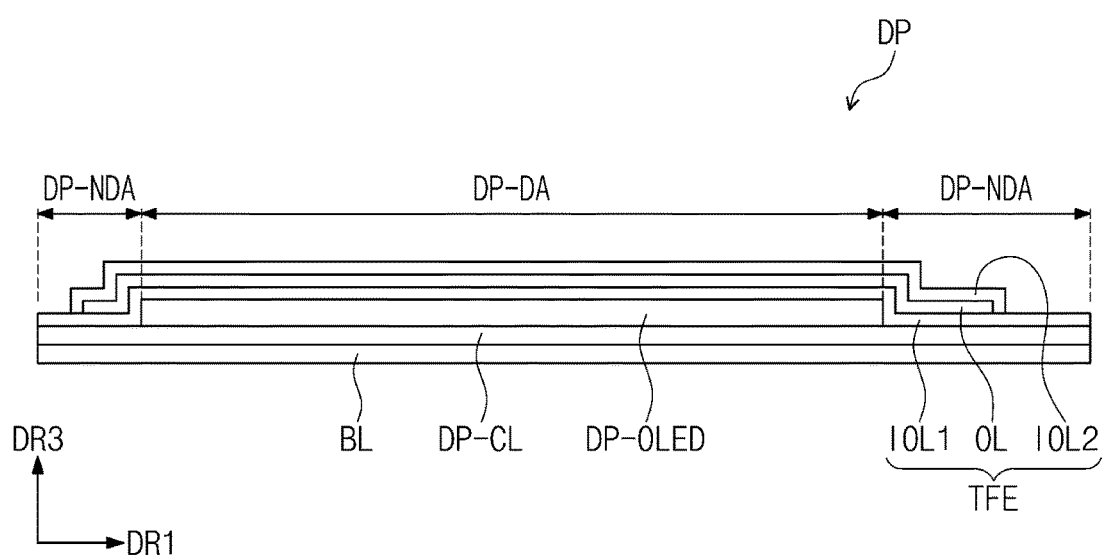
FIG. 8F is an enlarged cross-sectional view showing an exemplary embodiment of a portion of a display panel according to the invention.
Figure 8G:
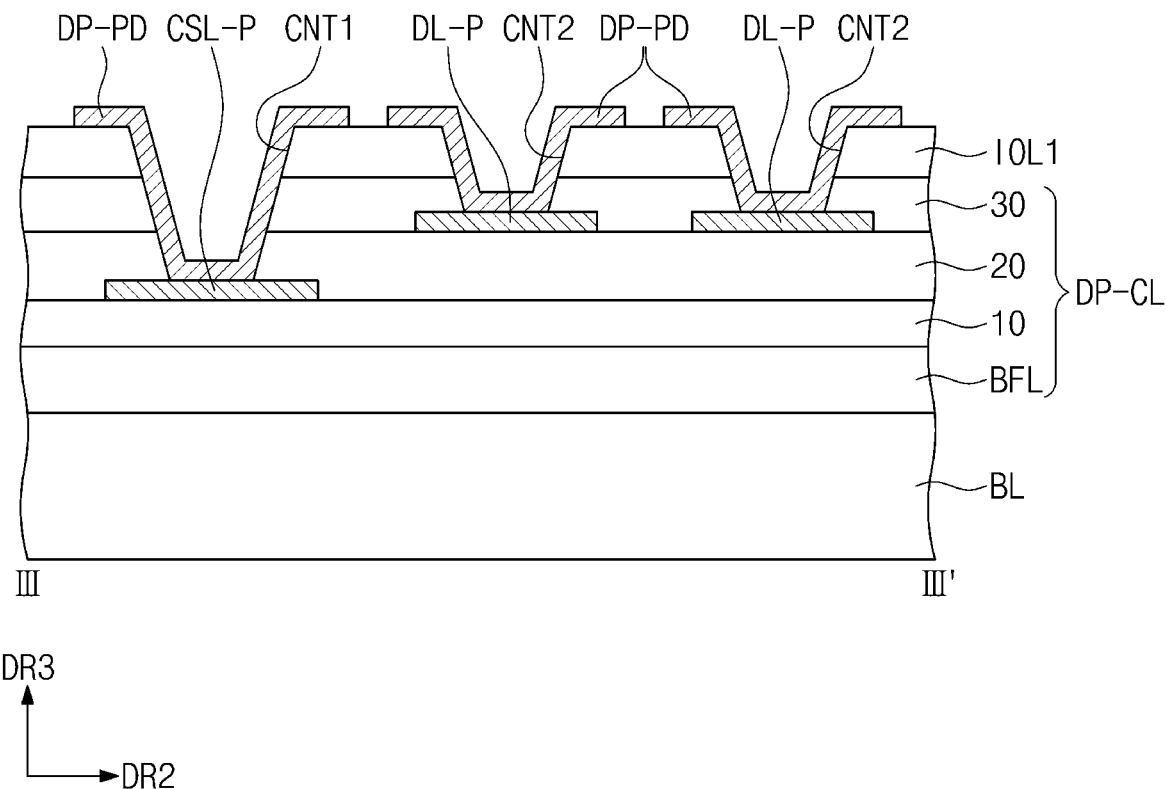
FIG. 8G is a cross-sectional view showing an exemplary embodiment of a pad area of a display panel according to the invention.

FIG. 8A is an enlarged cross-sectional view showing a portion of a display panel DP according to an exemplary embodiment of the invention. FIG. 8B is an enlarged plan view showing a pad area NDA-PD of a display panel DP according to an exemplary embodiment of the invention. FIG. 8C is a cross-sectional view taken along line of FIG. 8B. FIG. 8D is an enlarged cross-sectional view showing a portion of a display panel DP according to an exemplary embodiment of the invention. FIG. 8E is a cross-sectional view showing a pad area NDA-PD of a display panel DP according to an exemplary embodiment of the invention. FIG. 8F is an enlarged cross-sectional view showing a portion of a display panel DP according to an exemplary embodiment of the invention. FIG. 8G is a cross-sectional view showing a pad area NDA-PD of a display panel DP according to an exemplary embodiment of the invention.

FIGS. 8A to 8G show a thin film encapsulation layer TFE in which the "n" is 2 in the thin film encapsulation layer TFE shown in FIG. 7A. FIG. 8B shows an enlarged view of the area AA of FIGS. 4A and 4B. FIGS. 8E and 8G show a cross-section corresponding to FIG. 8C. In the exemplary embodiment of the invention, one signal line and a signal pad corresponding to the one signal line are electrically connected to each other through a contact hole defined through at least one encapsulation inorganic layer entirely overlapped with the display area DP-DA and the non-display area DP-NDA.

As shown in FIGS. 8A to 8C, the first encapsulation inorganic layer IOL1 is entirely disposed over the display area DP-DA and the non-display area DP-NDA. The encapsulation organic layer OL is disposed on the first encapsulation inorganic layer IOL1. The encapsulation organic layer OL entirely overlaps the display area DP-DA and a portion of the non-display area DP-NDA. The encapsulation organic layer OL may not overlap the pad area NDA-PD. The second encapsulation inorganic layer IOL2 is disposed on the encapsulation organic layer OL. The second encapsulation inorganic layer IOL2 may entirely overlap the display area DP-DA and the non-display area DP-NDA.

Each of the first encapsulation inorganic layer IOL1 and the second encapsulation inorganic layer IOL2 may be deposited as described with reference to FIGS. 7H and 7I. The encapsulation organic layer OL may be deposited using the mask MSK shown in FIG. 7E or provided by the inkjet method, for example. However, the manufacturing method of the first encapsulation inorganic layer IOL1, the second encapsulation inorganic layer IOL2, and the encapsulation organic layer OL should not be limited to a specific method.

FIG. 8B separately shows line parts CSL-L and DL-L and pad parts CSL-P and DL-P of the control signal line CSL and the data lines DL. The pad parts CSL-P and DL-P may have an area larger than that of the line parts CSL-L and DL-L at the same length. In an exemplary embodiment, the pad parts CSL-P and DL-P have a quadrangular shape, for example, but the shape of the pad parts CSL-P and DL-P may vary during the manufacturing process.

As shown in FIG. 8C, the pad part CSL-P of the control signal line CSL (refer to FIG. 8B) is disposed on the first intermediate inorganic layer 10, and the pad parts DL-P of the data lines are disposed on the second intermediate inorganic layer 20. The intermediate organic layer 30 covers the pad parts DL-P of the data lines DL. In the pad area NDA-PD (refer to FIG. 4D), the first encapsulation inorganic layer IOL1 is disposed on the intermediate organic layer 30. The first encapsulation inorganic layer IOL1 and the second encapsulation inorganic layer IOL2 contact each other in the pad area NDA-PD.

A plurality of signal pads DP-PD (hereinafter, referred to as signal pads) is disposed on the second encapsulation inorganic layer IOL2. Each of the signal pads DP-PD is connected to a corresponding pad part of the pad parts CSL-P and DL-P of the control signal line CSL and the data lines DL. One signal pad DP-PD may be electrically connected to the pad part CSL-P of the control signal line CSL through a first contact hole CNT1 defined through the second intermediate inorganic layer 20, the intermediate organic layer 30, the first encapsulation inorganic layer IOL1, and the second encapsulation inorganic layer IOL2. The other signal pad DP-PD may be electrically connected to the pad parts DL-P of the data lines DL through a second contact hole CNT2 defined through the intermediate organic layer 30, the first encapsulation inorganic layer IOL1, and the second encapsulation inorganic layer IOL2.

The number of the insulating layers through which the contact holes penetrate may be determined depending on a position of the pad part of the signal line in the cross-section. Although not shown separately, a pad part of the scan line may be disposed in the same layer as the pad part CSL-P of the control signal line CSL and connected to a corresponding signal pad.

In the illustrated exemplary embodiment, the second encapsulation inorganic layer IOL2 is disposed at an uppermost position of the pad area NDA-PD, but other organic layer and/or inorganic layer may further be disposed. In this case, the signal pads DP-PD are disposed on "the organic layer or the inorganic layer" disposed at the uppermost position of the pad area NDA-PD.

As shown in FIGS. 8D and 8E, the first encapsulation inorganic layer IOL1 does not overlap the pad area NDA-PD, and the second encapsulation inorganic layer IOL2 entirely overlaps the display area DP-DA and the non-display area DP-NDA. The first encapsulation layer IOL1 may be deposited using the open mask MSK shown in FIG. 7E. The encapsulation organic layer OL is disposed on the first encapsulation inorganic layer IOL1. An edge of the encapsulation layer OL may be positioned inside an edge of the first encapsulation inorganic layer IOU. The encapsulation organic layer OL may be deposited using the open mask MSK or provided by the inkjet method, for example. The second encapsulation inorganic layer IOL2 is disposed on the encapsulation organic layer OL. The second encapsulation inorganic layer IOL2 may contact the intermediate organic layer 30 in the pad area NDA-PD. In addition, the second encapsulation inorganic layer IOL2 may contact the first encapsulation inorganic layer IOL1 exposed through the encapsulation organic layer OL. The first encapsulation inorganic layer IOL1 and the second encapsulation inorganic layer IOL2 may encapsulate the encapsulation organic layer OL.

In the exemplary embodiment of the invention, the encapsulation organic layer OL may be deposited using the open mask MSK shown in FIG. 7E. In this case, the edge of the first encapsulation inorganic layer IOL1 may be aligned with the edge of the encapsulation organic layer OL.

One signal pad DP-PD may be electrically connected to the pad part CSL-P of the control signal line CSL through a first contact hole CNT1 defined through the second intermediate inorganic layer 20, the intermediate organic layer 30, and the second encapsulation inorganic layer IOL2. The other signal pad DP-PD may be electrically connected to the pad parts DL-P of the data lines DL through a second contact hole CNT2 defined through the intermediate organic layer 30 and the second encapsulation inorganic layer IOL2.

As shown in FIGS. 8F and 8G, the first encapsulation inorganic layer IOL1 entirely overlaps the display area DP-DA and the non-display area DP-NDA, and the second encapsulation inorganic layer IOL2 does not overlap the pad area NDA-PD. The first encapsulation inorganic layer IOL1 may be deposited without using the mask, and the second encapsulation inorganic layer IOL2 may be deposited using the open mask MSK.

The encapsulation organic layer OL is disposed between the first encapsulation inorganic layer IOL1 and the second encapsulation inorganic layer IOL2. The encapsulation organic layer OL may not overlap the pad area NDA-PD. An edge of the encapsulation layer OL may be positioned inside an edge of the second encapsulation inorganic layer IOL2. The second encapsulation inorganic layer IOL2 may cover the edge of the encapsulation organic layer OL.

In the exemplary embodiment of the invention, the encapsulation organic layer OL and the second encapsulation inorganic layer IOL2 may be deposited using the same open mask MSK. In this case, the edge of the second encapsulation inorganic layer IOL2 may be aligned with the edge of the encapsulation organic layer OL.

The first encapsulation inorganic layer IOL1 may contact the intermediate organic layer 30 in the pad area NDA-PD.

One signal pad DP-PD may be electrically connected to the pad part CSL-P of the control signal line CSL through a first contact hole CNT1 defined through the second intermediate inorganic layer 20, the intermediate organic layer 30, and the first encapsulation inorganic layer IOU. The other signal pad DP-PD may be electrically connected to the pad parts DL-P of the data lines DL through a second contact hole CNT2 defined through the intermediate organic layer 30 and the first encapsulation inorganic layer IOL1.

The display panels DP described with reference to FIGS. 8A to 8G commonly include at least one encapsulation inorganic layer entirely disposed on the display panel. In the cross-section of the pad area NDA-PD, the encapsulation inorganic layer entirely overlapped with the display panel is disposed between the pad parts CSL-P and DL-P and the signal pads DP-PD.

The entirely-disposed encapsulation inorganic layer has the uniform thickness and the dense film density. Accordingly, the encapsulation inorganic layer has a large coupling force with respect to the organic layer disposed therebelow. Thus, the moisture may be prevented from infiltrating into between the encapsulation inorganic layer and the organic layer disposed under the encapsulation inorganic layer, and the encapsulation inorganic layer may be prevented from being separated.

In the display panel DP shown in FIGS. 8A to 8C, the first encapsulation inorganic layer IOL1 and the second encapsulation inorganic layer IOL2 may be prevented from being separated from the intermediate organic layer 30 and the encapsulation organic layer OL, respectively. In the display panel DP shown in FIGS. 8D and 8E, the second encapsulation inorganic layer IOL2 may be prevented from being separated from the intermediate organic layer 30 and the encapsulation organic layer OL. In the display panel DP shown in FIGS. 8F and 8G, the first encapsulation inorganic layer IOL1 may be prevented from being separated from the intermediate organic layer 30.

Although not shown separately, each of the first chip pads TC-PD1 and the second chip pads TC-PD2 shown in FIG. 4B may have a cross-sectional structure corresponding to a cross-sectional structure of one of the pad parts CSL-P and DL-P described with reference to FIGS. 8A to 8G. The first chip pads TC-PD1 and the second chip pads TC-PD2 may be disposed in the same layer as the signal pads DP-PD and each of the first chip pads TC-PD1 and the second chip pads TC-PD2 may be connected to the pad part overlapped therewith through the contact hole.

Figure 9:
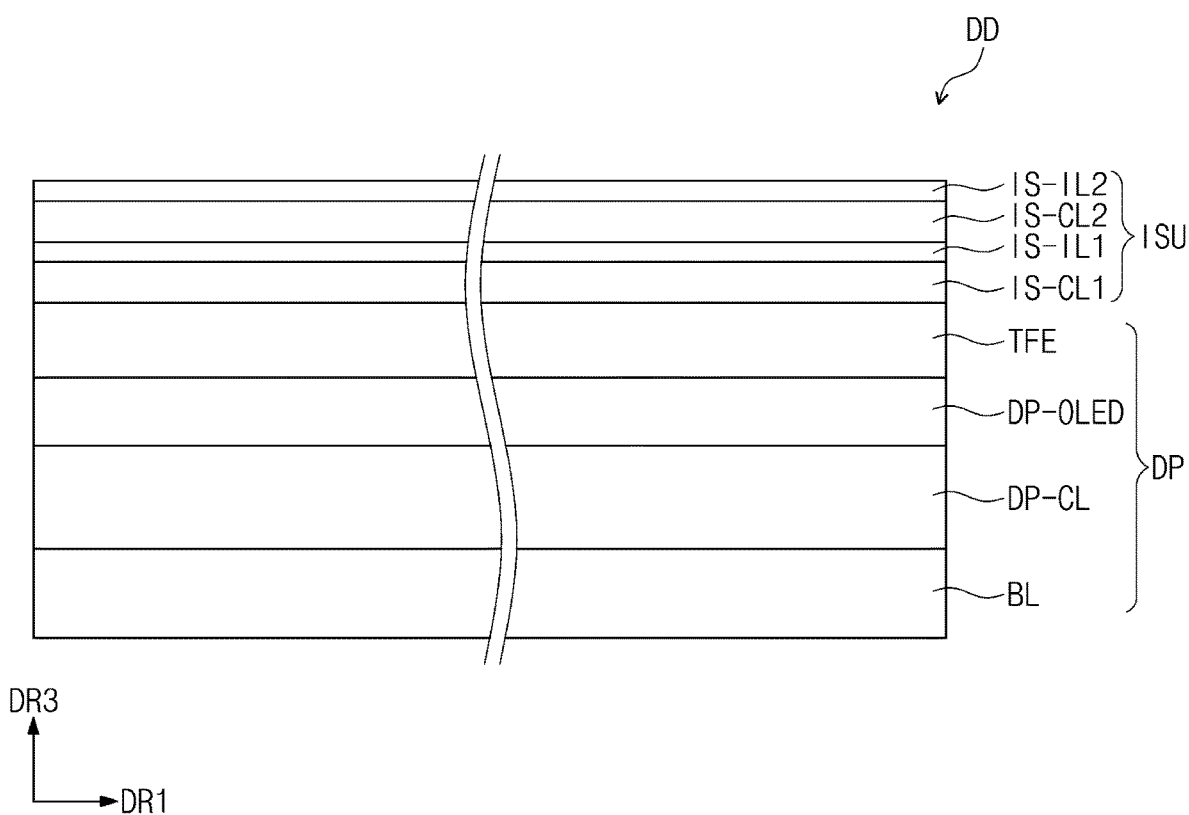
FIG. 9 is a cross-sectional view showing an exemplary embodiment of a display device according to the invention.
Figure 10A:
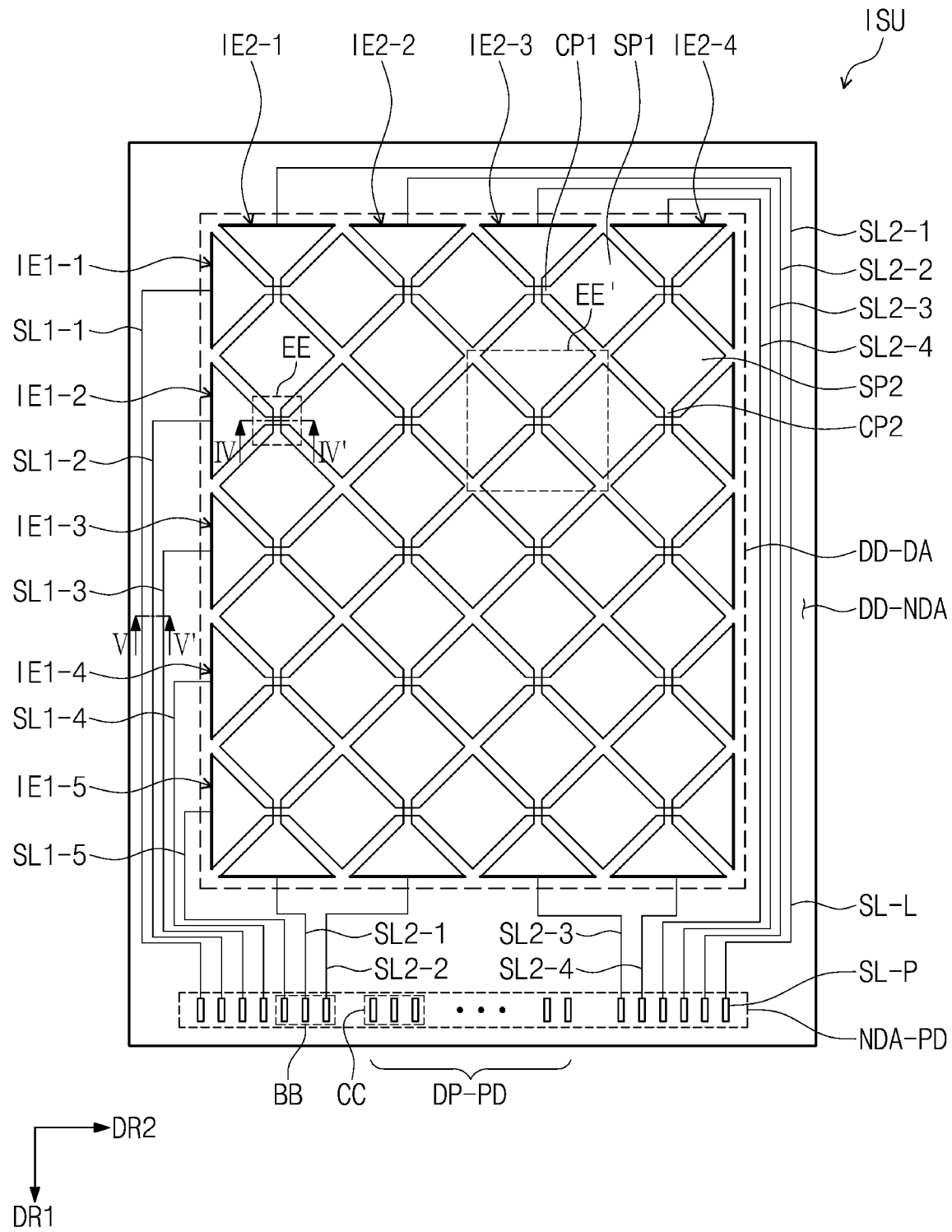
FIGS. 10A and 10B are plan views showing an exemplary embodiment of an input sensing unit according to the invention.
Figure 10B:
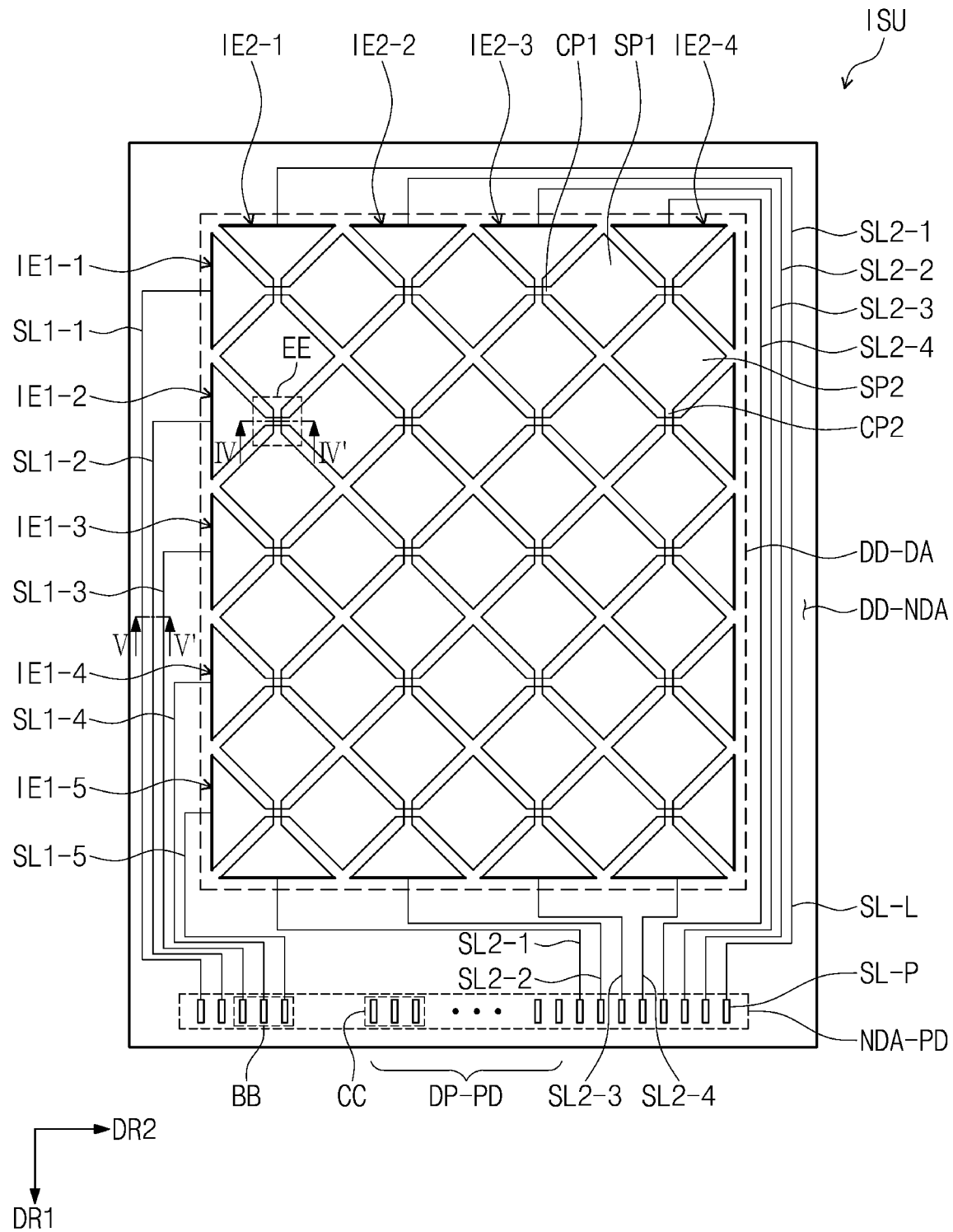
Figure 11A:
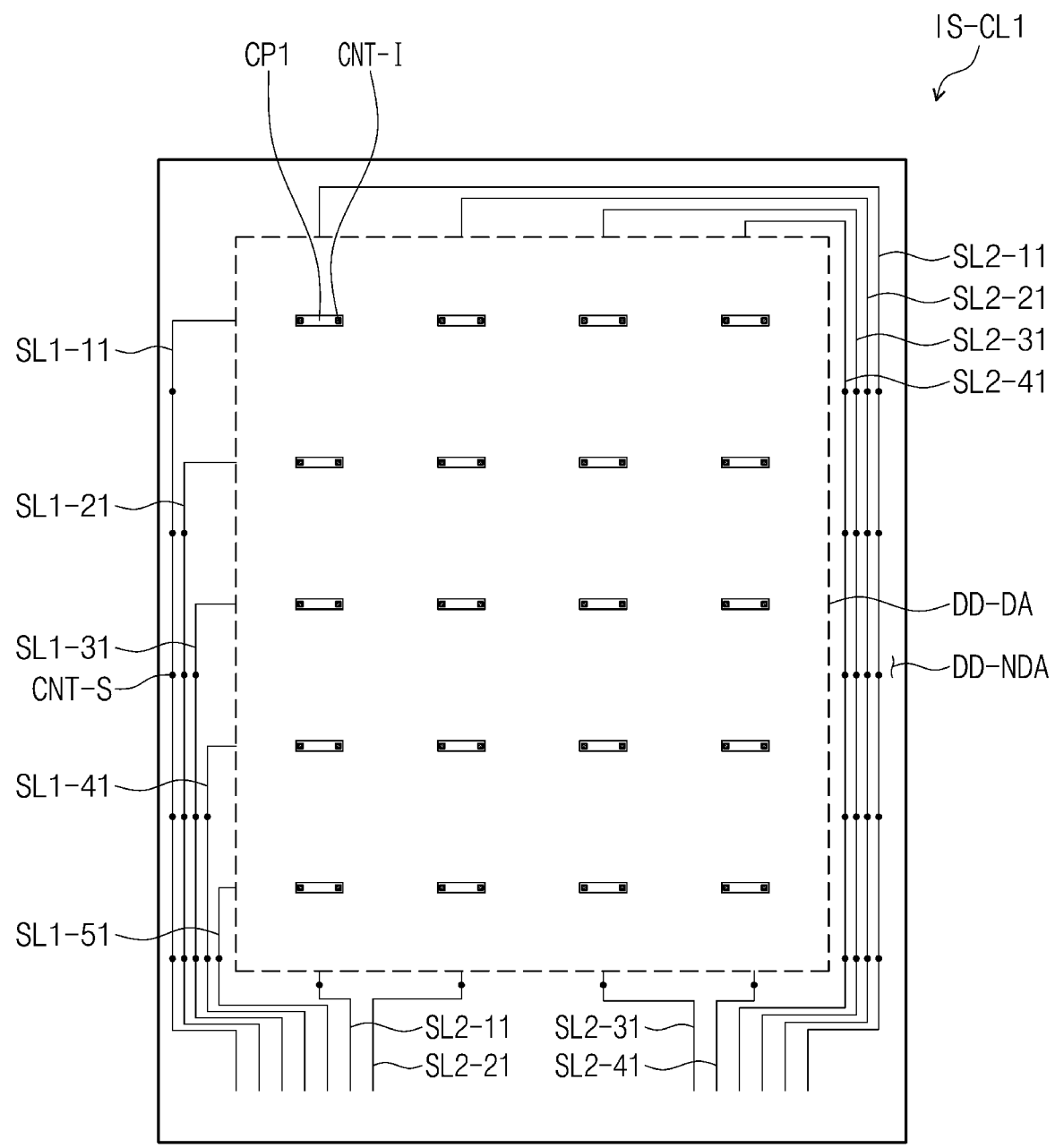
FIG. 11A is a plan view showing an exemplary embodiment of a first conductive layer of an input sensing unit according to the invention.
Figure 11B:
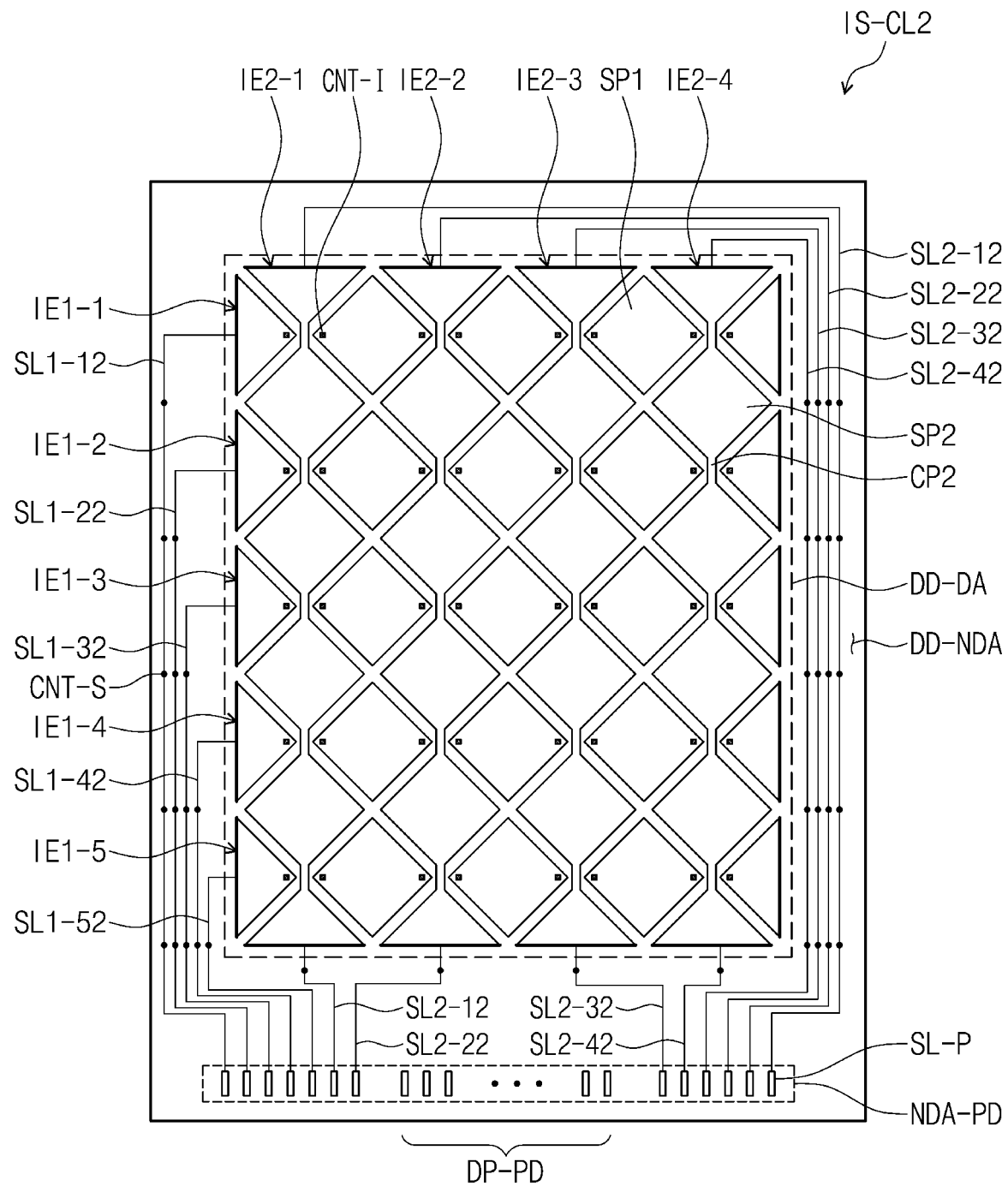
FIG. 11B is a plan view showing an exemplary embodiment of a second conductive layer of an input sensing unit according to the invention.
Figure 11C:
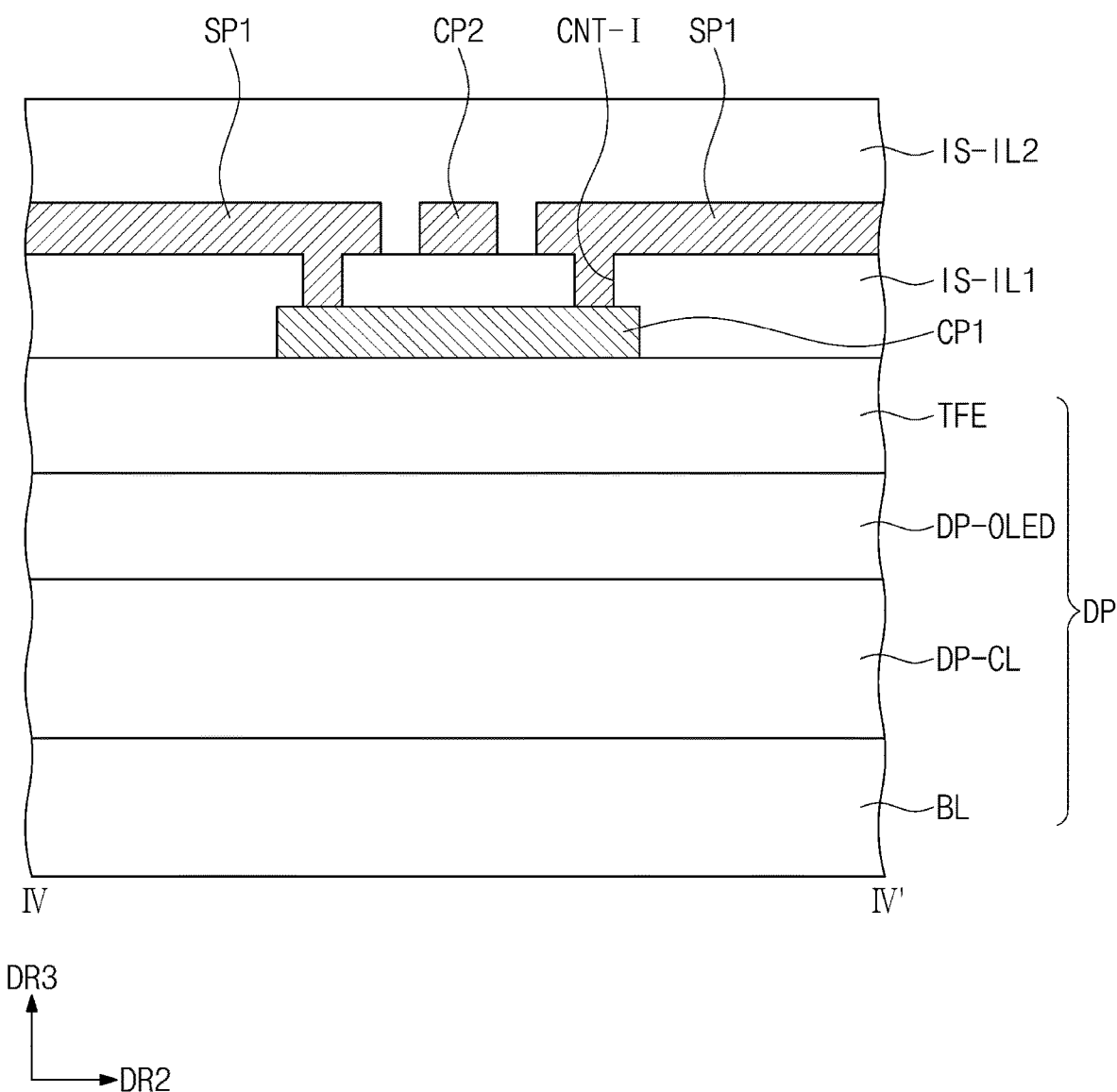
FIG. 11C is a cross-sectional view taken along line IV-IV' of FIG. 10A.
Figure 11D:
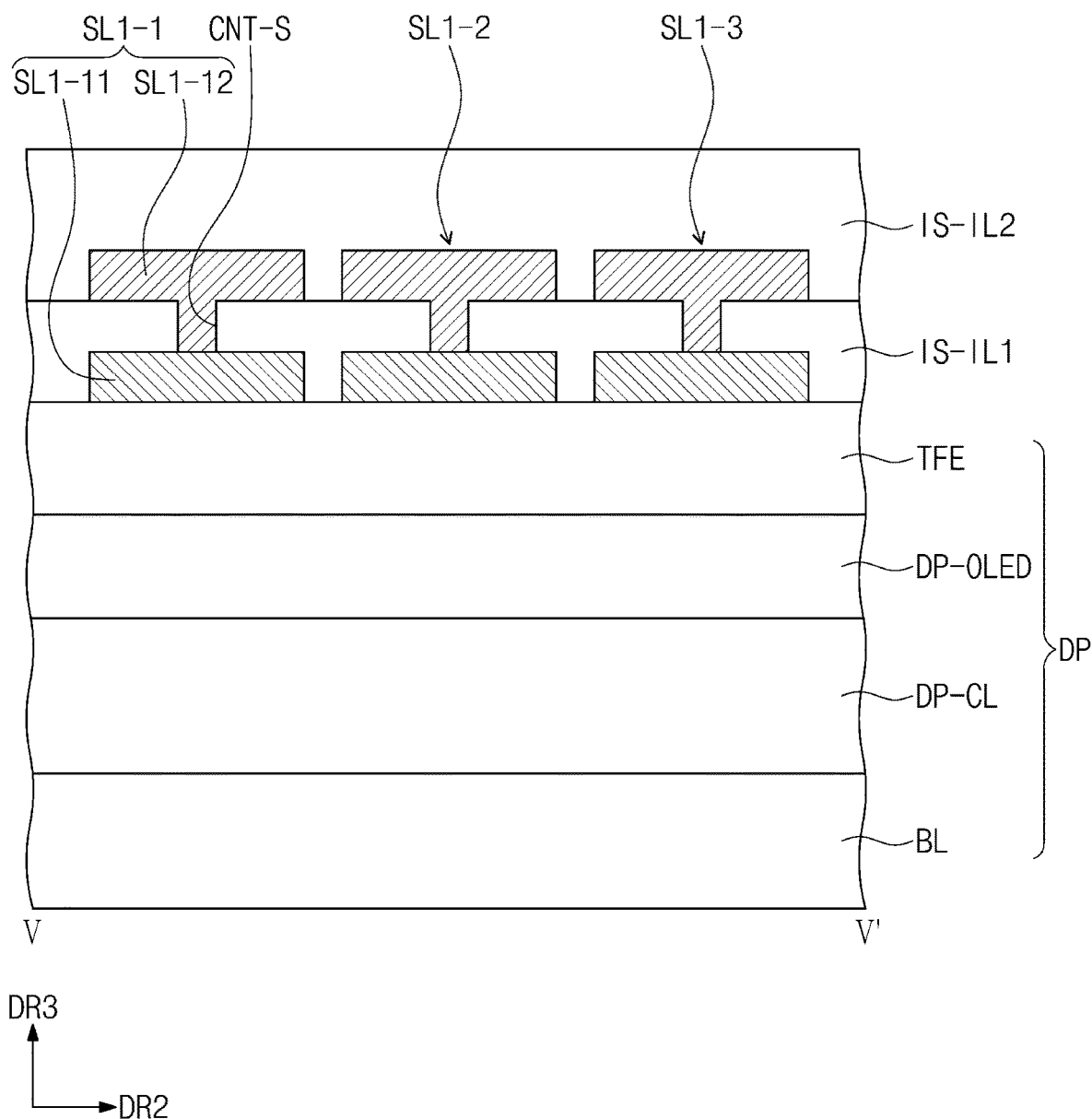
FIGS. 11D and 11E are cross-sectional views taken along line V-V' of FIG. 10A.
Figure 11E:
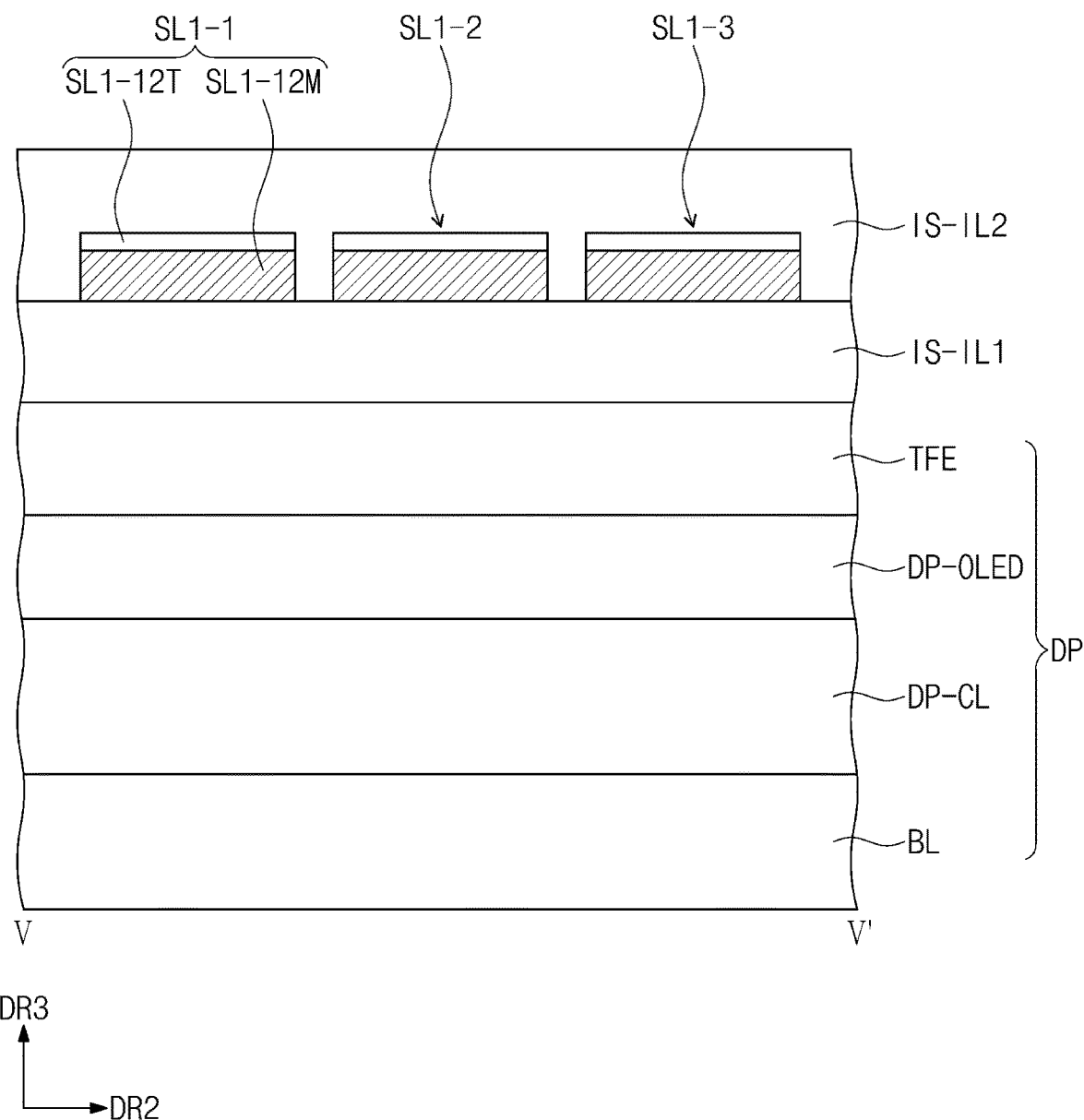

FIG. 9 is a cross-sectional view showing a display device DD according to an exemplary embodiment of the invention. FIGS. 10A and 10B are plan views showing an input sensing unit ISU according to an exemplary embodiment of the invention. FIG. 11A is a plan view showing a first conductive layer IS-CL1 of an input sensing unit ISU according to an exemplary embodiment of the invention. FIG. 11B is a plan view showing a second conductive layer IS-CL2 of an input sensing unit ISU according to an exemplary embodiment of the invention. FIG. 11C is a cross-sectional view taken along line IV-IV' of FIG. 10A. FIGS. 11D and 11E are cross-sectional views taken along line V-V' of FIG. 10A.

In FIG. 9, the display panel DP is shown simply to illustrate a stacking relationship of the input sensing unit ISU. An anti-reflection unit and a window unit, which are disposed on the input sensing unit ISU, are not shown.

In the illustrated exemplary embodiment, the input sensing unit ISU having the "layer shape" described with reference to FIG. 2A will be described as a representative example. The input sensing unit ISU having the "layer shape" is directly disposed on the base surface provided by the display panel DP, and the base layer is omitted different from the input sensing unit ISU having the "panel shape". Accordingly, the thickness of the display module DM may be reduced. In the illustrated exemplary embodiment, the base surface may be an upper surface of the thin film encapsulation layer TFE.

The input sensing unit ISU may have the multi-layer structure regardless of the shape (panel or layer) thereof. The input sensing unit ISU includes a sensing electrode, a signal line connected to the sensing electrode, and at least one insulating layer. In an exemplary embodiment, the input sensing unit ISU may sense an external input by an electrostatic capacitive method, for example. However, the operation of the input sensing unit ISU should not be limited to a specific method, and the input sensing unit ISU according to the exemplary embodiment of the invention may sense the external input by an electromagnetic induction method or a pressure-sensitive method.

As shown in FIG. 9, the input sensing unit ISU according to the exemplary embodiment of the invention may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layer structure or a multi-layer structure of layers stacked in the third direction DR3. The conductive layer having the single-layer structure may include a metal layer or a transparent conductive layer. In an exemplary embodiment, the metal layer may include molybdenum, silver, titanium, copper, aluminum, and alloys thereof, for example. In an exemplary embodiment, the transparent conductive layer may include a transparent conductive oxide material, such as indium tin oxide ("ITO"), indium zinc oxide ("IZO"), zinc oxide (ZnO), indium tin zinc oxide ("ITZO"), etc., for example. In an exemplary embodiment, the transparent conductive layer may include a conductive polymer such as PEDOT, a metal nanowire, a graphene, and the like, for example.

The conductive layer having the multi-layer structure may include multi-layered metal layers. The multi-layered metal layers may include, for example, a three-layer structure of titanium/aluminum/titanium. The conductive layer having the multi-layer structure may include at least one metal layer and at least one transparent conductive layer.

Each of the first conductive layer IS-CL1 and the second conductive layer IS-CL2 includes a plurality of patterns. Hereinafter, the first conductive layer IS-CL1 includes first conductive patterns, and the second conductive layer IS-CL2 includes second conductive patterns. Each of the first conductive patterns and the second conductive patterns may include sensing electrodes and signal lines.

A stack structure and a material of the sensing electrodes may be determined by taking into account a sensitivity. In general, a resistive-capacitive ("RC") delay affects the sensitivity, but an RC value is reduced in the sensing electrodes including the metal layer since the sensing electrodes including the metal layer have a relatively smaller resistance compared to the sensing electrodes including the transparent conductive layer. Accordingly, a time desired to charge a capacitor defined between the sensing electrodes is shortened. The sensing electrodes including the transparent conductive layer may not be perceived by a user and may increase an input area, thereby increasing a capacitance when compared to the sensing electrodes including the metal layer.

The sensing electrodes including the metal layer may have a mesh shape described later to prevent the sensing electrodes from being perceived by the user. The thickness of the thin film encapsulation layer TFE may be adjusted such that a noise generated by components of the display element layer DP-OLED does not exert influence on the input sensing unit ISU. Each of the first and second insulating layers IS-IL1 and IS-IL2 may have a single-layer structure or a multi-layer structure. Each of the first and second insulating layers IS-IL1 and IS-IL2 may include an inorganic material, an organic material, or a composite material.

At least one of the first insulating layer IS-IL1 and the second insulating layer IS-IL2 may include an inorganic layer. In an exemplary embodiment, the inorganic layer may include at least one of aluminum oxide, titanium oxide, silicon oxide, silicon oxynitride, zirconium oxide, and hafnium oxide, for example.

At least one of the first insulating layer IS-IL1 and the second insulating layer IS-IL2 may include an organic layer. In an exemplary embodiment, the organic layer may include at least one of an acryl-base resin, a methacryl-based resin, a polyisoprene, a vinyl-based resin, an epoxy-based resin, a urethane-based resin, a cellulose-based resin, a siloxane-based resin, a polyimide-based resin, a polyamide-based resin, and a perlyene-based resin, for example.

As shown in FIG. 10A, the input sensing unit ISU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. Although not shown in the drawings, the input sensing unit ISU may further include optical dummy electrodes disposed in boundary areas between the first sensing electrodes IE1-1 to IE1-5 and the second sensing electrodes IE2-1 to IE2-4.

Since the thin film encapsulation layer TFE shown in FIG. 9 includes at least one encapsulation inorganic layer described with reference to FIGS. 7H and 7I, the base surface may be more flat. Accordingly, although the components of the input sensing unit ISU are provided by a continuous process, a defective rate of the input sensing unit ISU may be reduced. Since the first signal lines SL1-1 to SL1-5 and the second signal lines SL2-1 to SL2-4 are arranged in the non-display area DD-NDA in which a step difference is reduced, the thin film encapsulation layer TFE may have the uniform thickness. Therefore, a stress applied to an area overlapped with an area in which the step difference between the first signal lines SL1-1 to SL1-5 and the second signal lines SL2-1 to SL2-4 occurs may be reduced.

The first sensing electrodes IE1-1 to IE1-5 and the second sensing electrodes IE2-1 to IE2-4 cross each other. The first sensing electrodes IE1-1 to IE1-5 are arranged in the first direction DR1, and each of the first sensing electrodes IE1-1 to IE1-5 has a shape extending in the second direction DR2. The first sensing electrodes IE1-1 to IE1-5 and the second sensing electrodes IE2-1 to IE2-4 may sense the external input by a mutual capacitance method and/or a self-capacitance method. As another way, the first sensing electrodes IE1-1 to IE1-5 and the second sensing electrodes IE2-1 to IE2-4 may calculate a coordinate of the external input by the mutual capacitance method and re-calculate the coordinate of the external input by the self-capacitance method.

Each of the first sensing electrodes IE1-1 to IE1-5 includes first sensor parts SP1 and first connection parts CP1. Each of the second sensing electrodes IE2-1 to IE2-4 includes second sensor parts SP2 and second connection parts CP2. Among the first sensor parts SP1, two first sensor parts disposed at both ends of the first electrode may have a size (e.g., ½) smaller than that of the first sensor part disposed at a center portion. Among the second sensor parts SP2, two second sensor parts disposed at both ends of the second electrode may have a size (e.g., ½) smaller than that of the second sensor part disposed at a center portion.

FIG. 10A shows first sensing electrodes IE1-1 to IE1-5 and second sensing electrodes IE2-1 to IE2-4, but a shape of the first sensing electrodes IE1-1 to IE1-5 and the second sensing electrodes IE2-1 to IE2-4 should not be limited to a specific shape. In another exemplary embodiment of the invention, the first sensing electrodes IE1-1 to IE1-5 and the second sensing electrodes IE2-1 to IE2-4 may have the shape (e.g., a bar shape) in which the sensor part and the connection part are not distinguished from each other, for example. In FIG. 10A, the first sensor parts SP1 and the second parts SP2 have a lozenge shape, but the shape of the first sensor parts SP1 and the second parts SP2 should not be limited to the lozenge shape. As another example, the first sensor parts SP1 and the second parts SP2 may have a polygonal shape other than the lozenge shape, for example.

The first sensor parts SP1 are arranged along the second direction DR2 in one first sensing electrode, the second sensor parts SP2 are arranged along the first direction DR1 in one second sensing electrode. Each of the first connection parts CP1 connects the first sensor parts SP1 adjacent to each other, and each of the second connection parts CP2 connects the second sensor parts SP2 adjacent to each other.

The first signal lines SL1-1 to SL1-5 are respectively connected to one ends of the first sensing electrodes IE1-1 to IE1-5. The second signal lines SL2-1 to SL2-4 are connected to both ends of the second sensing electrodes IE2-1 to IE2-4. In the exemplary embodiment of the invention, the first signal lines SL1-1 to SL1-5 may be connected to both ends of the first sensing electrodes IE1-1 to IE1-5. In addition, the second signal lines SL2-1 to SL2-4 may be connected to only one ends of the second sensing electrodes IE2-1 to IE2-4, respectively.

According to the illustrated exemplary embodiment, the sensitivity may be improved compared to that of the input sensing unit ISU in which the second signal lines SL2-1 to SL2-4 are connected to only one ends of the second sensing electrodes IE2-1 to IE2-4, respectively. Since the second sensing electrodes IE2-1 to IE2-4 are longer than the first sensing electrodes IE1-1 to IE1-5, a voltage drop of a sensing signal (or a transmission signal) occurs in the first sensing electrodes IE1-1 to IE1-5, and thus the sensitivity may be lowered. According to the illustrated exemplary embodiment, since the sensing signal (or the transmission signal) is provided through the second signal lines SL2-1 to SL2-4 connected to the both ends of the second sensing electrodes IE2-1 to IE2-4, the voltage drop of the sensing signal (or the transmission signal) may be prevented from occurring, and the sensitivity may be prevented from being lowered.

The first signal lines SL1-1 to SL1-5 and the second signal lines SL2-1 to SL2-4 may include a line part SL-L and a pad part SL-P. The pad part SL-P may be aligned with the pad area NDA-PD. The pad part SL-P may overlap the dummy pads IS-DPD shown in FIG. 4A.

The input sensing unit ISU may include signal pads DP-PD. The signal pads DP-PD may be aligned with the pad area NDA-PD. The signal pads DP-PD may overlap the pad parts CSL-P and DL-P shown in FIGS. 8A to 8G.

The first signal lines SL1-1 to SL1-5 and the second signal lines SL2-1 to SL2-4 according to the exemplary embodiment of the invention may be replaced with a circuit substrate separately manufactured.

As shown in FIG. 10B, a pad part SL-P of first signal lines SL1-1 to SL1-5 and a pad part SL-P of second signal lines SL2-1 to SL2-4 may be disposed in different areas from each other such that signal pads DP-PD are disposed between the pad part SL-P of first signal lines SL1-1 to SL1-5 and the pad part SL-P of second signal lines SL2-1 to SL2-4. Since two groups of the pad parts SL-P are disposed to be spaced apart from each other, the pad part SL-P of the first signal lines SL1-1 to SL1-5 and the pad part SL-P of the second signal lines SL2-1 to SL2-4 may be easily connected to the circuit substrate. In this case, pads of the circuit substrate, to which the pad part SL-P of the first signal lines SL1-1 to SL1-5 and the pad part SL-P of the second signal lines SL2-1 to SL2-4 are connected, are grouped into two groups that are spaced apart from each other, and thus a short between the pads of the circuit substrate is reduced.

In the exemplary embodiment of the invention, positions of the first signal lines SL1-1 to SL1-5 and the second signal lines SL2-1 to SL2-4 may be changed with respect to each other. Different from FIG. 10A, the first signal lines SL1-1 to SL1-5 may be disposed at a left side of the input sensing unit ISU, and the second signal lines SL2-1 to SL2-4 may be disposed at a right side of the input sensing unit ISU.

Referring to FIG. 11A, a first conductive layer IS-CL1 includes first connection parts CP1. In addition, the first conductive layer IS-CL1 may include first line parts SL1-11 to SL1-51 of first signal lines SL1-1 to SL1-5 (refer to FIGS. 10A and 10B) and first line parts SL2-11 to SL2-41 of second signal lines SL2-1 to SL2-4 (refer to FIGS. 10A and 10B).

The first connection parts CP1, the first line parts SL1-11 to SL1-51 of the first signal lines SL1-1 to SL1-5, and the first line parts SL2-11 to SL2-41 of the second signal lines SL2-1 to SL2-4 may be defined through the same process. The first connection parts CP1, the first line parts SL1-11 to SL1-51 of the first signal lines SL1-1 to SL1-5, and the first line parts SL2-11 to SL2-41 of the second signal lines SL2-1 to SL2-4 may include the same material and have the same stack structure. The first connection parts CP1 may be provided through different processes from those of the first line parts SL1-11 to SL1-51 of the first signal lines SL1-1 to SL1-5 and the first line parts SL2-11 to SL2-41 of the second signal lines SL2-1 to SL2-4. The first line parts SL1-11 to SL1-51 of the first signal lines SL1-1 to SL1-5 and the first line parts SL2-11 to SL2-41 of the second signal lines SL2-1 to SL2-4 may have the same stack structure, but the first connection parts CP1 may have a stack structure different from the first line parts SL1-11 to SL1-51 of the first signal lines SL1-1 to SL1-5 and the first line parts SL2-11 to SL2-41 of the second signal lines SL2-1 to SL2-4.

In the exemplary embodiment of the invention, the first conductive layer IS-CL1 may include second connection parts CP2 (refer to FIG. 10A). In this case, the first connection parts CP1 are provided from the first conductive layer IS-CL1. Accordingly, each of the first sensing electrodes IE1-1 to IE1-5 may be provided in a single body.

Although not shown in FIG. 11A, the first insulating layer IS-IL1 covers at least the first connection part CP1. In the illustrated exemplary embodiment, the first insulating layer IS-IL1 may entirely overlap the display area DD-DA. The first insulating layer IS-IL1 may further overlap at least a portion of the non-display area DD-NDA. The first insulating layer IS-IL1 may cover the first line parts SL1-11 to SL1-51 of the first signal lines SL1-1 to SL1-5 and the first line parts SL2-11 to SL2-41 of the second signal lines SL2-1 to SL2-4 in the non-display area DD-NDA.

In the illustrated exemplary embodiment, the first insulating layer IS-IL1 may overlap the display area DD-DA and the pad area NDA-PD. The first insulating layer IS-IL1 may entirely overlap the display area DD-DA and the non-display area DD-NDA. The first insulating layer IS-IL1 may be provided through the processes described with reference to FIGS. 7H and 7I.

First connection contact holes CNT-I that partially expose the first connection parts CP1 and second connection contact holes CNT-S that partially expose the first line parts SL1-11 to SL1-51 of the first signal lines SL1-1 to SL1-5 and the first line parts SL2-11 to SL2-41 of the second signal lines SL2-1 to SL2-4 may be defined through the first insulating layer IS-IL1.

As shown in FIG. 11B, a second conductive layer IS-CL2 includes first sensor parts SP1, second sensor parts SP2, and second connection parts CP2. Each of the second sensing electrodes IE2-1 to IE2-4 may be provided in a single body. The first sensor parts SP1 is spaced apart from the second sensing electrodes IE2-1 to IE2-4.

The second conductive layer IS-CL2 may include second line parts SL1-12 to SL1-52 of first signal lines SL1-1 to SL1-5 (refer to FIGS. 10A and 10B), pad parts SL-P of the first signal lines SL1-1 to SL1-5, second line parts SL2-12 to SL2-42 of second signal lines SL2-1 to SL2-4 (refer to FIGS. 10A and 10B), and pad parts SL-P of the second signal lines SL2-1 to SL2-4. The second conductive layer IS-CL2 may include signal pads DP-PD.

The first sensor parts SP1, the second sensor parts SP2, and the second connection parts CP2 may be provided through the same process. The first sensor parts SP1, the second sensor parts SP2, and the second connection parts CP2 may include the same material and have the same structure. The second line parts SL1-12 to SL1-52 of the first signal lines SL1-1 to SL1-5, the pad parts SL-P of the first signal lines SL1-1 to SL1-5, the second line parts SL2-12 to SL2-42 of the second signal lines SL2-1 to SL2-4, the pad parts SL-P of the second signal lines SL2-1 to SL2-4, and the signal pads DP-PD may be provided through the same process as or different process from the first sensor parts SP1, the second sensor parts SP2, and the second connection parts CP2.

Although not shown in FIG. 11B, the second insulating layer IS-IL2 may entirely overlap the display area DD-DA. The second insulating layer IS-IL2 may further overlap at least a portion of the non-display area DD-NDA. In the illustrated exemplary embodiment, the second insulating layer IS-IL2 may expose the pad area NDA-PD.

As shown in FIG. 11C, the first sensor parts SP1 are electrically connected to the first connection part CP1 through the first connection contact holes CNT-I. The first connection part CP1 may include a material having a lower resistance than that of the first sensor part SP1.

The first connection part CP1 crosses the second connection part CP2, and it is desirable to minimize a width, taken along a horizontal direction in FIG. 11C, of the first connection part CP1 when viewed in a plan view to reduce effects of the parasitic capacitance. The first connection part CP1 may include a material having a low resistance to improve the sensitivity and may include the same metal material as that of the first line parts SL1-11 to SL1-51 (refer to FIGS. 11A and 11B) of the first signal lines SL1-1 to SL1-5 (refer to FIGS. 10A and 10B).

In the illustrated exemplary embodiment, the first insulating layer IS-IL1 may be a polymer layer, e.g., an acrylic polymer layer. In an exemplary embodiment, the second insulating layer IS-IL2 may be a polymer layer, e.g., an acrylic polymer layer. The polymer layer may improve a flexibility of the display device DD even though the input sensing unit ISU is directly disposed on the display panel DP as shown in FIGS. 9 to 11D. In order to improve the flexibility, the first sensor parts SP1 and the second sensor parts SP2 may have a mesh shape and include a metal material. In an exemplary embodiment, the first sensor parts SP1 and the second sensor parts SP2 may be referred to as a metal mesh pattern, for example.

FIG. 11D shows three first signal lines SL1-1 to SL1-3 among the first signal lines SL1-1 to SL1-5 as a representative example. Referring to the first signal line SL1-1, the first line part SL1-11 and the second line part SL1-12 may be electrically connected to each other through the second connection contact holes CNT-S. Accordingly, a resistance of the first signal line SL1-1 may be reduced. For the same reason, the second signal lines SL2-1 to SL2-4 shown in FIGS. 11A and 11B include the first and second line parts.

In another exemplary embodiment of the invention, one of the first line part SL1-11 and the second line part SL1-12 may be omitted. One of the first line part and the second line part of the second signal lines SL2-1 to SL2-4 may be omitted. As shown in FIG. 11E, the first line part SL1-11 may be omitted. The first signal line SL1-1 includes only the second line part SL1-12 of FIG. 11D. The first signal line SL1-1 may include a metal layer SL1-12M and a transparent conductive layer SL1-12T directly disposed on the metal layer SL1-12M. In this case, the sensing electrodes (e.g., the first sensing electrodes SP1 of FIG. 11C) may include the metal layer, but not include the transparent conductive layer.

Figure 12A:
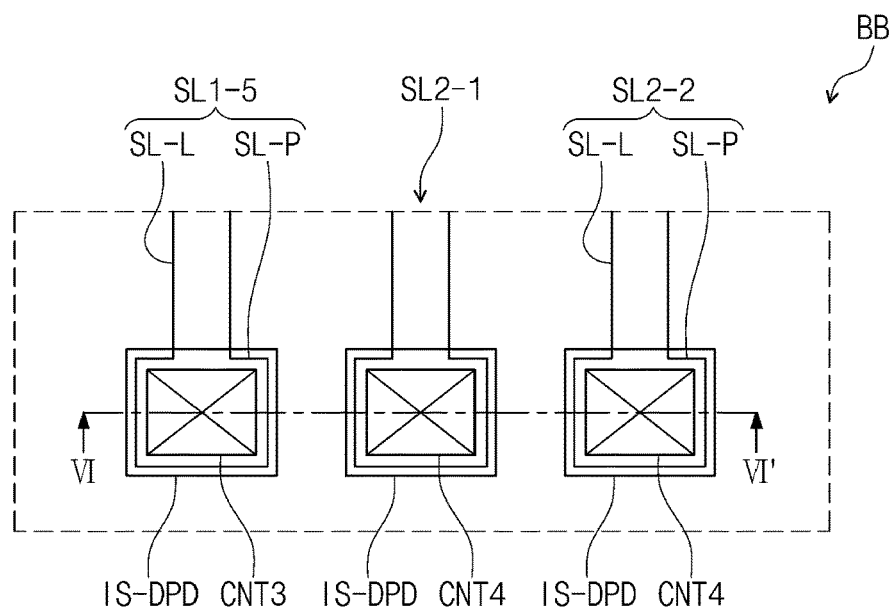
FIG. 12A is an enlarged plan view showing an exemplary embodiment of a portion of a pad area of a display device according to the invention.
Figure 12B:
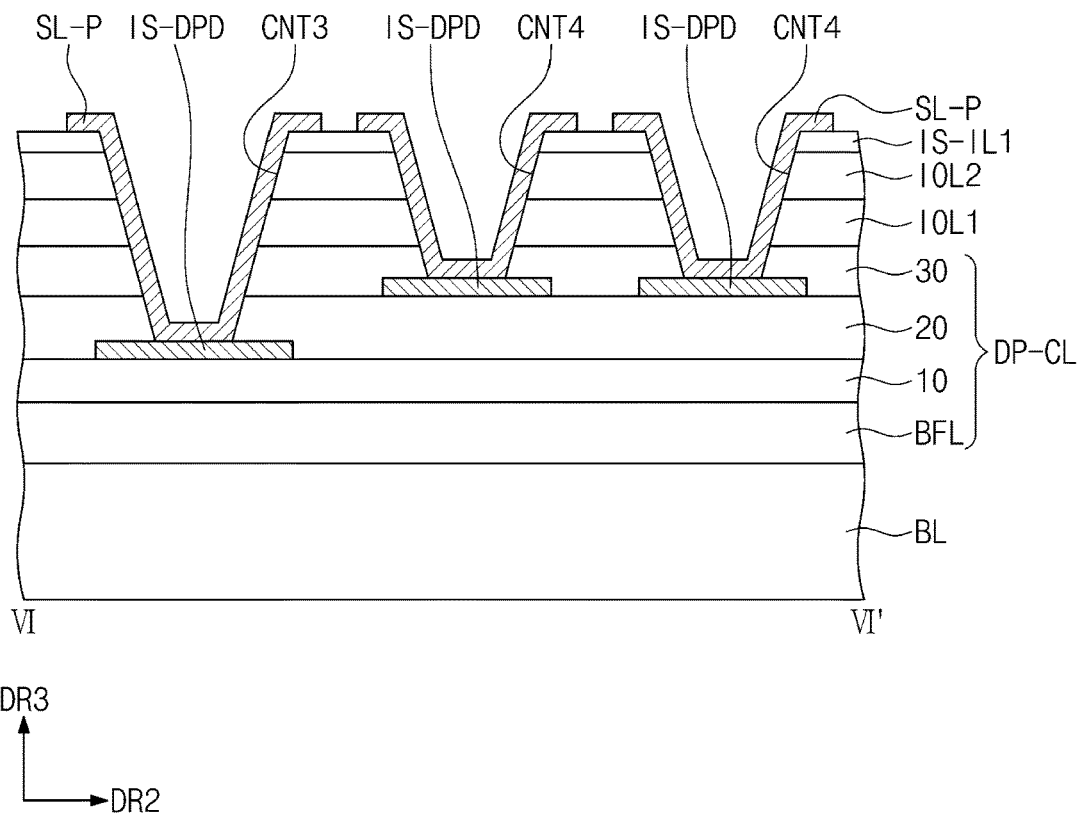
FIGS. 12B and 12C are cross-sectional views taken along line VI-VI' of FIG. 12A.
Figure 12C:
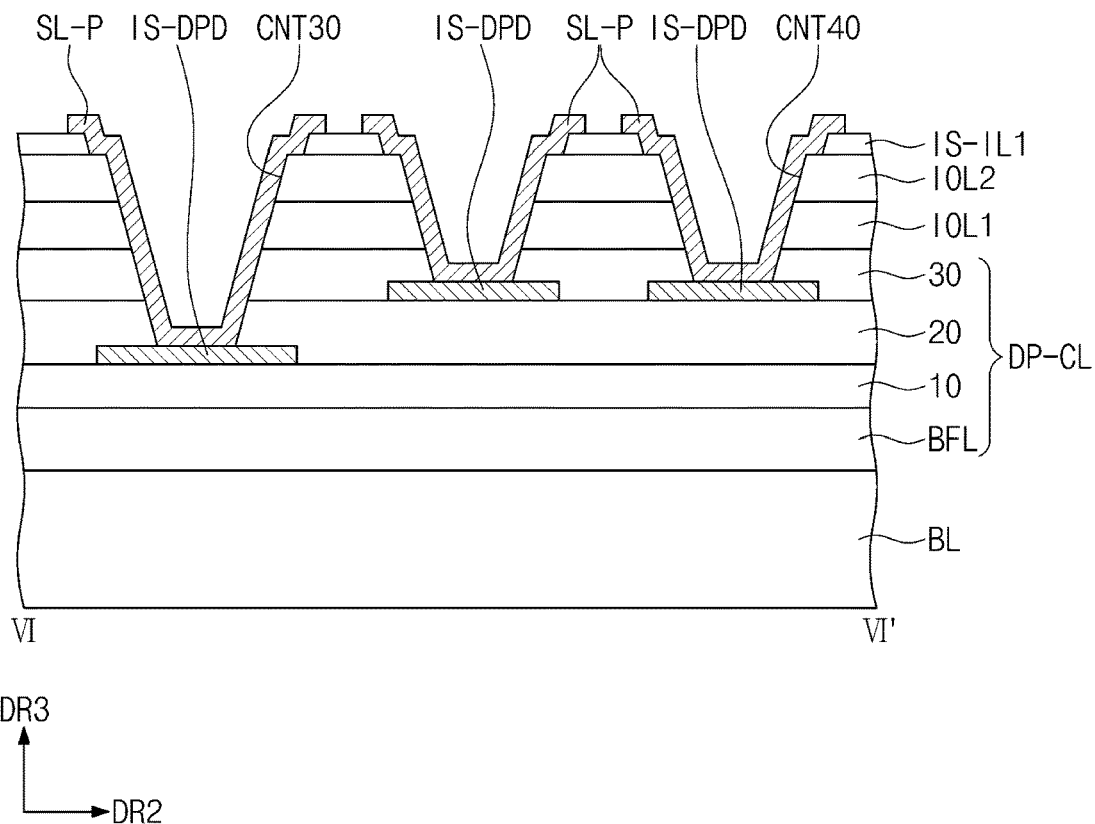
Figure 12D:
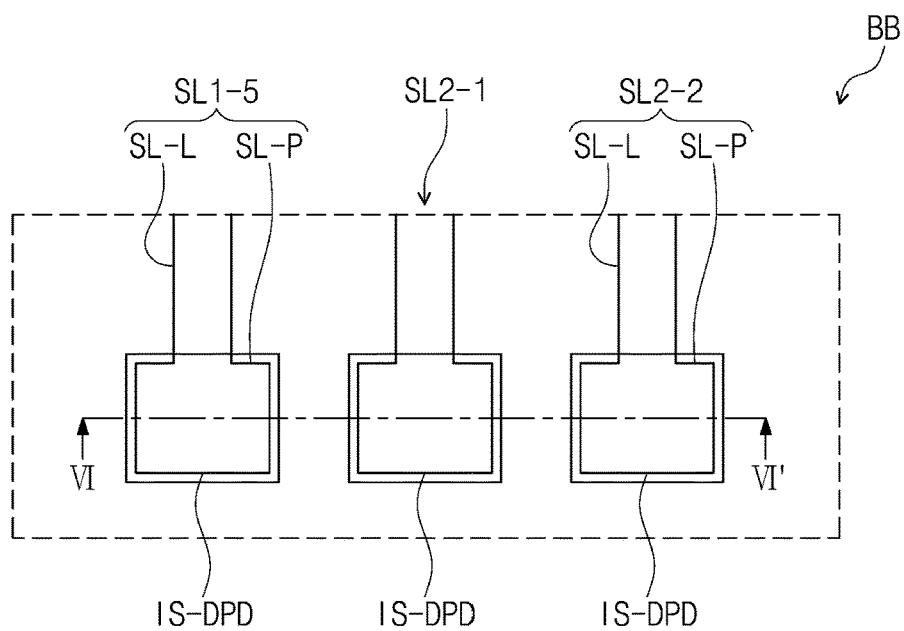
FIG. 12D is an enlarged plan view showing an exemplary embodiment of a portion of a pad area of a display device according to the invention.
Figure 12E:
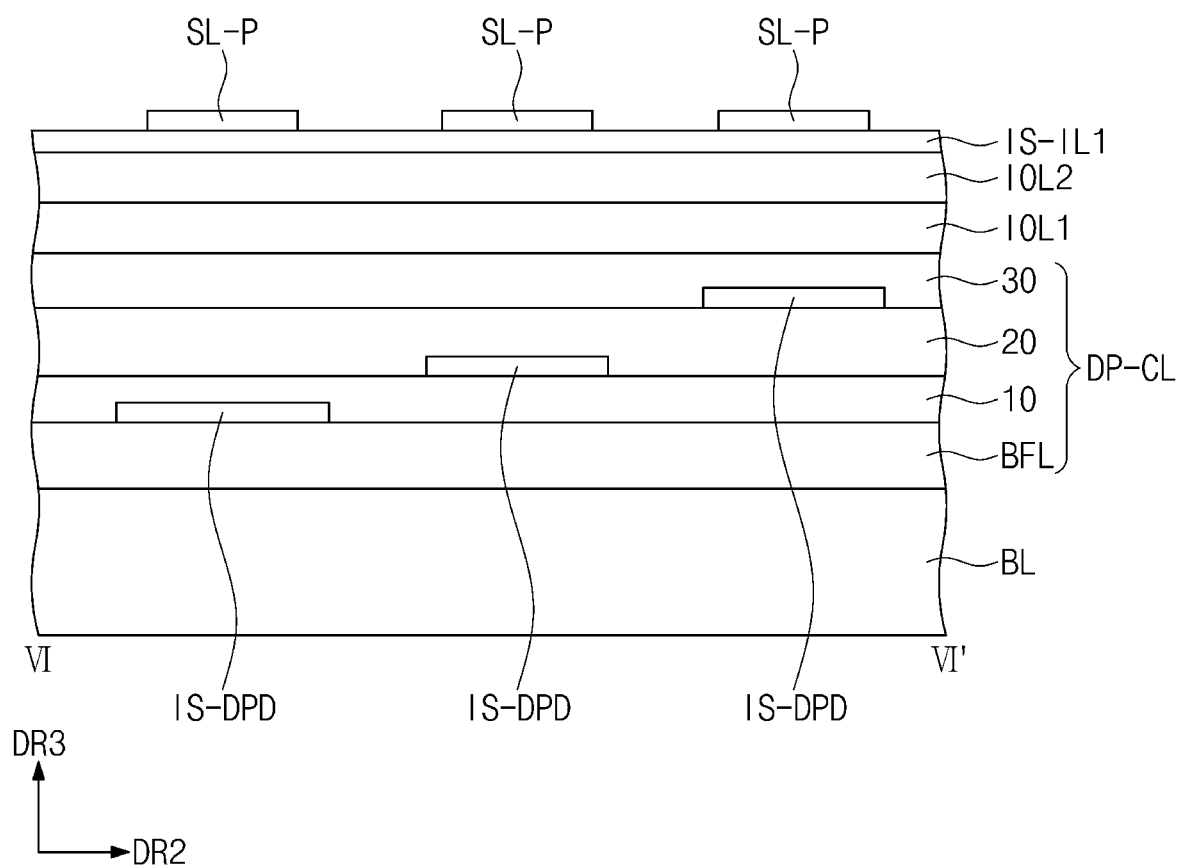
FIG. 12E is a cross-sectional view taken along line VI-VI' of FIG. 12D.
Figure 13A:
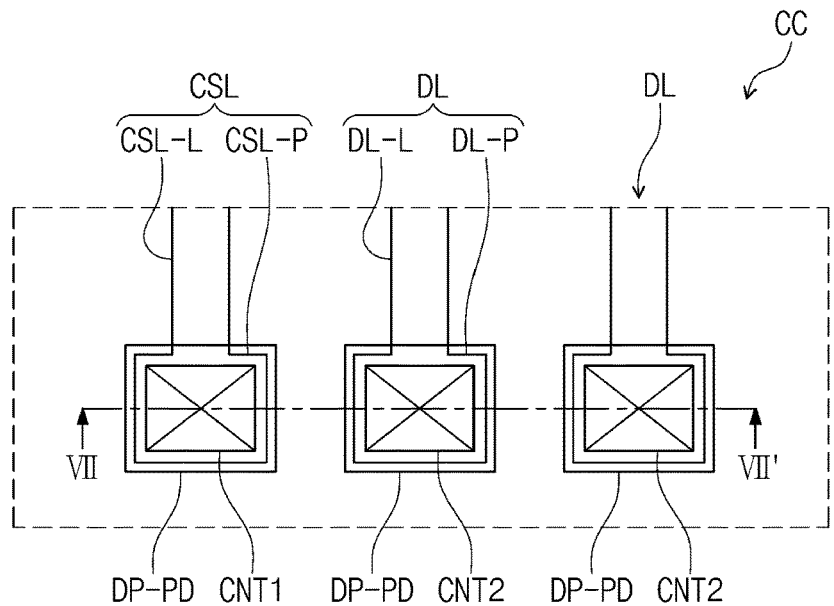
FIG. 13A is an enlarged plan view showing an exemplary embodiment of another portion of a pad area of a display device according to the invention.
Figure 13B:
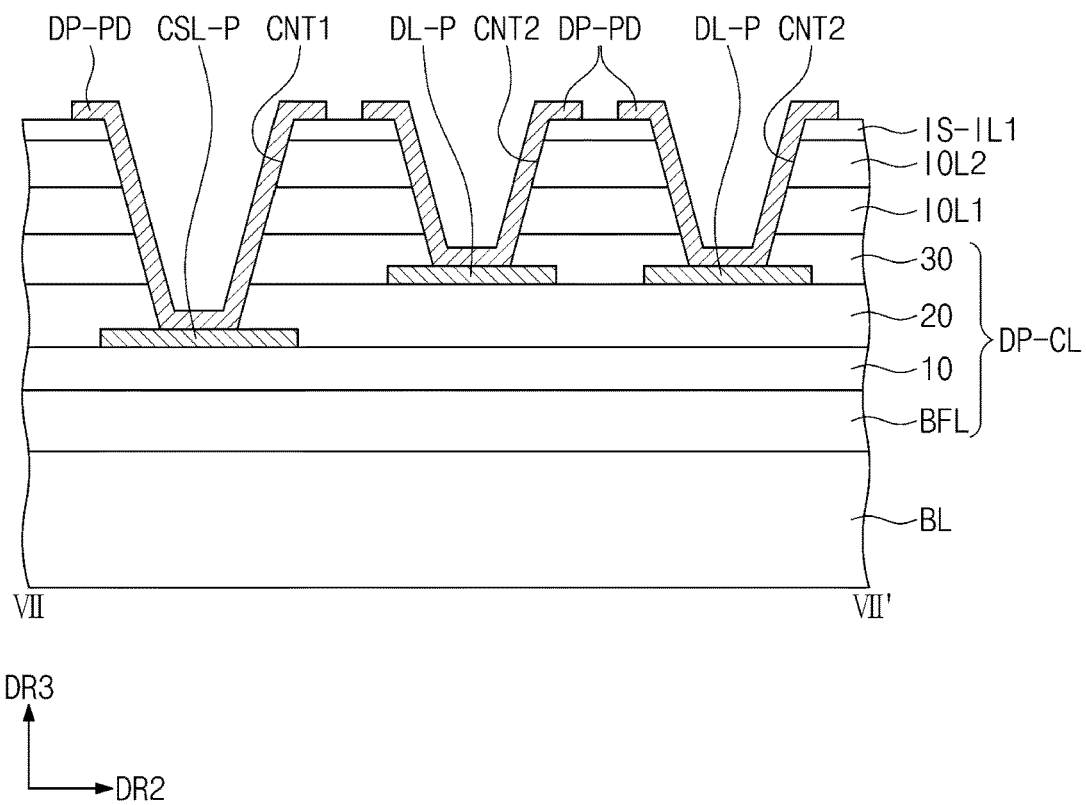
FIGS. 13B and 13C are cross-sectional views taken along line VII-VII' of FIG. 13B.
Figure 13C:
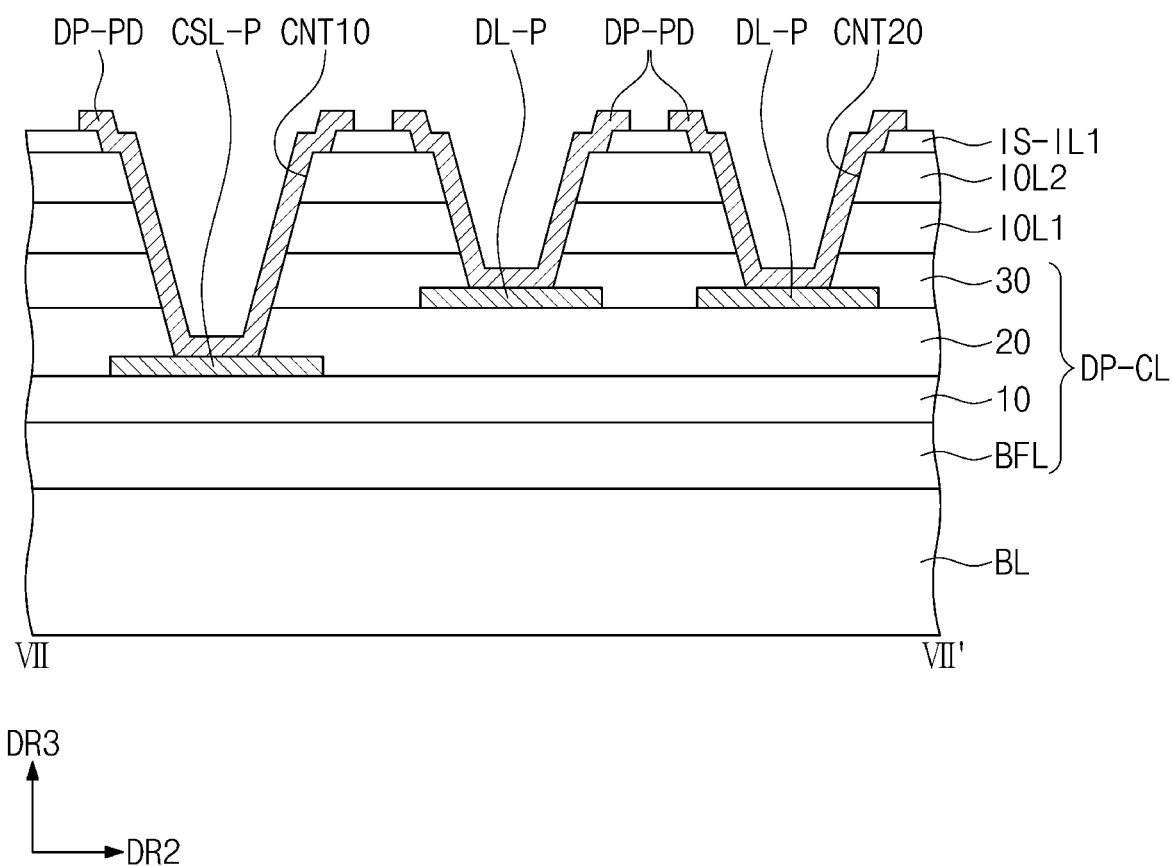

FIG. 12A is an enlarged plan view showing a portion of a pad area NDA-PD of a display device DD according to an exemplary embodiment of the invention. FIGS. 12B and 12C are cross-sectional views taken along line VI-VI' of FIG. 12A. FIG. 12D is an enlarged plan view showing a portion of a pad area NDA-PD of a display device DD according to an exemplary embodiment of the invention. FIG. 12E is a cross-sectional view taken along line VI-VI' of FIG. 12D. FIG. 13A is an enlarged plan view showing another portion of the pad area of a display device DD according to an exemplary embodiment of the invention. FIGS. 13B and 13C are cross-sectional views taken along line VII-VII' of FIG. 13A.

FIGS. 12A and 12D show an enlarged view of an area BB of FIG. 10A. FIG. 13A shows an enlarged view of an area CC of FIG. 10A. One signal line of the first signal lines SL1-1 to SL1-5 and two signal lines of the second signal lines SL2-1 to SL2-4 are shown as a representative example. One control signal line CSL and two data lines DL are shown as a representative example.

Referring to FIGS. 12A and 12B, the pad part SL-P of the first signal line SL1-1 and the pad parts SL-P of the second signal lines SL2-1 and SL2-2 are disposed on the first insulating layer IS-IL1. The pad part SL-P of the first signal line SL1-1 and the pad parts SL-P of the second signal lines SL2-1 and SL2-2 overlap corresponding dummy pads IS-DPD, respectively. Hereinafter, two dummy pads IS-DPD disposed on different layers from each other will be shown as a representative example, but the dummy pads IS-DPD may be disposed in the same layer according to other exemplary embodiments. The correspondence between the two dummy pads IS-DPD and the pads SL-P should not be limited to a specific example.

The pad part SL-P of the first signal line SL1-1 (refer to FIG. 10A) may be electrically connected to a corresponding dummy pad IS-DPD through a third contact hole CNT3 defined through the second intermediate inorganic layer 20, the intermediate organic layer 30, the first encapsulation inorganic layer IOL1, the second encapsulation inorganic layer IOL2, and the first insulating layer IS-IL1. Each of the pad parts SL-P of the second signal lines SL2-1 and SL2-2 may be electrically connected to a corresponding dummy pad IS-DPD through a fourth contact hole CNT4 defined through the intermediate organic layer 30, the first encapsulation inorganic layer IOL1, the second encapsulation inorganic layer IOL2, and the first insulating layer IS-IL1.

FIG. 12C shows a cross-section of a pad area NDA-PD according to another exemplary embodiment different from the pad area NDA-PD shown in FIG. 12B. Different from the third contact hole CNT3 and the fourth contact hole CNT4 shown in FIG. 12B and defined by a single process, a third contact hole CNT30 and a fourth contact hole CNT40 shown in FIG. 12C are defined by a plurality of processes. When viewed in a cross-section, an inner side surface of the third contact hole CNT30 has a stepped shape.

In an exemplary embodiment, the third contact hole CNT30 has a diameter that linearly increases as it goes upward from the second intermediate inorganic layer 20 to the intermediate organic layer 30, the first encapsulation inorganic layer IOL1, and the second encapsulation inorganic layer IOL2. The diameter of the third contact hole CNT30 non-linearly increases between the second encapsulation inorganic layer IOL2 and the first insulating layer IS-IL1. An inner side surface of the fourth contact hole CNT40 has a stepped shape when viewed in a cross-section.

FIGS. 12D and 12E show a pad area NDA-PD according to another exemplary embodiment different from the pad area NDA-PD shown in FIGS. 12A and 12B. According to the illustrated exemplary embodiment, the pad part SL-P of the first signal line SL1-1 (refer to FIG. 10A) and the pad parts SL-P of the second signal lines SL2-1 and SL2-2 overlap the corresponding dummy pads IS-DPD, respectively, but not electrically connected to the corresponding dummy pads IS-DPD. That is, the third contact hole CNT3 and the fourth contact hole CNT4 are omitted.

In the display devices DD described with reference to FIGS. 12A to 12E, at least one encapsulation inorganic layer is entirely disposed over the display panel DP. FIGS. 12A to 12E show the display device DD with reference to the thin film encapsulation layer TFE described with reference to FIG. 8A, but the display device DD according to the exemplary embodiment of the invention may include the thin film encapsulation layer TFE shown in FIGS. 8D and 8F. In a cross-section of the pad area NDA-PD, the entirely-overlapped encapsulation inorganic layer is disposed between the dummy pads IS-DPD and the pad parts SL-P. In addition, the first insulating layer IS-IL1 is disposed between the dummy pads IS-DPD and the pad parts SL-P.

As shown in FIGS. 13A and 13B, the signal pads DP-PD may overlap pad parts CSL-P and DL-P of a control signal line CSL and data lines DL. Different from the signal pads DP-PD described with reference to FIGS. 8A to 8G, the signal pads DP-PD according to the illustrated exemplary embodiment are disposed on the first insulating layer IS-IL1. In other words, the signal pads DP-PD may be disposed in the same layer as the signal lines SL1-1 to SL1-5 and SL2-1 to SL2-4 of the input sensing unit ISU. The signal pads DP-PD may be electrically connected to the pad parts CSL-P and DL-P through the first contact hole CNT1 and the second contact hole CNT2. The first contact hole CNT1 and the second contact hole CNT2 may respectively correspond to the third contact hole CNT3 and the fourth contact hole CNT4 shown in FIG. 12B.

As shown in FIG. 13C, an inner side surface of each of the first contact hole CNT10 and the second contact hole CNT20 may have a stepped shape when viewed in a cross-section. The first contact hole CNT10 and the second contact hole CNT20 may respectively correspond to the third contact hole CNT30 and the fourth contact hole CNT40 shown in FIG. 12C. In the exemplary embodiment, a step difference occurs between the first insulating layer IS-IL1 and the second encapsulation inorganic layer IOL2, but it should not be limited thereto or thereby.

In the display devices DD described with reference to FIGS. 13A to 13C, at least one encapsulation inorganic layer that is entirely disposed and the first insulating layer IS-IL1 are disposed between the pad part DL-P and the signal pad DP-PD when viewed in a cross-section of the pad area NDA-PD. The first contact holes CNT1 and CNT10 and the second contact holes CNT2 and CNT20 penetrate through the at least one encapsulation inorganic layer and the first insulating layer IS-IL1.

The signal pads DP-PD described with reference to FIGS. 13A to 13C are provided to electrically connect the signal line SGL and the circuit substrate pads PCB-P shown in FIG. 4A. Different from the above, the dummy pads IS-DPD described with reference to FIGS. 12A to 12E are provided to improve a bonding reliability between the pad parts SL-P of the input sensing unit ISU and the circuit substrate pads PCB-P. The pad area of the input sensing unit ISU may be provided to have a stack structure similar to that of the pad area of the display panel DP by using the dummy pads IS-DPD included in the circuit element layer DP-CL. Since the pad area NDA-PD of the display panel DP has a uniform stack structure, the bonding reliability between the display panel DP and the circuit substrate PCB is improved.

Although not shown separately, a cross-sectional structure of each of the first chip pads TC-PD1 and the second chip pads TC-PD2 shown in FIG. 4B may be the same as a cross-sectional structure of one of the pad parts CSL-P and DL-P described with reference to FIGS. 13A to 13C. The first chip pads TC-PD1 and the second chip pads TC-PD2 may be disposed in the same layer as the signal pads DP-PD and connected to pad parts, which respectively overlap the first chip pads TC-PD1 and the second chip pads TC-PD2, through contact holes.

FIGS. 14A to 14E are cross-sectional views showing a method of manufacturing a display device DD according to an exemplary embodiment of the invention. The cross-sections shown in FIGS. 14A to 14E correspond to the cross-sections of FIGS. 11C, 11D, 12B, and 13B, and FIGS. 14A to 14E show the manufacturing processes associated with the cross-sections of FIGS. 11C, 11D, 12B, and 13B.

Figure 14A:
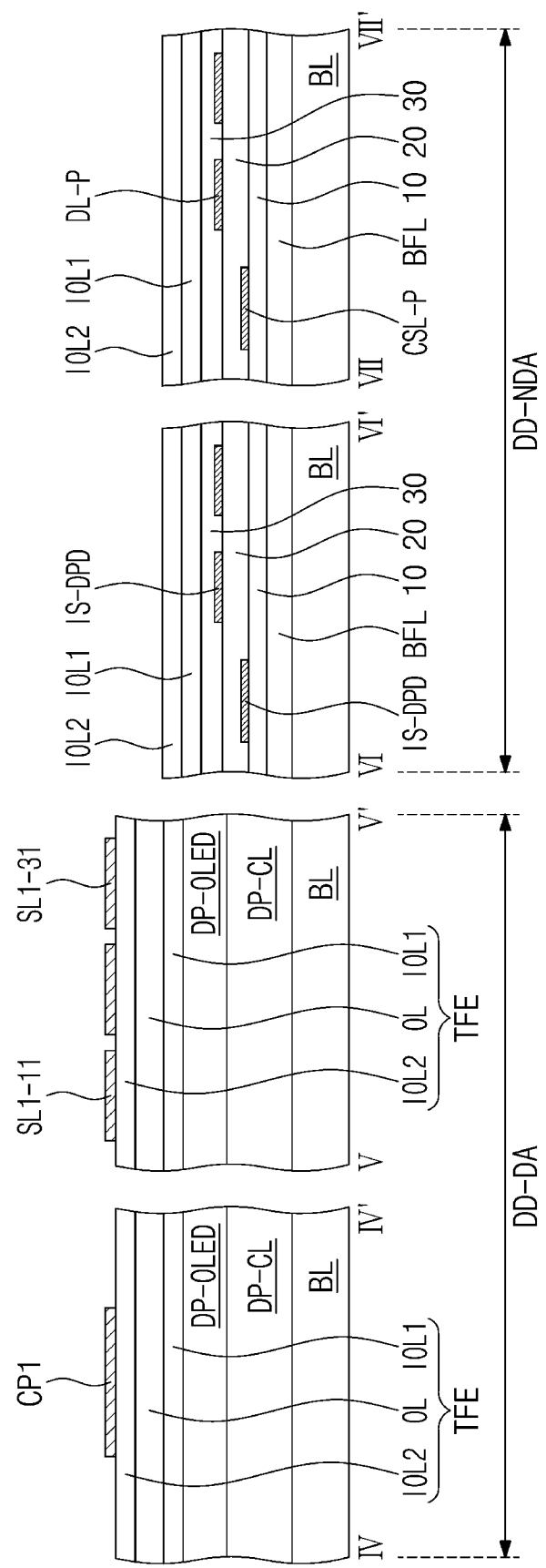

Referring to FIG. 14A, the first conductive pattern is disposed on the base surface of the display panel DP through a continuous process. In the illustrated exemplary embodiment, the base surface is provided by the second encapsulation inorganic layer IOL2.

The first connection part CP1 and the first line part SL1-11 are shown in FIG. 14A as an example of the first conductive pattern. After the first conductive layer is provided, the first conductive layer is patterned by a photolithography process to form the first conductive pattern.

Figure 14B:
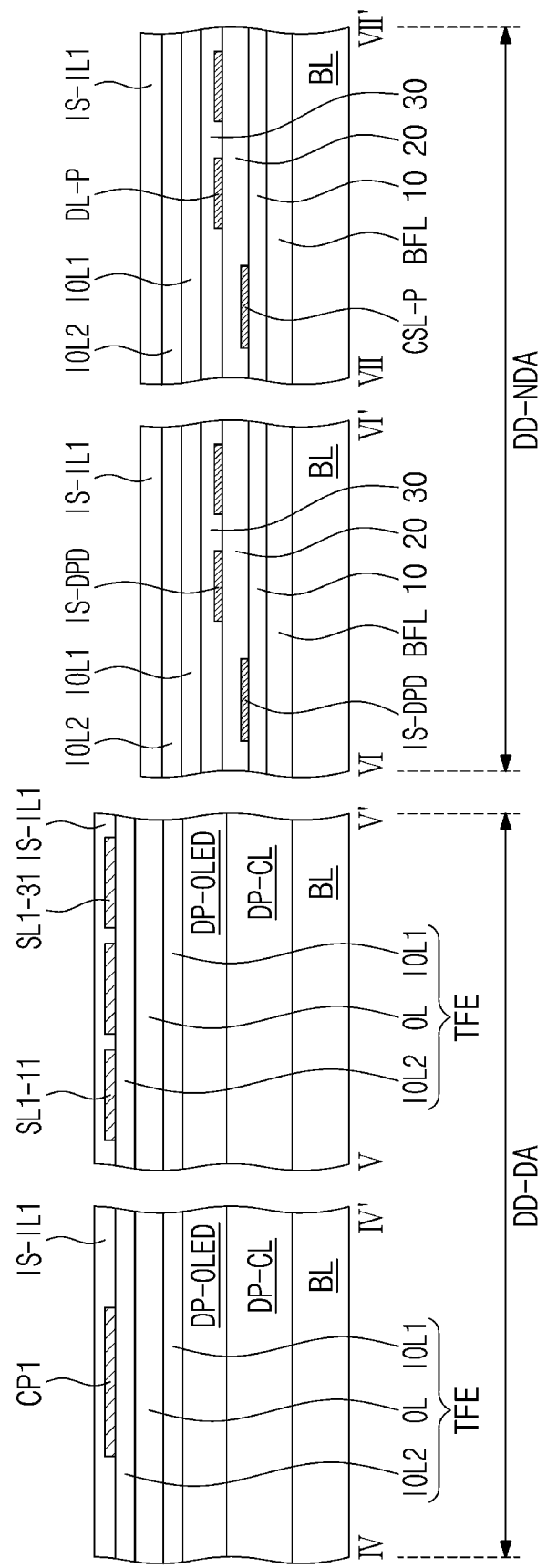

Referring to FIG. 14B, the first insulating layer IS-IL1 is disposed on the base surface to overlap the display area DD-DA and the non-display area DD-NDA and cover the first conductive pattern. In an exemplary embodiment, the first insulating layer IS-IL1 may be provided by a depositing, coating, or printing method, for example. In an exemplary embodiment, the first insulating layer IS-IL1 may be provided by the method described with reference to FIGS. 7H and 7I using an inorganic material.

Figure 14C:
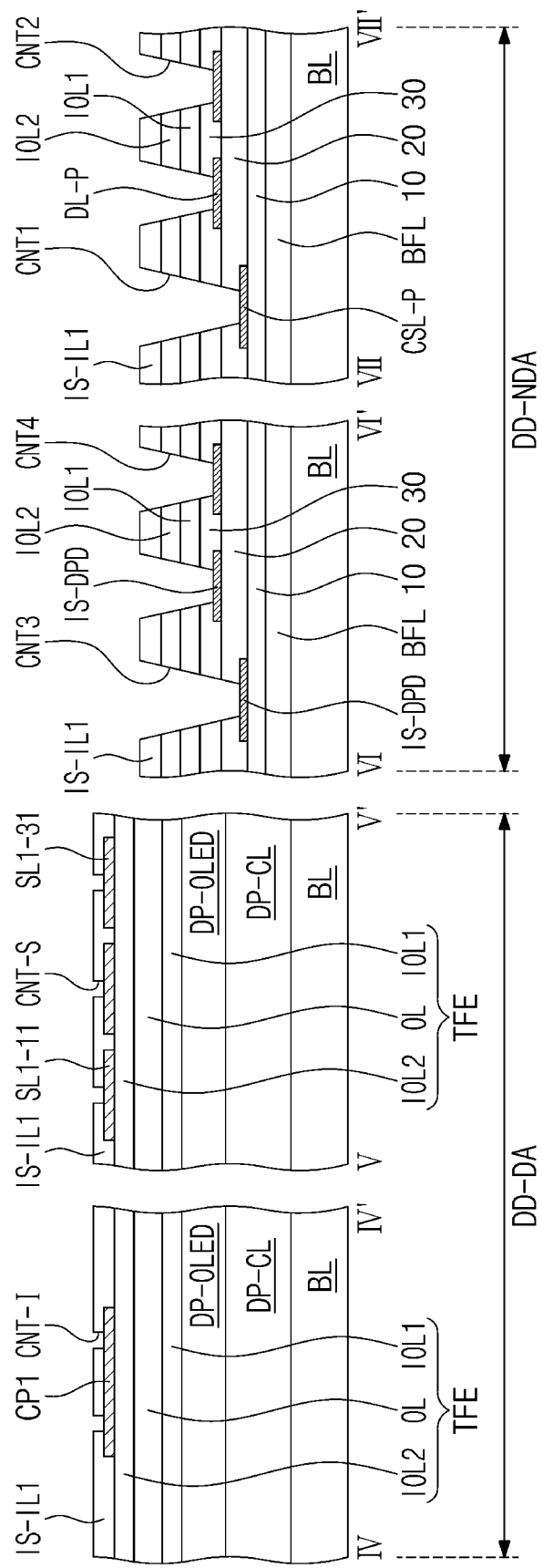

Referring to FIG. 14C, the contact holes CNT-I, CNT-S, and CNT1 to CNT4 may be defined. In the exemplary embodiment of the invention, the contact holes CNT-I, CNT-S, and CNT1 to CNT4 may be defined by an exposure and development process. In the exemplary embodiment of the invention, the contact holes CNT-I, CNT-S, and CNT1 to CNT4 may be defined by a laser drilling method.

The contact holes CNT-I and CNT-S may be defined to expose the first conductive patterns. The first connection contact holes CNT-I may be defined to partially expose the first connection parts CP1. In addition, the second connection contact holes CNT-S may be provided to partially expose the first line parts SL1-11 to SL1-31.

The contact holes CNT3 and CNT4 may be defined to expose the dummy pads IS-DPD. The contact holes CNT1 and CNT2 may be defined to expose the pad parts CSL-P and DL-P of the signal lines SGL. The first contact hole CNT1 and the third contact hole CNT3 may be defined to penetrate through the second intermediate inorganic layer 20, the intermediate organic layer 30, the first encapsulation inorganic layer IOL1, the second encapsulation inorganic layer IOL2, and the first insulating layer IS-IL1. The second contact hole CNT2 and the fourth contact hole CNT4 may be defined to penetrate through the intermediate organic layer 30, the first encapsulation inorganic layer IOL1, the second encapsulation inorganic layer IOL2, and the first insulating layer IS-IL1.

The contact holes CNT-I, CNT-S, and CNT1 to CNT4 may be substantially simultaneously defined by a single process, e.g., the same photolithography process or the same laser drilling process. The contact holes CNT-I, CNT-S, and CNT1 to CNT4 may be defined by the type of the contact holes CNT-I, CNT-S, and CNT1 to CNT4 through a plurality of processes. In an exemplary embodiment, the first contact hole CNT1 and the third contact hole CNT3 may be substantially simultaneously defined, the second contact hole CNT2 and the fourth contact hole CNT4 may be substantially simultaneously defined, and the first connection contact holes CNT-I and the second connection contact holes CNT-S may be substantially simultaneously defined.

Referring to FIG. 14D, the second conductive pattern may be provided on the first insulating layer IS-IL1. After the second conductive layer is provided, the second conductive layer is patterned by a photolithography process to form the second conductive pattern.

The first sensor parts SP1 and the second connection parts CP2 may be disposed on the first insulating layer IS-IL1. The second line parts SL1-12 to SL1-32 connected to the first line parts SL1-11 to SL1-31 may be provided through the same photolithography process, for example.

The signal pads DP-PD connected to the pad parts CSL-P and DL-P of the signal lines SGL through the first and second contact holes CNT1 and CNT2 may be provided. The first sensor parts SP1, the second connection parts CP2, the second line parts SL1-12 to SL1-32, and the signal pads DP-PD may be defined through the same process.

Figure 14E:
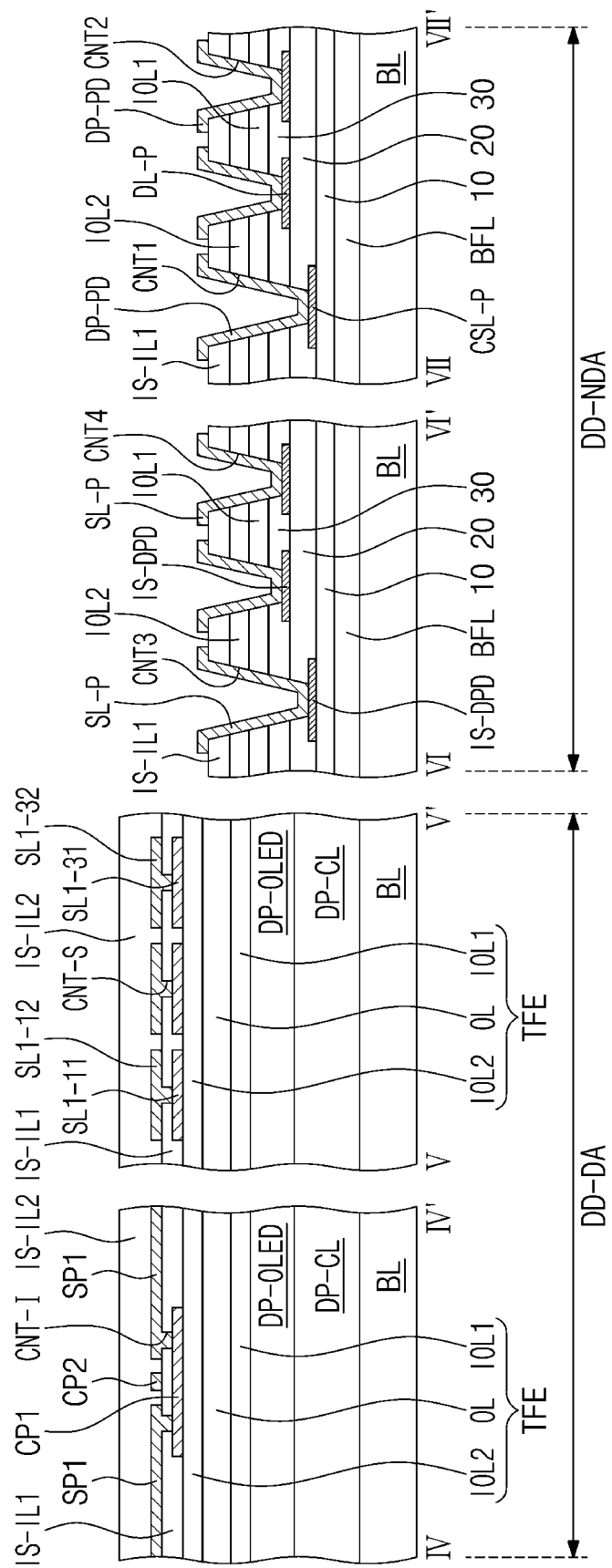

Referring to FIG. 14E, the second insulating layer IS-IL2 may be disposed on the first insulating layer IS-IL1 to cover the second conductive patterns. The second insulating layer IS-IL2 may entirely overlap the display area DD-DA and may overlap a portion of the non-display area DD-NDA. The second insulating layer IS-IL2 may expose the signal pads DP-PD and the pad parts SL-P of the input sensing unit ISU.

In another exemplary embodiment of the invention, the second insulating layer IS-IL2 may be replaced with another member such as an adhesive member. In the aforementioned exemplary embodiment, the process of forming the second insulating layer IS-IL2 may be omitted.

FIGS. 15A to 15F are cross-sectional views showing a method of manufacturing a display device DD according to an exemplary embodiment of the invention. In FIGS. 15A to 15F, different features from the manufacturing method of the display device DD described with reference to FIGS. 14A to 14E will be mainly described.

Figure 15A:
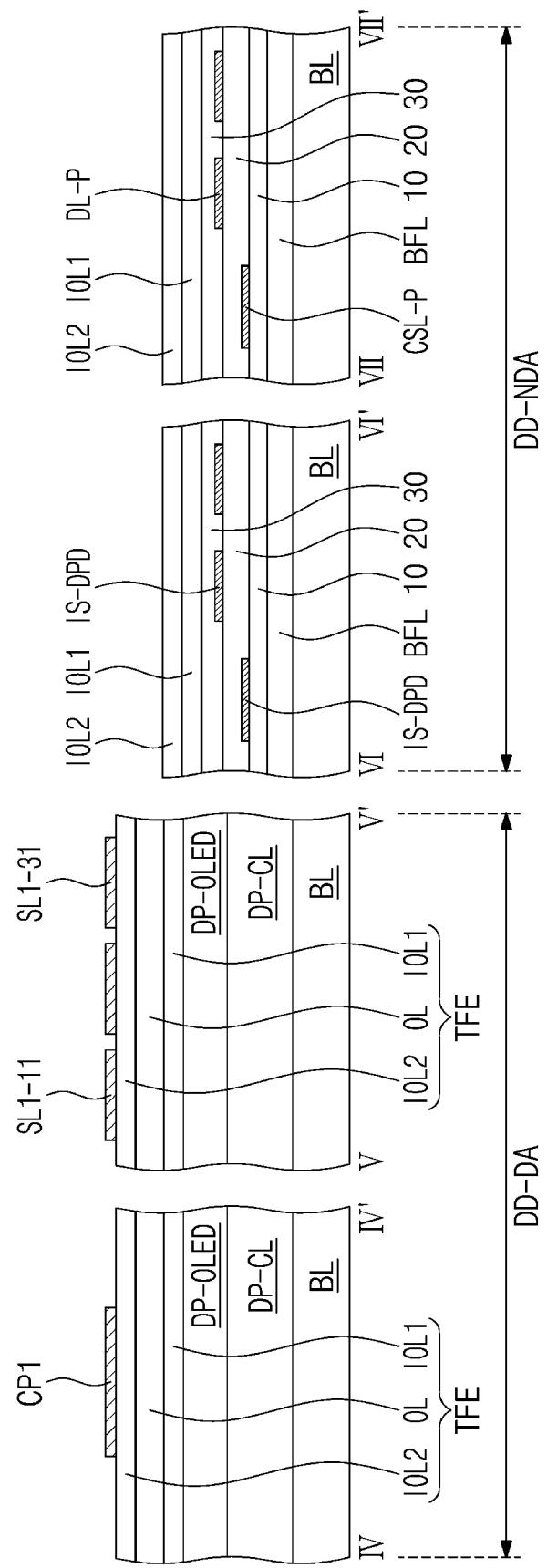
FIGS. 15A to 15F are cross-sectional views showing an exemplary embodiment of a method of manufacturing a display device according to the invention.
Figure 15B:
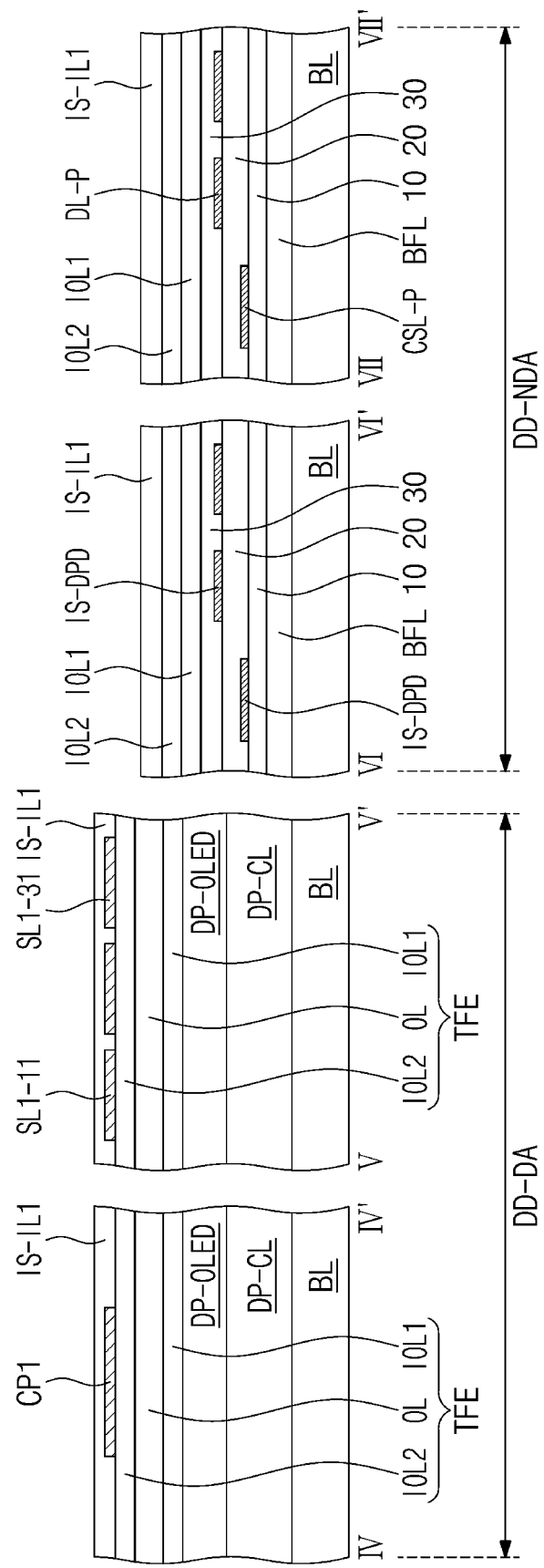

As shown in FIG. 15A, a first conductive pattern is provided. The first conductive pattern may be provided through the same process as the process described with reference to FIG. 14A. As shown in FIG. 15B, a first insulating layer IS-IL1 is provided. The first insulating layer IS-IL1 may be defined through the same process as the process described with reference to FIG. 14B.

Figure 15C:
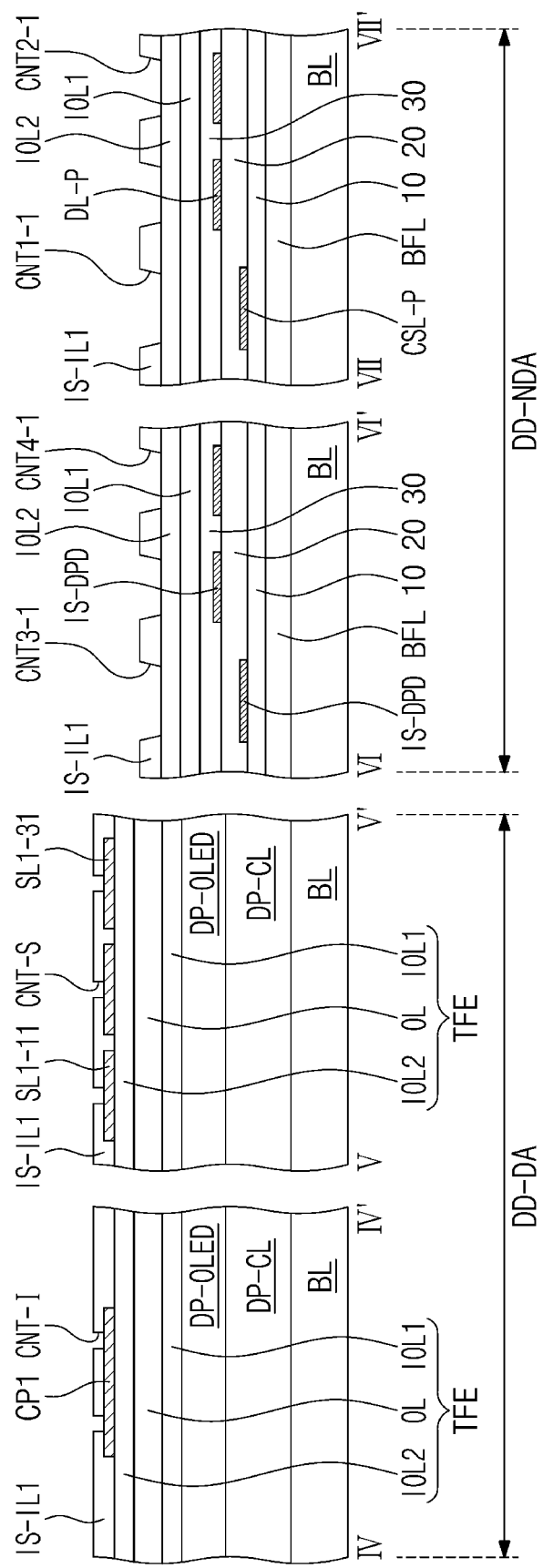

As shown in FIG. 15C, upper contact holes CNT1-1 to CNT4-1 are defined through the first insulating layer IS-IL1. First and second connection contact holes CNT-I and CNT-S may be defined through the same process to expose the first conductive patterns. The upper contact holes CNT1-1 to CNT4-1 and the first and second connection contact holes CNT-I and CNT-S may be defined through a first exposure and development process.

Figure 15D:
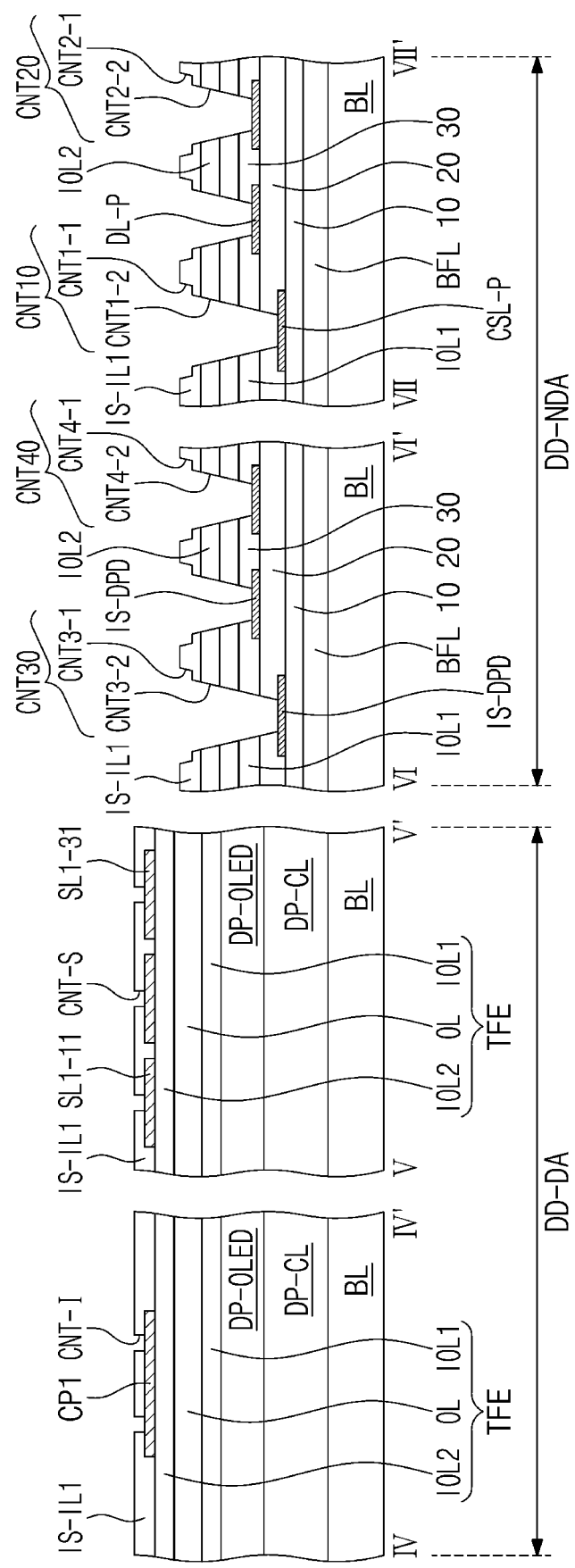

As shown in FIG. 15D, lower contact holes CNT1-2 to CNT4-2 are provided to correspond to the upper contact holes CNT1-1 to CNT4-1. The lower contact holes CNT1-2 to CNT4-2 may be provided by a second exposure and development process. The process of forming the lower contact holes CNT1-2 to CNT4-2 includes removing a portion of the encapsulation inorganic layer overlapped with at least the dummy pad IS-DPD.

In this case, the first and second connection contact holes CNT-I and CNT-S may be protected from the second exposure and development process by using a mask. Some contact holes of the lower contact holes CNT1-2 to CNT4-2 penetrate through the second intermediate inorganic layer 20, the intermediate organic layer 30, the first encapsulation inorganic layer IOL1, and the second encapsulation inorganic layer IOL2, and the other contact holes of the lower contact holes CNT1-2 to CNT4-2 penetrate through the intermediate organic layer 30, the first encapsulation inorganic layer IOL1, and the second encapsulation inorganic layer IOL2.

First contact hole CNT10 to fourth contact holes CNT40, each having a stepped shape when viewed in a cross-section, may be defined through the processes described with reference to FIGS. 15C and 15D.

Figure 15E:
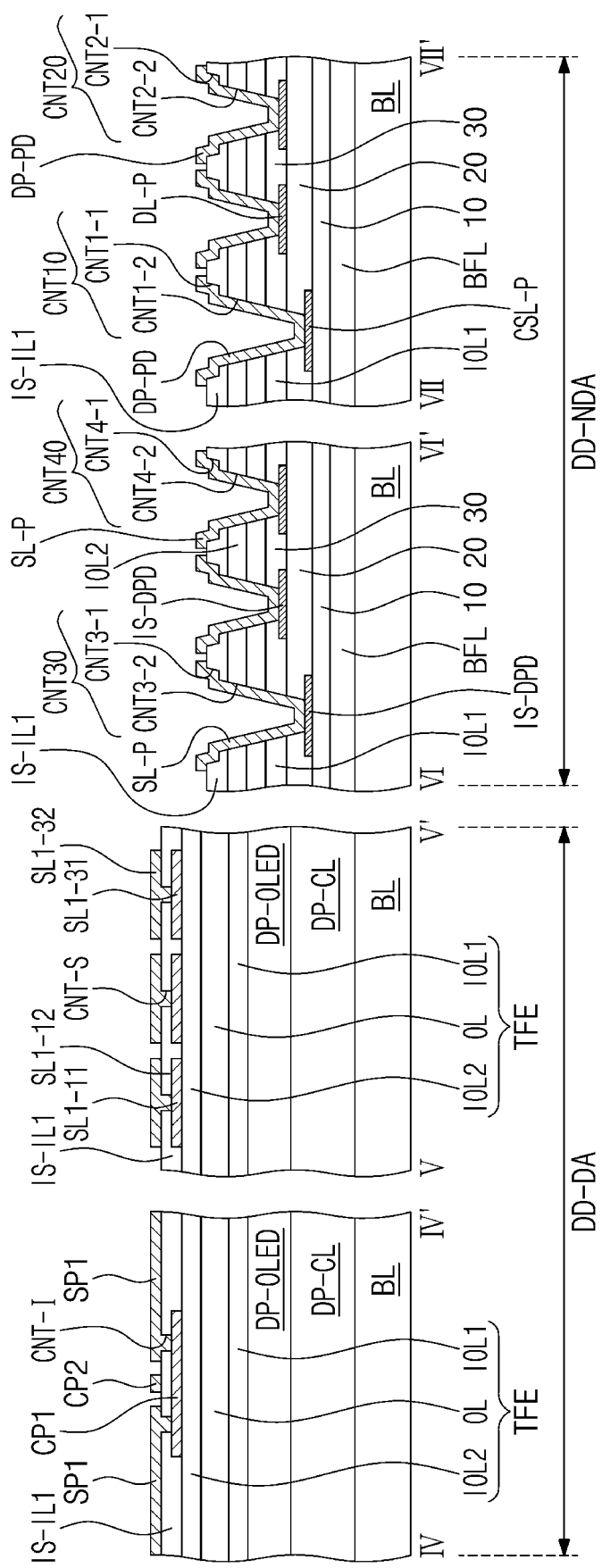
Figure 15F:
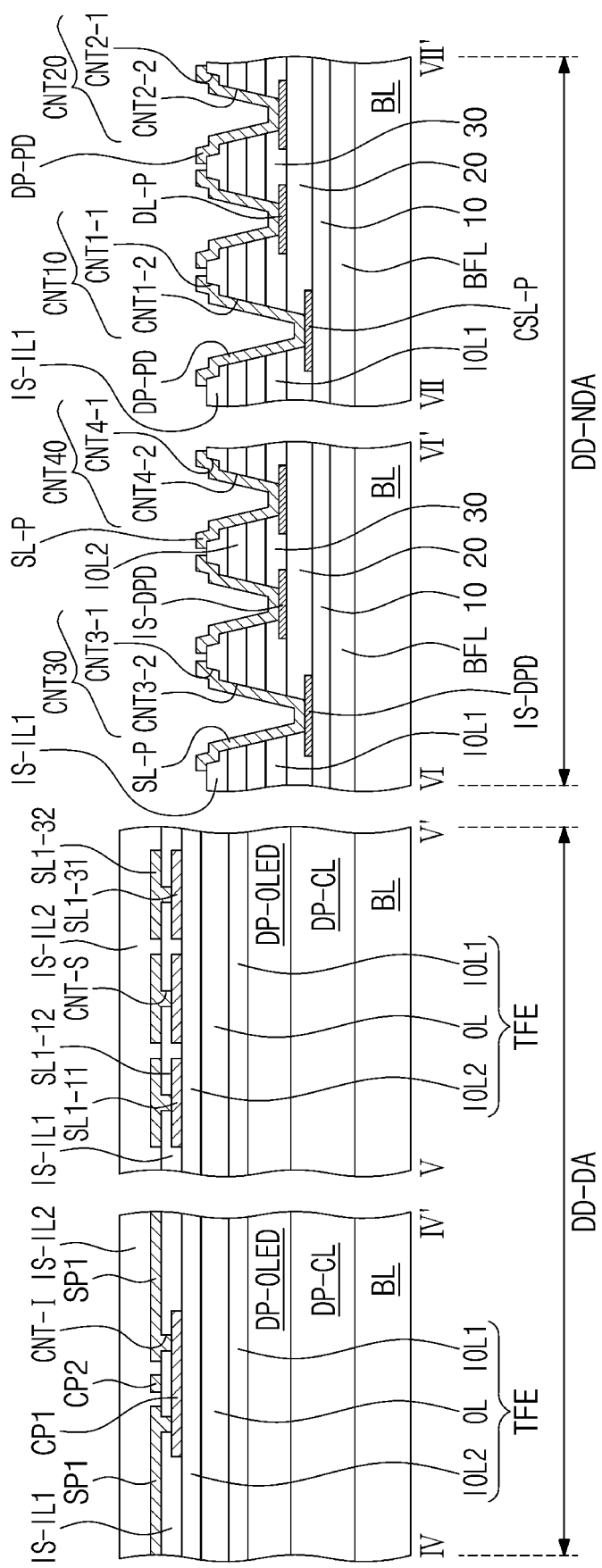

Then, as shown in FIG. 15E, a second contact pattern may be provided on the first insulating layer IS-IL1. The second contact pattern may be provided through the same process as the process described with reference to FIG. 14D. Then, as shown in FIG. 15F, a second insulating layer IS-IL2 may be provided. The second insulating layer IS-IL2 may be defined through the same process as the process described with reference to FIG. 14E.

Figure 16A:
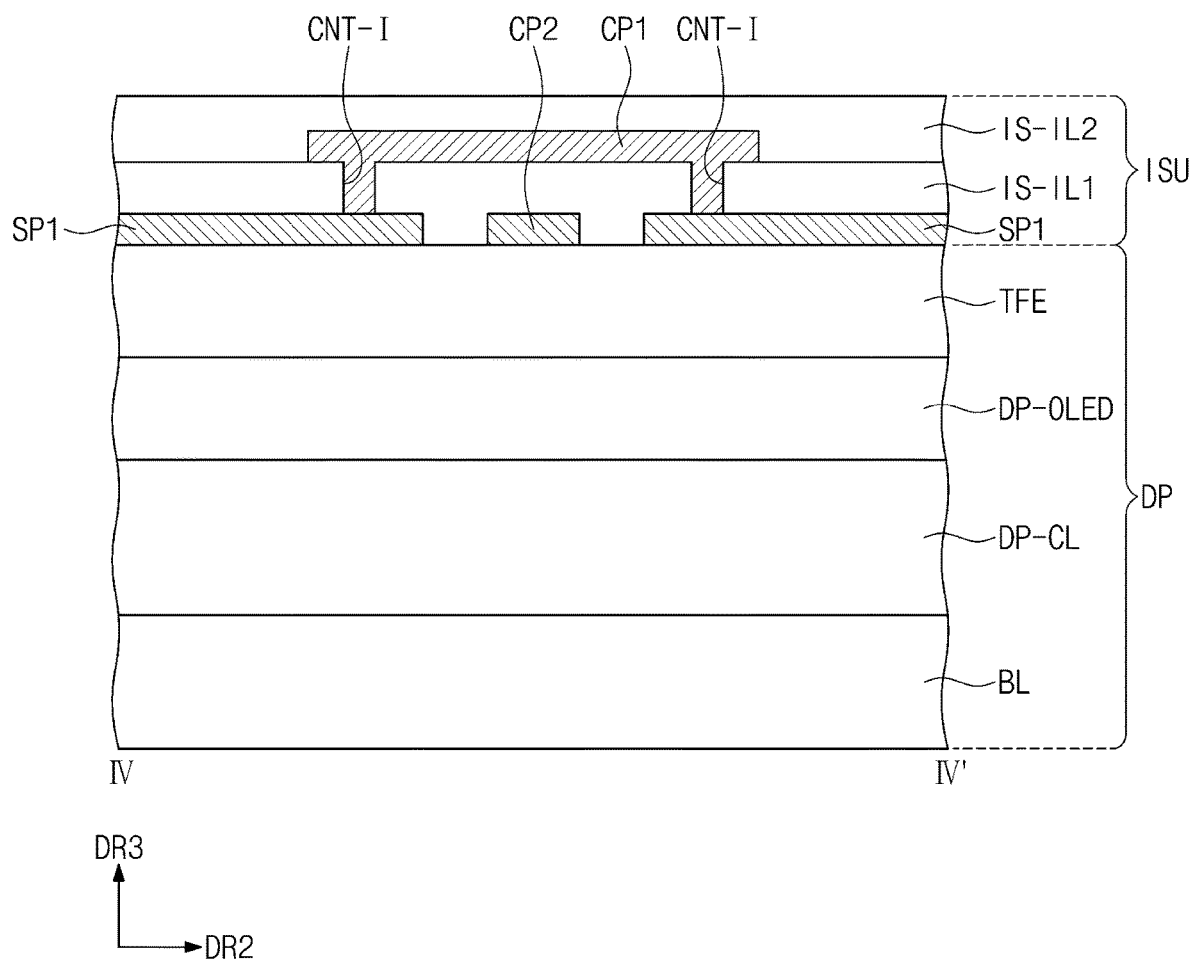
FIGS. 16A to 16C are cross-sectional view showing an exemplary embodiment of a display device according to the invention.
Figure 16B:
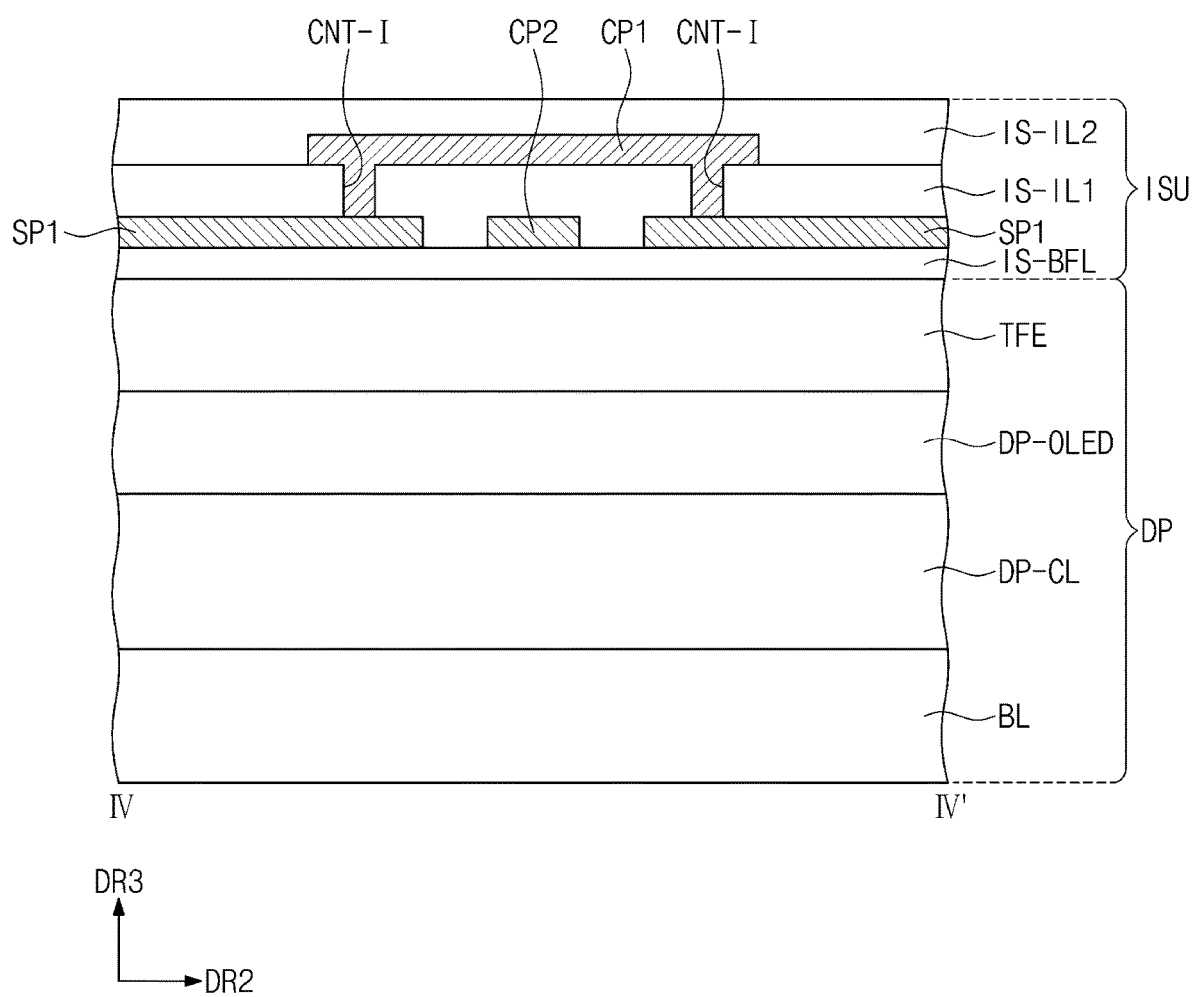
Figure 16C:
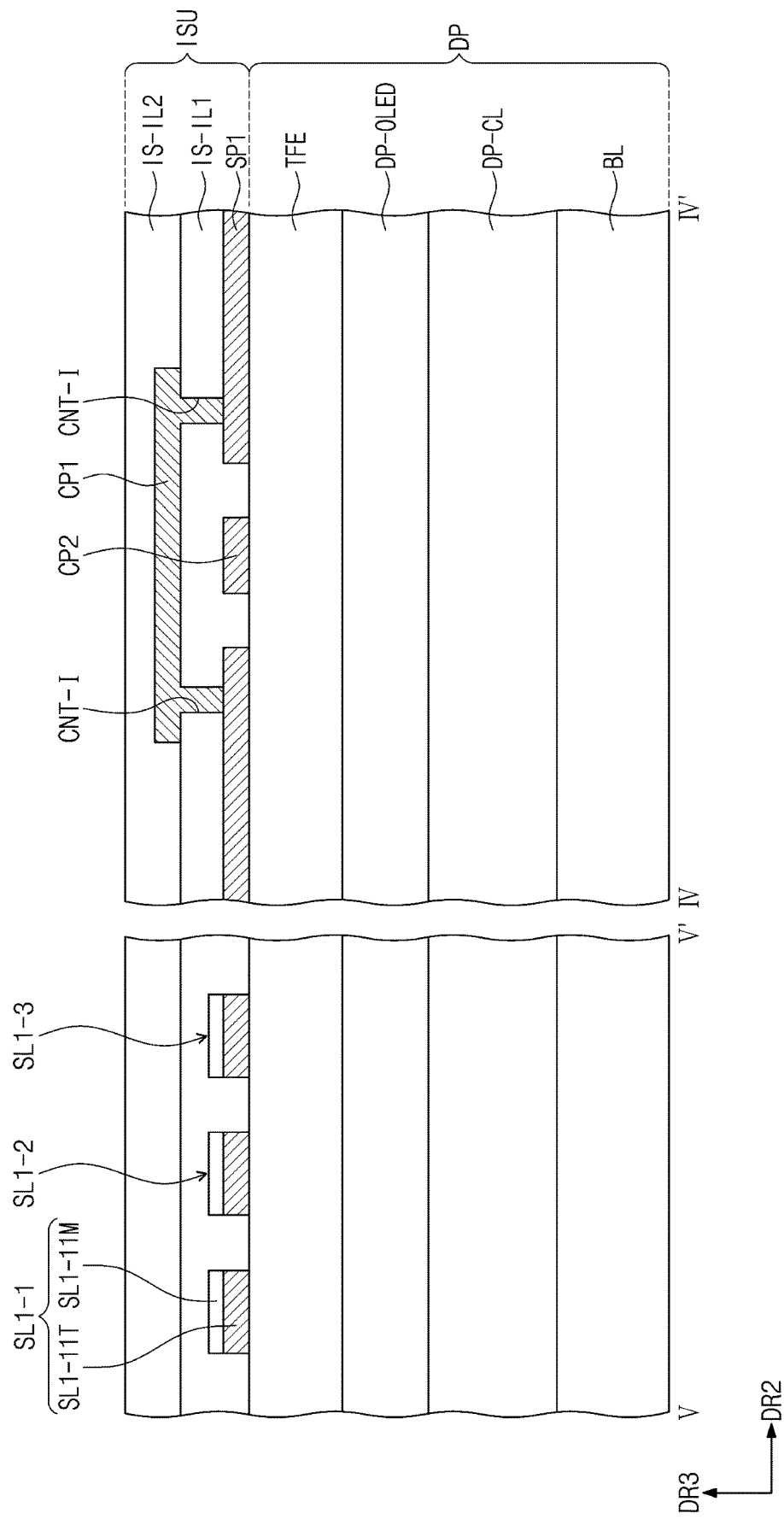

FIGS. 16A to 16C are cross-sectional view showing a display device DD according to an exemplary embodiment of the invention. In FIGS. 16A to 16C, detailed descriptions of the same elements as those of the display device DD described with reference to FIGS. 1 to 15F will be omitted.

FIG. 16A shows a cross-section corresponding to FIG. 11C. According to the illustrated exemplary embodiment, first sensor parts SP1 and a second connection part CP2 are directly disposed on a thin film encapsulation layer TFE. A first insulating layer IS-IL1 is disposed on the thin film encapsulation layer TFE to cover the first sensor parts SP1 and the second connection part CP2. A first connection part CP1 disposed on the first insulating layer IS-IL1 is electrically connected to the first sensor parts SP1 through first connection contact holes CNT-I.

In an input sensing unit ISU according to the illustrated exemplary embodiment, first conductive patterns of a first conductive layer IS-CL1 and second conductive patterns of a second conductive layer IS-CL2 are changed with respect to each other when compared to the input sensing unit ISU described with reference to FIGS. 11A to 11D. However, pad parts SL-P (refer to FIG. 10A) of first signal lines SL1-1 to SL1-5 (refer to FIG. 10A) and pad parts SL-P of second signal lines SL2-1 to SL2-4 (refer to FIG. 10A) may be provided from the first conductive layer IS-CL1 disposed at an upper position than the second conductive layer IS-CL2.

In other words, the first conductive layer IS-CL1 disposed on the first insulating layer IS-IL1 may include first line parts SL1-11 to SL1-51 (refer to FIG. 11A) of the first signal lines SL1-1 to SL1-5, pad parts SL-P of the first signal lines SL1-1 to SL1-5, first line parts SL2-11 to SL2-41 (refer to FIG. 11A) of the second signal lines SL2-1 to SL2-4, and pad parts SL-P of the second signal lines SL2-1 to SL2-4. Accordingly, a cross-sectional structure of a pad area NDA-PD according to the illustrated exemplary embodiment may be substantially the same as the cross-sectional structure of the pad area NDA-PD described with reference to FIGS. 12A to 13C.

In an exemplary embodiment, in order to improve the flexibility, the first insulating layer IS-IL1 may be a polymer layer, e.g., an acrylic polymer layer. In an exemplary embodiment, the second insulating layer IS-IL2 may be a polymer layer, e.g., an acrylic polymer layer.

As shown in FIG. 16B, the input sensing unit ISU may further include a buffer layer IS-BFL directly disposed on the thin film encapsulation layer TFE. In an exemplary embodiment, the buffer layer IS-BFL may include an inorganic material, e.g., a silicon nitride layer. An inorganic layer disposed at an uppermost position of the thin film encapsulation layer TFE may include silicon nitride, and the silicon nitride layer of the thin film encapsulation layer TFE and the buffer layer IS-BFL may be disposed under different deposition conditions. Although not shown separately, the buffer layer IS-BFL may be applied to input sensing units according to other exemplary embodiments described later.

FIG. 16C shows a cross-section corresponding to FIGS. 11C and 11D. As shown in FIG. 16C, the second line part SL1-12 shown in FIG. 11D may be omitted. The first signal line SL1-1 includes only the first line part SL1-11 of FIG. 11D. The first signal line SL1-1 may include a transparent conductive layer SL1-11T and a metal layer SL1-11M directly disposed on the transparent conductive layer SL1-11T. The first sensor parts SP1, the second connection part CP2, and the second sensor parts SP2 (not shown) may include the transparent conductive layer SL1-11T, but not include the metal layer SL1-11M.

The transparent conductive layer SL1-11T and the metal layer SL1-11M are provided by sequentially forming a preliminary transparent conductive layer and a preliminary metal layer and sequentially patterning the preliminary metal layer and the preliminary transparent conductive layer. After the first insulating layer IS-IL1 is provided, connection contact holes CNT-I are defined through the first insulating layer IS-IL1. Then, the first connection part CP1 may be provided.

Figure 17A:
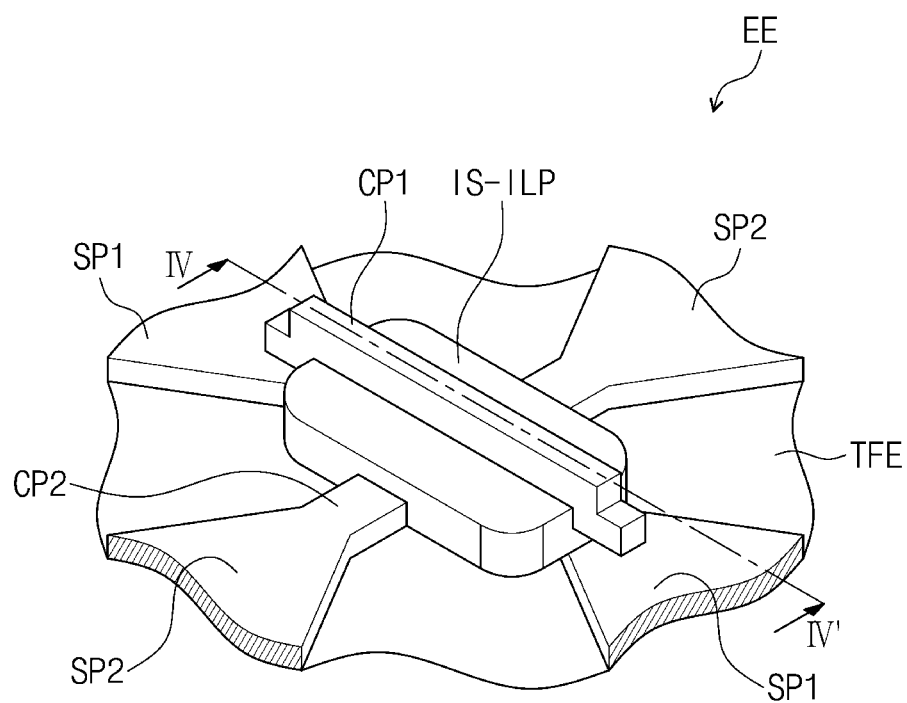
FIG. 17A is a plan view showing an exemplary embodiment of a crossing area of an input sensing unit according to the invention.
Figure 17B:
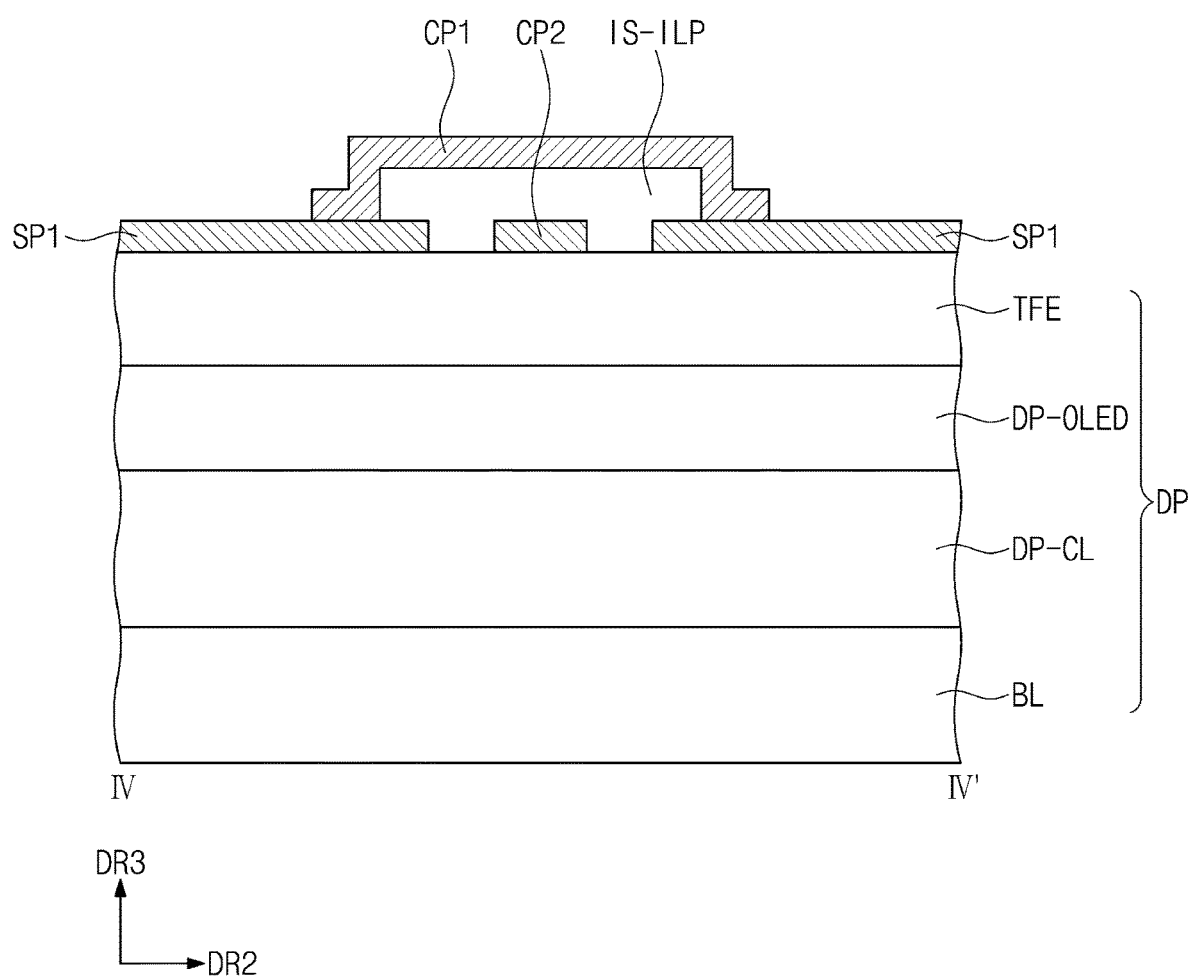
FIG. 17B is a cross-sectional view showing an exemplary embodiment of a display device according to the invention.
Figure 17C:
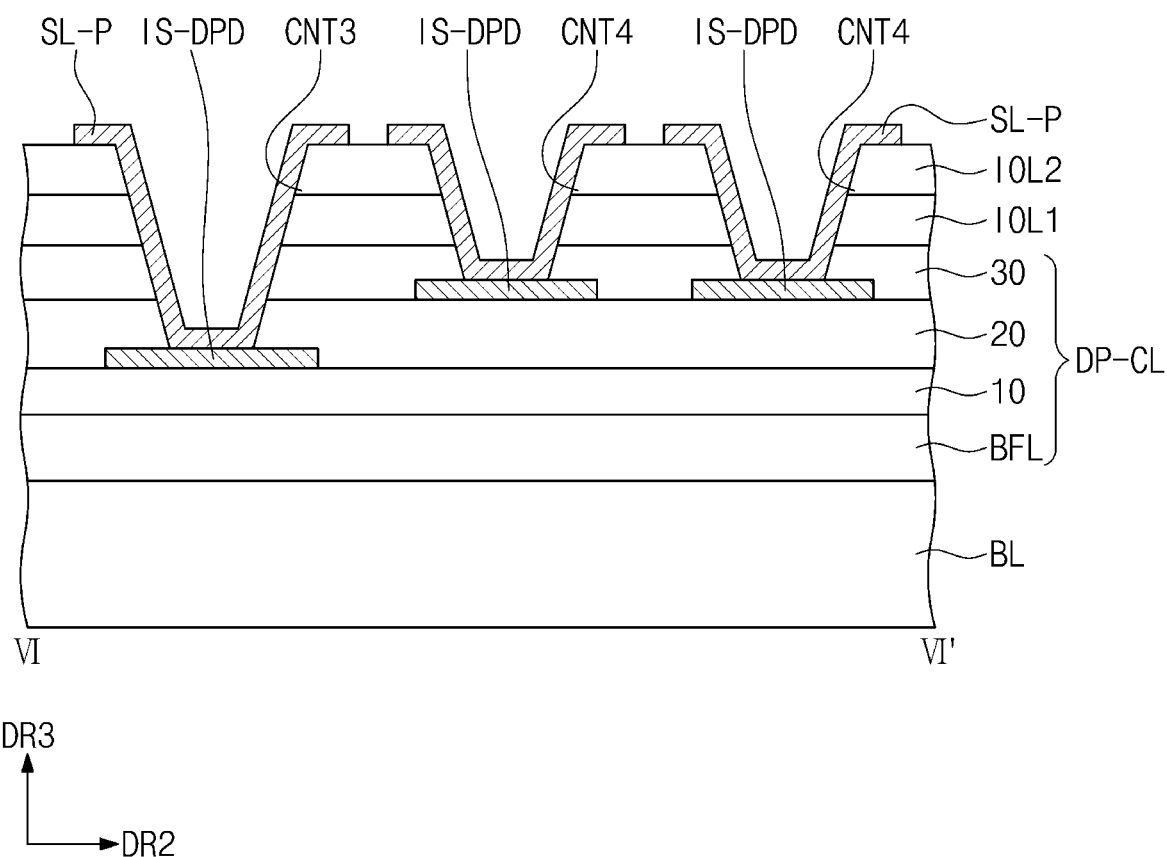
FIG. 17C is a cross-sectional view showing an exemplary embodiment of a portion of a pad area of a display device according to the invention.
Figure 17D:
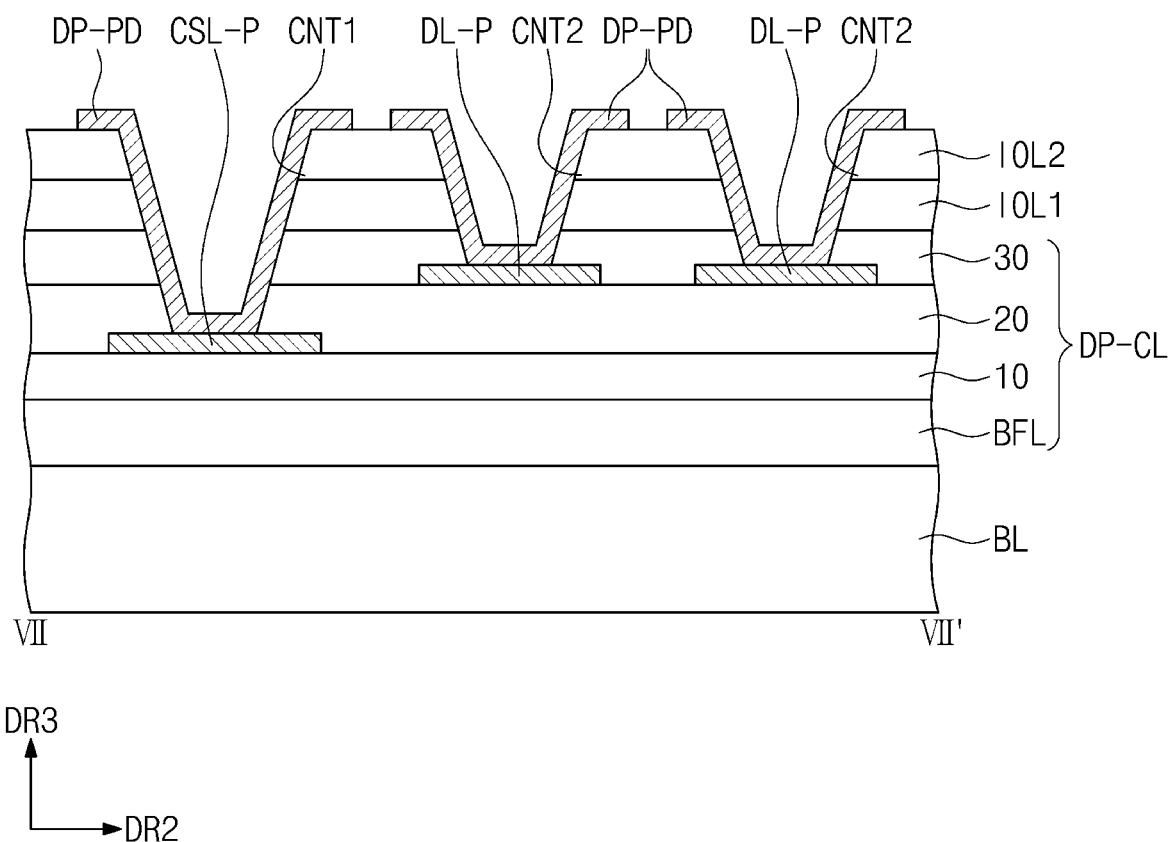
FIG. 17D is a cross-sectional view showing an exemplary embodiment of another portion of a pad area of a display device according to the invention.

FIG. 17A is a plan view showing a crossing area of an input sensing unit ISU according to an exemplary embodiment of the invention. FIG. 17B is a cross-sectional view showing a display device DD according to an exemplary embodiment of the invention. FIG. 17C is a cross-sectional view showing a portion of a pad area NDA-PD of a display device DD according to an exemplary embodiment of the invention. FIG. 17D is a cross-sectional view showing another portion of the pad area NDA-PD of the display device DD according to an exemplary embodiment of the invention. A crossing area of the input sensing unit ISU described below corresponds to the area EE of FIG. 10A. In FIGS. 17A to 17D, detailed descriptions of the same elements as the display device DD described with reference to FIGS. 1 to 16B will be omitted.

Referring to FIGS. 17A and 17B, the input sensing unit ISU includes an insulating pattern IS-ILP disposed at the crossing area. The insulating pattern IS-ILP may be disposed at every crossing area shown in FIG. 10A. Different from the input sensing unit ISU that includes the first insulating layer IS-IL1 entirely overlapped with the display area DD-DA and the non-display area DD-NDA as shown in FIGS. 9 to 13C, the input sensing unit ISU according to the illustrated exemplary embodiment includes insulating patterns IS-ILP respectively disposed at the crossing areas.

In an exemplary embodiment, the insulating patterns IS-ILP may include a material including at least one of a photosensitive material, silicon dioxide, titanium dioxide, zinc oxide, silicon nitride, aluminum nitride, and tantalum oxide. The insulating patterns IS-ILP may include an organic material or an inorganic material in addition to the material.

The first connection part CP1 is disposed on the insulating pattern IS-ILP to connect the first sensor parts SP1. Although not shown separately, an insulating layer may further be disposed on the thin film encapsulation layer TFE to cover the first sensing electrodes IE1-1 to IE1-5 (refer to FIG. 10A) and the second sensing electrodes IE2-1 to IE2-4 (refer to FIG. 10A). This insulating layer corresponds to the second insulating layer IS-IL2 described with reference to FIGS. 9 to 13C.

Since the first insulating layer IS-IL1 of the input sensing unit ISU described with reference to FIGS. 9 to 13C are replaced with the insulating patterns IS-ILP, the cross-sectional structure of the pad area NDA-PD may be changed. FIGS. 17C and 17D show cross-sections corresponding to FIGS. 12B and 13B. Different from those shown in FIGS. 12B and 13B, the first insulating layer IS-IL1 is omitted from (i.e., is not disposed) between the dummy pads IS-DPD and the pad part SL-P and is omitted from (i.e., is not disposed) between the pad parts CSL-P and DL-P and the signal pads DP-PD.

Figure 18:
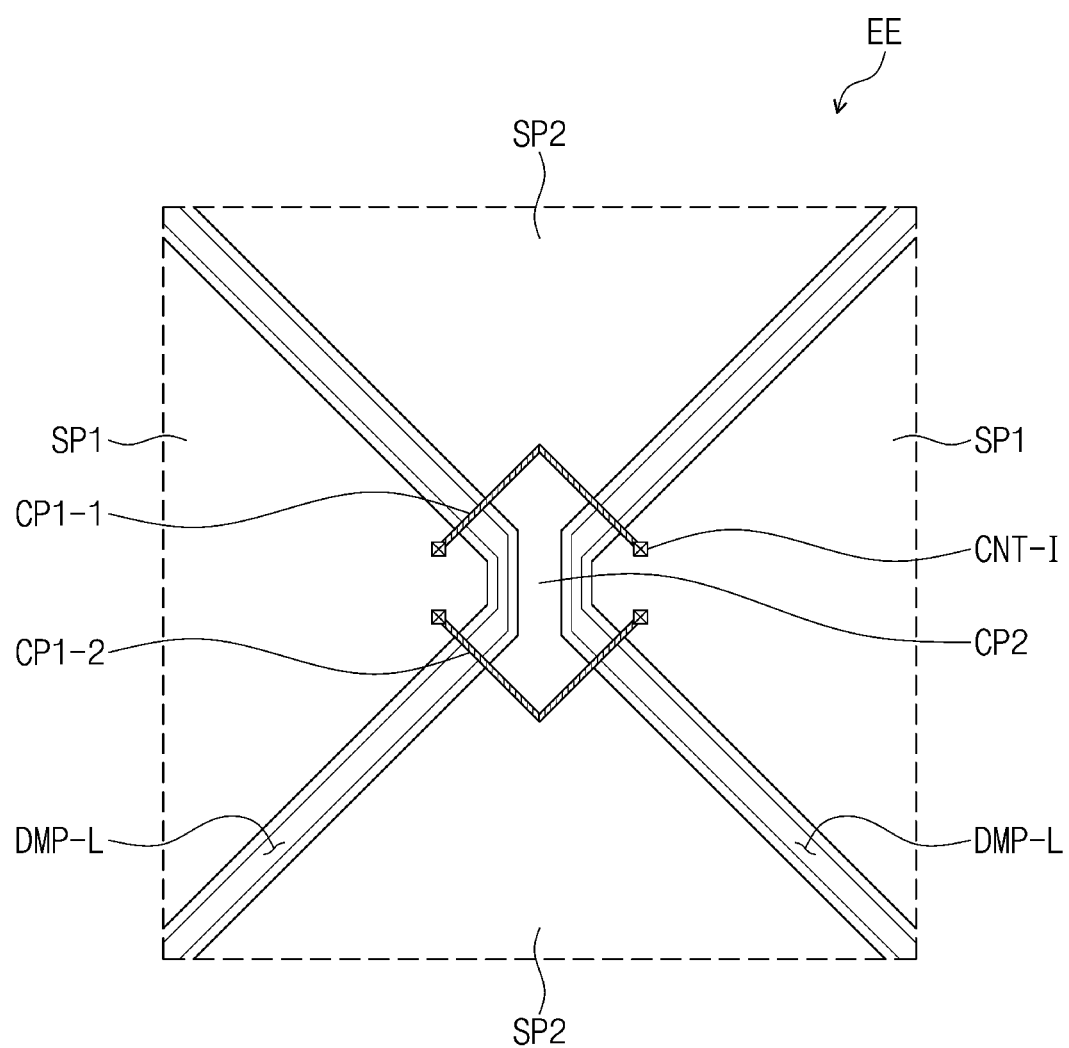
FIG. 18 is a plan view showing an exemplary embodiment of a crossing area of an input sensing unit included in a display device according to the invention.
Figure 19A:
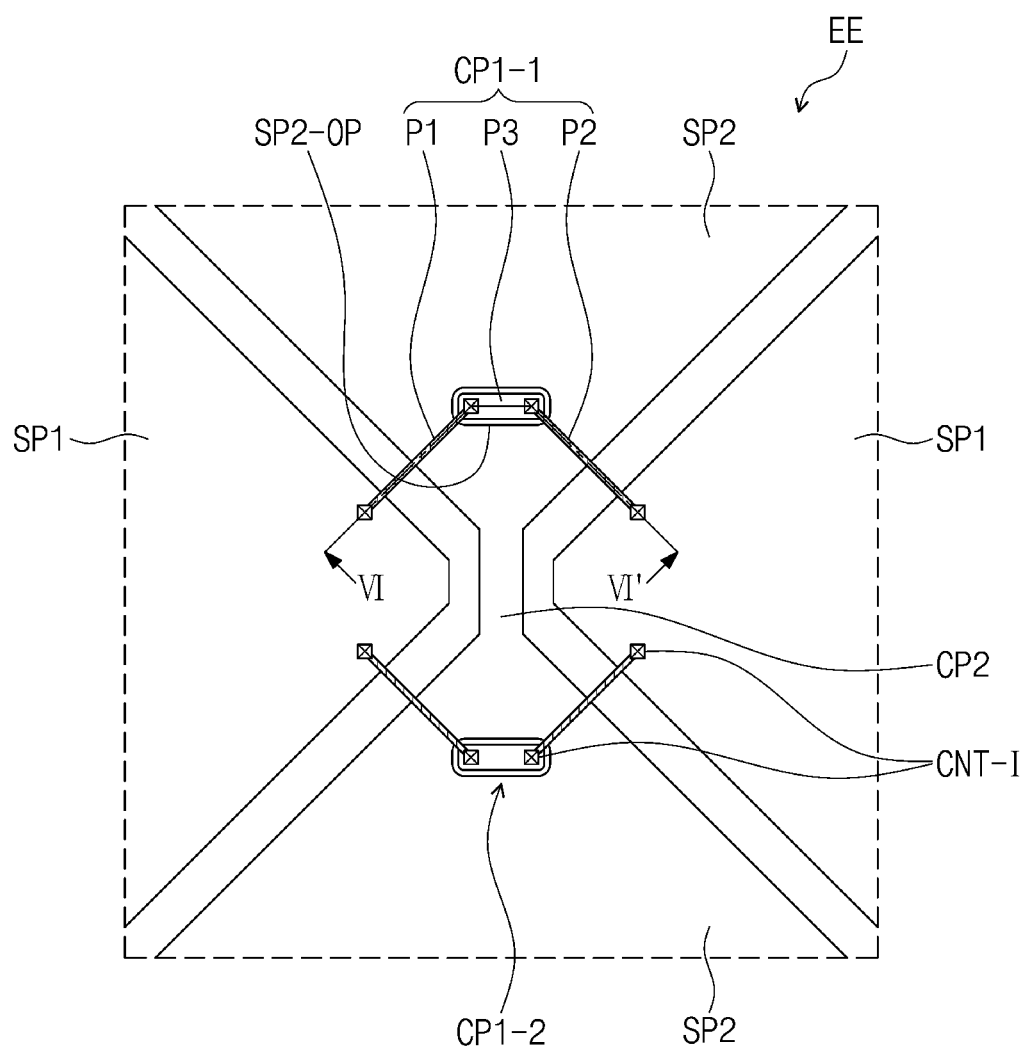
FIG. 19A is a plan view showing an exemplary embodiment of a crossing area of an input sensing unit included in a display device according to the invention.
Figure 19B:
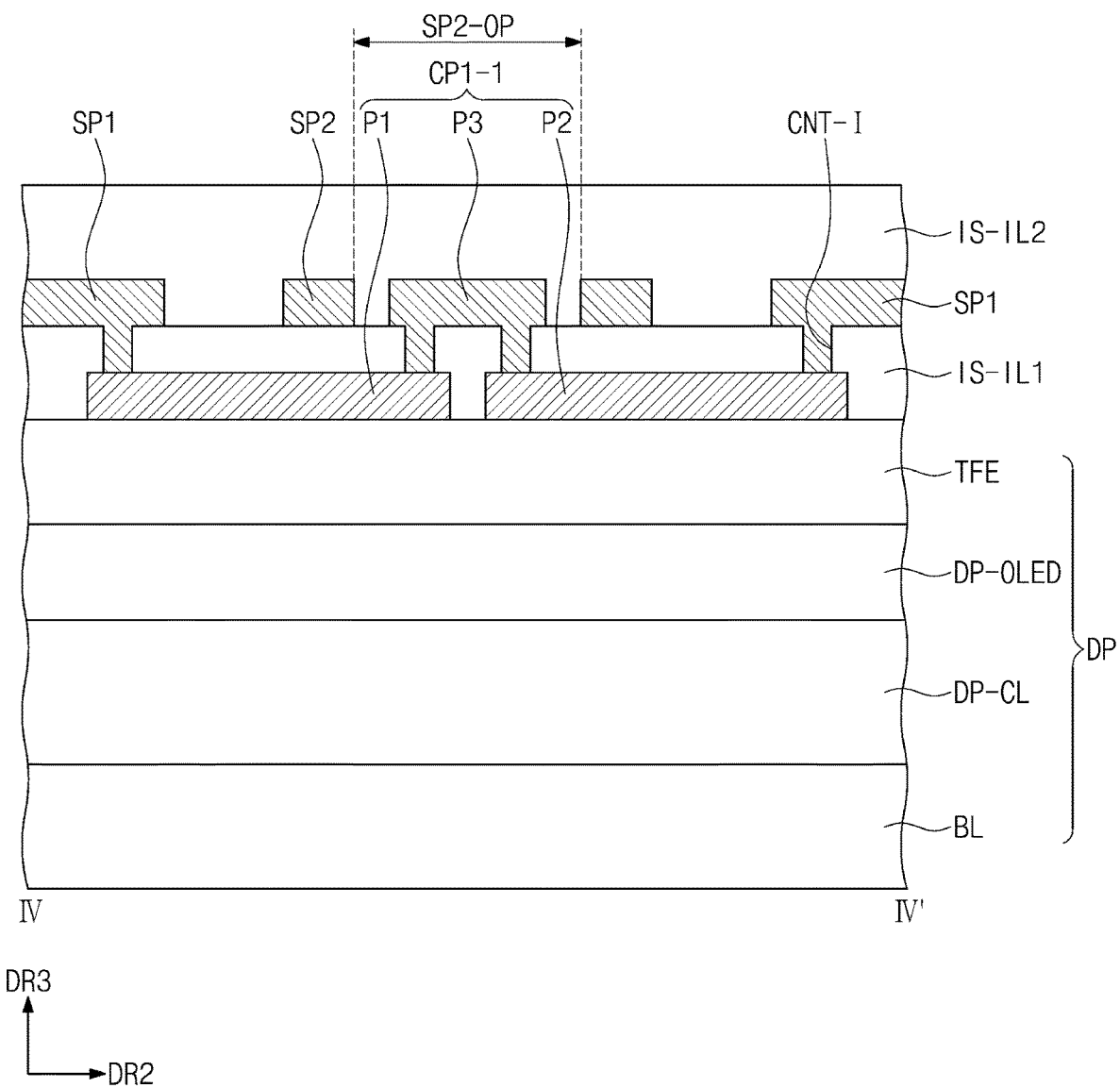
FIG. 19B is a cross-sectional view showing an exemplary embodiment of a display device according to the invention.
Figure 20A:
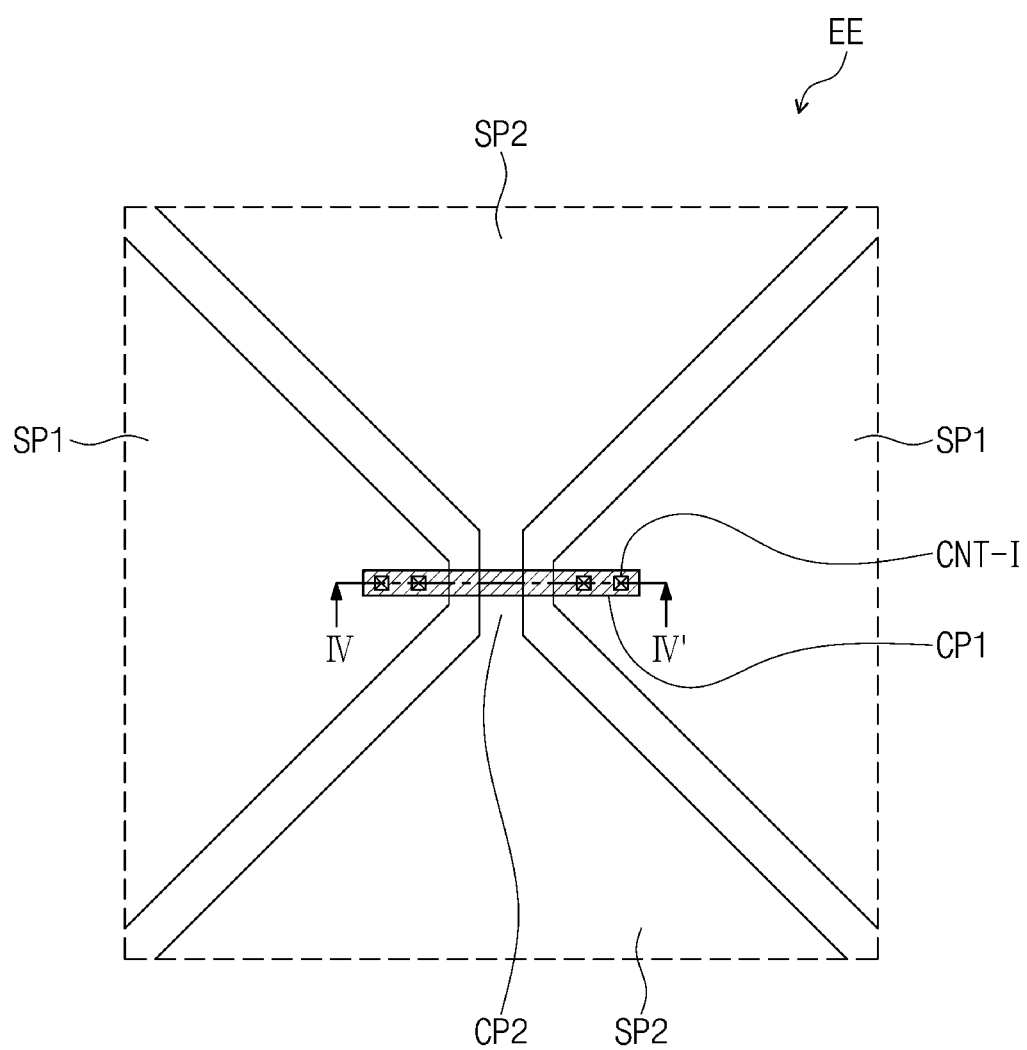
FIG. 20A is a plan view showing an exemplary embodiment of a crossing area of an input sensing unit included in a display device according to the invention.
Figure 20B:
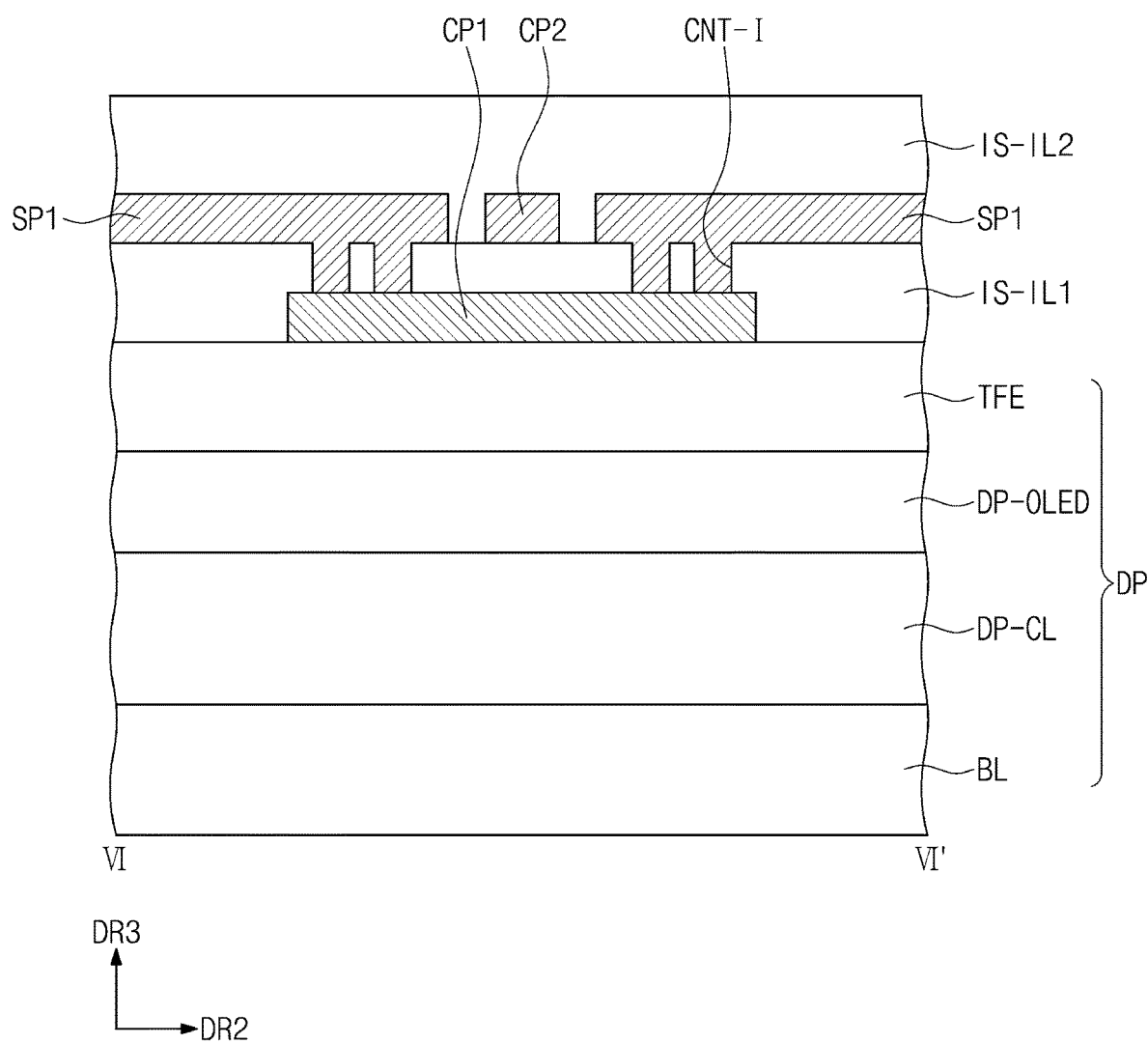
FIG. 20B is a cross-sectional view showing an exemplary embodiment of a display device according to the invention.
Figure 21:
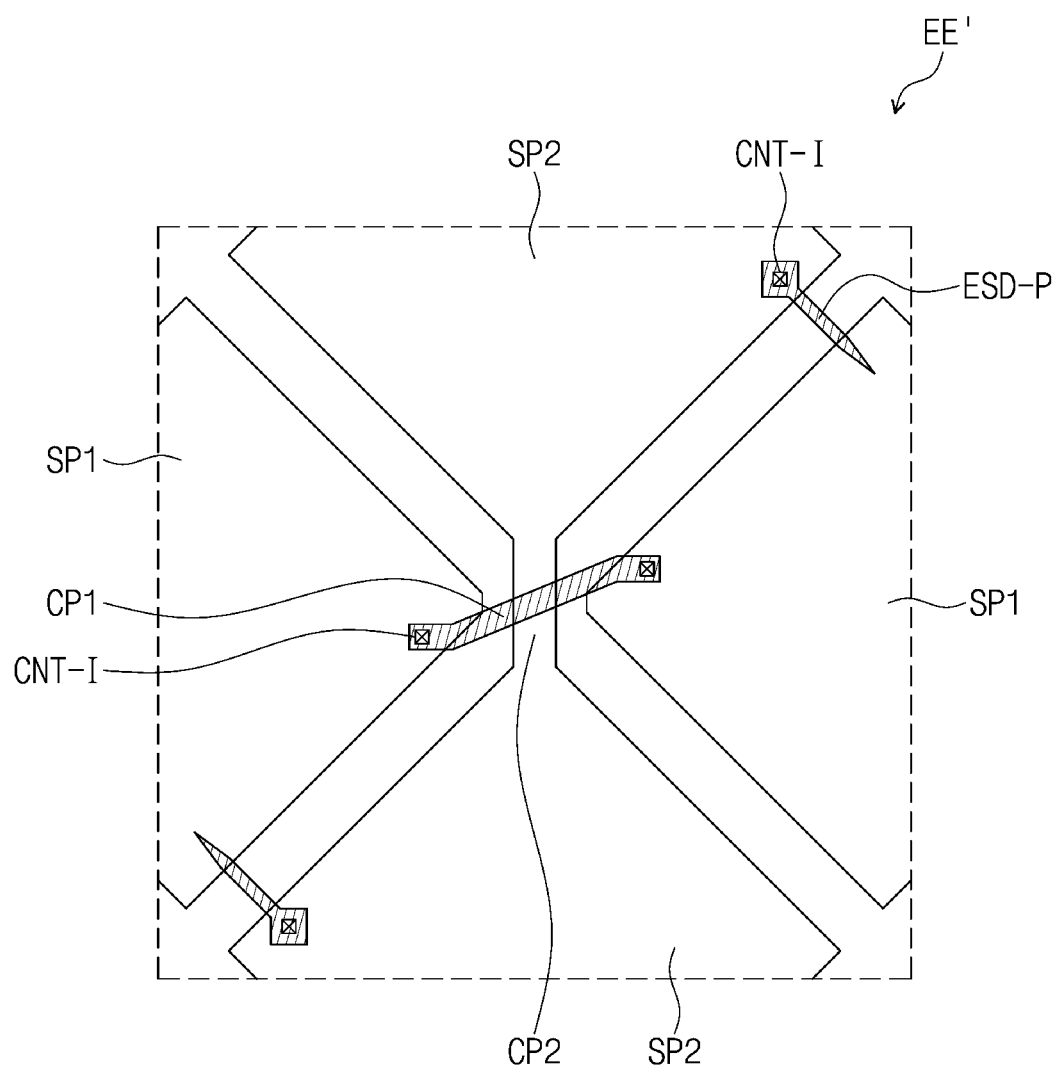
FIG. 21 is a plan view showing an exemplary embodiment of a crossing area of an input sensing unit included in a display device according to the invention.

FIG. 18 is a plan view showing a crossing area of an input sensing unit ISU included in a display device according to an exemplary embodiment of the invention. FIG. 19A is a plan view showing a crossing area of an input sensing unit ISU included in a display device according to an exemplary embodiment of the invention. FIG. 19B is a cross-sectional view showing a display device DD according to an exemplary embodiment of the invention. FIG. 20A is a plan view showing a crossing area of an input sensing unit ISU included in a display device according to an exemplary embodiment of the invention. FIG. 20B is a cross-sectional view showing a display device DD according to an exemplary embodiment of the invention. FIG. 21 is a plan view showing a crossing area of an input sensing unit ISU included in a display device according to an exemplary embodiment of the invention.

FIGS. 18 to 21 show a crossing area different from the crossing area shown in FIG. 10A. In FIGS. 18 to 21, detailed descriptions of the same elements as those of the display device DD described with reference to FIGS. 1 to 15F will be omitted.

As shown in FIG. 18, the input sensing unit ISU may include a plurality of first connection parts CP1-1 and CP1-2 arranged in one crossing area. In the illustrated exemplary embodiment, two first connection parts CP1-1 and CP1-2 are shown as a representative example. Two first connection parts CP1-1 and CP1-2 do not cross the second connection part CP2.

The two first connection parts CP1-1 and CP1-2 may reduce a resistance of corresponding sensing electrodes. Although one of the two first connection parts CP1-1 and CP1-2 is disconnected, for example by a static electricity, the corresponding sensing electrode may be prevented from being disconnected. Since the two first connection parts CP1-1 and CP1-2 do not cross the second sensor part SP2, a parasitic capacitance occurring therebetween may be reduced.

FIG. 18 shows the optical dummy electrode DMP-L not shown in FIG. 10A. The optical dummy electrode DMP-L is provided through the same process as the first sensor parts SP1 and the second sensor parts SP2, and thus the optical dummy electrode DMP-L may include the same material and the same stacking structure as those of the first and second sensor parts SP1 and SP2. The optical dummy electrode DMP-L serves as a floating electrode and is not electrically connected to the first sensor parts SP1 and the second sensor parts SP2. Due to the optical dummy electrode DMP-L, a visibility of a boundary area between the first sensor parts SP1 and the second sensor parts SP2 may decrease. Although not shown separately, the optical dummy electrode DMP-L may be applied to other input sensing units according to other exemplary embodiments described hereinafter.

As shown in FIGS. 19A and 19B, the input sensing unit ISU includes a plurality of first connection parts CP1-1 and CP1-2 arranged in one crossing area. One or more of the first connection parts CP1-1 and CP1-2 may include a plurality of patterns P1, P2, and P3.

A first pattern P1 and a second pattern P2 may be provided from the first conductive layer IS-CL1 (refer to FIG. 9), and a third pattern P3 may be provided from the second conductive layer IS-CL2 (refer to FIG. 9). Each of the first and second patterns P1 and P2 may electrically connect the third pattern P3 and the first sensor part SP1 through first connection contact holes CNT-I.

An opening SP2-OP is defined through the second sensor part SP2. The third pattern P3 is disposed in the opening SP2-OP. The first and second patterns P1 and P2 may include a material having a resistance lower than that of the third pattern P3. The third pattern P3 and the first and second sensor parts SP1 and SP2 may be provided through the same process, and thus the third pattern P3 and the first and second sensor parts SP1 and SP2 may have the same stacking structure and include the same material. The third pattern P3 and the first and second sensor parts SP1 and SP2 may include a transparent conductive material. The first pattern P1 and the second pattern P2 may include a metal material.

Different from the first connection part CP1 that extends in the second direction DR2 as shown in FIG. 10A, the first pattern P1 and the second pattern P2 extend in an oblique direction crossing the first direction DR1 and the second direction DR2. Since a user's perception with respect to the oblique direction is relatively inferior than that with respect to the first direction DR1 and the second direction DR2 due to the characteristics of human vision, the first and second patterns P1 and P2 including the metal material is perceived relatively less by the user.

In the illustrated exemplary embodiment, the opening SP2-OP is defined through the second sensor part SP2, but the opening SP2-OP may be defined in the second connection part CP2 according to other exemplary embodiments. In this case, the third pattern P3 is disposed in the opening defined through the second connection part CP2.

As shown in FIGS. 20A and 20B, a first connection part CP1 may be electrically connected to each of first sensor parts SP1 through a plurality of first connection contact holes CNT-I (hereinafter, referred to as first connection contact holes). As shown in FIGS. 20A and 20B, a left end of the first connection part CP1 is electrically connected to the first sensor part SP1 disposed at a left side thereof through two first connection contact holes CNT-I, and a right end of the first connection part CP1 is electrically connected to the first sensor part SP1 disposed at a right side thereof through two first connection contact holes CNT-I.

As described above, since the first connection part CP1 is electrically connected to the first sensor part SP1 through the first connection contact holes CNT-I, a contact resistance may be reduced. The connection relation between the connection part and the sensor part through the connection contact holes may be applied to other exemplary embodiments of the invention.

Different from the first connection part CP1 that extends in the second direction DR2 as shown in FIG. 10A, a first connection part CP1 shown in FIG. 21 extends in an oblique direction crossing the first direction DR1 and the second direction DR2 to reduce the visibility. The input sensing unit ISU may further include an electrostatic discharge pattern ESD-P. FIG. 21 shows two electrostatic discharge patterns ESD-P as a representative example. The electrostatic discharge pattern ESD-P may be connected to the second sensing part SP2 through the first connection contact hole CNT-I.

One end of the electrostatic discharge pattern ESD-P may overlap the first sensor part SP1. A vertex may be provided at the one end of the electrostatic discharge pattern ESD-P overlapped with the first sensor part SP1 to easily discharge the static electricity. In other words, the electrostatic discharge pattern ESD-P may have a needle shape, and the vertex portion of the electrostatic discharge pattern ESD-P may overlap the first sensor part SP1.

When viewed in a plan view, the electrostatic discharge pattern ESD-P is disposed to be more adjacent to the first sensing part SP1 than the first connection part CP1. In other words, the electrostatic discharge pattern ESD-P is disposed to be farther from a point at which the first connection part CP1 crosses the second connection part CP2. The static electricity is induced to the vertex, and thus the first connection part CP1 may be prevented from being disconnected.

In the exemplary embodiment of the invention, the electrostatic discharge pattern ESD-P may be connected to the first sensing part SP1 through the first connection contact hole CNT-I. The one end of the electrostatic discharge pattern ESD-P, at which the vertex is provided, may overlap the second sensor part SP2.

Figure 22A:
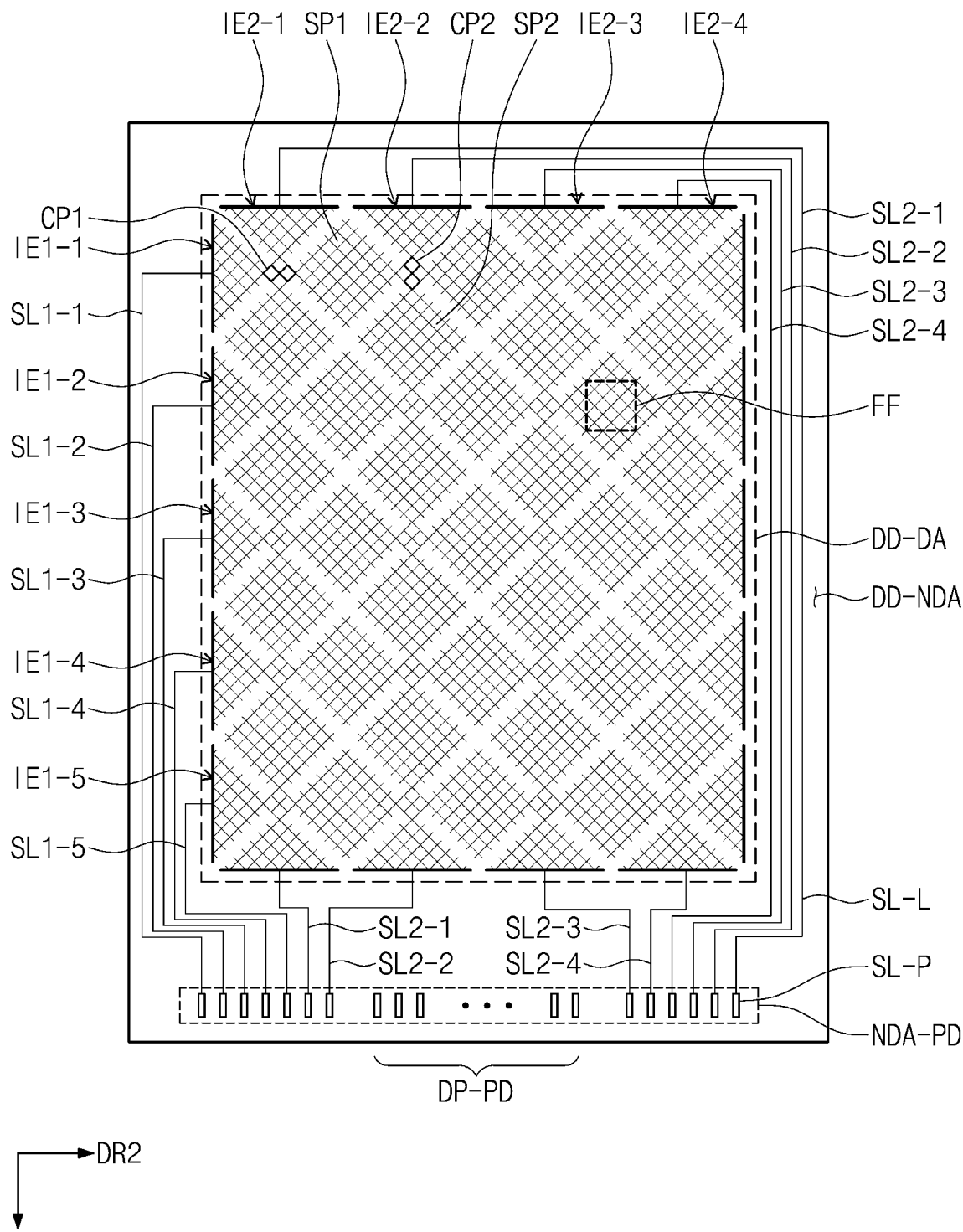
FIG. 22A is a plan view showing an exemplary embodiment of an input sensing unit according to the invention.
Figure 22B:
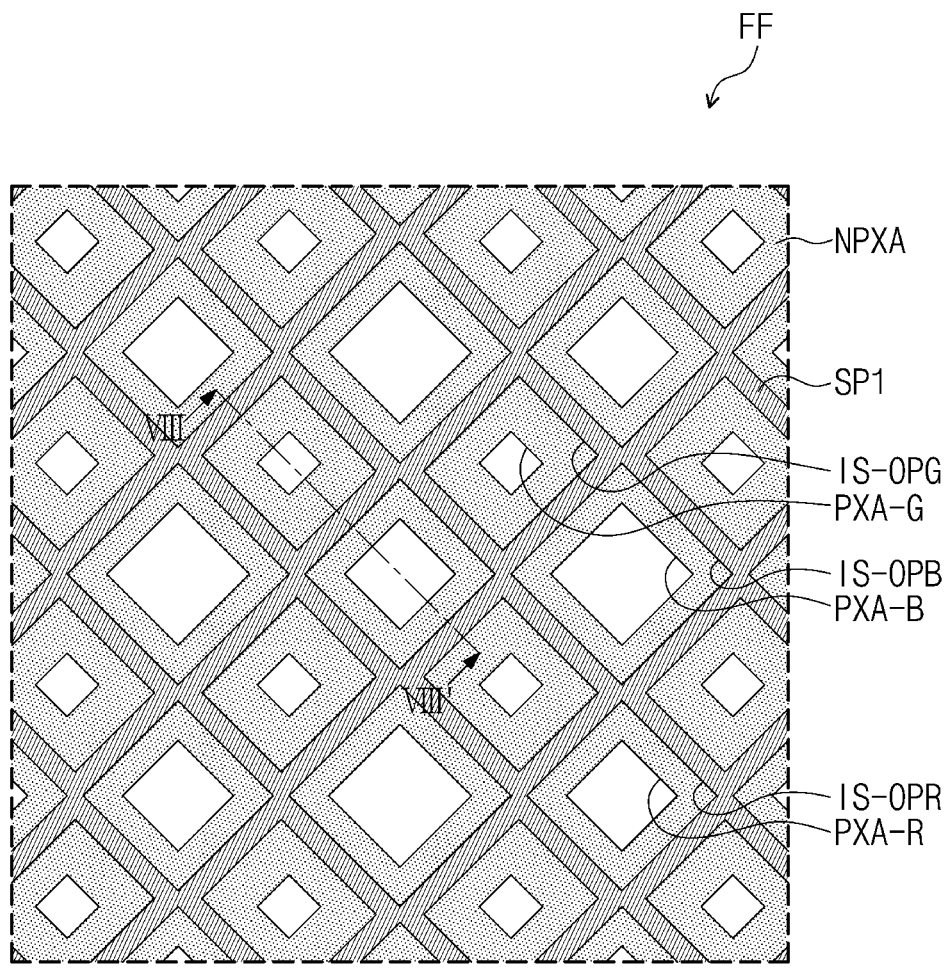
FIG. 22B is a plan view showing an area "FF" of the input sensing unit shown in FIG. 22A.
Figure 22C:
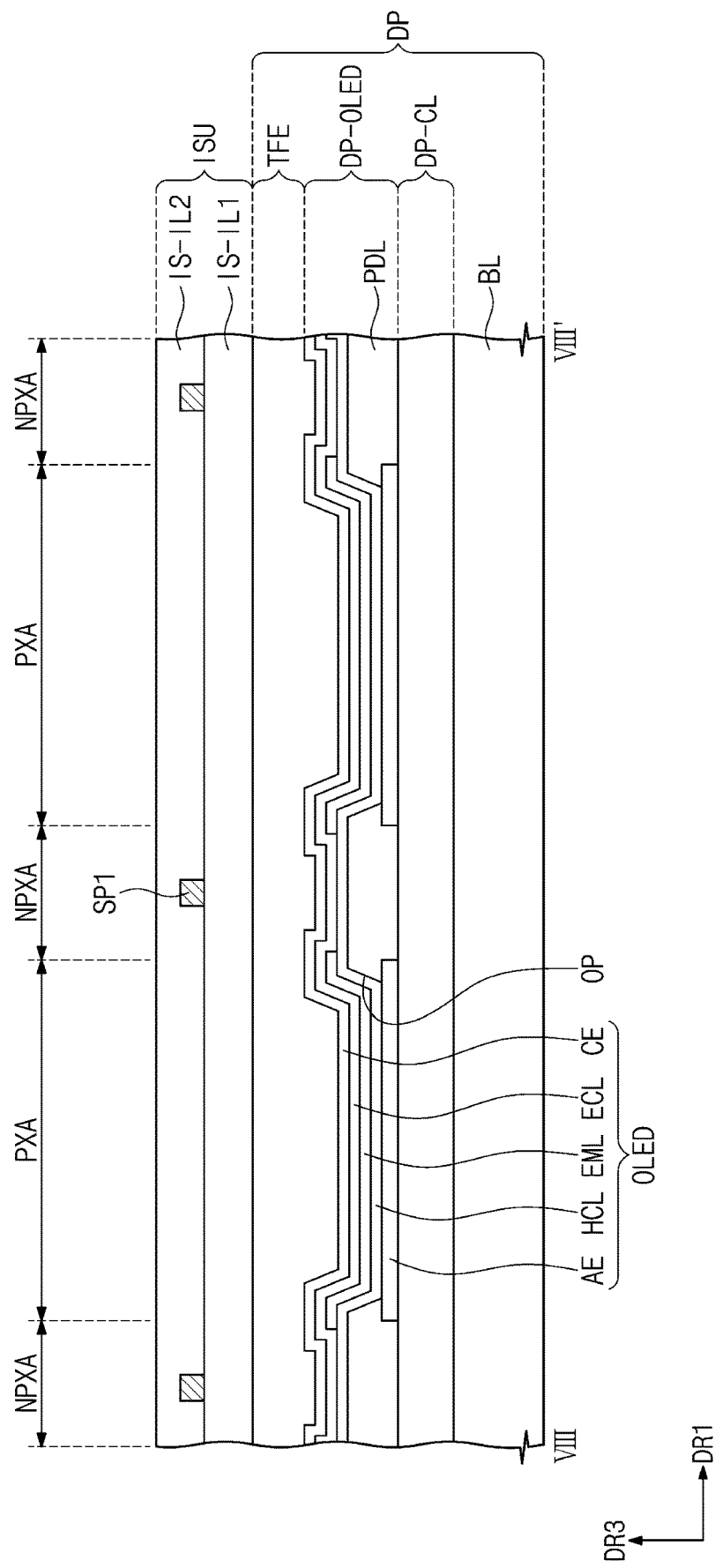
FIGS. 22C and 22D are cross-sectional views taken along line VIII-VIII' of FIG. 22B.
Figure 22D:
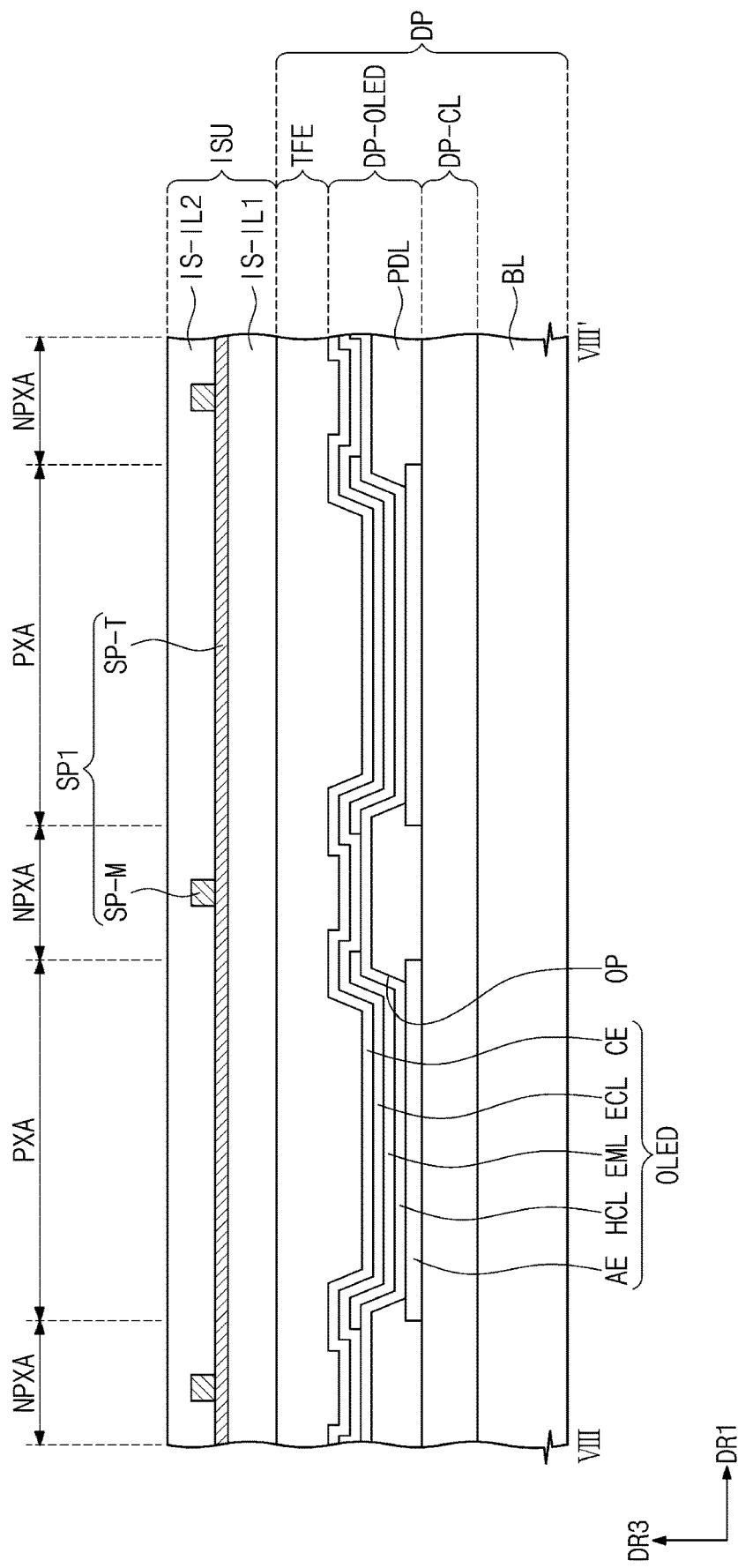

FIG. 22A is a plan view showing an input sensing unit ISU according to an exemplary embodiment of the invention. FIG. 22B is a plan view showing an area "FF" of the input sensing unit ISU shown in FIG. 22A. FIGS. 22C and 22D are cross-sectional views taken along line VIII-VIII' of FIG. 22B. FIG. 22A corresponds to FIG. 10A. In FIGS. 22A to 22D, detailed descriptions of the same elements as those of FIGS. 1 to 15F will be omitted. Hereinafter, the circuit element layer DP-CL will be simply shown. The exemplary embodiments described with reference to FIGS. 16A to 21 may be applied to the input sensing unit ISU described hereinafter.

As shown in FIG. 22A, first sensing electrodes IE1-1 to IE1-5 and second sensing electrodes IE2-1 to IE2-4 may have a mesh shape. Since the first sensing electrodes IE1-1 to IE1-5 and the second sensing electrodes IE2-1 to IE2-4 have the mesh shape, a parasitic capacitance between the sensing electrodes and the electrodes of the display panel DP (refer to FIG. 9) may be reduced. In addition, the first sensing electrodes IE1-1 to IE1-5 and the second sensing electrodes IE2-1 to IE2-4 do not overlap light emitting areas PXA-R, PXA-G, and PXA-B, and thus the first sensing electrodes IE1-1 to IE1-5 and the second sensing electrodes IE2-1 to IE2-4 are not perceived by the user.

In an exemplary embodiment, the first sensing electrodes IE1-1 to IE1-5 and the second sensing electrodes IE2-1 to IE2-4 having the mesh shape may include a material that may be applied with a low temperature process, such as silver, aluminum, copper, chromium, nickel, titanium, etc., but they should not be limited thereto or thereby. Although the input sensing unit ISU is provided by a continuous process, the organic light emitting diode OLED (refer to FIG. 6) may be prevented from being damaged.

As shown in FIGS. 22B and 22C, the first sensor part SP1 overlaps the non-light emitting area NPXA and does not overlap the light emitting areas PXA-R, PXA-G, and PXA-B. Each of the light emitting areas PXA-R, PXA-G, and PXA-B may be defined to be the same as the light emitting area PXA shown in FIG. 6.

Mesh lines of the first sensor part SP1 may define a plurality of mesh holes IS-OPR, IS-OPG, and IS-OPB (hereinafter, referred to as mesh holes). The mesh lines may have a three-layer structure of titanium/aluminum/titanium. The mesh holes IS-OPR, IS-OPG, and IS-OPB may correspond to the light emitting areas PXA-R, PXA-G, and PXA-B in a one-to-one correspondence.

The light emitting areas PXA-R, PXA-G, and PXA-B may be grouped into a plurality of groups depending on a color of a light generated by the organic light emitting diodes OLED. FIG. 22B shows the light emitting areas PXA-R, PXA-G, and PXA-B grouped into three groups depending on a light emitting color.

The light emitting areas PXA-R, PXA-G, and PXA-B may have different areas from each other depending on the color of the light emitted from the light emitting layer EML of the organic light emitting diode OLED. The areas of the light emitting areas PXA-R, PXA-G, and PXA-B may be determined depending on the type of the organic light emitting diode.

The mesh holes IS-OPR, IS-OPG, and IS-OPB may be grouped into a plurality of groups having different areas from each other. The mesh holes IS-OPR, IS-OPG, and IS-OPB may be grouped into three groups according to corresponding light emitting areas PXA-R, PXA-G, and PXA-B.

In the above-described embodiment, the mesh holes IS-OPR, IS-OPG, and IS-OPB respectively correspond to the light emitting areas PXA-R, PXA-G, and PXA-B. However, according to other exemplary embodiments, each of the mesh holes IS-OPR, IS-OPG, and IS-OPB may correspond to two or more light emitting areas among the light emitting areas PXA-R, PXA-G, and PXA-B.

In addition, the light emitting areas PXA-R, PXA-G, and PXA-B have different areas as described above. However, according to other exemplary embodiments, the light emitting areas PXA-R, PXA-G, and PXA-B may have the same size, and the mesh holes IS-OPR, IS-OPG, and IS-OPB may have the same size. The shape of the mesh holes IS-OPR, IS-OPG, and IS-OPB when viewed in a plan view should not be limited to that of FIG. 22B. That is, the mesh holes IS-OPR, IS-OPG, and IS-OPB may have a polygonal shape different from a lozenge shape, for example. The shape of the mesh holes IS-OPR, IS-OPG, and IS-OPB may have a polygonal shape with a rounded corner when viewed in a plan view, for example.

As shown in FIG. 22D, the first sensor part SP1 according to the exemplary embodiment of the invention may have a multi-layer structure. The first sensor part SP1 may include a transparent conductive oxide layer SP-T and a mesh line layer SP-M, which are sequentially stacked (which contact with each other). The transparent conductive oxide layer SP-T may overlap the light emitting areas PXA-R, PXA-G, and PXA-B (refer to FIG. 22B). The stacking order of the transparent conductive oxide layer SP-T and the mesh line layer SP-M should not be limited thereto or thereby.

Although not shown in the drawings, other conductive patterns provided from the second conductive layer IS-CL2, e.g., the second sensor parts SP2 (refer to FIGS. 10A and 22A) and the second connection parts CP2 (refer to FIGS. 10A and 22A), may have the same stacking structure as the first sensor part SP1.

FIGS. 23A to 23F are cross-sectional views showing a display device DD according to an exemplary embodiment of the invention. In FIGS. 23A to 23F, detailed descriptions of the same elements as those of FIGS. 1 to 15F will be omitted. The exemplary embodiments described with reference to FIGS. 16A to 22D may be applied to an input sensing unit ISU described below.

Figure 23A:
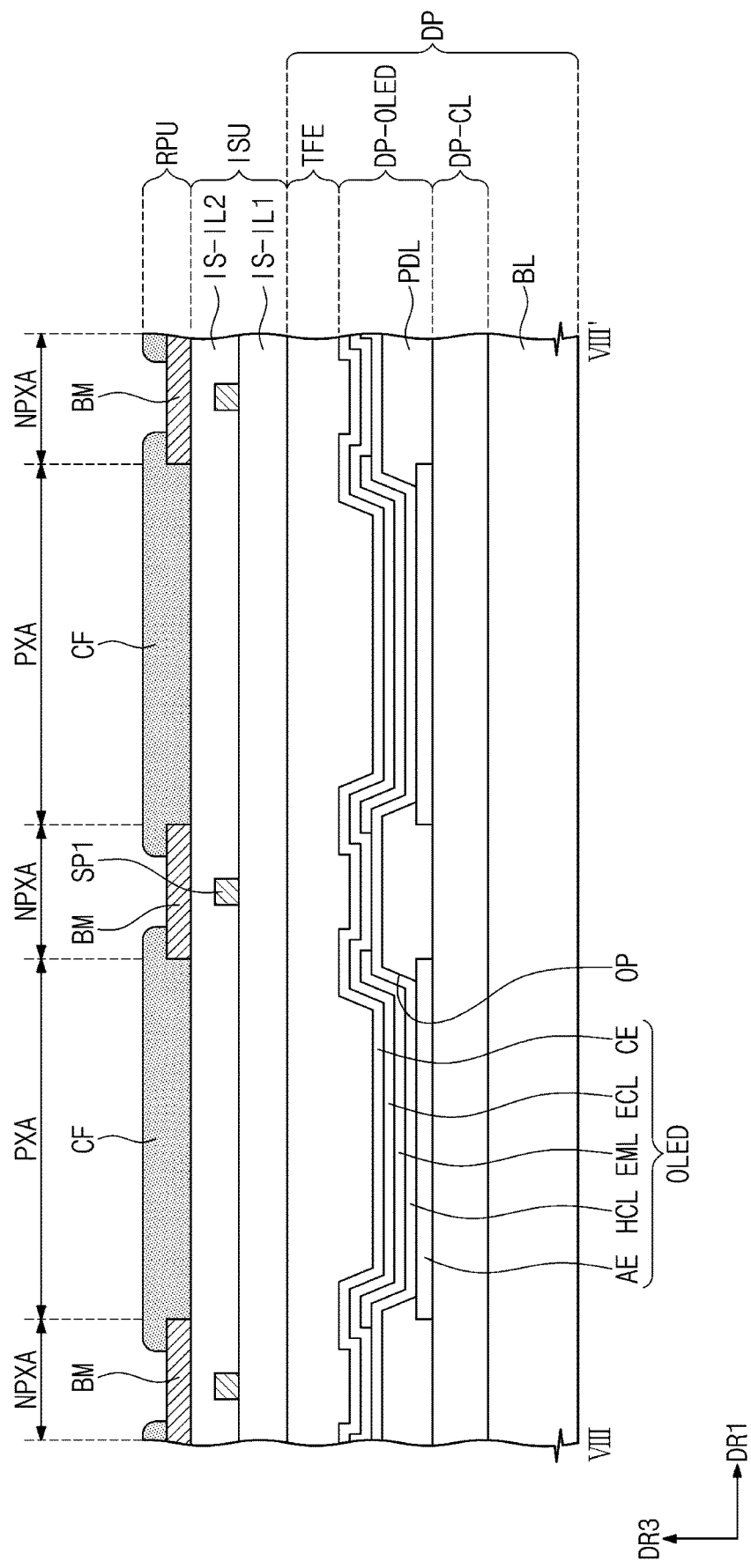
FIGS. 23A to 23F are cross-sectional views showing an exemplary embodiment of a display device according to the invention.
Figure 23B:
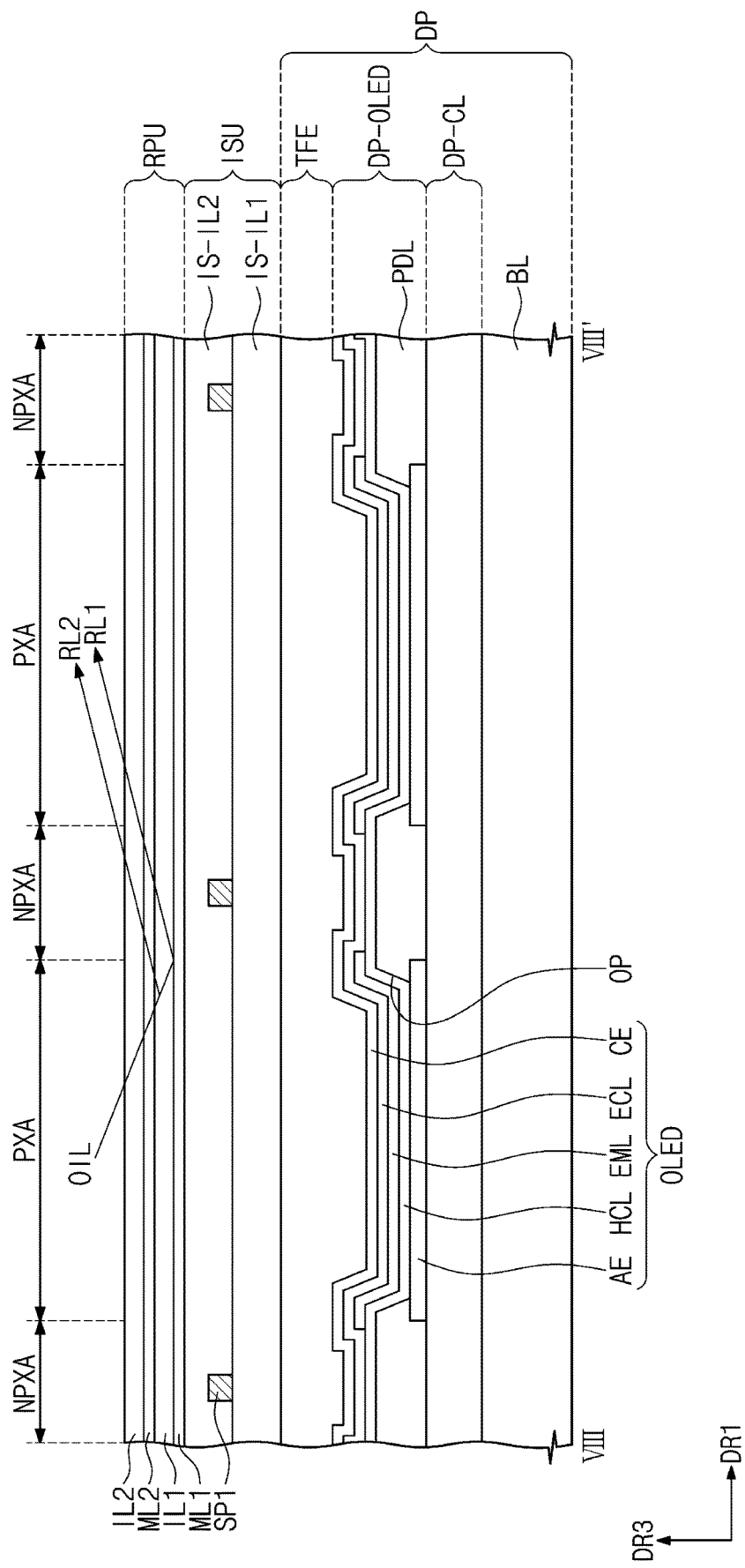
Figure 23C:
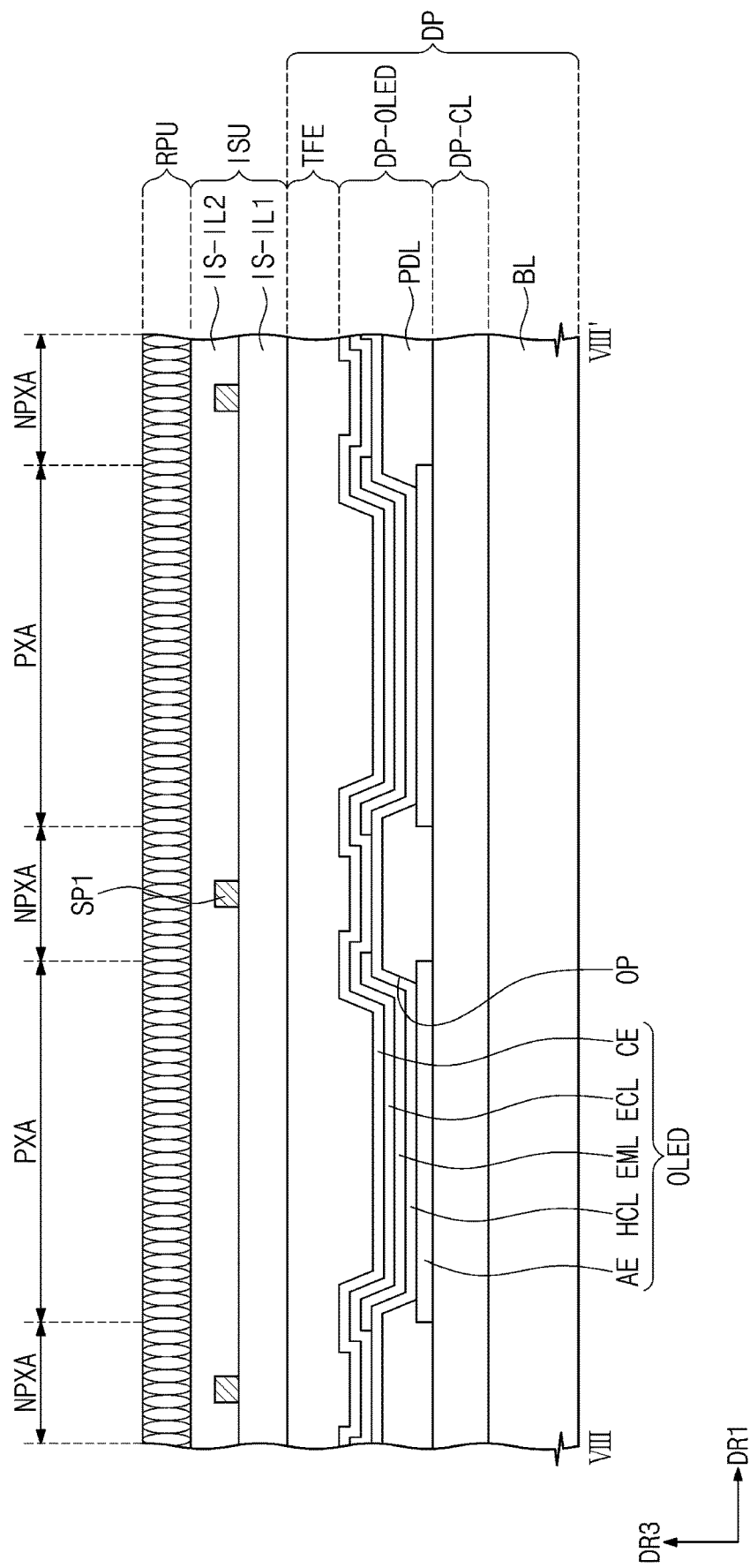

FIGS. 23A to 23F show the cross-sectional views corresponding to FIG. 22C. In the illustrated exemplary embodiment, a sensing electrode having a mesh shape is shown as a representative example, but the shape of the sensing electrode should not be limited to the mesh shape. FIGS. 23A to 23C specifically shows the anti-reflection unit having the "layer" shape described with reference to FIGS. 2A to 2F.

Referring to FIG. 23A, an anti-reflection unit RPU includes a black matrix BM and color filters CF, which are directly disposed on a second insulating layer IS-IL2. The black matrix BM overlaps the non-light emitting area NPXA, and the color filters CF overlap the light emitting areas PXA, respectively. The color filters CF include a plurality of color filter groups. In an exemplary embodiment, the color filters CF may include red color filters, green color filters, and blue color filters, for example. However, the invention is not limited thereto, and the color filters CF may include a gray filter, for example.

In the illustrated exemplary embodiment, the black matrix BM includes a material to block a light. In an exemplary embodiment, the black matrix BM may include an organic material having a high light absorption rate, for example. The black matrix BM may include a black dye or pigment. In an exemplary embodiment, the black matrix BM includes a photosensitive organic material, e.g., a colorant like dye and pigment. The black matrix BM may have a single-layer structure or a multi-layer structure.

The black matrix BM and the color filters CF may form a step difference. Depending on the order of formation of the black matrix BM and the color filters CF, the black matrix BM may cover portions of the color filters CF, or the color filters CF may cover portions of the black matrix BM. The color filters CF may overlap each other in an area that overlaps the black matrix BM.

The color filters CF not only transmits a light generated by organic light emitting diodes OLED but also reduces a reflectance of a light (hereinafter, referred to as an "external light") incident thereto from an external source (not shown). An amount of the external light is reduced to about ⅓ while passing through the color filters CF. A portion of the external light passing through the color filters CF becomes extinct, and the other portion of the external light is reflected by components, e.g., a display element layer DP-OLED and a thin film encapsulation layer TFE, which are disposed under the color filters CF. The reflected light is incident again to the color filters CF. A brightness of the reflected light is reduced when the reflected light passes through the color filters CF. Consequently, only a portion of the external light is reflected by the display device. That is, the reflectance of the external light is reduced.

Referring to FIG. 23B, an anti-reflection unit RPU may include metal-containing layers ML1 and ML2 that overlap the display area DD-DA (refer to FIG. 22A) and the non-display area DD-NDA (refer to FIG. 22A) and dielectric layers IL1 and IL2 that overlap the display area DD-DA and the non-display area DD-NDA. In the exemplary embodiment, the anti-reflection unit RPU includes two metal-containing layers ML1 and ML2 and two dielectric layers IL1 and IL2. The metal-containing layers ML1 and ML2 correspond to reflective layers, and the dielectric layers control a condition of destructive interference.

The metal-containing layers ML1 and ML2 may be alternately stacked with the dielectric layers IL1 and IL2. However, the stacking order of the metal-containing layers ML1 and ML2 and the dielectric layers IL1 and IL2 should not be particularly limited. A first metal-containing layer ML1 among the metal-containing layers ML1 and ML2 may include a metal material with an absorption rate of about 30% or above. The first metal-containing layer ML1 may be a material having a refractive index (n) of about 1.5 to about 1.7 and an absorption coefficient (k) of about 1.5 to about 7. The first metal-containing layer ML1 may include one or more of chromium (Cr), molybdenum (Mo), tungsten (W), titanium (Ti), nickel (Ni), cobalt (Co), copper oxide (CuO), titanium nitride ($TiN_x$), and nickel sulphide (NiS). The first metal-containing layer ML1 may be, but not limited to, a metal layer including one of the above-mentioned metal materials. A second metal-containing layer ML2 among the first metal-containing layers ML1 and ML2 may include the metals materials.

In an exemplary embodiment, first and second dielectric layers IL1 and IL2 among the dielectric layers ML1 and ML2 may include at least one of silicon oxide ($SiO_2$), titanium oxide ($TiO_2$), lithium fluoride (LiF), calcium fluoride ($CaF_2$), magnesium fluoride ($MaF_2$), silicon nitride ($SiN_x$), tantalum oxide ($Ta_2O_5$), niobium oxide ($Nb_2O_5$), silicon carbon nitride (SiCN), molybdenum oxide ($MoO_x$), iron oxide ($FeO_x$), and chromium oxide ($CrO_x$), for example.

A portion of a light OIL incident from the outside is reflected by the first metal-containing layer ML1 (hereinafter, the reflected light by the first metal-containing layer ML1 will be referred to as a "first reflective light RL1"), and the other portion of the light OIL incident from the outside is reflected by the second metal-containing layer ML2 (hereinafter, the reflected light by the second metal-containing layer ML2 will be referred to as a "second reflective light RL2"). The first dielectric layer IL1 controls a phase of the light passing through the first dielectric layer IL1 such that a difference in phase between the first reflective light RL1 and the second reflective light RL2 becomes about 180 degrees. Accordingly, the first reflective light RL1 and the second reflective light RL2 destructively interfere with each other.

A thickness and a material of the first metal-containing layer ML1, the second metal-containing layer ML2, the first dielectric layer IL1, and the second dielectric layer IL2 may be selected to satisfy a condition that the first reflective light RL1 and the second reflective light RL2 destructively interfere with each other.

Referring to FIG. 23C, an anti-reflection unit RPU may include liquid crystals aligned in a predetermined direction. In an exemplary embodiment, the anti-reflection unit RPU may include a discotic liquid crystal layer having a tilt angle in one direction, for example. The anti-reflection unit RPU may have a function of a polarizer. The anti-reflection unit RPU may include a plurality of liquid crystal layers.

The above-mentioned anti-reflection units RPU are directly disposed on the input sensing unit ISU, but the stacking order of the anti-reflection units RPU may be changed.

Figure 23D:
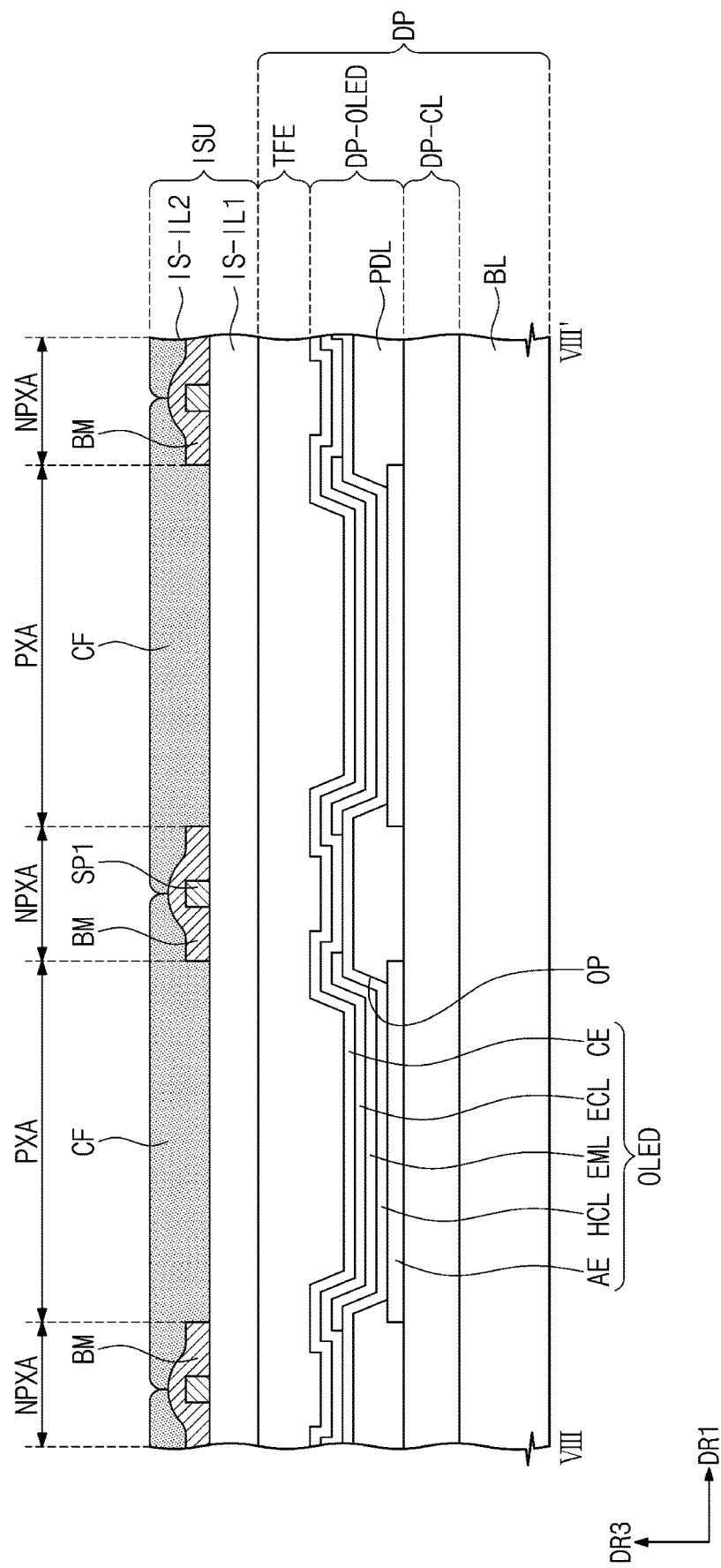

FIG. 23D specifically shows an input sensing layer ISL-1 having the function of the anti-reflection unit described with reference to FIG. 2E. A second insulating layer IS-IL2 may include a black matrix BM and color filters CF. In the exemplary embodiment of the invention, not the second insulating layer IS-IL2 but a first insulating layer IS-IL1 may include the black matrix BM and the color filters CF. Detailed descriptions of the black matrix BM and the color filters CF are as described with reference to FIG. 23A.

Figure 23E:
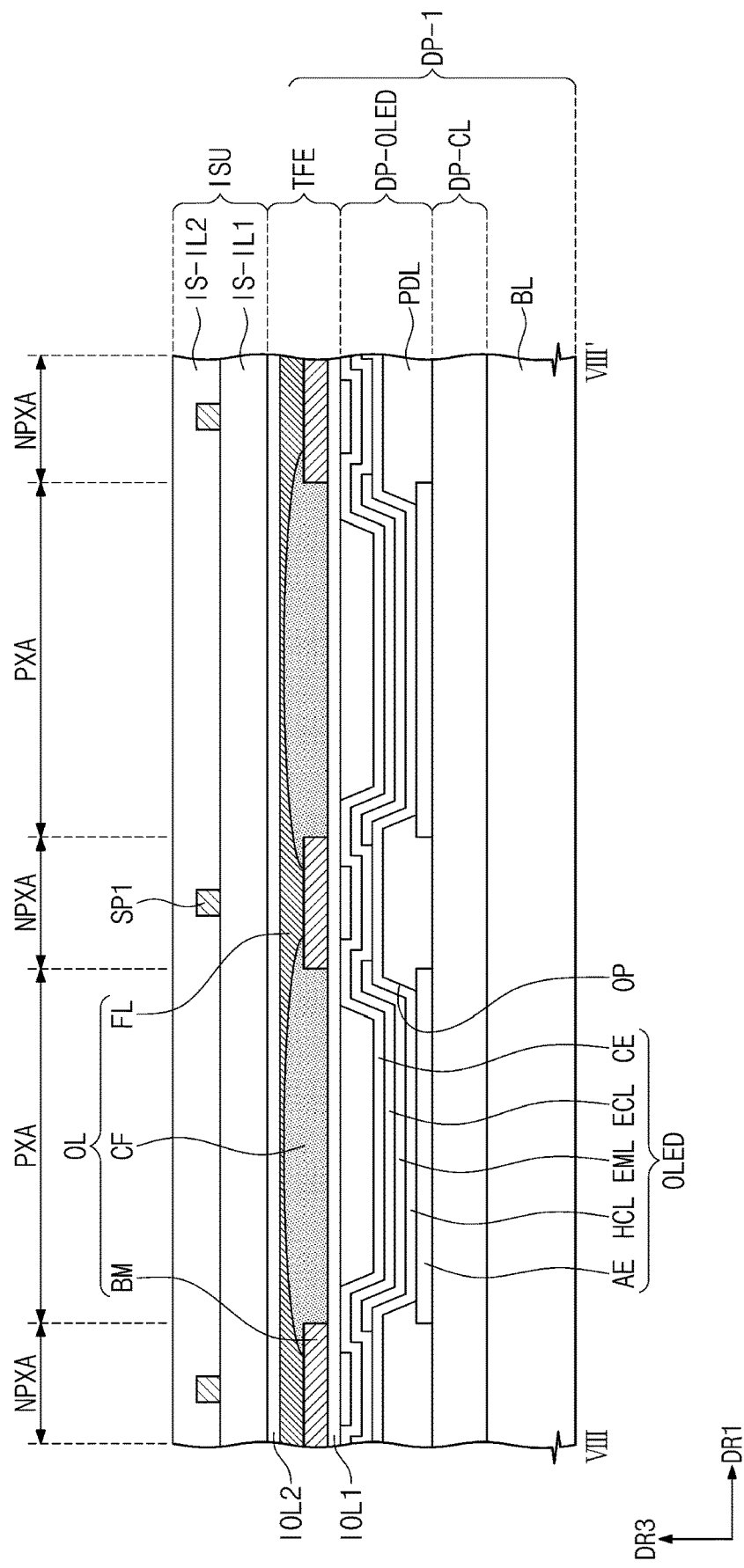

FIG. 23E specifically shows a display panel DP-1 having the function of the anti-reflection unit described with reference to FIG. 2F. As shown in FIG. 23E, an encapsulation organic layer OL included in a thin film encapsulation layer TFE may include a black matrix BM, color filters CF, and a planarization layer FL. An arrangement between the black matrix BM and the color filters CF may be the same as the anti-reflection layer RPL shown in FIG. 23A, and thus details thereof will be omitted. The planarization layer FL planarizes an upper surface on which a step difference occurs by the black matrix BM and the color filters CF to provide the planarized upper surface. The planarization layer FL may be, but not limited to, an organic monomer layer.

In the front surface light emitting type display device, the black matrix BM and the color filters CF may replace an organic layer of a display panel, an organic layer of an input sensing unit, or an organic layer of a window unit as FIG. 23E. The organic layer of the display panel, the organic layer of the input sensing unit, and the organic layer of the window unit are disposed on the display element layer DP-OLED. Therefore, the input sensing unit, the input sensing unit, or the window unit has an anti-reflection function.

Figure 23F:
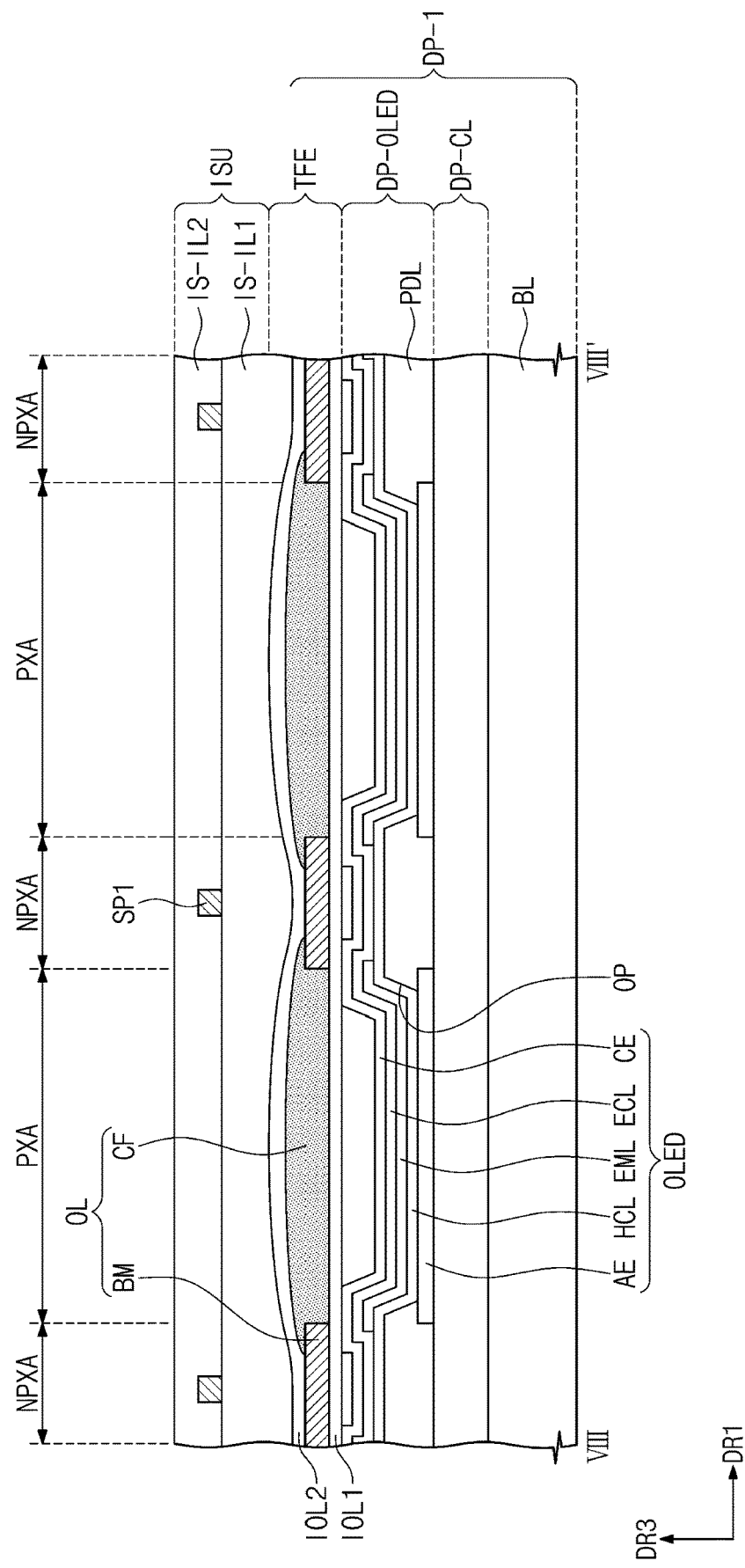

In a display panel DP-1 shown in FIG. 23F, the planarization layer FL may be omitted compared to the display panel DP-1 shown in FIG. 23E. A first insulating layer IS-IL1 may include an organic material and planarize an upper surface on which a step difference occurs by the black matrix BM and the color filters CF to provide the planarized upper surface.

Figure 24A:
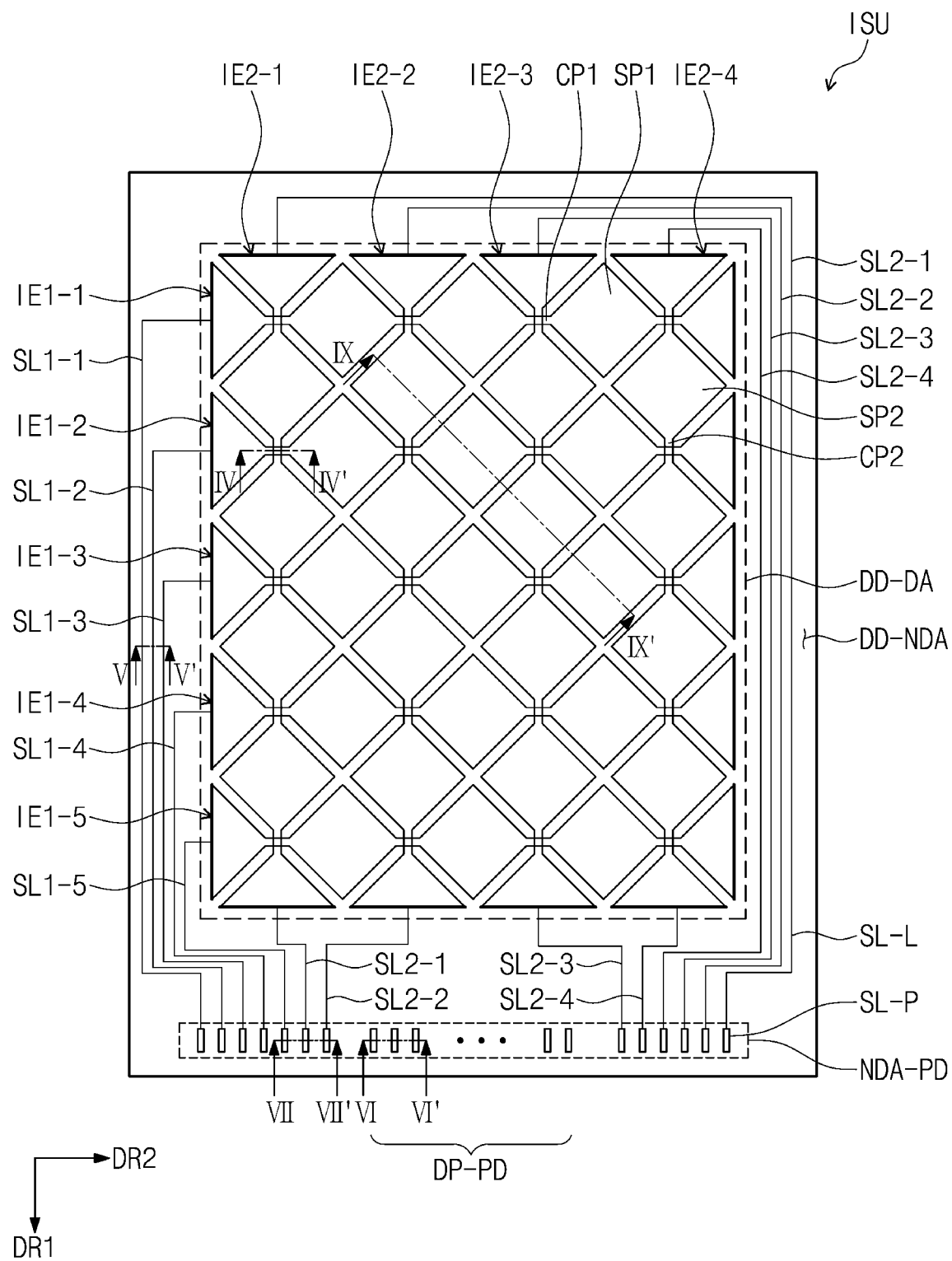
FIG. 24A is a plan view showing an exemplary embodiment of an input sensing unit according to the invention.
Figure 24B:
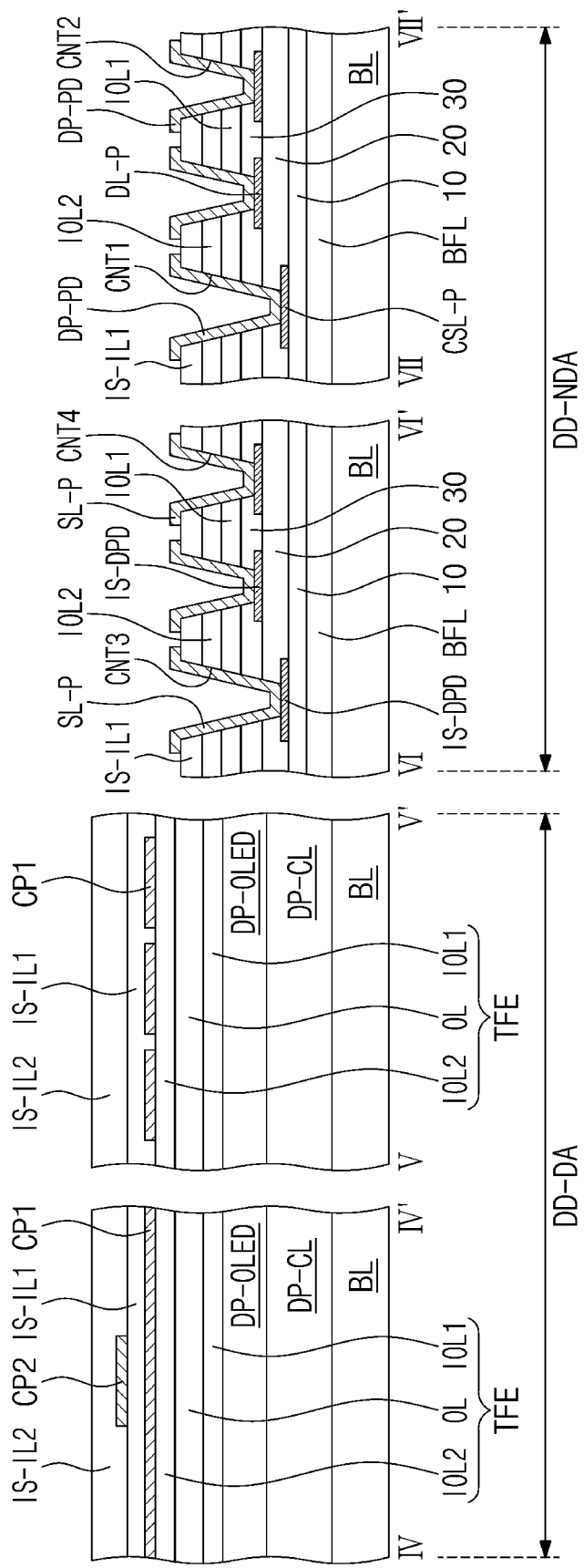
FIG. 24B is a cross-sectional view showing an exemplary embodiment of a display device according to the invention.
Figure 24C:
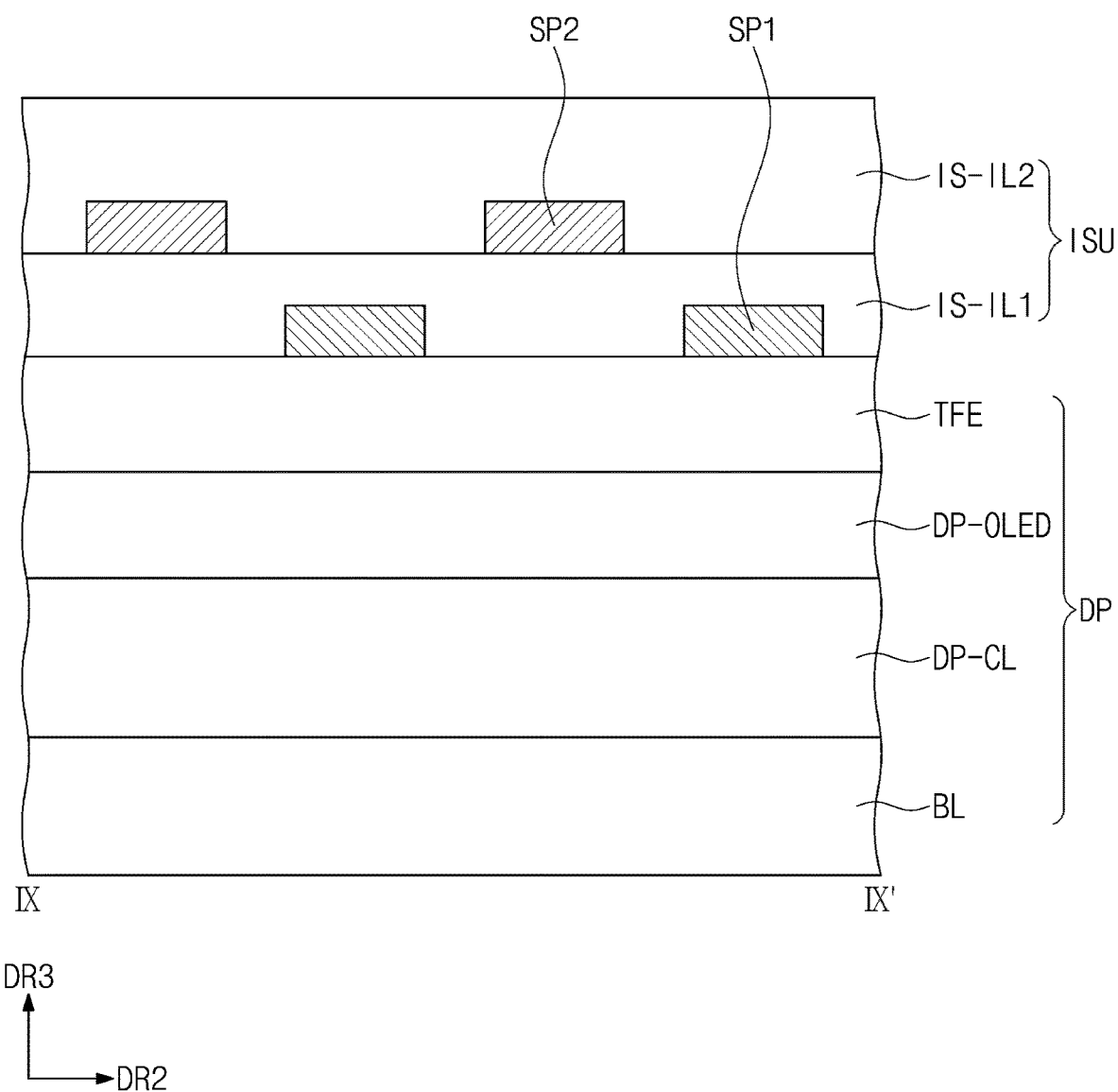
FIG. 24C is a cross-sectional view showing an exemplary embodiment of a display device according to the invention.

FIG. 24A is a plan view showing an input sensing unit ISU according to an exemplary embodiment of the invention. FIG. 24B is a cross-sectional view showing a display device DD according to an exemplary embodiment of the invention. FIG. 24C is a cross-sectional view showing a display device according to an exemplary embodiment of the invention. In FIGS. 24A to 24C, detailed descriptions of the same elements as those of the display device DD described with reference to FIGS. 1 to 15F will be omitted. The exemplary embodiments described with reference to FIGS. 22A to 23F may be applied to the display device DD described below.

FIG. 24A shows a plan view corresponding to FIG. 10A, and FIG. 24B shows a cross-sectional view corresponding to FIG. 14E. According to the illustrated exemplary embodiment, first sensing electrodes IE1-1 to IE1-5 are provided from the first conductive layer IS-CL1 (refer to FIG. 9), and second sensing electrodes IE2-1 to IE2-4 are provided from the second conductive layer IS-CL2 (refer to FIG. 9). Accordingly, the first connection contact holes CNT-I described with reference to FIGS. 11A to 11C may be omitted. A driving method of the input sensing unit ISU according to the illustrated exemplary embodiment should not be particularly limited, and an external input may be sensed by a mutual capacitance method and/or a self-capacitance method.

First signal lines SL1-1 to SL1-5 and second signal lines SL2-1 to SL2-4 may be the same as those described with reference to FIGS. 11A to 13C. In the exemplary embodiment of the invention, the first signal lines SL1-1 to SL1-5 may include only first line parts SL1-11 to SL1-51 provided by a first conductive layer IS-CL1, and the second signal lines SL2-1 to SL2-4 may include only second line parts SL2-12 to SL2-43 provided by a second conductive layer IS-CL2.

In the exemplary embodiment of the invention, the first conductive layer IS-CL1 (refer to FIG. 9) and the second conductive layer IS-CL2 (refer to FIG. 9) include a conductive polymer, and the first insulating layer IS-IL1 (refer to FIG. 9) and the second insulating layer IS-IL2 (refer to FIG. 9) include an insulating polymer. In the case that the first conductive layer IS-CL1, the second conductive layer IS-CL2, the first insulating layer IS-IL1, and the second insulating layer IS-IL2 have different conductivities and include the polymer, the first conductive layer IS-CL1, the second conductive layer IS-CL2, the first insulating layer IS-IL1, and the second insulating layer IS-IL2 may be provided by a continuous process in the same chamber, and thus a manufacturing time may be shortened. In addition, since the polymer has a small elastic modulus, the polymer may be applied to a flexible display device.

FIG. 24C shows a cross-sectional view taken along line IX-IX' of FIG. 24A. FIG. 24C shows the first insulating layer IS-IL1 that provides a flat upper surface as a representative example, but the first insulating layer IS-IL1 may have a step difference. In the illustrated exemplary embodiment, a difference in reflectance between the first sensing electrodes IE1-1 to IE1-5 and the second sensing electrodes IE2-1 to IE2-4 disposed on a different layer from that of the first sensing electrode IE1-1 to IE1-5 may be reduced by controlling a refractive index of the first insulating layer IS-IL1 and a refractive index of the second insulating layer IS-IL2.

The first insulating layer IS-IL1 may have a refractive index similar to a refractive index of the first sensing electrodes IE1-1 to IE1-5. The second insulating layer IS-IL2 is desired to have a refractive index smaller than that of the first insulating layer IS-IL1. In an exemplary embodiment, in a case that the first sensing electrodes IE1-1 to IE1-5 are an ITO electrode, the first insulating layer IS-IL1 has the refractive index of about 1.7 to about 1.8 with respect to a wavelength of about 550 nanometers (nm), and the second insulating layer IS-IL2 may have the refractive index between a refractive index of air and the refractive index of the first insulating layer IS-IL1, for example, about 1.5 to about 1.65, for example.

As described above, since the first and second insulating layers IS-IL1 and IS-IL2 having different refractive indices are disposed on the sensing electrode, the reflectance of the external light may be reduced, and the difference in reflectance between the first sensing electrodes IE1-1 to IE1-5 and the second sensing electrodes IE2-1 to IE2-4 disposed on the different layer from that of the first sensing electrode IE1-1 to IE1-5 may be reduced.

Figure 25A:
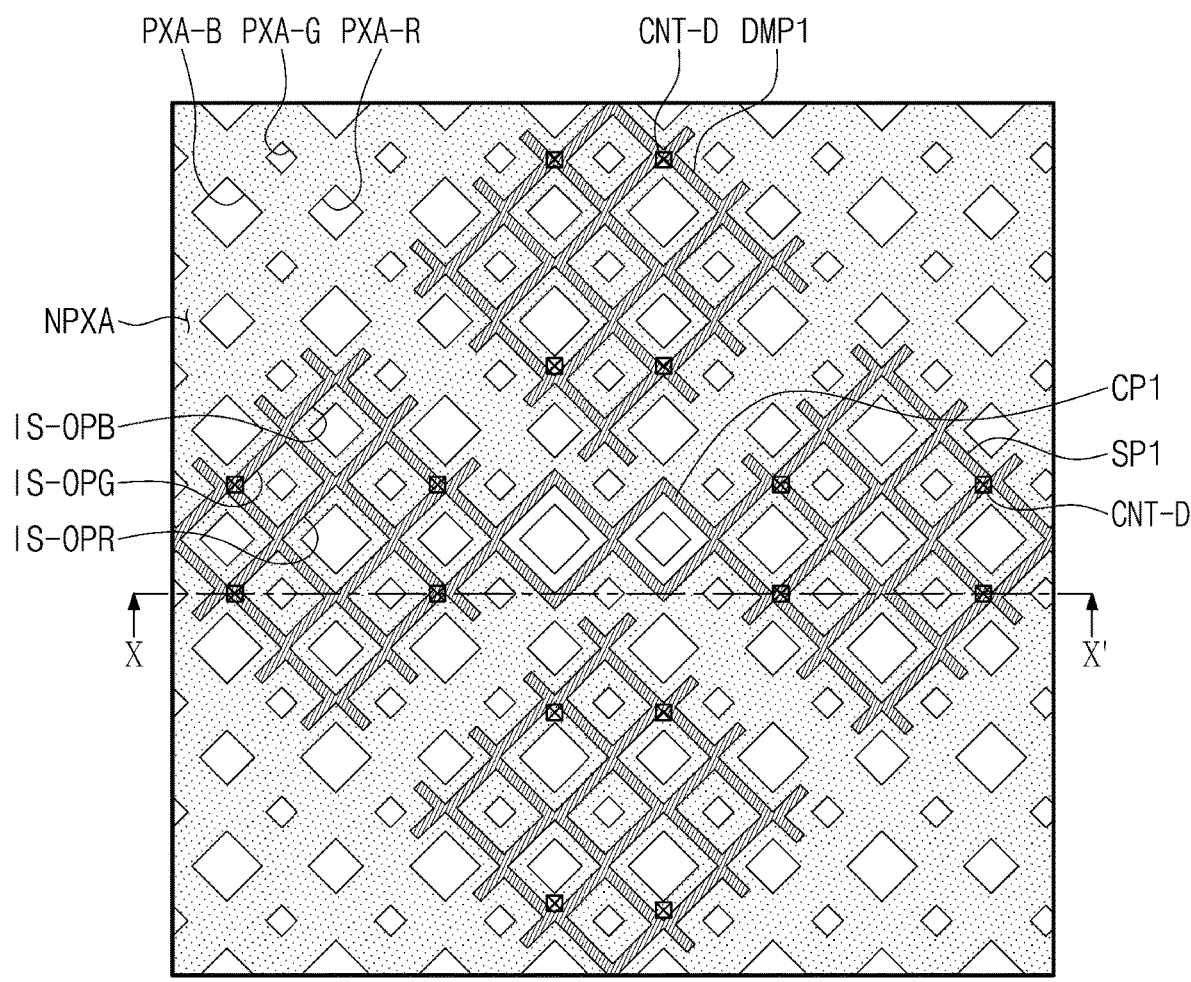
FIGS. 25A and 25B are plan views showing an exemplary embodiment of a portion of an input sensing unit according to the invention.
Figure 25B:
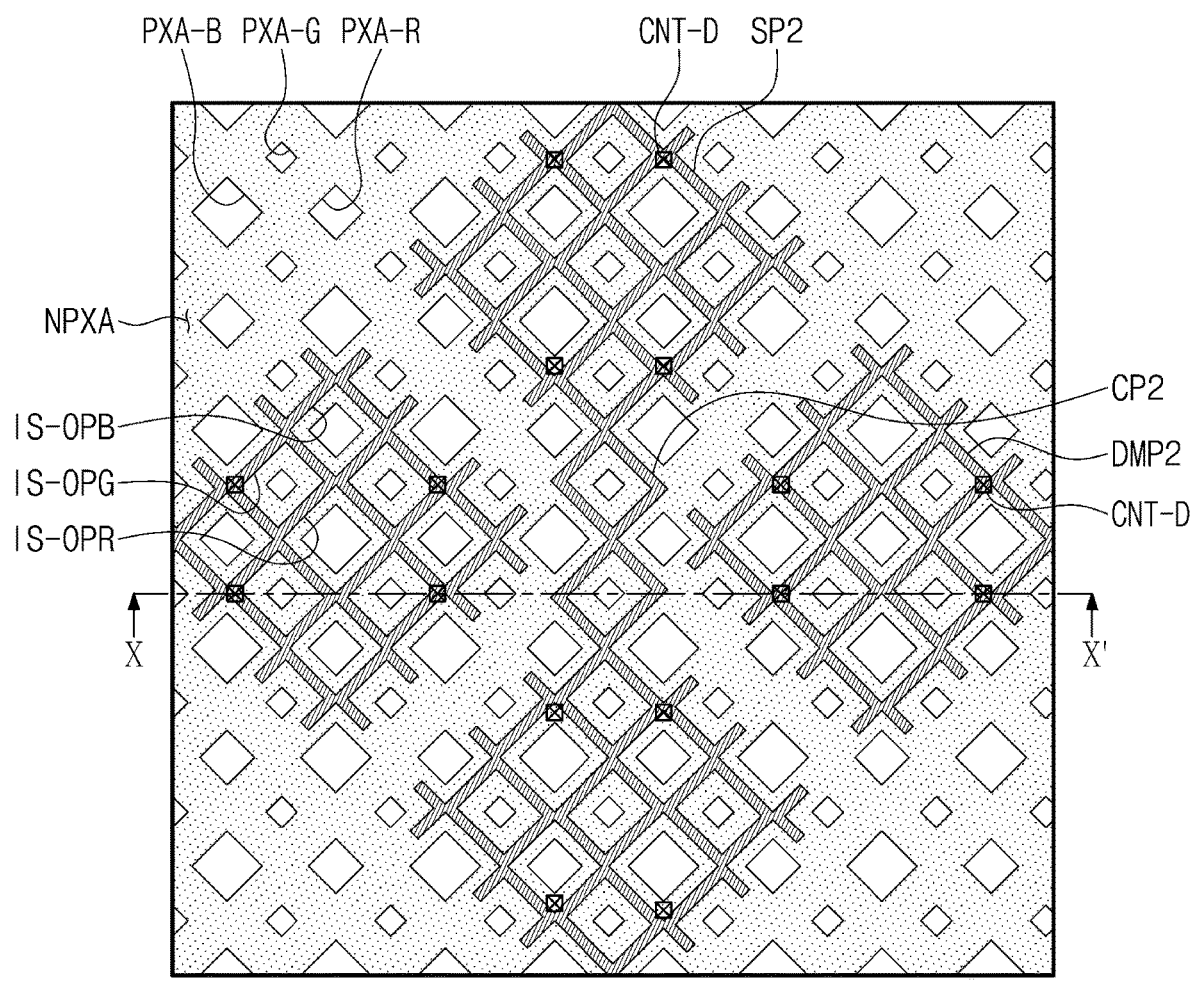
Figure 25C:
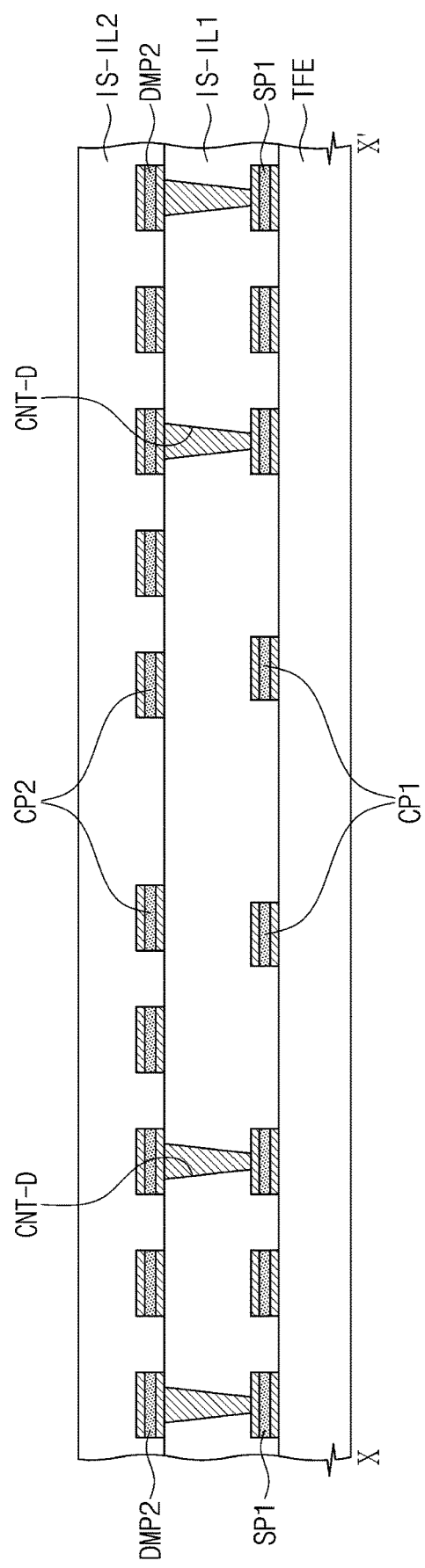
FIG. 25C is a cross-sectional view taken along line X-X' of FIGS. 25A and 25B.

FIGS. 25A and 25B are plan views showing a portion of an input sensing unit ISU according to an exemplary embodiment of the invention. FIG. 25C is a cross-sectional view taken along line X-X' of FIGS. 25A and 25B. In FIGS. 25A to 25C, detailed descriptions of the same elements as those of the display device DD described with reference to FIGS. 1 to 15F will be omitted. The exemplary embodiments described with reference to FIGS. 22A to 24C may be applied to the display device DD described below.

In the input sensing unit ISU according to the illustrated exemplary embodiment, similar to the input sensing unit ISU shown in FIGS. 24A and 24B, first sensing electrodes IE1-1 to IE1-5 are provided from the first conductive layer IS-CL1 (refer to FIG. 9), and second sensing electrodes IE2-1 to IE2-4 are provided from the second conductive layer IS-CL2 (refer to FIG. 9). Different from the input sensing unit ISU shown in FIGS. 24A and 24B, the first sensing electrodes IE1-1 to IE1-5 and the second sensing electrodes IE2-1 to IE2-4 have a mesh shape. In an exemplary embodiment, the first sensing electrodes IE1-1 to IE1-5 and the second sensing electrodes IE2-1 to IE2-4 have a three-layer structure of titanium/aluminum/titanium, for example.

The input sensing unit ISU according to the illustrated exemplary embodiment may further include first dummy electrodes DMP1 provided from the first conductive layer IS-CL1 and second dummy electrodes DMP2 provided from the second conductive layer IS-CL2. The first dummy electrodes DMP1 are connected to second sensor parts SP2 of the second sensing electrodes IE2-1 to IE2-4 through third connection contact holes CNT-D. The second dummy electrodes DMP2 are connected to first sensor parts SP1 of the first sensing electrodes IE1-1 to IE1-5 through third connection contact holes CNT-D. The first dummy electrodes DMP1 and the second dummy electrodes DMP2 may reduce a resistance of the first sensing electrodes IE1-1 to IE1-5 and the second sensing electrodes IE2-1 to IE2-4.

In the illustrated exemplary embodiment, the first dummy electrodes DMP1 have the same stacking structure and material as those of the first sensing electrodes IE1-1 to IE1-5, but the first dummy electrodes DMP1 may have different stacking structure and material from those of the first sensing electrodes IE1-1 to IE1-5 according to exemplary embodiments. In an exemplary embodiment, the first dummy electrodes DMP1 may include a transparent conductive oxide and have a shape (a shape overlapped with the light emitting areas PXA-R, PXA-G, and PXA-B) similar to that of the second sensor part of the second sensing electrodes IE2-1 to IE2-4 shown in FIG. 24A, for example. Although not shown separately, the input sensing units ISU described with reference to FIGS. 10A to 23F may further include the dummy electrodes provided from the first conductive layer IS-CL1. Each of the dummy electrodes may overlap a corresponding sensor part among the first sensor parts and the second sensor parts.

Figure 26A:
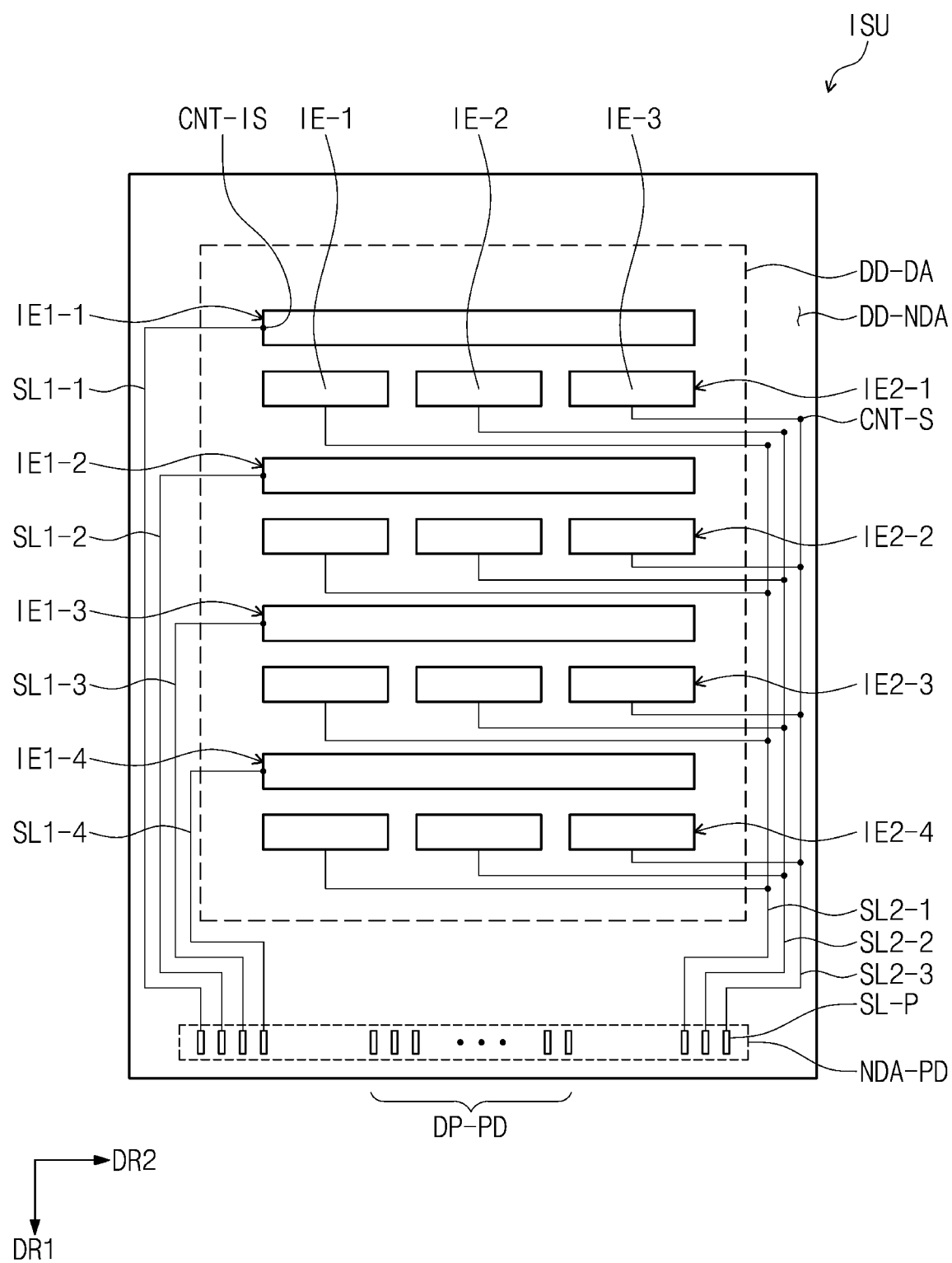
FIG. 26A is a plan view showing an exemplary embodiment of an input sensing unit according to the invention.
Figure 26B:
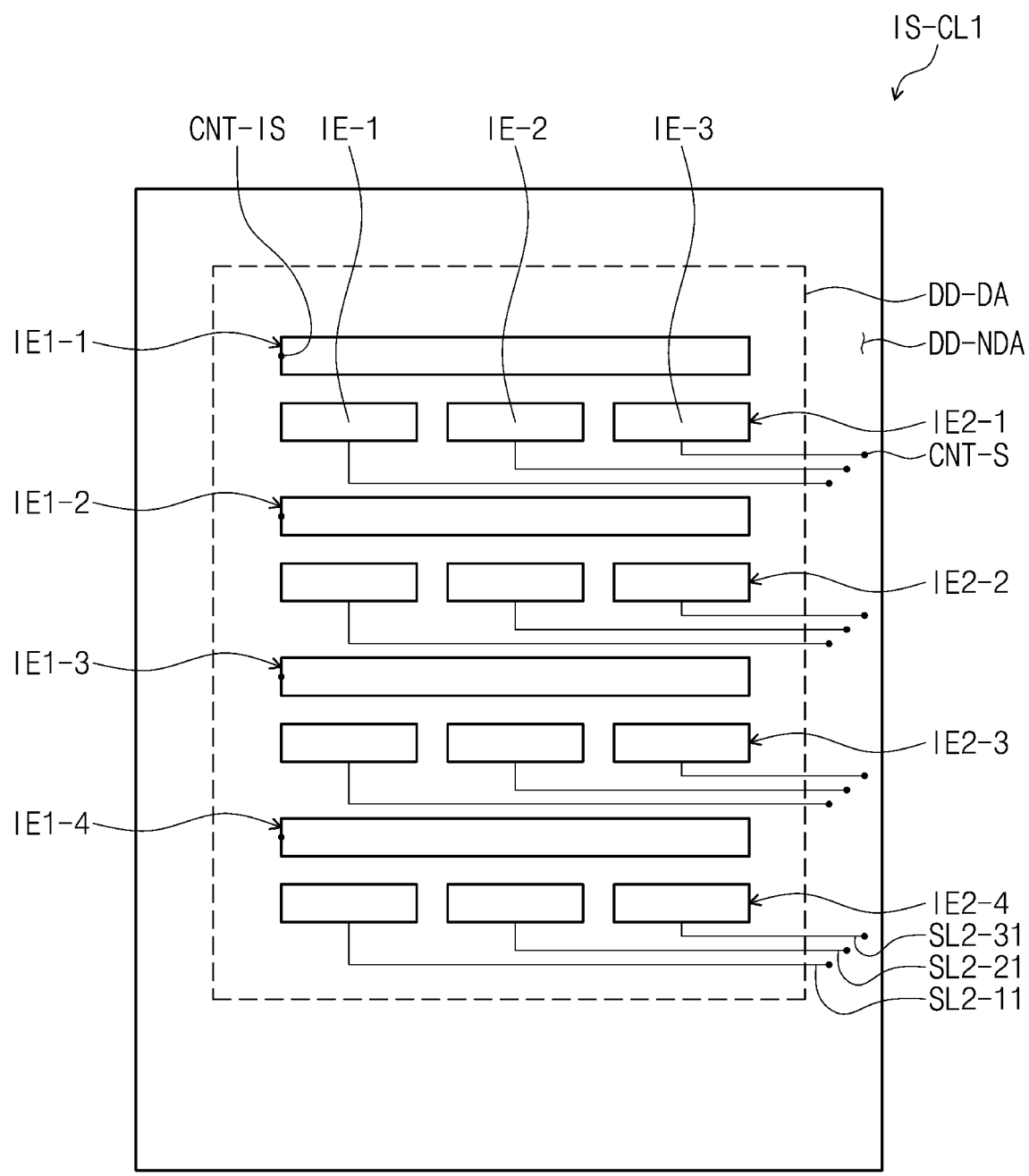
FIG. 26B is a plan view showing an exemplary embodiment of a first conductive layer of an input sensing unit according to the invention.
Figure 26C:
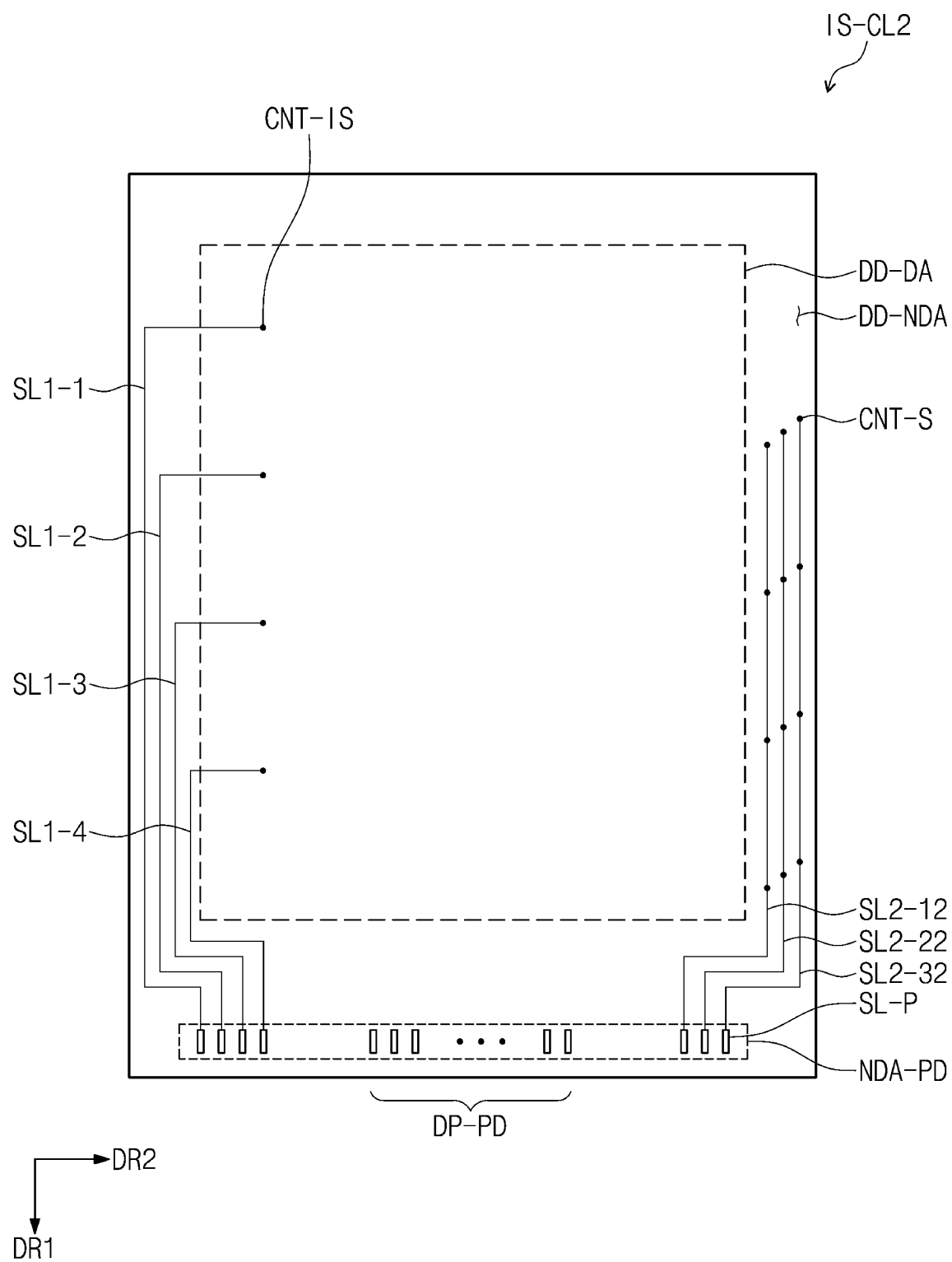
FIG. 26C is a plan view showing an exemplary embodiment of a second conductive layer of an input sensing unit according to the invention.

FIG. 26A is a plan view showing an input sensing unit ISU according to an exemplary embodiment of the invention. FIG. 26B is a plan view showing a first conductive layer IS-CL1 of an input sensing unit ISU according to an exemplary embodiment of the invention. FIG. 26C is a plan view showing a second conductive layer IS-CL2 of an input sensing unit ISU according to an exemplary embodiment of the invention. In FIGS. 26A to 26C, detailed descriptions of the same elements as those of the display device DD described with reference to FIGS. 1 to 15F will be omitted. The exemplary embodiments described with reference to FIGS. 22A to 25C may be applied to the display device DD described below.

As shown in FIG. 26A, the input sensing unit ISU may include first sensing electrodes IE1-1 to IE1-4, first signal lines SL1-1 to SL1-4 connected to the first sensing electrodes IE1-1 to IE1-4, second sensing electrodes IE2-1 to IE2-3, and second signal lines SL2-1 to SL2-3 connected to the second sensing electrodes IE2-1 to IE2-3. A driving method of the input sensing unit ISU according to the illustrated exemplary embodiment should not be particularly limited, and the external input may be sensed by a mutual capacitance method and/or a self-capacitance method.

Each of the first sensing electrodes IE1-1 to IE1-4 has a shape extending in the second direction DR2. The first sensing electrodes IE1-1 to IE1-4 are arranged in the first direction DR1. The second sensing electrodes IE2-1 to IE2-3 are alternately arranged with the first sensing electrodes IE1-1 to IE1-4. The second sensing electrodes IE2-1 to IE2-3 include a plurality of sensor parts IE-1 to IE-3. In FIG. 26A, the second sensing electrodes IE2-1 to IE2-3 including three sensor parts IE-1 to IE-3 and arranged in the second direction DR2 are shown as a representative example.

The second signal lines SL2-1 to SL2-3 electrically connect corresponding sensor parts of the second sensing electrodes IE2-1 to IE2-3. The first sensor parts IE-1 of the second sensing electrodes IE2-1 to IE2-3 are connected to one signal line SL2-1 among the second signal lines SL2-1 to SL2-3.

As shown in FIG. 26B, the first sensing electrodes IE-1 to IE1-4, the second sensing electrodes IE2-1 to IE2-3, and first line parts SL2-21 to SL2-31 of the second signal lines SL2-1 to SL2-3 may be provided from the first conductive layer IS-CL1. Although the first insulating layer IS-IL1 (refer to FIG. 9) is not shown in FIG. 26B, second connection contact holes CNT-S and fourth connection contact holes CNT-IS may be defined through the first insulating layer IS-IL1.

As shown in FIG. 26C, the first signal lines SL1-1 to SL1-4 may be provided from the second conductive layer IS-CL2, and second line parts SL2-22 to SL2-32 of the second signal lines SL2-1 to SL2-3 and pad parts SL-P connected to the second lines parts SL2-22 to SL2-32 may be provided. The second lines parts SL2-22 to SL2-32 of the second signal lines SL2-1 to SL2-3 are respectively connected to the first line parts SL2-21 to SL2-31 of the second signal lines SL2-1 to SL2-3 through the second connection contact holes CNT-S. The first signal lines SL1-1 to SL1-4 are respectively connected to the first sensing electrodes IE1-1 to IE1-4 through the fourth connection contact holes CNT-IS.

As described with reference to FIGS. 26A to 26C, the sensing electrodes are disposed in the same layer, and some of the signal lines may be disposed on a different layer from the sensing electrodes. The pad area NDA-PD of the input sensing unit ISU according to the illustrated exemplary embodiment may have the same cross-sectional structure as that of FIGS. 12A to 13C.

Figure 27A:
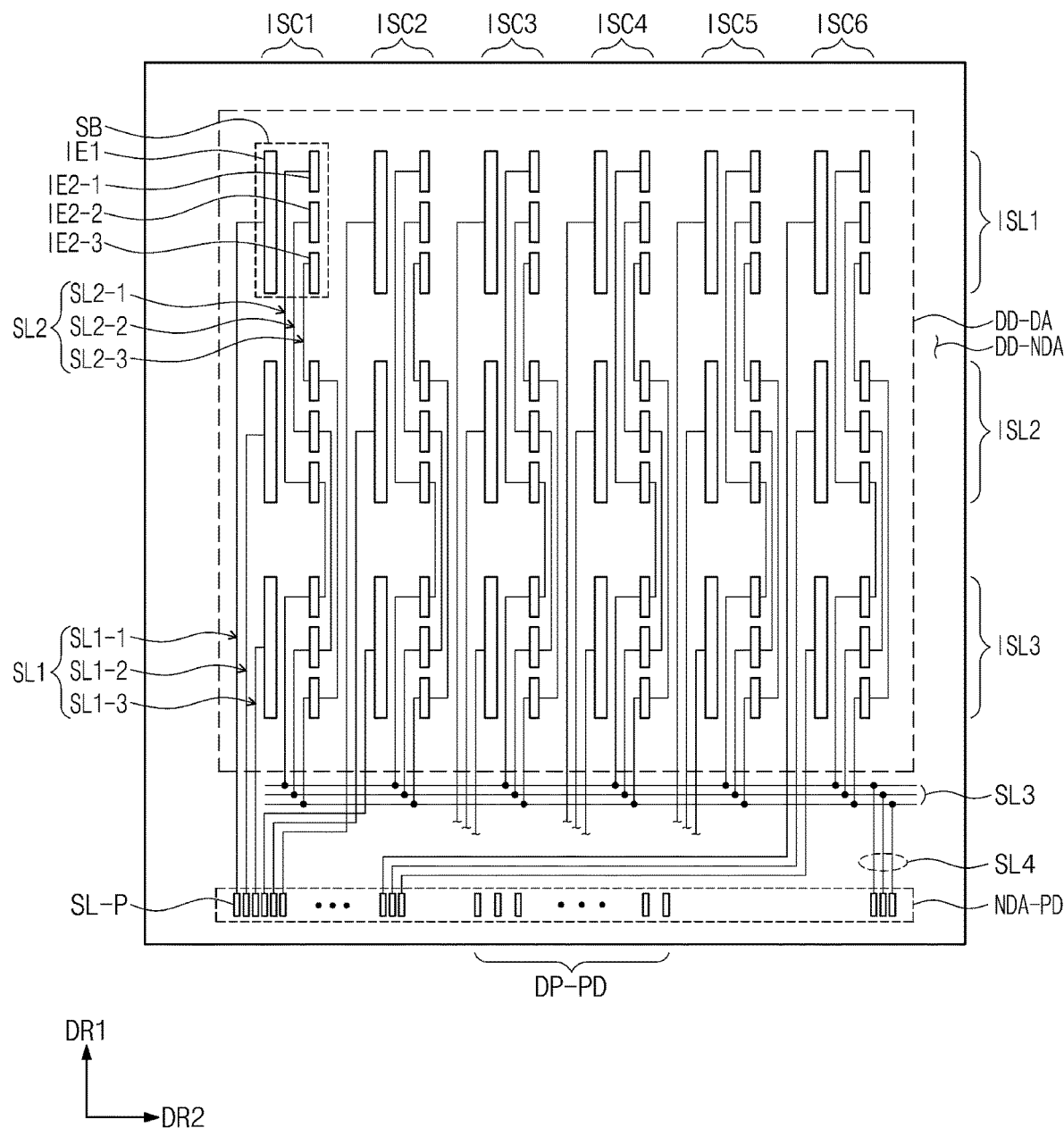
FIG. 27A is a plan view showing an exemplary embodiment of an input sensing unit according to the invention.
Figure 27B:
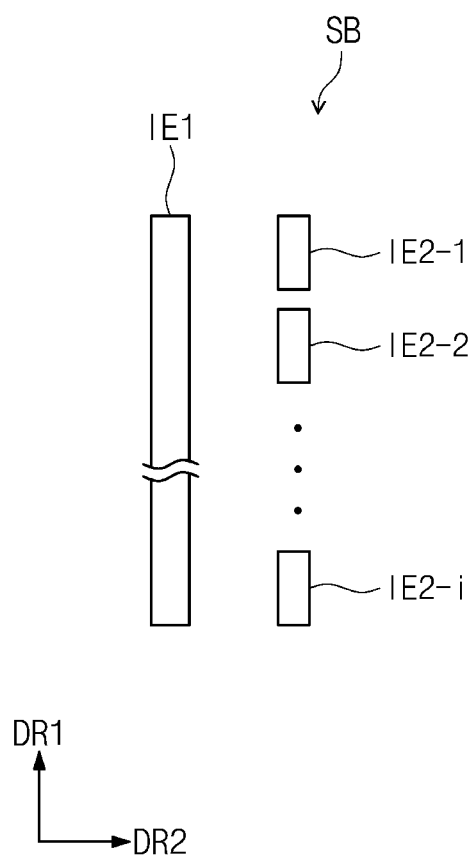
FIG. 27B is a plan view showing an exemplary embodiment of a sensor block according to the invention.
Figure 27C:
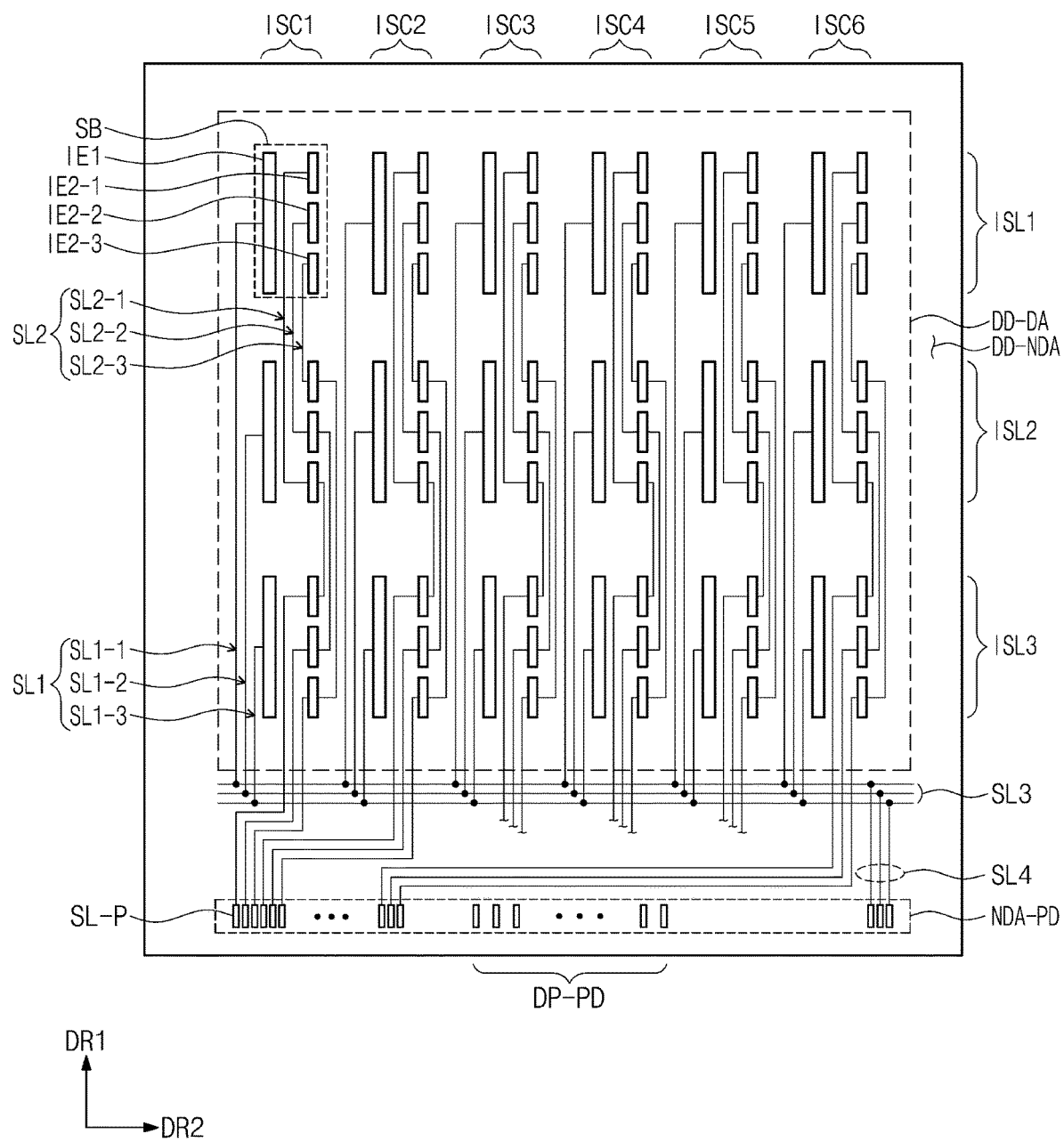
FIG. 27C is a plan view showing an exemplary embodiment of an input sensing unit according to the invention.

FIG. 27A is a plan view showing an input sensing unit ISU according to an exemplary embodiment of the invention. FIG. 27B is a plan view showing a sensor block according to an exemplary embodiment of the invention. FIG. 27C is a plan view showing an input sensing unit according to an exemplary embodiment of the invention.

As shown in FIG. 27A, the input sensing unit ISU includes first sensing electrodes IE1, second sensing electrodes IE2-1 to IE2-3, and a plurality of signal lines SL1 to SL4. The input sensing unit ISU includes a plurality of sensor blocks SB disposed in a display area DD-DA. The sensor blocks SB may define a plurality of sensor columns ISC1 to ISC6 or a plurality of sensor rows ISL1 to ISL3. Each of the sensor columns ISC1 to ISC6 may include a plurality of sensor blocks SB arranged in a column direction, i.e., the first direction DR1 of FIG. 27A. The sensor columns ISC1 to ISC6 are arranged in a row direction, i.e., the second direction DR2 of FIG. 27A. In FIG. 27A, the sensor blocks SB are arranged in a matrix form, but the arrangement of the sensor blocks SB should not be limited to the matrix form.

As shown in FIG. 27B, each of the sensor blocks SB includes a first sensing electrode IE1 and i ("i" is a natural number equal to or greater than 2) second sensing electrodes IE2-1 to IE2-i disposed adjacent to the first sensing electrode IE1 and arranged in a predetermined direction. FIG. 27B shows i number of second sensing electrodes IE2-1 to IE2-i. The i second sensing electrodes IE2-1 to IE2-i form one sensor group. The direction in which the second sensing electrodes IE2-1 to IE2-i are arranged may be substantially the same as the direction in which the first sensing electrode IE1 extends.

Here, the number of the first sensing electrodes included in the sensor block SB is determined by the number of the first sensing electrodes electrically insulated from each other. Although the sensor block SB includes two conductive patterns, the two conductive patterns electrically connected to each other by a signal line are defined as one first sensing electrode. This may be applied to the second sensing electrode. That is, the i second sensing electrodes IE2-1 to IE2-i shown in FIG. 27B are electrically separated from each other.

Hereinafter, an ordinal number of the sensor columns ISC1 to ISC6 increases from left to right, an ordinal number of the sensor rows ISL1 to ISL3 increases from top to bottom, and an ordinal number of the i second sensing electrodes IE2-1 to IE2-i increases from top to bottom. In an exemplary embodiment, among the sensor columns ISC1 to ISC6, the sensor column ISC1 located at a leftmost position is referred to as a "first sensor column ISC1", and the sensor column ISC6 located at a rightmost position is referred to as a "sixth sensor column ISC6", for example.

When the second sensing electrodes IE2-1 to IE2-i receive a sensing signal (or a transmission signal) used to sense the external input, the first sensing electrode IE1 is capacitively coupled to the second sensing electrodes IE2-1 to IE2-i. When an input unit is disposed on a specific second sensing electrode among the capacitively-coupled second sensing electrodes IE2-1 to IE2-i, a capacitance between the first sensing electrode IE1 and the second sensing electrode is changed. The input sensing circuit IS-C (refer to FIG. 4A) senses the changed capacitance from the specific second sensing electrode to calculate coordinate information of the input unit.

In the exemplary embodiment of the invention, the first sensing electrode IE1 may receive the sensing signal to sense the external input, and in this case, the input sensing circuit IS-C senses the changed capacitance from the specific second sensing electrode to calculate coordinate information of the input unit.

A connection relationship between the sensor blocks SB and the signal lines SL1 to SL4 will be described with reference back to FIG. 27A. The first sensor column ISC1 and the second sensor column ISC2 will be mainly described in association with connection relationship between the sensor blocks SB and the signal lines SL1 to SL4.

The signal lines SL1 to SL4 include first signal lines SL1, second signal lines SL2, third signal lines SL3, and fourth signal lines SL4. The first signal lines SL1 are respectively connected to the first sensors IE1 of the sensor blocks SB of the first sensor column ISC1. The first signal lines SL1 may include a line part and a pad part SL-P connected to an end of the line part. The line part may be defined by a portion of each of the first signal lines SL1 except for the pad part SL-P of each of the first signal lines SL1. The pad parts SL-P of the first signal lines SL1 may be aligned in the non-display area DD-NDA.

The second signal lines SL2 connect a j-th ("j" is a natural number equal to or greater than 1 and equal to or smaller than "i") second sensing electrode among the i second sensing electrodes arranged in an n-th sensor block of the sensor blocks SB of the sensor column to a (i−j+1)th second sensing electrode among the i second sensing electrodes arranged in an (n+1)th sensor block of the sensor blocks SB of the sensor column. Hereinafter, three second signal lines SL2-1, SL2-2, and SL2-3 corresponding to the first sensor column ISC1 will be described in detail.

One second signal line SL2-1 connects a first second sensing electrode IE2-1 of a first sensor block SB, a third second sensing electrode IE2-3 of a second sensor block SB, and a first second sensing electrode IE2-1 of a third sensor block SB. Another second signal line SL2-2 connects second sensing electrodes IE2-2 of first to third sensor blocks SB. The other second signal line SL2-3 connects a third second sensing electrode IE2-3 of the first sensor block SB, a first second sensing electrode IE2-1 of the second sensor block SB, and a third second sensing electrode IE2-3 of the third sensor block SB.

The second signal lines SL2 corresponding to the first sensor column ISC1 may be connected to the second signal lines SL2 corresponding to the second sensor column ISC2 through the third signal lines SL3. The second signal lines SL2 may be connected to the corresponding third signal line through the second connection contact holes CNT-S.

The third signal lines SL3 may be provided in the same number as the number of the second sensors disposed in one sensor block. That is, i third signal lines SL3 may be provided. In the illustrated exemplary embodiment, three third signal lines SL3 are shown.

One second signal line SL2-1 corresponding to the first sensor column ISC1 and one second signal line SL2-1 corresponding to the second sensor column ISC2 are connected to each other by one third signal line SL3 among the three third signal lines SL3. Another second signal line SL2-2 corresponding to the first sensor column ISC1 and another second signal line SL2-2 corresponding to the second sensor column ISC2 are connected to each other by another third signal line SL3 among the three third signal lines SL3. The corresponding second sensing electrodes IE2-1 to IE2-3 disposed in the sensor columns ISC1 to ISC6 are electrically connected to each other by the third signal line SL3.

The fourth signal lines SL4 may be provided in the same number as the number of the third signal lines SL3. That is, i fourth signal lines SL4 are provided. The i fourth signal lines SL4 may be connected to the i third signal lines SL3 through the second connection contact holes CNT-S in a one-to-one correspondence.

In the input sensing unit ISU shown in FIG. 27C, the connection relationship between the signal lines SL1 to SL4 and the first and second sensing electrodes IE1 and IE2-1 to IE2-3 is different from that of the input sensing unit ISU shown in FIG. 27A.

The first signal lines SL1 corresponding to the first sensor column ISC1 may be connected to the first signal lines SL1 corresponding to the second sensor column ISC2 through the third signal lines SL3. The third signal lines SL3 may be provided in the same number as the number of the first sensing electrodes IE1 disposed in one sensor column. In the illustrated exemplary embodiment, three third signal lines SL3 are shown.

A first sensing electrode IE1 of the first sensor column ISC1 and a first sensing electrode IE1 of the second sensor column ISC2 are connected to each other by one third signal line SL3 among the three third signal lines SL3. A second first sensing electrode IE1 of the first sensor column ISC1 and a second first sensing electrode IE1 of the second sensor column ISC2 are connected to each other by another third signal line SL3 among the three third signal lines SL3. A third first sensing electrode IE1 of the first sensor column ISC1 and a third first sensing electrode IE1 of the second sensor column ISC2 are connected to each other by the other third signal line SL3 among the three third signal lines SL3. The fourth signal lines SL4 may be provided in the same number as the number of the third signal lines SL3.

Figure 28:
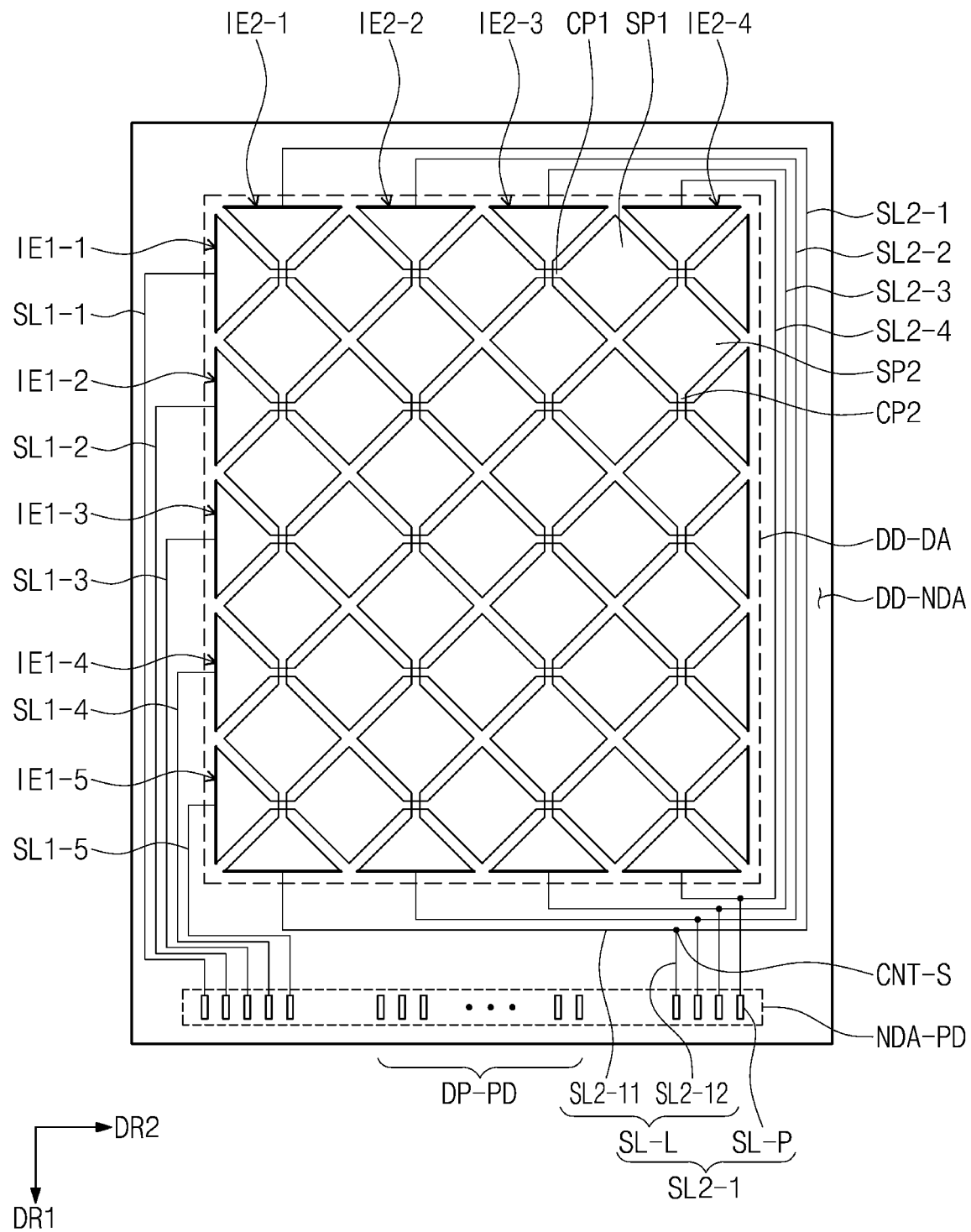
FIG. 28 is a plan view showing an exemplary embodiment of an input sensing unit according to the invention.

FIG. 28 is a plan view showing an input sensing unit ISU according to an exemplary embodiment of the invention. Hereinafter, differences between the input sensing unit ISU shown in FIG. 28 and the input sensing units ISU described with reference to FIGS. 9 to 13C will be mainly described.

As shown in FIG. 28, the input sensing unit ISU includes first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

The second signal lines SL2-1 to SL2-4 include a line part SL-L and a pad part SL-P. One second signal line SL2-1 will be described in detail. The line part SL-L may include a first line part SL2-11 and a second line part SL2-12. The first line part SL2-11 is connected to both ends of one second sensing electrode IE2-1. The first line part SL2-11 may be provided from a first conductive layer IS-CL1. The second sensing electrodes IE2-1 to IE2-4 may be provided from the first conductive layer IS-CL1.

The second line part SL2-12 may be connected to the first line part SL2-11 through the second connection contact hole CNT-S. The pad part SL-P is connected to an end of the second line part SL2-12. The second line part SL2-12 may be provided from a second conductive layer IS-CL2. The second line part SL2-12 and the pad part SL-P are defined through the same photolithography process, and thus the second line part SL2-12 and the pad part SL-P may be integrally provided with each other. The first sensing electrodes IE1-1 to IE1-5 and the first signal lines SL1-1 to SL1-5 may be provided from the second conductive layer IS-CL2.

In the exemplary embodiment of the invention, the first signal lines SL1-1 to SL1-5 may have the two-layer structure as described with reference to FIG. 11D. The second signal lines SL2-1 to SL2-4 may be integrally provided with the second line part SL2-12 and may further include line parts corresponding to the first line part SL2-11.

Figure 29:
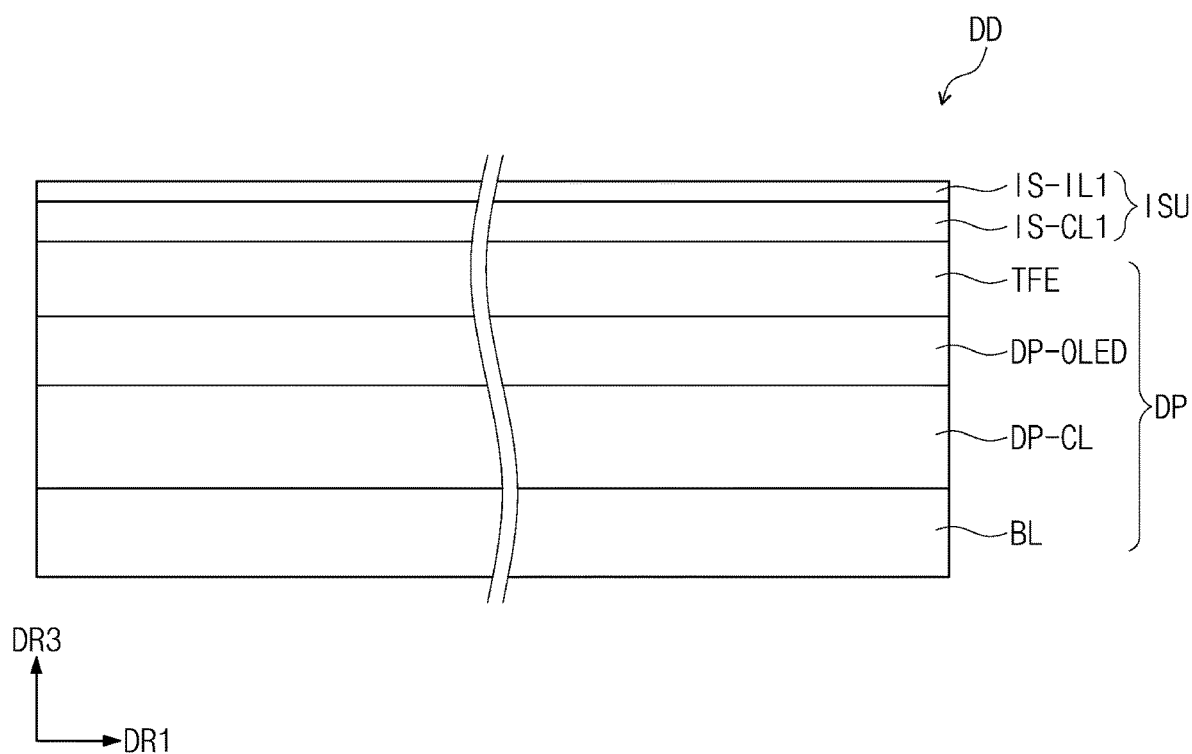
FIG. 29 is a cross-sectional view showing an exemplary embodiment of a display device according to the invention.
Figure 30A:
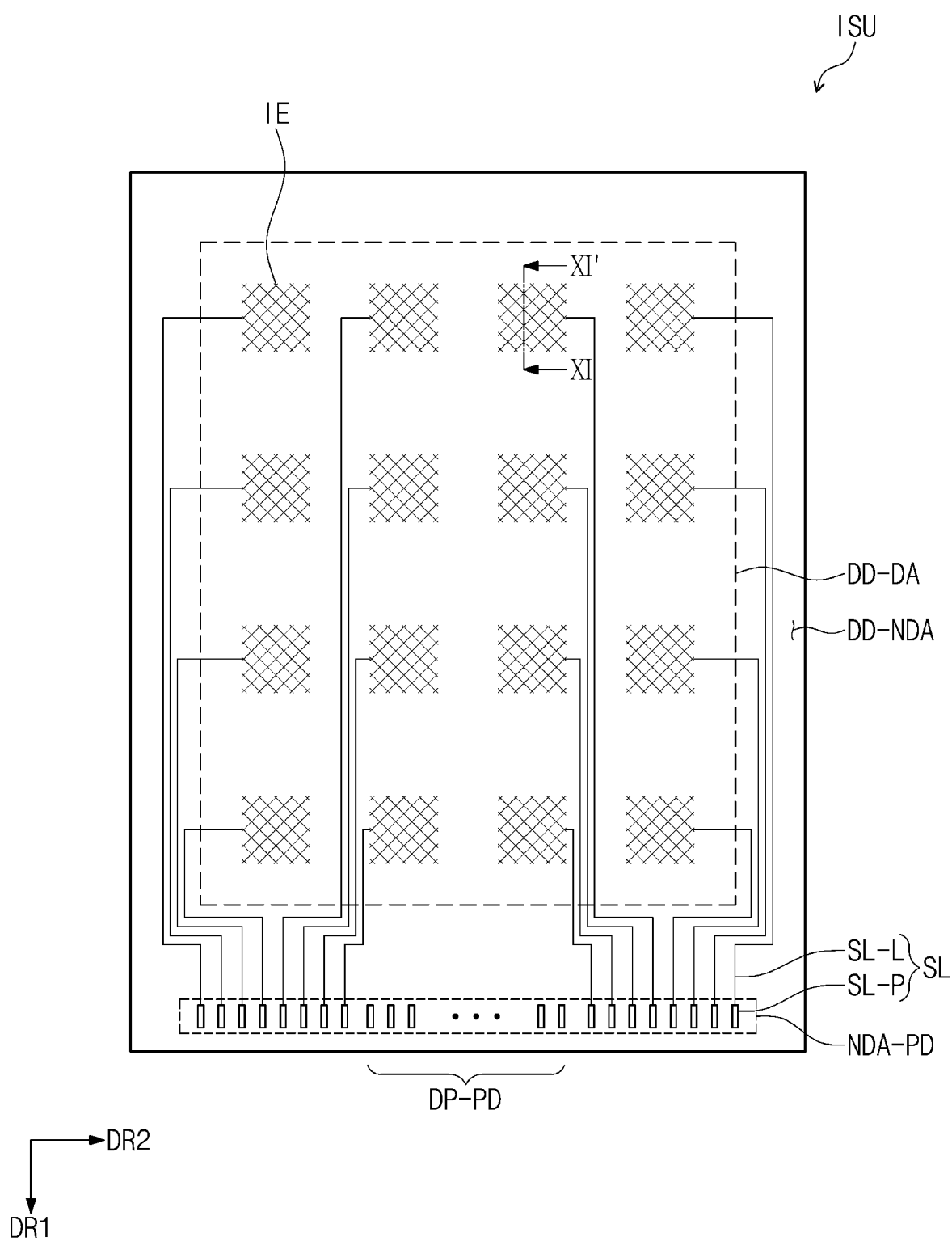
FIG. 30A is a plan view showing an exemplary embodiment of an input sensing unit according to the invention.
Figure 30B:
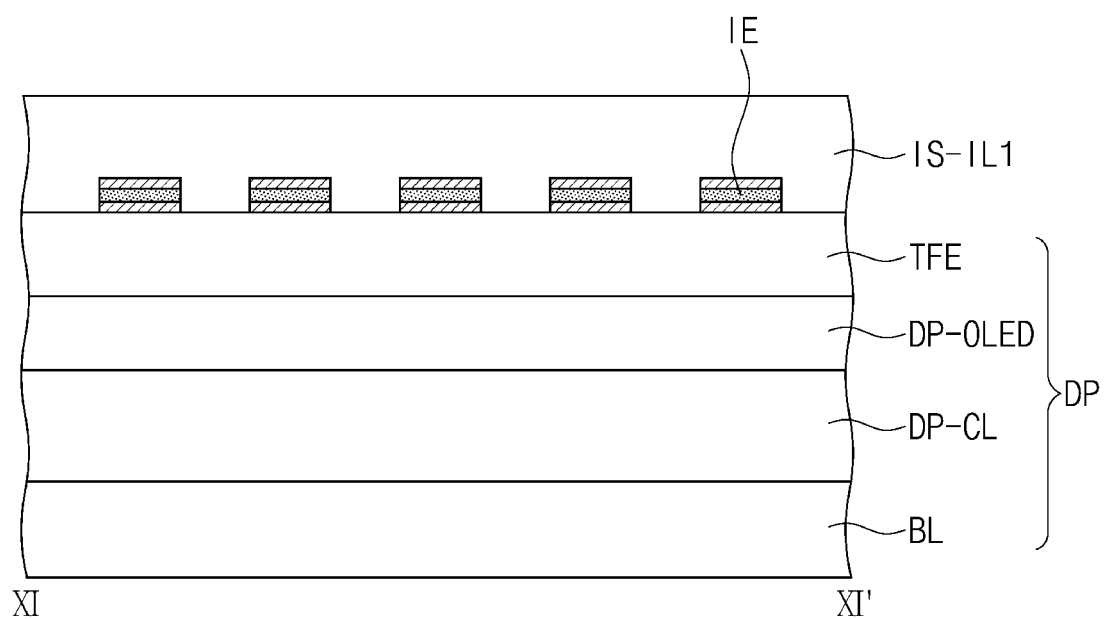
FIG. 30B is a cross-sectional view taken along line XI-XI' of FIG. 30A.
Figure 30C:
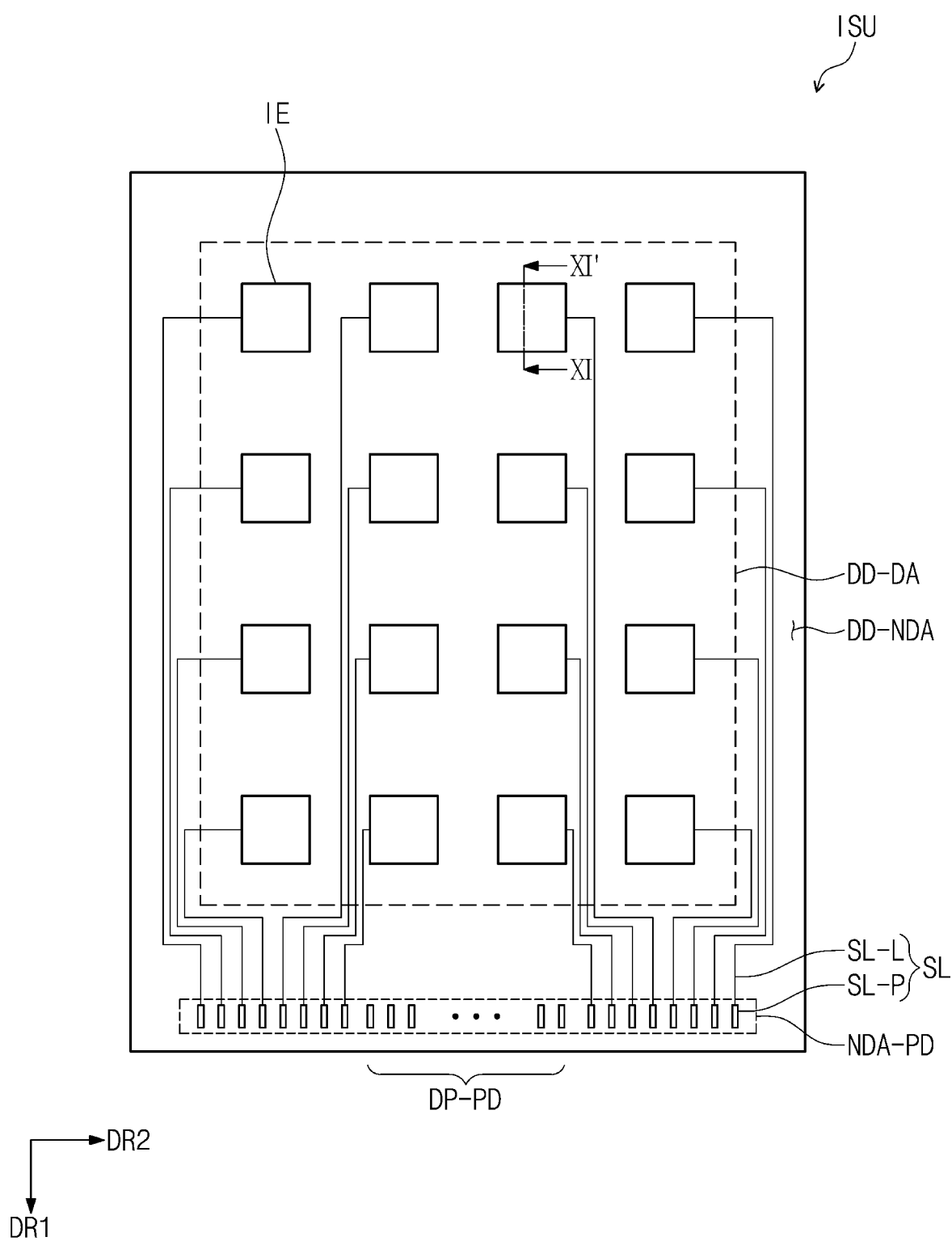
FIG. 30C is a plan view showing an exemplary embodiment of an input sensing unit according to the invention.
Figure 30D:
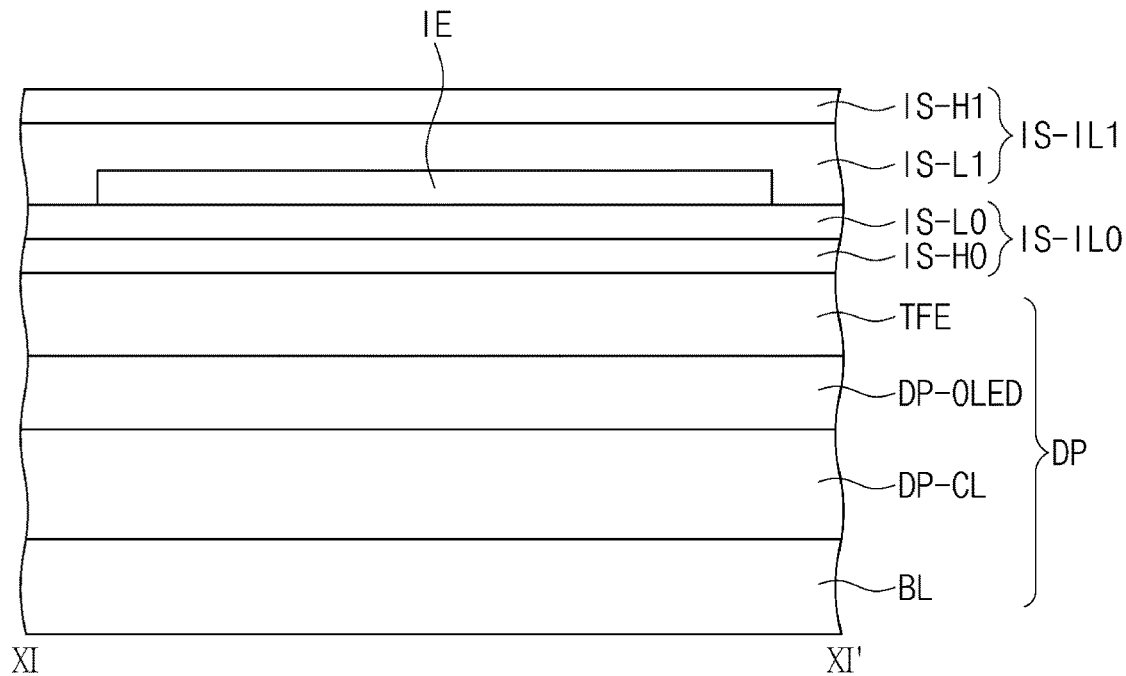
FIGS. 30D to 30F are cross-sectional views taken along line XI-XI' of FIG. 30C.
Figure 30E:
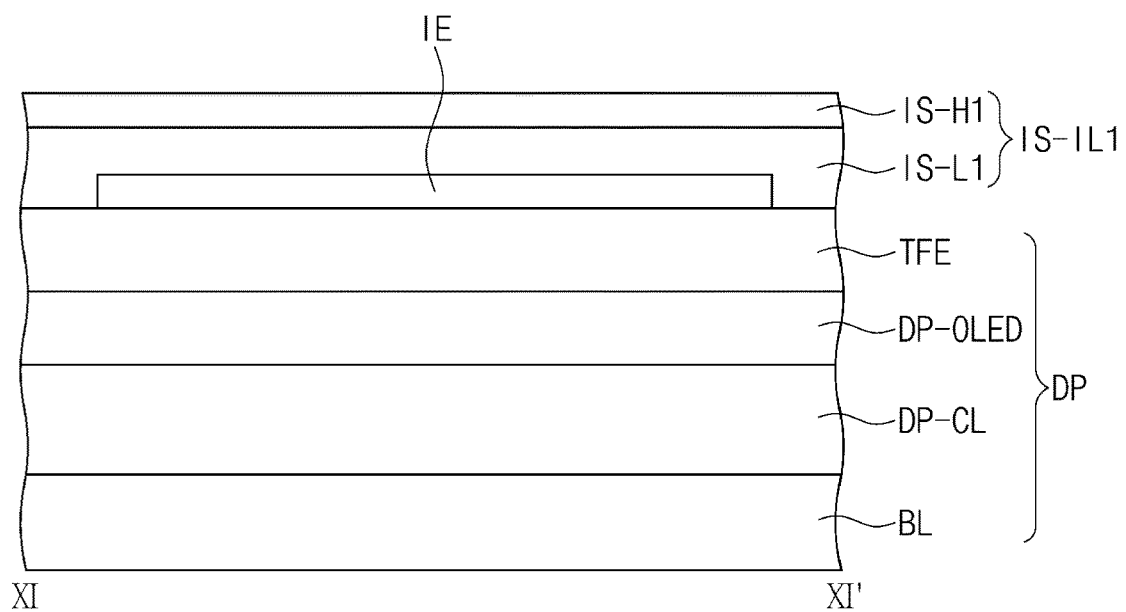
Figure 30F:
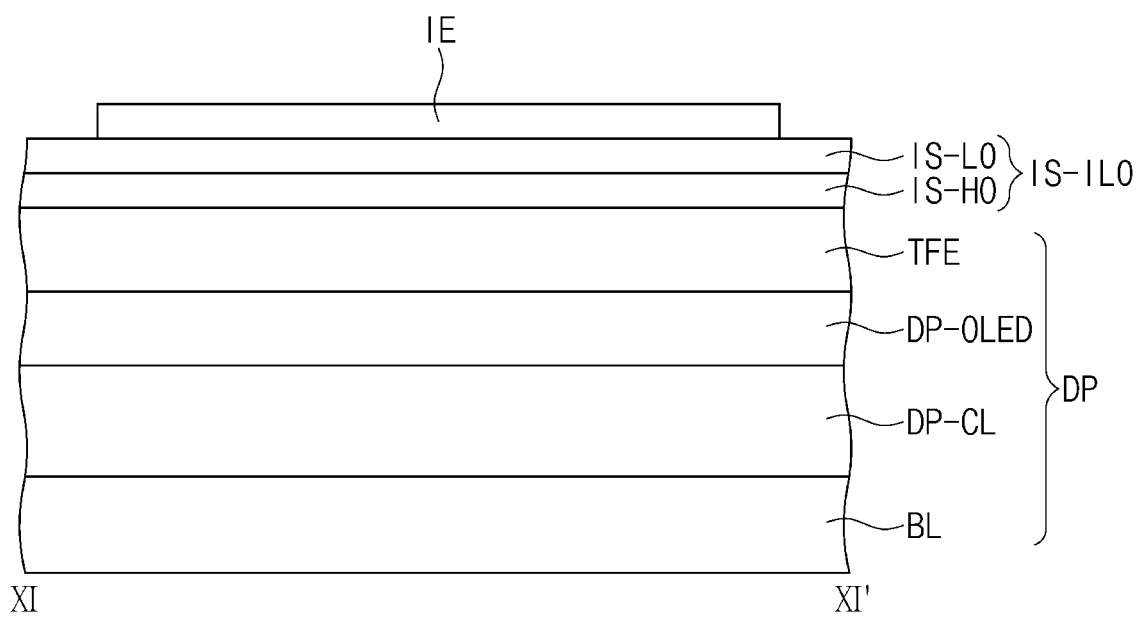

FIG. 29 is a cross-sectional view showing a display device according to an exemplary embodiment of the invention. FIG. 30A is a plan view showing an input sensing unit according to an exemplary embodiment of the invention. FIG. 30B is a cross-sectional view taken along line XI-XI' of FIG. 30A. FIG. 30C is a plan view showing an input sensing unit according to an exemplary embodiment of the invention. FIGS. 30D to 30F are cross-sectional views taken along line XI-XI' of FIG. 30C. In FIGS. 29 and 30A to 30F, detailed descriptions of the same elements as those of the display device DD described with reference to FIGS. 1 to 28 will be omitted.

In FIG. 29, the display device DD is shown simply to illustrate a stacking structure of the input sensing unit ISU. In FIG. 29, the second conductive layer IS-CL2 and the second insulating layer IS-IL2 are omitted compared to the display device DD shown in FIG. 9.

As shown in FIG. 29, the input sensing unit ISU according to the exemplary embodiment of the invention may include a first conductive layer IS-CL1 and a first insulating layer IS-IL1 that directly covers (or contacts) the first conductive layer IS-CL1. The first conductive layer IS-CL1 includes a plurality of conductive patterns.

As shown in FIGS. 30A and 30B, the input sensing unit ISU may include a plurality of sensing electrodes IE (hereinafter, referred to as sensing electrodes) and a plurality of signal lines SL (hereinafter, referred to as signal lines). The sensing electrodes IE have their own coordinate information. In an exemplary embodiment, the sensing electrodes IE may be arranged in a matrix form and respectively connected to the signal lines SL, for example. Each of the signal lines SL may include a line part SL-L and a pad part SL-P. The shape and arrangement of the sensing electrodes IE should not be particularly limited. Some of the signal lines SL are arranged in the display area DD-DA, and the others of the signal lines SL are arranged in the non-display area DD-NDA. The input sensing unit ISU according to the illustrated exemplary embodiment may obtain coordinate information by a self-capacitance method.

In the illustrated exemplary embodiment, the sensing electrodes IE have a mesh shape, but the shape of the sensing electrodes IE should not be limited to the mesh shape. The pad area NDA-PD of the input sensing unit ISU according to the illustrated exemplary embodiment may have a cross-section similar to that of FIGS. 12A to 13C. However, different from FIGS. 12A to 13C, a first insulating layer IS-IL1 is omitted from between dummy pads IS-DPD and a pad part SL-P, and the first insulating layer IS-IL1 is omitted from between pad parts CSL-P and DL-P and a signal pads DP-PD. In the illustrated exemplary embodiment, the first insulating layer IS-IL1 overlaps the display area DD-DA and the non-display area DD-NDA and exposes the pad area NDA-PD.

As shown in FIGS. 30C and 30D, the input sensing unit ISU may include sensing electrodes IE, a spare insulating layer IS-IL0 disposed under the sensing electrodes IE, and a first insulating layer IS-IL1 disposed on the sensing electrodes IE. Hereinafter, the spare insulating layer IS-IL0 and the first insulating layer IS-IL1 are referred to as a "lower insulating layer" and an "upper insulating layer", respectively.

In the illustrated exemplary embodiment, the sensing electrodes IE may have a polygonal shape, e.g., a quadrangular shape. In the illustrated exemplary embodiment, each of the lower insulating layer IS-IL0 and the upper insulating layer IS-IL1 may include a plurality of insulating layers, e.g., two insulating layers. A refractive index of the insulating layers of the lower insulating layer IS-IL0 and the upper insulating layer IS-IL1 may be controlled, and thus a reflectance of the sensing electrode IE may be reduced.

Each of the lower insulating layer IS-IL0 and the upper insulating layer IS-IL1 includes two insulating layers having different refractive indices from each other. The lower insulating layer IS-IL0 includes a first high-refractive index insulating layer IS-H0 and a first low-refractive index insulating layer IS-L0, and the upper insulating layer IS-IL1 includes a second high-refractive index insulating layer IS-H1 and a second low-refractive index insulating layer IS-L1.

The first high-refractive insulating layer IS-H0 may have a refractive index greater than that of the first low-refractive insulating layer IS-LO. The first high-refractive insulating layer IS-H0 may have a refractive index similar to that of the sensing electrodes IE. In an exemplary embodiment, in a case that the sensing electrode IE is an ITO electrode, the first high-refractive insulating layer IS-H0 may have a refractive index of about 1.7 to about 2.2 with respect to a wavelength of about 550 nm, and the first low-refractive index insulating layer IS-L0 may have a refractive index, e.g., about 1.4 to about 1.65, between a refractive index of air and the refractive index of the first high-refractive insulating layer IS-H0, for example. In an exemplary embodiment, the first high-refractive index insulating layer IS-H0 may include niobium oxide (NbOx), and the first low-refractive index insulating layer IS-L0 may include silicon oxide, silicon nitride, or silicon oxynitride, for example.

The second high-refractive insulating layer IS-H1 may have a refractive index greater than that of the second low-refractive insulating layer IS-L1. The second high-refractive insulating layer IS-H1 may have a refractive index similar to that of the sensing electrodes IE. In an exemplary embodiment, in a case that the sensing electrodes IE are the ITO electrode, the second high-refractive insulating layer IS-H1 may have a refractive index of about 1.7 to about 2.2 with respect to the wavelength of about 550 nm, and the second low-refractive index insulating layer IS-L1 may have the refractive index, e.g., about 1.4 to about 1.65, between the refractive index of air and the refractive index of the second high-refractive insulating layer IS-H1, for example. In an exemplary embodiment, the second low-refractive index insulating layer IS-L1 may include silicon oxide, silicon nitride, or silicon oxynitride, and the second high-refractive index insulating layer IS-H1 may include niobium oxide (NbOx), for example. The input sensing unit ISU may include only the upper insulating layer IS-IL1 as shown in FIG. 30E, or the input sensing unit ISU may include only the lower insulating layer IS-IL0 as shown in FIG. 30F. Although not shown separately, the second insulating layer IS-IL2 shown in FIG. 11C may have the same stacking structure as the upper insulating layer IS-IL1, and the first insulating layer IS-IL1 may have the same stacking structure as the lower insulating layer IS-IL0. The first insulating layer IS-IL1 shown in FIGS. 16A and 16B may have the same stacking structure as the upper insulating layer IS-IL1.

Figure 31:
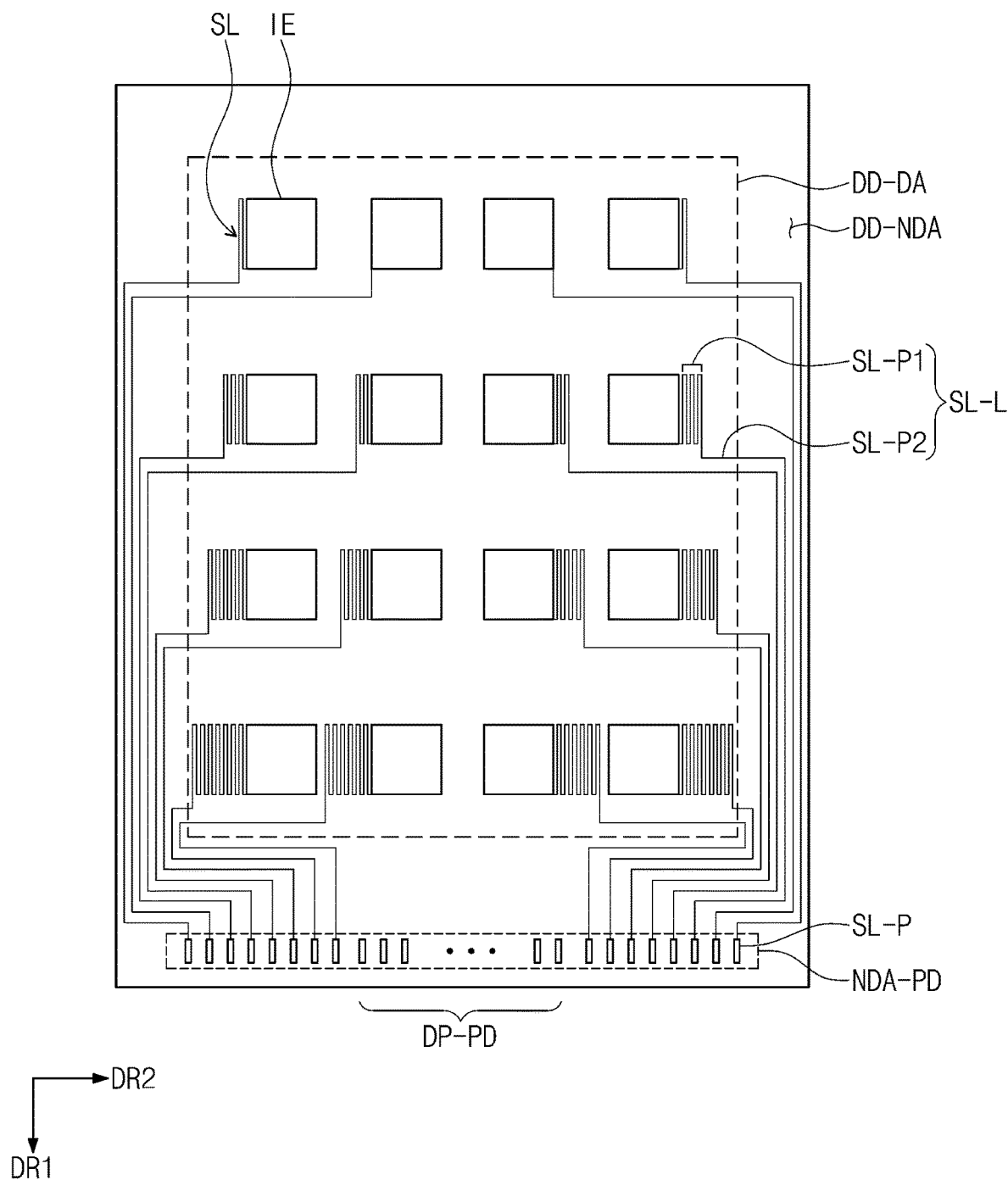
FIG. 31 is a plan view showing an exemplary embodiment of an input sensing unit according to the invention.

FIG. 31 is a plan view showing an input sensing unit according to an exemplary embodiment of the invention. In FIG. 31, detailed descriptions of the same elements as those of the display device DD described with reference to FIGS. 1 to 30F will be omitted.

As shown in FIG. 31, the input sensing unit ISU may include sensing electrodes IE having a polygonal shape, for example. Distances between the sensing electrodes IE and the pad area NDA-PD may be determined by coordinates of the sensing electrodes IE. Signal lines SL may have a length determined by the coordinates of the sensing electrodes IE connected thereto. In the illustrated exemplary embodiment, the signal lines SL may have the same length as each other such that the signal lines SL have the same resistance as each other. A line part SL-L may include a first part SL-P1 and a second part SL-P2. One end of the first part SL-P1 is connected to a corresponding sensing electrode among the sensing electrodes IE. A second part SL-P2 extends from the first part SL-P1 and is connected to the pad part SL-P through one end thereof.

The first part SL-P1 may be bent "n" times or more and control the resistance of the signal lines SL. In the illustrated exemplary embodiment, "n" is an integer number equal to or greater than zero (0). The "n" may be determined by the coordinates of the sensing electrodes IE connected to the signal lines SL. As the sensing electrodes IE are placed farther away from the pad area NDA-PD, the "n" becomes small, and as the sensing electrodes IE are placed closer to the pad area NDA-PD, the "n" becomes great. When the signal lines SL are compared to each other while being stretched, the signal lines SL may have the same length.

In the illustrated exemplary embodiment, the first part SL-P1 is disposed in the display area DD-DA, but the first part SL-P1 may be disposed in the non-display area DD-NDA. The first part SL-P1 may be disposed closer to the pad area NDA-PD. The first part SL-P1 may reduce a static electricity applied thereto from the outside. In this case, the input sensing unit ISU may further include a third part connecting the first part SL-P1 disposed in the non-display area DD-NDA and the sensing electrodes IE.

In the exemplary embodiment of the invention, the first parts SL-P1 may have different stacking structures, include materials having different conductivities, or have different line widths. The first parts SL-P1 have the stacking structure and the conductive material to reduce the resistance thereof as the first parts SL-P1 are placed farther away from the pad area NDA-PD. As the first parts SL-P1 are placed closer to the pad area NDA-PD, the first parts SL-P1 may have a simplified stacking structure, a material having a low conductivity, and a narrow line width.

Figure 32:
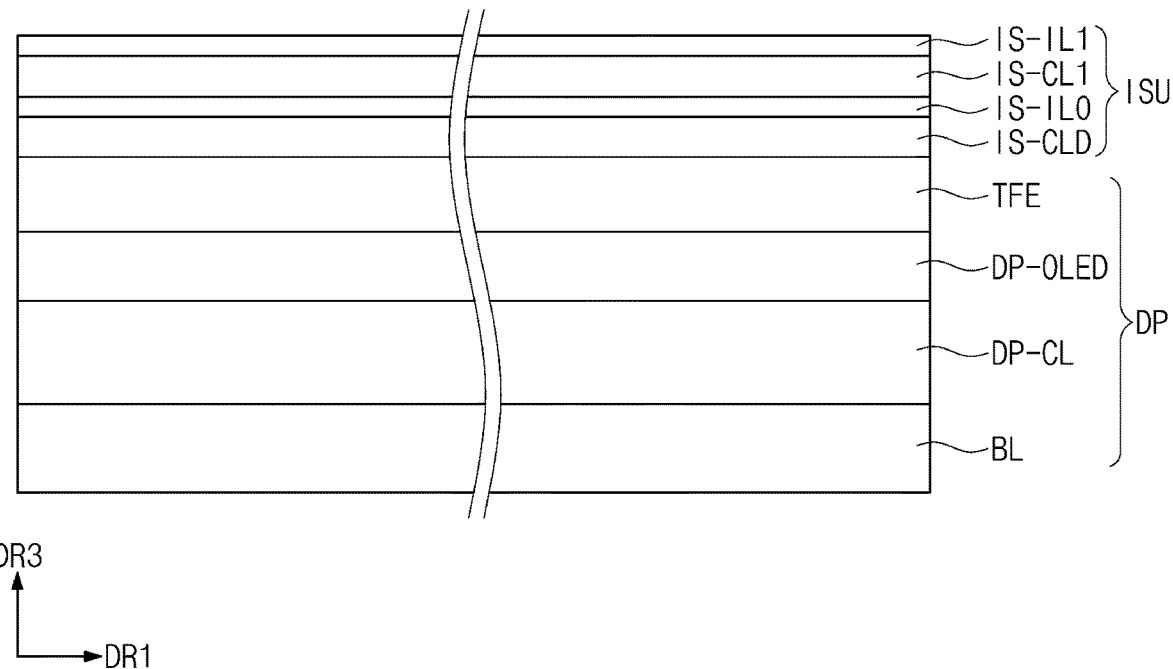
FIG. 32 is a cross-sectional view showing an exemplary embodiment of a display device according to the invention.
Figure 33:
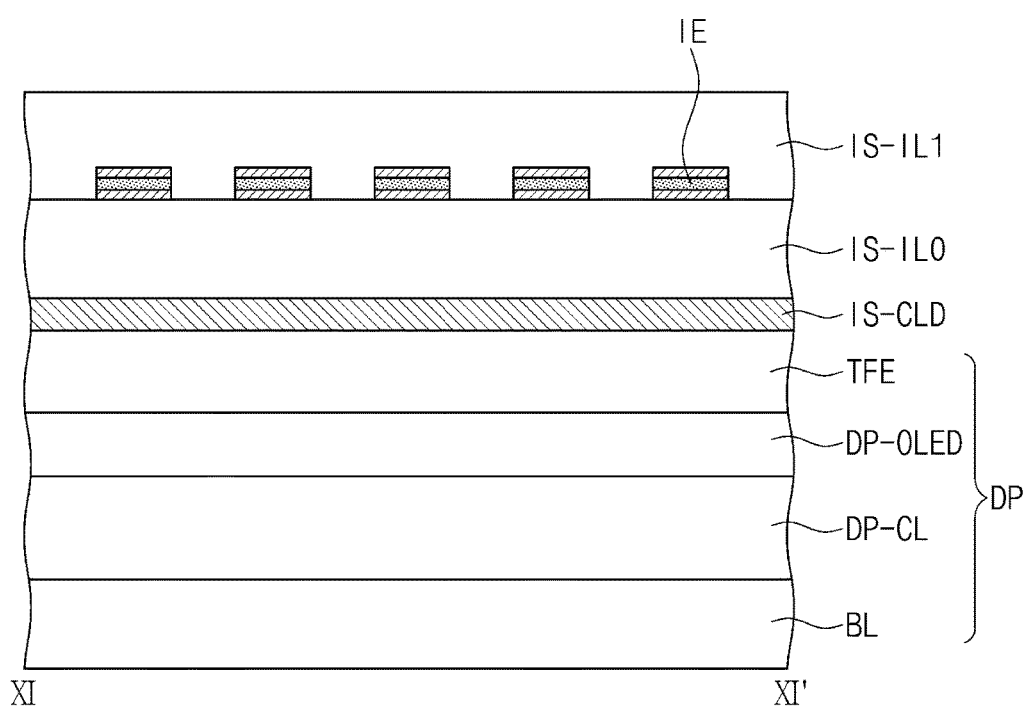
FIG. 33 is a cross-sectional view showing an exemplary embodiment of an input sensing unit according to the invention.

FIG. 32 is a cross-sectional view showing a display device DD according to an exemplary embodiment of the invention, and FIG. 33 is a cross-sectional view showing an input sensing unit ISU according to an exemplary embodiment of the invention. In FIGS. 32 and 33, detailed descriptions of the same elements as those of the display device DD described with reference to FIGS. 1 to 31 will be omitted.

The input sensing unit ISU may further include a dummy electrode layer IS-CLD and a spare insulating layer IS-IL0 disposed on the dummy electrode layer IS-CLD when compared to the input sensing unit ISU shown in FIG. 29. Although not shown separately, the input sensing unit ISU shown in FIG. 9 may further include the dummy electrode layer IS-CLD and the spare insulating layer IS-IL0.

The dummy electrode layer IS-CLD and the spare insulating layer IS-IL0 may be disposed between the thin film encapsulation layer TFE and the first conductive layer IS-CL1. The dummy electrode layer IS-CLD and the spare insulating layer IS-IL0 may be provided from the display panel DP by a continuous process.

The dummy electrode layer IS-CLD may include a transparent conductive oxide layer, a transparent conductive polymer layer, or a metal layer having a thickness thin enough to transmit a light. The spare insulating layer IS-IL0 may include an organic layer and/or an inorganic layer.

The dummy electrode layer IS-CLD may entirely overlap the display area DD-NDA (refer to FIG. 30C). The dummy electrode layer IS-CLD may block a noise caused by electrodes (e.g., the second electrode CE as shown in FIG. 6) of the display panel DP with respect to the sensing electrodes IE. In an exemplary embodiment, the dummy electrode layers IS-CLD may be a floating electrode or may receive a predetermined reference voltage, for example. In an exemplary embodiment, the reference voltage may be, but not limited to, a ground voltage, for example.

Although not shown separately, the spare insulating layer IS-IL0 may be replaced with the anti-reflection layer described earlier. Although not shown separately, the dummy electrode layer IS-CLD may have a mesh shape and include a plurality of patterns. The patterns may entirely overlap the sensing electrodes IE.

The cross-sectional structure of the pad area NDA-PD of the input sensing unit ISU according to the illustrated exemplary embodiment may be similar to those of FIGS. 12A to 13C. However, different from those shown in FIGS. 12A to 13C, the first insulating layer IS-IL1 between the dummy pads IS-DPD and the pad part SL-P may be replaced with the spare insulating layer IS-IL0, and the first insulating layer IS-IL1 between the pad parts CSL-P and DL-P and the signal pads DP-PD may be replaced with the spare insulating layer IS-IL0.

Figure 34A:
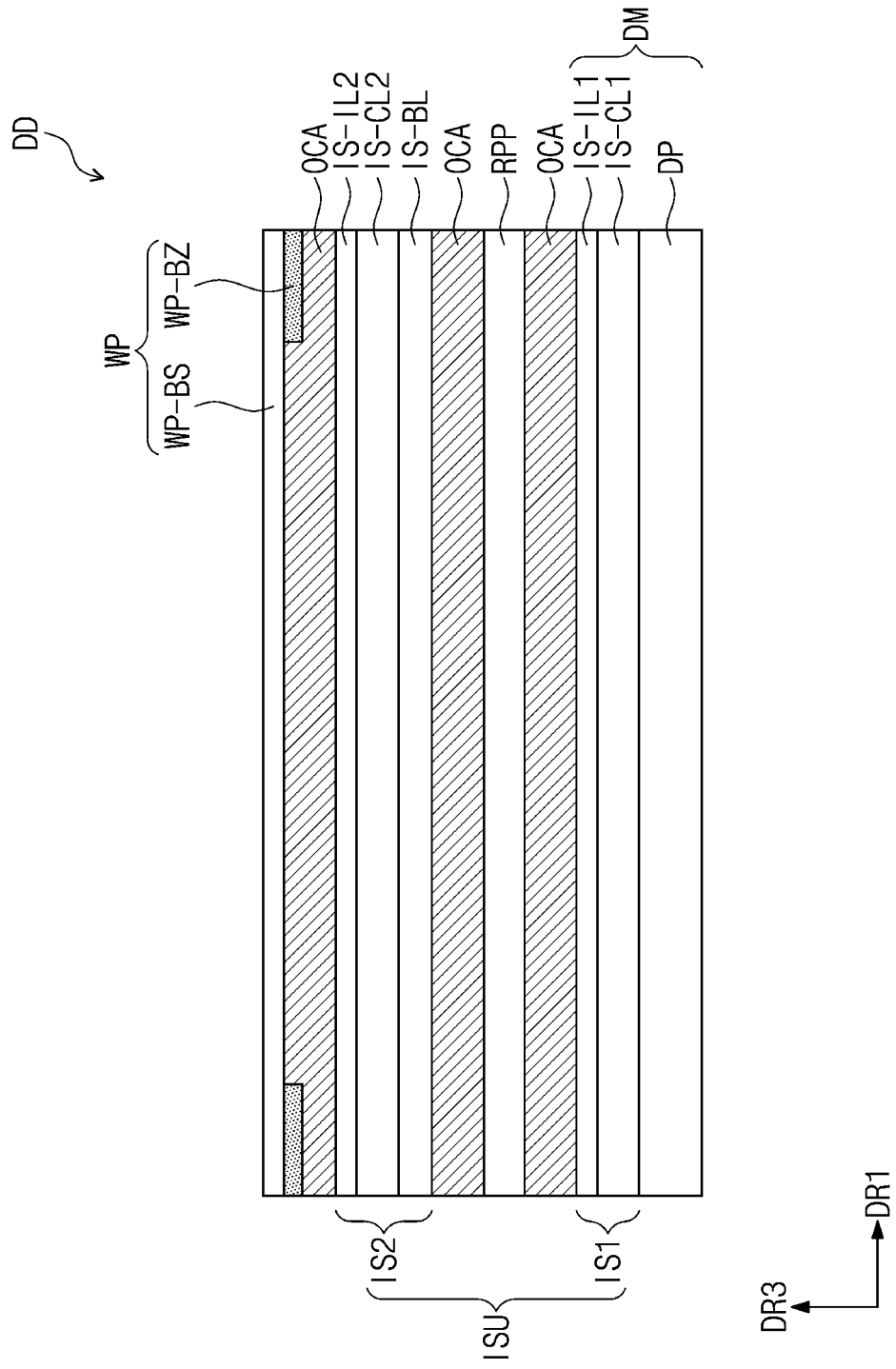
FIGS. 34A to 34C are cross-sectional views showing an exemplary embodiment of a display device according to the invention.
Figure 34B:
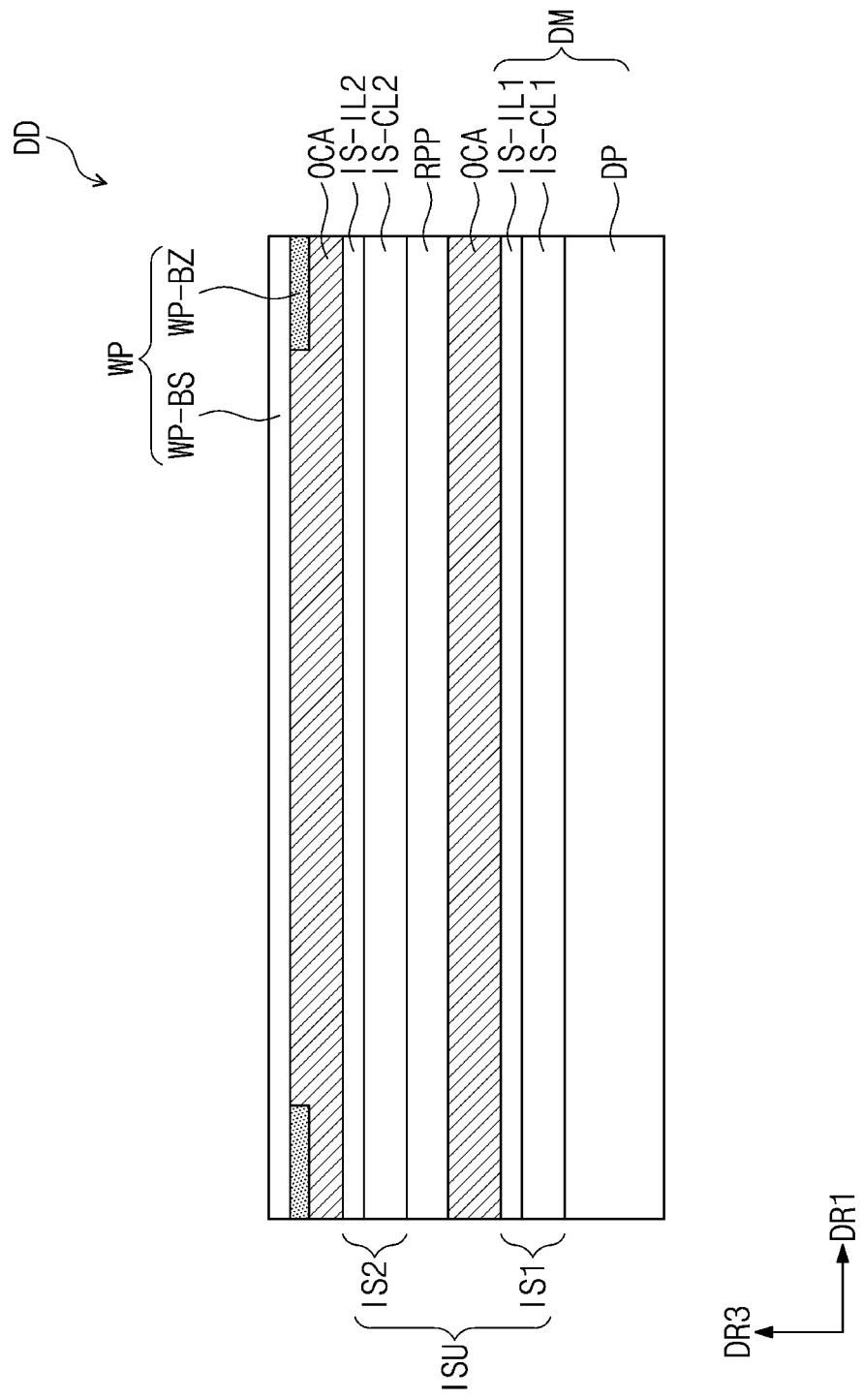
Figure 34C:
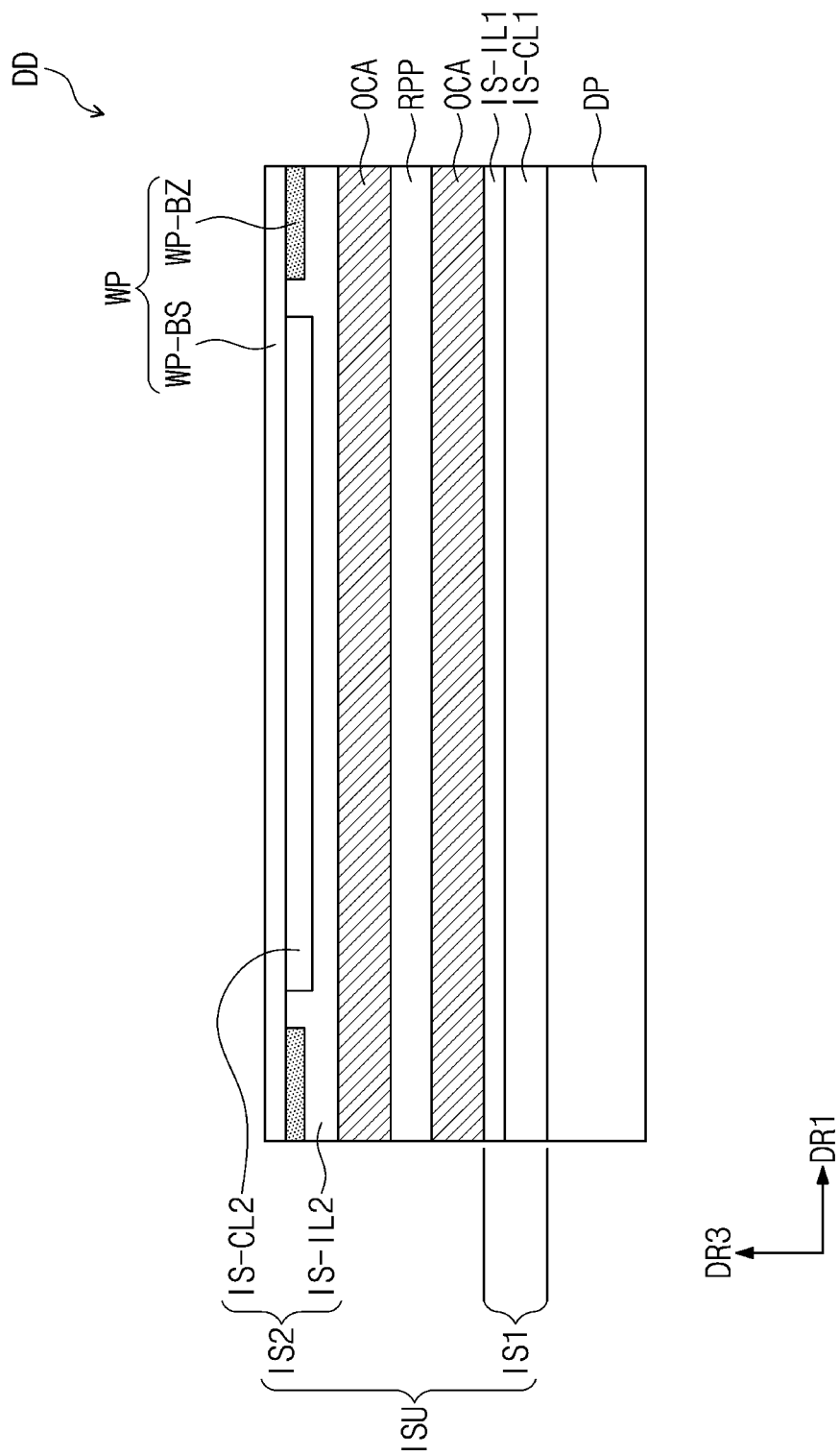

FIGS. 34A to 34C are cross-sectional views showing a display device DD according to an exemplary embodiment of the invention. In FIGS. 34A to 34C, detailed descriptions of the same elements as those of the display device DD described with reference to FIGS. 1 to 33 will be omitted.

As shown in FIG. 34A, the display device DD may include a display panel DP, an input sensing unit ISU, an anti-reflection panel RPP, and a window panel WP. Some of the display panel DP, the input sensing unit ISU, the anti-reflection panel RPP, and the window panel WP may be provided through a continuous process, and some of the display panel DP, the input sensing unit ISU, the anti-reflection panel RPP, and the window panel WP may be coupled by an optically clear adhesive.

The input sensing unit ISU includes a first partial unit IS1 and a second partial unit IS2. The first partial unit IS1 may include the first conductive layer IS-CL1 and the first insulating layer IS-IL1 described with reference to FIGS. 10A to 13C. In the exemplary embodiment of the invention, the first partial unit IS1 may further include a dummy electrode layer IS-CLD and a spare insulating layer IS-IL0 described with reference to FIG. 32.

The anti-reflection panel RPP and the second partial unit IS2 may be coupled to each other by the optically clear adhesives OCA. The second partial unit IS2 may include a base film IS-BL and the second conductive layer IS-CL2 and the second insulating layer IS-IL2 described with reference to FIGS. 10A to 13C.

In the illustrated exemplary embodiment, the anti-reflection panel RPP and the optical clear adhesives OCA have a function of insulating the first conductive layer IS-CL1 from the second conductive layer IS-CL2. In the illustrated exemplary embodiment, since it is difficult to define a contact hole penetrating through the anti-reflection panel RPP and the optical clear adhesives OCA, the first conductive layer IS-CL1 and the second conductive layer IS-CL2 have the structure of the sensing electrode described with reference to FIGS. 24A to 24C.

The anti-reflection panel RPP and the window panel WP may vary to have the "layer" shape. The anti-reflection panel RPP may be directly disposed on the first partial unit IS1, or the window panel WP may be directly disposed on the second partial unit IS2.

As shown in FIG. 34B, the base film IS-BL of the second partial unit IS2 of FIG. 34A may be omitted. The second conductive layer IS-CL2 of the second partial unit IS2 may be directly disposed on the anti-reflection panel RPP.

As shown in FIG. 34C, the base film IS-BL of the second partial unit IS2 of FIG. 34A may be omitted. The second conductive layer IS-CL2 of the second partial unit IS2 may be directly disposed on a lower surface of a base film WP-BS. In other words, the base surface for the second conductive layer IS-CL2 is provided by the base film WP-BS of the window panel WP. The second insulating layer IS-IL2 may be directly disposed on a lower surface of the base film WP-BS and directly cover the second conductive patterns and light blocking pattern WP-BZ of the second conductive layer IS-CL2.

Figure 35A:
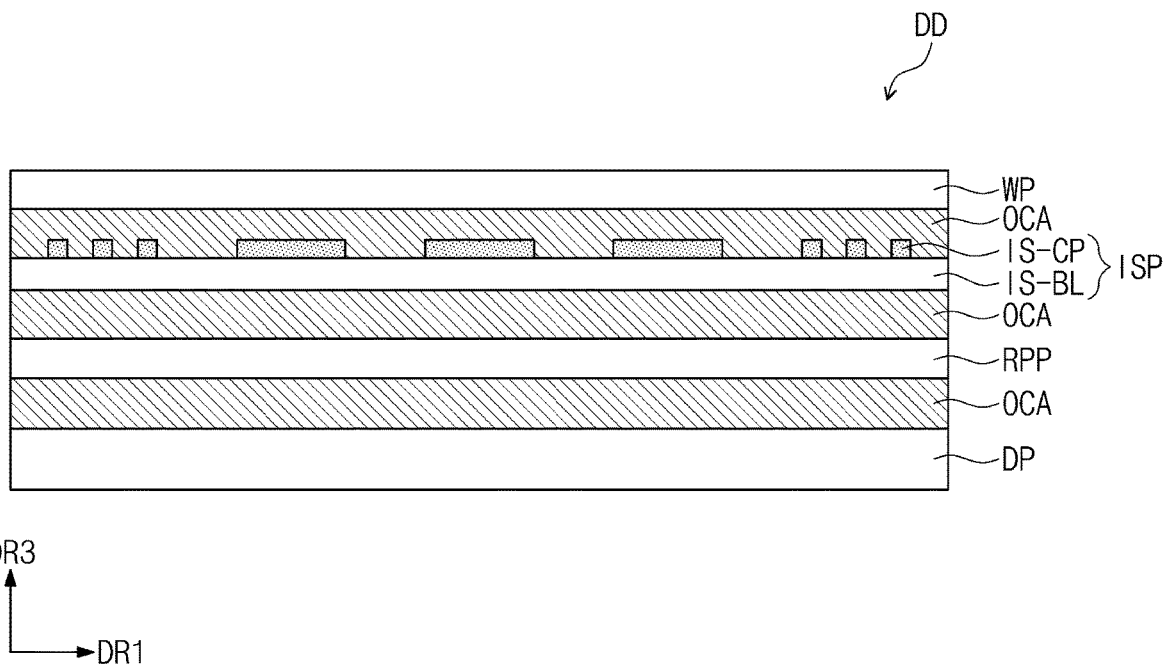
FIGS. 35A to 35C are cross-sectional views showing an exemplary embodiment of a display device according to the invention.
Figure 35B:
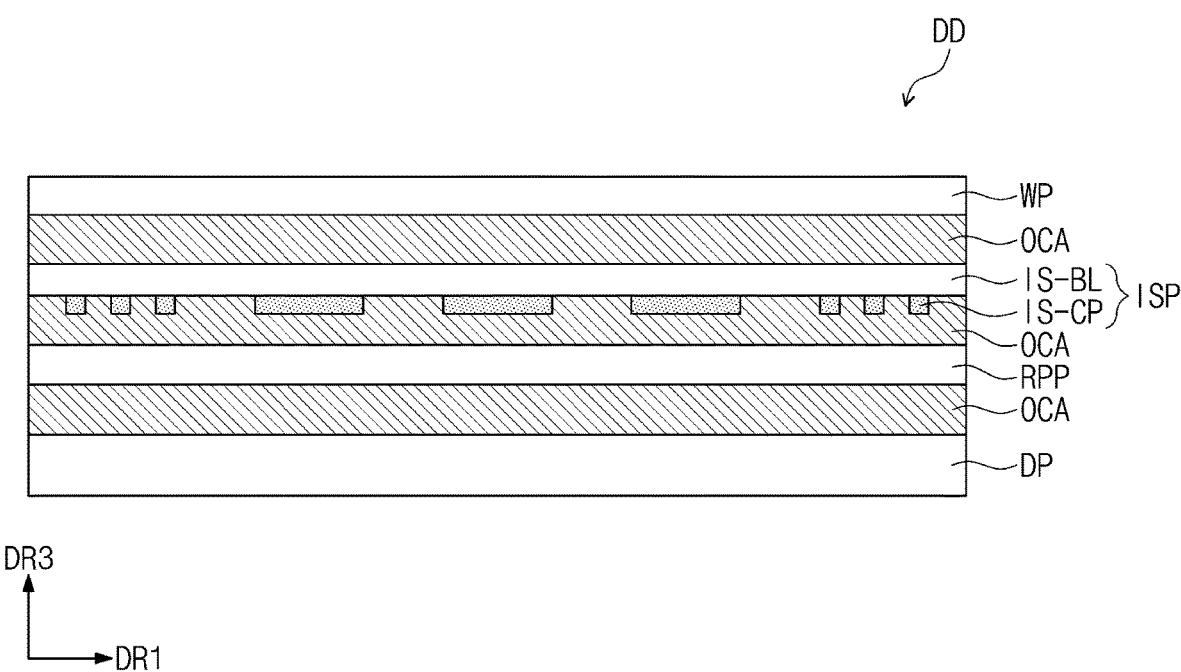
Figure 35C:
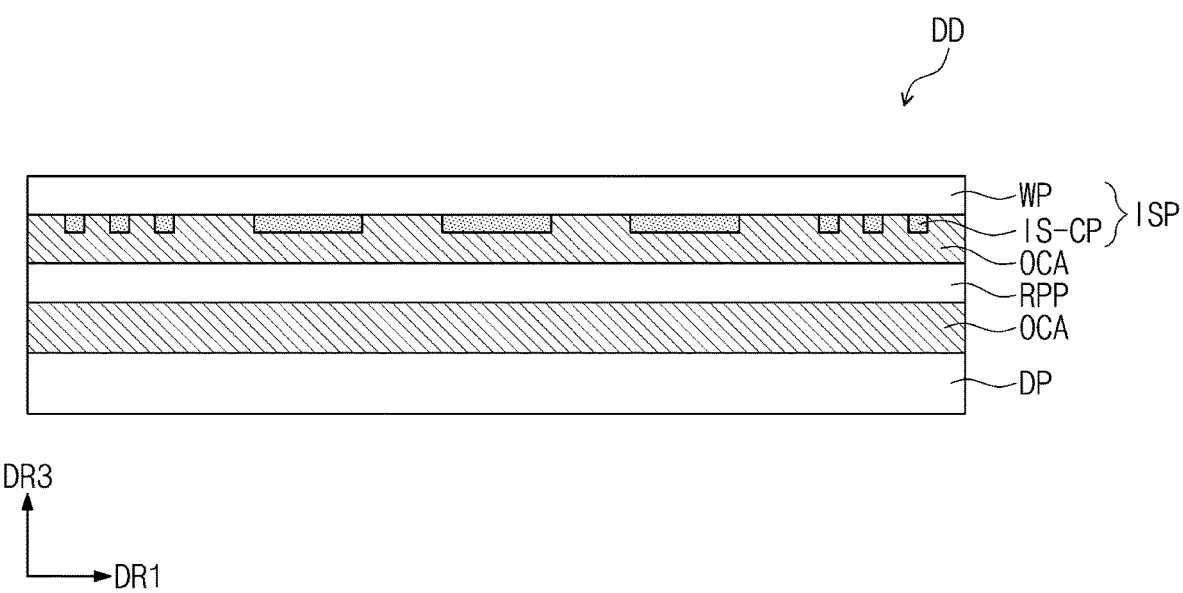
Figure 36A:
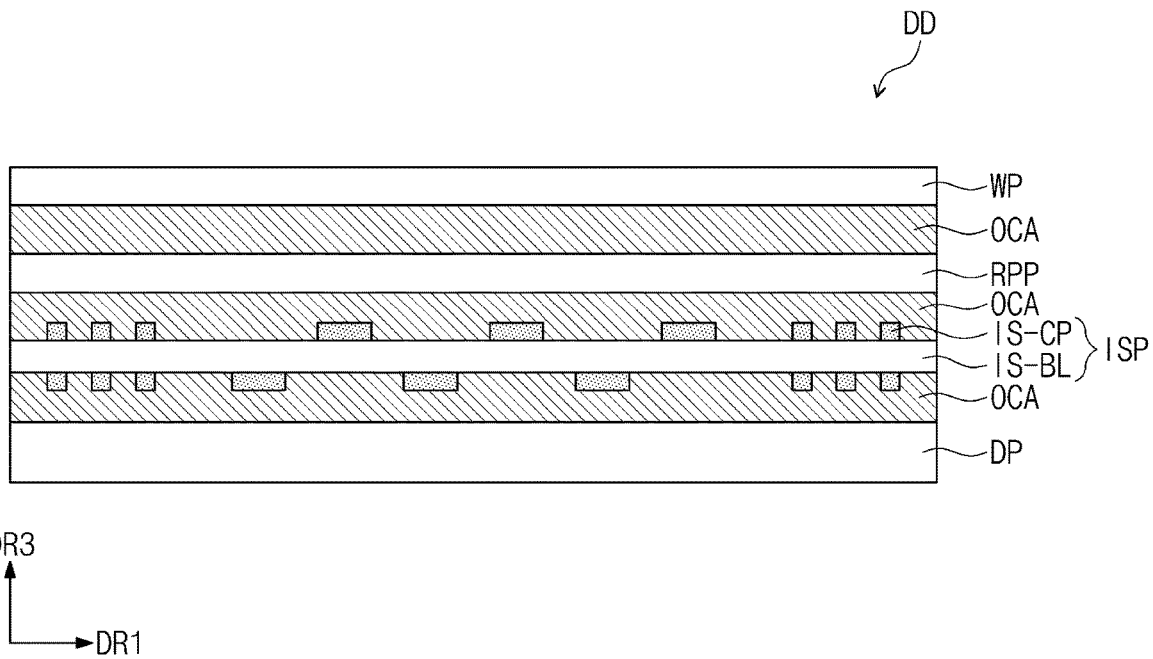
FIGS. 36A and 36B are cross-sectional views showing an exemplary embodiment of a display device according to the invention.
Figure 36B:
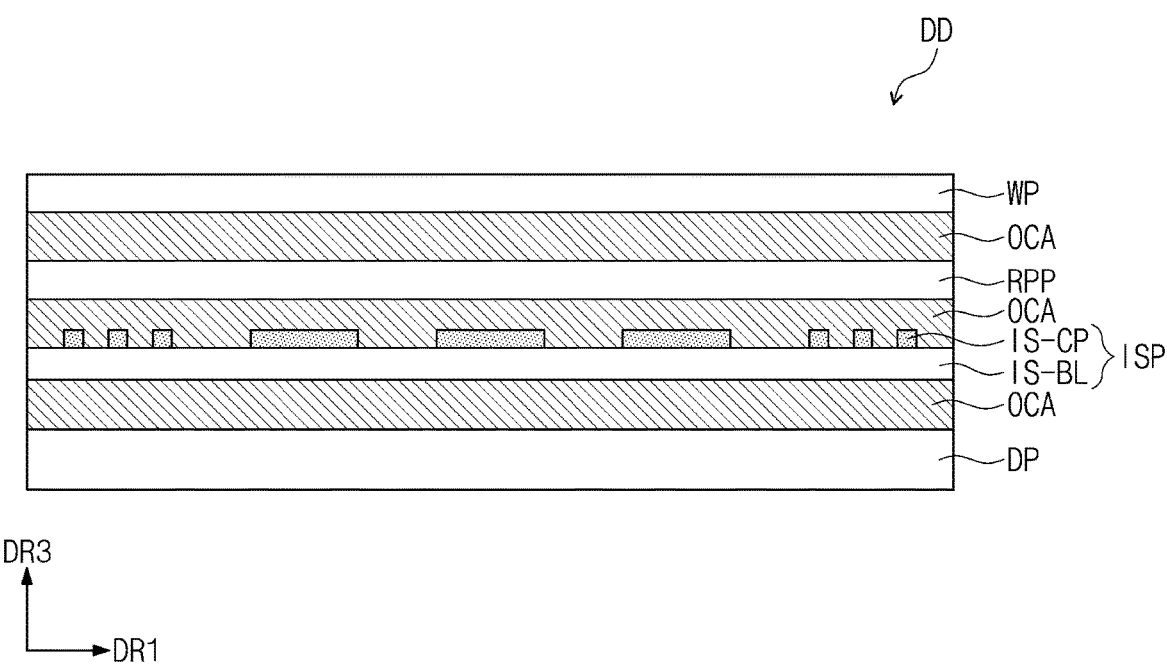
Figure 36C:
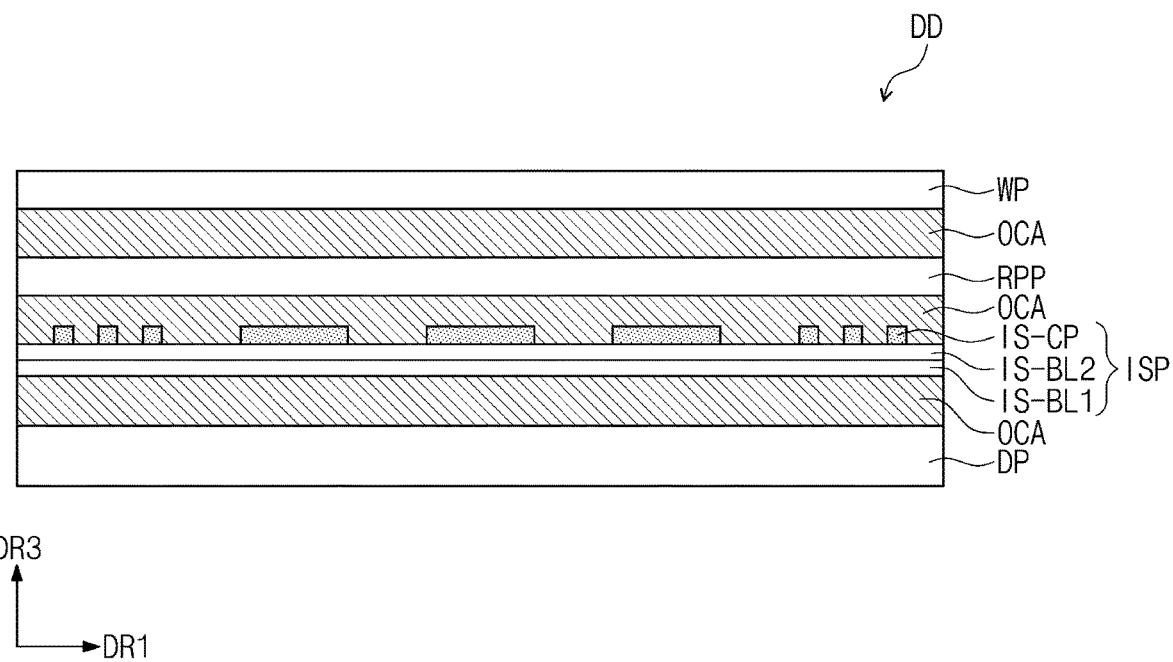
FIG. 36C is a cross-sectional view showing an exemplary embodiment of a display device according to the invention.
Figure 36D:
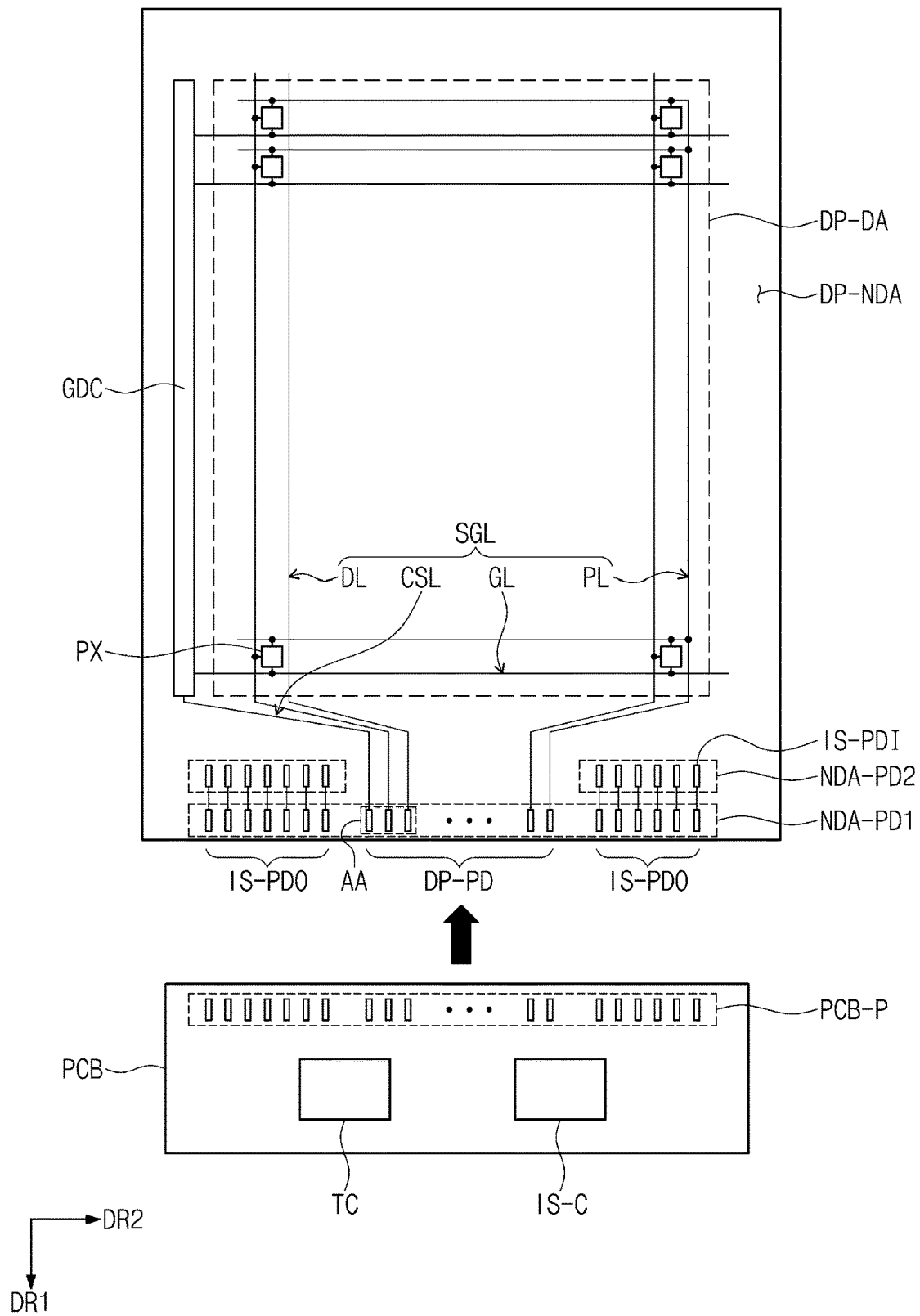
FIG. 36D is a plan view showing an exemplary embodiment of a display panel according to the invention.
Figure 36E:
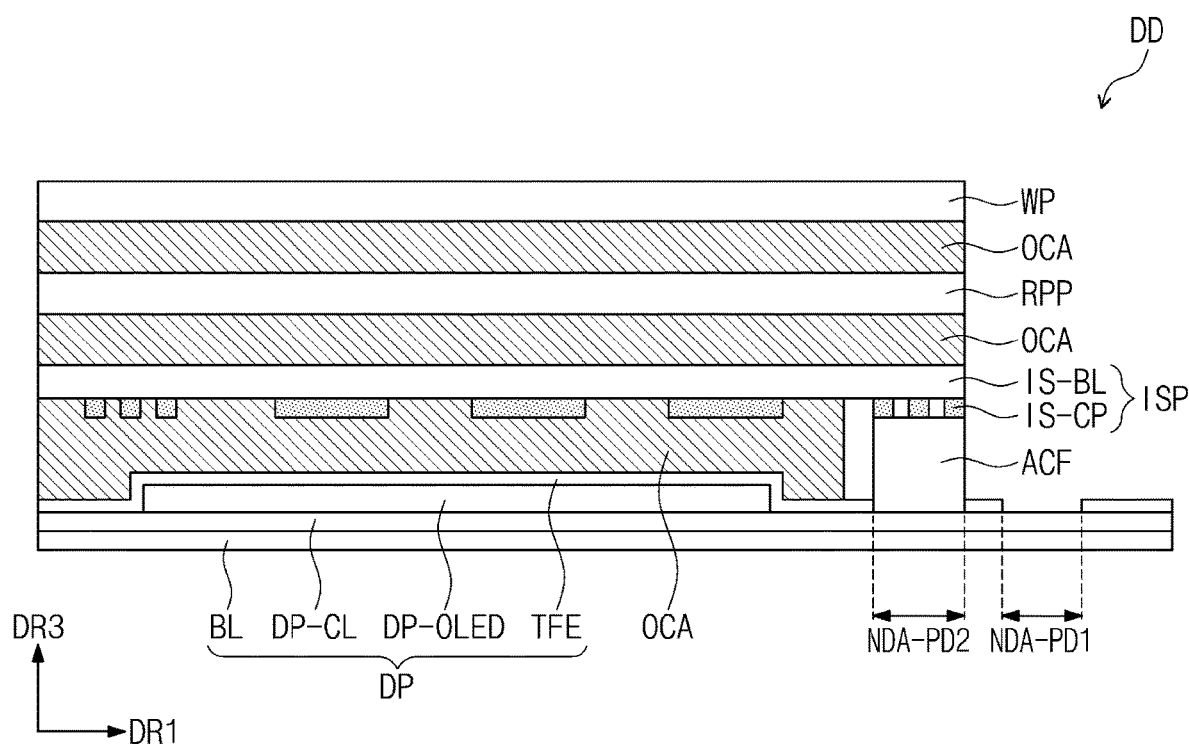
FIG. 36E is a cross-sectional view showing an exemplary embodiment of a display device according to the invention.

FIGS. 35A to 35C are cross-sectional views showing a display device according to an exemplary embodiment of the invention. FIGS. 36A and 36B are cross-sectional views showing a display device according to an exemplary embodiment of the invention. FIG. 36C is a cross-sectional view showing a display device according to an exemplary embodiment of the invention. FIG. 36D is a plan view showing a display panel according to an exemplary embodiment of the invention. FIG. 36E is a cross-sectional view showing a display device according to an exemplary embodiment of the invention. In FIGS. 35A to 35C and 36A to 36E, detailed descriptions of the same elements as those of the display device DD described with reference to FIGS. 1 to 34B will be omitted.

The display device described with reference to FIGS. 9 to 34B is based on the display device DD shown in FIG. 2A, and at least a portion of the input sensing layer ISL is directly disposed on the display panel DP. However, as described with reference to FIGS. 2B and 2C, display devices DD described hereinafter include an input sensing panel ISP and/or an anti-reflection panel RPP coupled to the display panel DP by an optically clear adhesive (OCA) member. The display panel DP described hereinafter may have the same structure and function as those of the display panel DP described with reference to FIGS. 4A to 8G, and thus detailed descriptions thereof will be omitted.

Referring to FIG. 35A, the display panel DP and the anti-reflection panel RPP may be coupled to each other by the optically clear adhesive (OCA) member, and the anti-reflection panel RPP and the input sensing panel ISP may be coupled to each other by the optically clear adhesive (OCA) member. The input sensing panel ISP and the window panel WP may be coupled to each other by the optically clear adhesive (OCA) member. In an exemplary embodiment, the anti-reflection panel RPP may include a film-type polarizer and a film-type retarder, for example. The film-type polarizer may be referred to as a "polarizer film", and the film-type retarder may be referred to as a "retarder film".

The input sensing panel ISP includes a base film IS-BL and conductive patterns IS-CP disposed on one surface or both surfaces of the base film IS-BL. FIG. 35A shows the input sensing panel ISP in which the conductive patterns IS-CP are disposed on an upper surface of the base film IS-BL.

Although not shown separately, the input sensing panel ISP may include a first conductive layer IS-CL1 and a second conductive layer IS-CL2 as shown in FIG. 9. The conductive patterns IS-CP may be provided from the first conductive layer IS-CL1 and the second conductive layer IS-CL2 as described with reference to FIGS. 10A to 28. In addition, the input sensing panel ISP may include the first conductive layer IS-CL1 as shown in FIG. 29. The conductive patterns IS-CP may be provided from the first conductive layer IS-CL1 as described with reference to FIGS. 30A to 33. The input sensing panel ISP may include at least one insulating layer as described with reference to FIGS. 9 to 33.

Different from the display device DD shown in FIG. 35A, conductive patterns IS-CP may be disposed on a lower surface of a base film IS-BL in the display device DD shown in FIG. 35B. The conductive patterns IS-CP are disposed on the lower surface of the base film IS-BL to be adjacent to a center (e.g., a center in the third direction DR3) of the display device DD. The display device DD shown in FIG. 35B may be applied to a foldable display device, and in this case, the conductive patterns IS-CP disposed at the center of the display device DD may be under relatively less stress.

This is because a neutral surface occurs when the display device DD is folded and the neutral surface occurs adjacent to the conductive patterns IS-CP. In a cast that the conductive patterns IS-CP include a transparent conductive pattern that is vulnerable to the stress, the display device DD according to the illustrated exemplary embodiment may prevent the conductive patterns IS-CP from being cracked when compared to the display device DD shown in FIG. 35A.

First sensing electrodes and second sensing electrodes, which are defined by the conductive patterns IS-CP, may be aligned in an arrangement suitable to be driven in the self-capacitance method. The arrangement of the sensing electrodes suitable to be driven in the self-capacitance method is as described above, and thus details thereof will be omitted. The input sensing panel ISP driven in the self-capacitance method may maintain a sensitivity equal to or greater than a reference sensitivity even though the window panel WP becomes thin.

Different from the display device DD shown in FIG. 35B, the base film IS-BL of the input sensing panel ISP and one optically clear adhesive (OCA) member may be omitted in the display device DD shown in FIG. 35C. The base film IS-BL of the input sensing panel ISP may be replaced with the base film WP-BS (refer to FIG. 2A) of the window panel WP. The conductive patterns IS-CP may be disposed on a lower surface of the window panel WP.

One or more of the lower insulating layer IS-IL0 and the upper insulating layer IS-IL1, which are described with reference to FIGS. 30C to 30F, may further be disposed on the window panel WP. The lower surface of the window panel WP may correspond to the upper surface of the thin film encapsulation layer TFE shown in FIG. 30D. The lower insulating layer IS-IL0 described with reference to FIGS. 30C to 30F may be deposed between the lower surface of the window panel WP and the conductive patterns IS-CP or the upper insulating layer IS-IL1 may be disposed on the lower surface of the window panel WP to cover the conductive patterns IS-CP.

As shown in FIG. 36A, conductive patterns IS-CP may be disposed on both surfaces of a base film IS-BL. A display panel DP and an input sensing panel ISP may be coupled to each other by an optically clear adhesive (OCA) member. The input sensing panel ISP and an anti-reflection panel RPP, e.g., a film-type polarizer, may be coupled to each other by an optically clear adhesive (OCA) member.

As shown in FIG. 36B, conductive patterns IS-CP may be disposed on an upper surface of a base film IS-BL. A film-type polarizer may be applied as an anti-reflection panel RPP. Although not shown separately, the conductive patterns IS-CP may be disposed on a lower surface of the base film IS-BL in the exemplary embodiment of the invention.

As shown in FIG. 36C, an input sensing panel ISP may include a base film IS-BL1 and a base insulating layer IS-BL2. A base insulating layer is disposed on a glass substrate using a resin material such as polyimide, and conductive patterns are disposed on the base insulating layer through the following process. When a preliminary input sensing panel ISP is manufactured, the base insulating layer is separated from the glass substrate and attached to the base film IS-BL1. Accordingly, the input sensing panel ISP shown in FIG. 36C is manufactured. In the illustrated exemplary embodiment, a film-type polarizer may be applied as an anti-reflection panel RPP.

According to the display devices DD shown in FIGS. 36A to 36C, the film-type polarizer may be disposed on the input sensing panel ISP. The base films IS-BL and IS-BL1 of the input sensing panel ISP may include an isotropic film. In an exemplary embodiment, the isotropic film may be one of a cyclic polyolefin ("COP") film, a non-stretched polycarbonate film, and a triacetyl cellulose ("TAC") film and may have a thickness of about 0.02 millimeter (mm) to about 0.2 mm, for example.

Since the isotropic film has the same physical properties, e.g., a refractive index, in any direction, a member used to compensate for a phase difference is unnecessary, and thus the thickness of the display device may be reduced. Since a stretch-type PET film has different phase difference values (about 1,000 nm or above) depending on directions, an optical condition of polarization is not satisfied by the stretch-type PET film, but the optical condition of polarization may be satisfied by the isotropic film. Accordingly, a deterioration of an image quality, e.g., the conductive patterns IS-CP being visible, may be prevented.

The display panel shown in FIG. 36D may further include a second pad area NDA-PD2 compared to the display panel DP shown in FIG. 4A. A first pad area NDA-PD1 shown in FIG. 36D corresponds to the pad area NDA-PD of the display panel DP shown in FIG. 4A.

Output pads IS-PDO provided by the same process as the signal pads DP-PD may further be provided in the first pad area NDA-PD1. Input pads IS-PD1 provided by the same process as the signal pads DP-PD may further be provided in the second pad area NDA-PD2. A cross-sectional structure of the output pads IS-PDO and the input pads IS-PDI may be the same as the cross-sectional structure of the signal pads DP-PD, and thus details thereof will be omitted.

The output pads IS-PDO may be connected to corresponding input pads IS-PDI among the input pads IS-PDI through the signal lines. The input pads IS-PDI may be electrically connected to the signal lines of the input sensing panel ISP.

As shown in FIG. 36E, conductive patterns IS-CP of the input sensing panel ISP may be disposed on a lower surface of a base film IS-BL. The display panel DP and the input sensing panel ISP may be coupled to each other by an optically clear adhesive ("OCA") member.

A pad part of the signal lines of the input sensing panel ISP may be electrically connected to the input pads IS-PDI of the second pad area NDA-PD2 described with reference to FIG. 36D through a conductive member, e.g., an anisotropic conductive film ("ACF"). In another exemplary embodiment, the ACF may be replaced with conductive balls, for example.

In the illustrated exemplary embodiment, a stacking structure of the base film should not be particularly limited. As described with reference to FIG. 36C, the base film IS-BL may have a two-layer structure. The input sensing panel may have a shape obtained by inverting the input sensing panel ISP described with reference to FIG. 36C. A manufacturing method may be substantially the same as that described with reference to FIG. 36C. Although the input sensing panel ISP is provided separately from and attached to the display panel DP, the pad part SL-P (refer to FIG. 10A) of the input sensing panel ISP may be connected to the output pads IS-PDO of the display panel PD. Accordingly, the input sensing panel ISP and the display panel DP may be electrically connected to an external electronic device through one circuit board PCB. Thus, a manufacturing cost of the display device may be reduced.

Figure 37A:
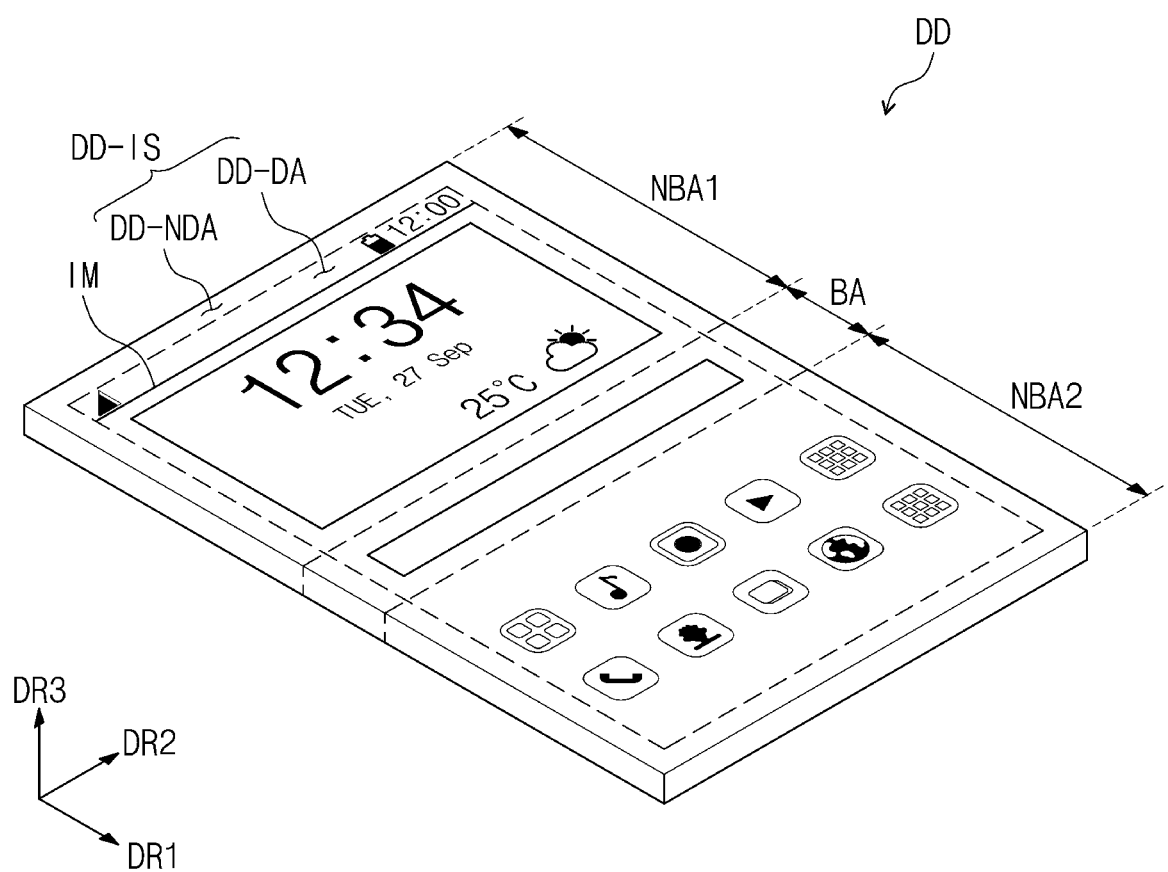
FIGS. 37A to 37C are perspective views showing an exemplary embodiment of a display device according to the invention.
Figure 37B:
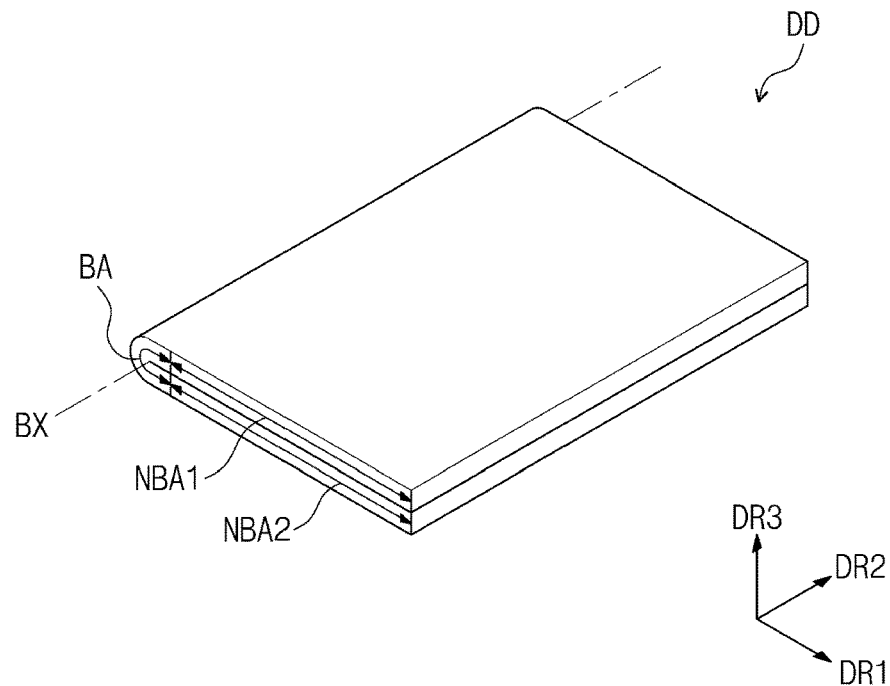
Figure 37C:
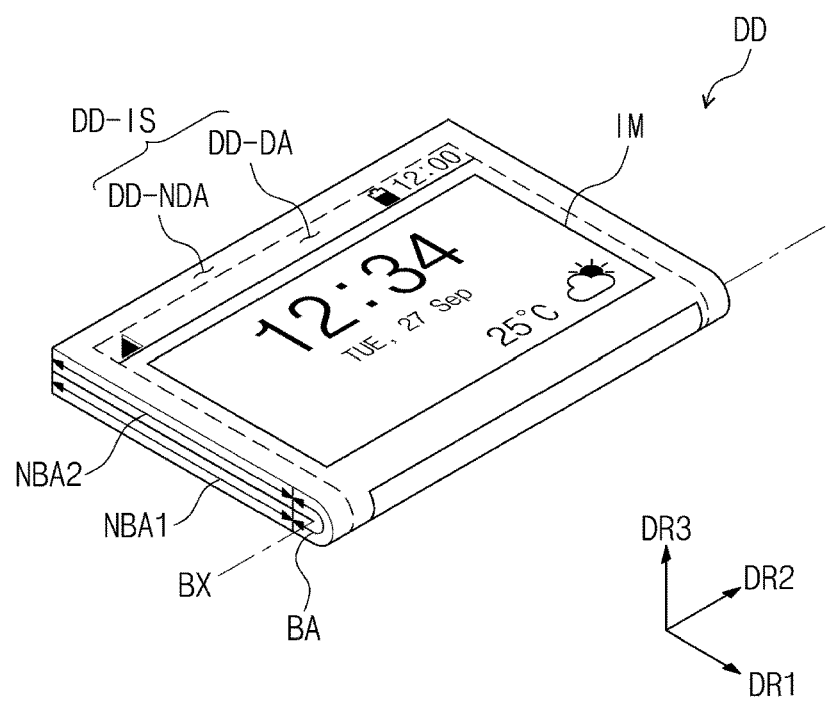
Figure 38A:
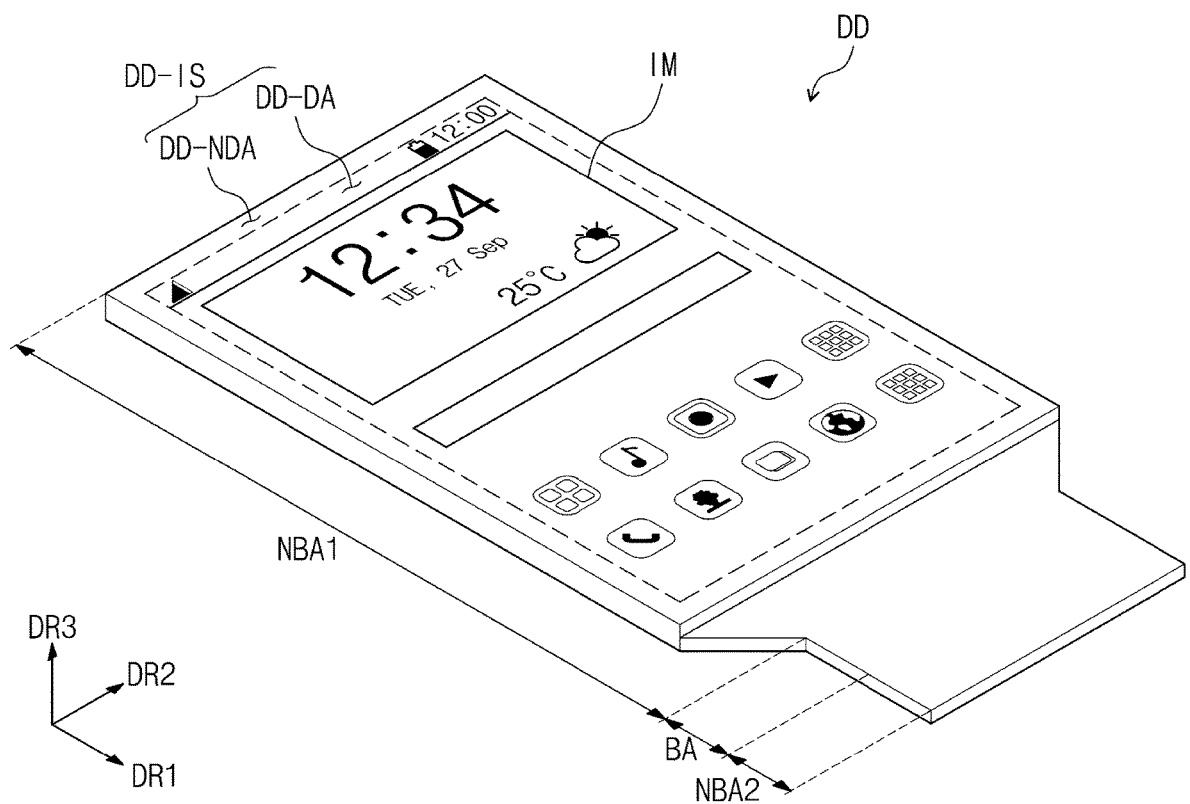
FIGS. 38A and 38B are perspective views showing an exemplary embodiment of a display device according to the invention.
Figure 38B:
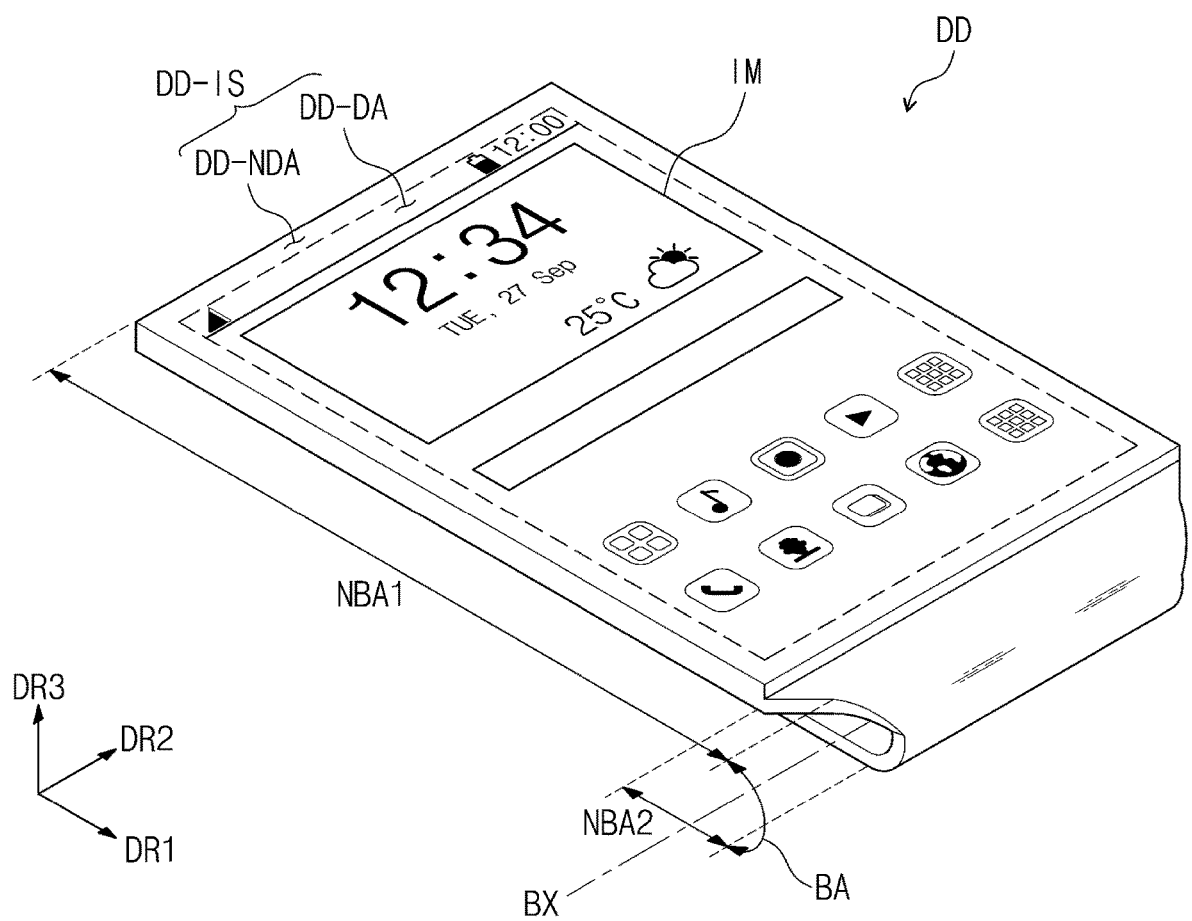
Figure 39:
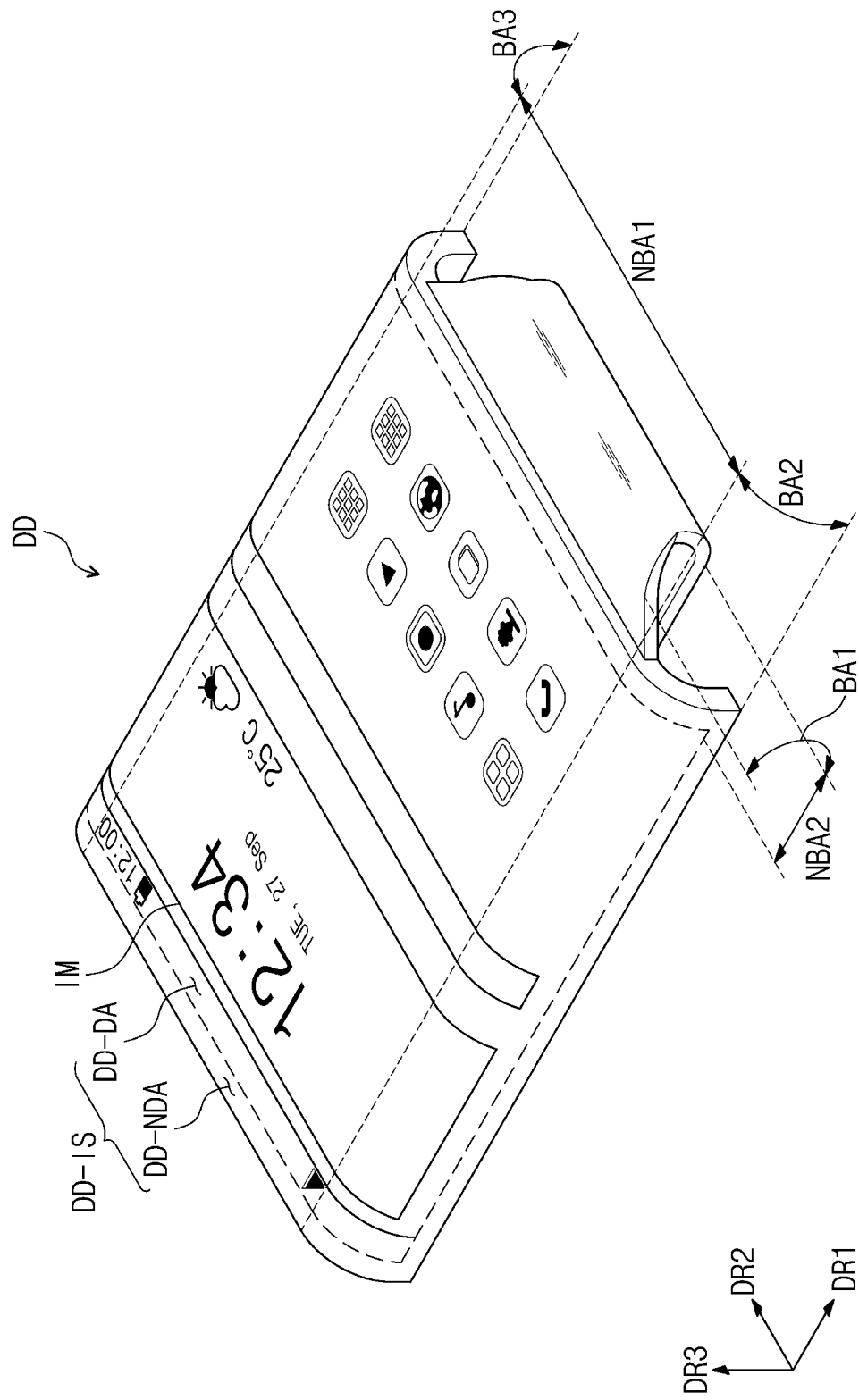
FIG. 39 is a perspective view showing an exemplary embodiment of a display device according to the invention.

FIGS. 37A to 37C are perspective views showing a display device DD according to an exemplary embodiment of the invention. FIGS. 38A and 38B are perspective views showing a display device DD according to an exemplary embodiment of the invention. FIG. 39 is a perspective view showing a display device DD according to an exemplary embodiment of the invention. The display panel DP and the input sensing unit ISU described with reference to FIGS. 1 to 34C may be applied to a flexible display device DD described hereinafter.

As shown in FIGS. 37A to 37C, the display device DD may include a plurality of areas defined by an operation mode. The display device DD may include a first area NBA1, a second area NBA2, and a third area BA disposed between the first area NBA1 and the second area NBA2. The third area BA is bent on the basis of a bending axis BX to form a curvature. Hereinafter, the first area NBA1, the second area NBA2, and the third area BA may be referred to as a first non-bending area NBA1, a second non-bending area NBA1, and a bending area BA.

As shown in FIG. 37B, the display device DD may be inwardly bent such that a display surface DD-IS of the first non-bending area NBA1 faces a display surface DD-IS of the second non-bending area NBA2. As shown in FIG. 37C, the display device DD may be outwardly bent such that the display surface DD-IS is exposed to the outside.

In the exemplary embodiment of the invention, the display device DD may include a plurality of bending areas. In addition, the bending area BA may be defined to correspond to a user's operation. In an exemplary embodiment, different from FIGS. 37B and 37C, the bending area BA may be defined to be substantially parallel to the first directional axis DR1 or defined along a diagonal direction, for example. The bending area BA may have an area determined by a radius of curvature without being fixed. In the exemplary embodiment of the invention, the display device DD may be implemented to allow only the operation mode shown in FIGS. 37A and 37B to be repeated or only the operation mode shown in FIGS. 37A and 37C to be repeated.

As shown in FIGS. 38A and 38B, a display device DD may include a first non-bending area NBA1, a second non-bending area NBA2, and a bending area BA. The first non-bending area NBA1, the second non-bending area NBA2, and the bending area BA may be defined with respect to the display panel DP (refer to FIGS. 2A to 2F). The input sensing unit, the anti-reflection unit, and the window unit may be disposed only in the first non-bending area NBA1.

As shown in FIG. 38A, the first non-bending area NBA1, the second non-bending area NBA2, and the bending area BA of the display panel DP may have different widths in the first direction DR1. The bending area BA and the second non-bending area NBA2 may have a width smaller than that of the first non-bending area NBA1. When the bending area BA has a relatively small width, the display panel DP may be easily bent. A boundary area in which the width gradually decreases in FIG. 38A may be included in the first non-bending area NBA1. In the exemplary embodiment of the invention, the boundary area in which the width gradually decreases may be omitted.

The second non-bending area NBA2 may include the pad area NDA-PD (refer to FIG. 4A). As shown in FIG. 38B, the second non-bending area NBA2 faces the first non-bending area NBA1 and is spaced apart from the first non-bending area NBA1.

As shown in FIG. 39, a display device DD may include three bending areas BA1, BA2, and BA3. When compared to the display device DD shown in FIG. 38B, two edge areas facing each other in the second direction DR2 of the first non-bending area NBA1 are bent from a center area to define the second and third bending areas BA2 and BA3. The first bending area BA1 may correspond to the bending area BA of FIGS. 38A and 38B. The input sensing unit ISU, the anti-reflection unit RPU, and the window unit WU shown in FIGS. 2A to 2F may overlap the first non-bending area NBA1 and the second and third bending areas BA2 and BA3.

Figure 40A:
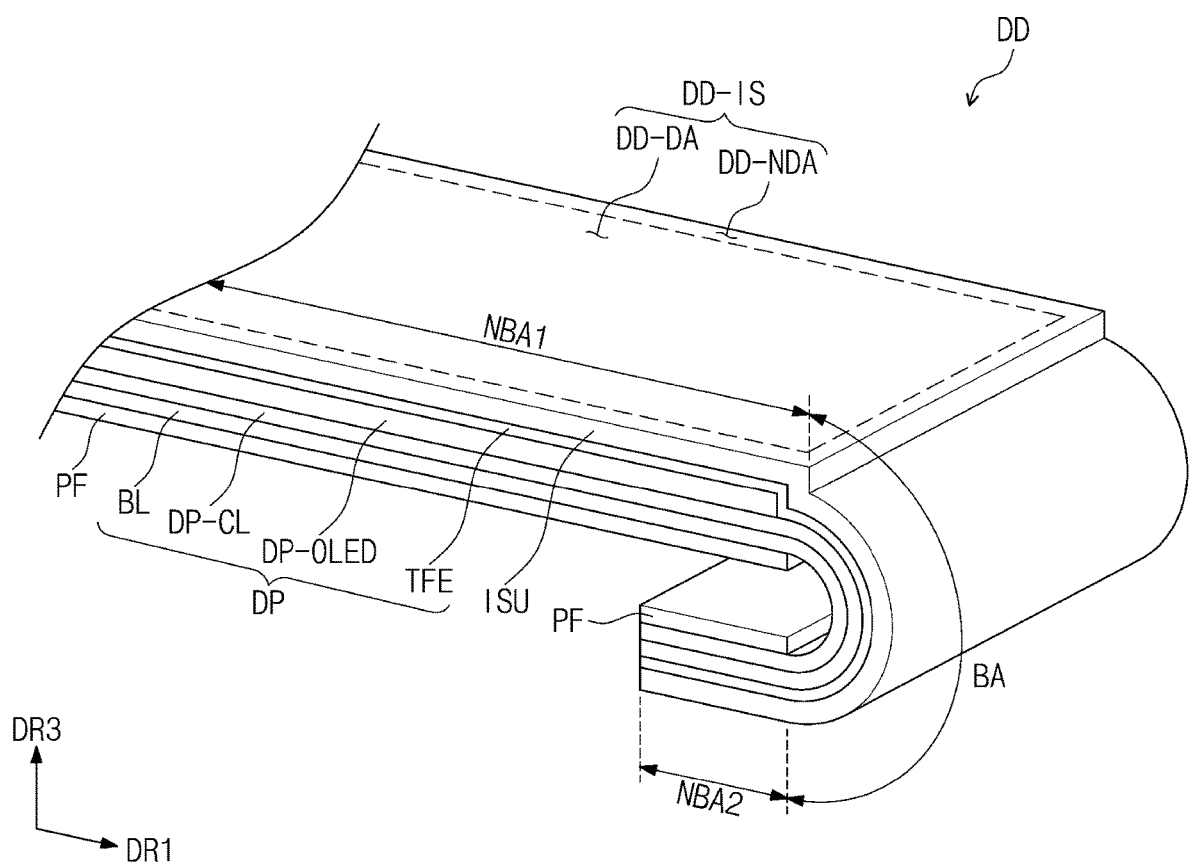
FIG. 40A is a perspective view showing an exemplary embodiment of a display device according to the invention.
Figure 40B:
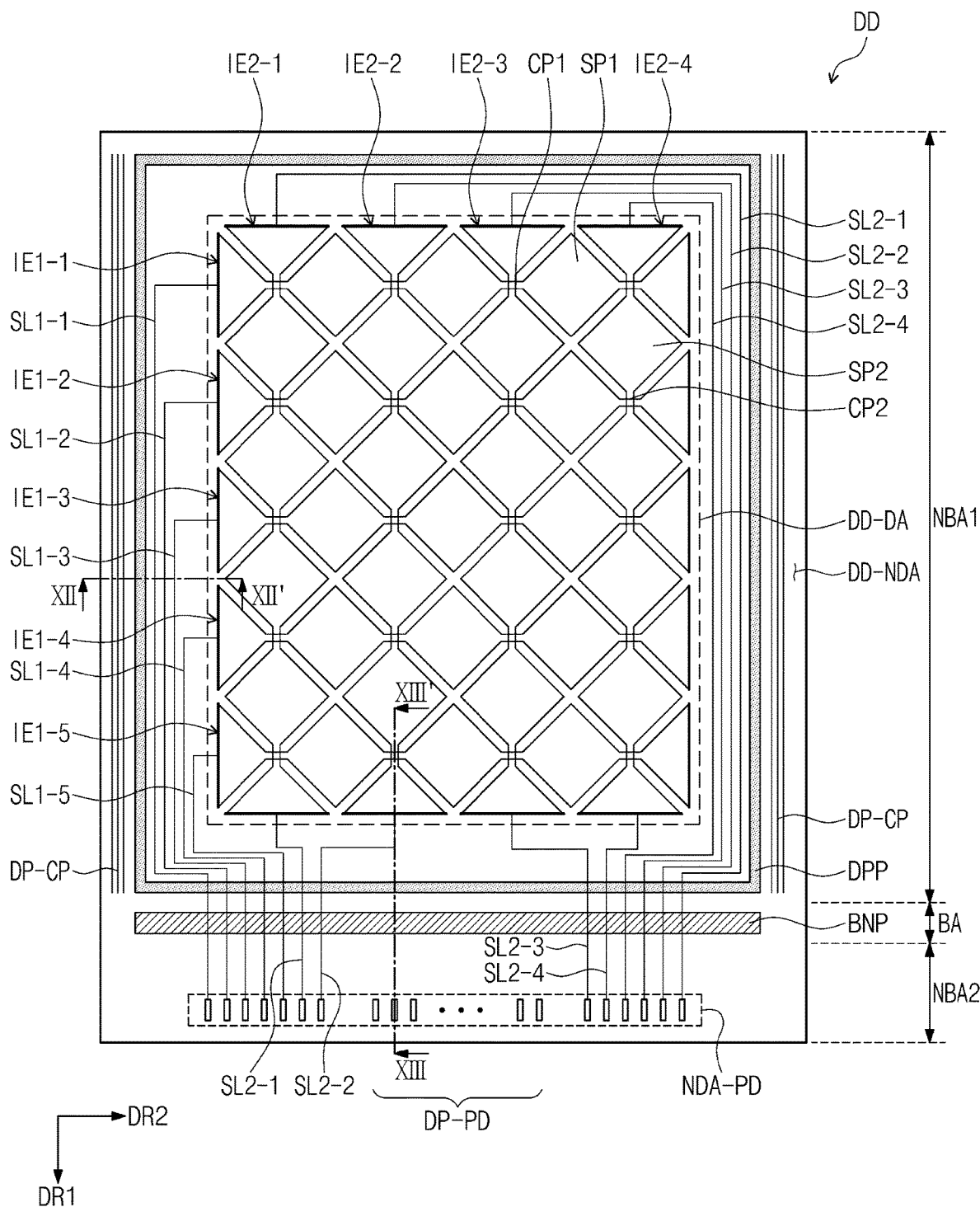
FIG. 40B is a plan view showing an exemplary embodiment of a display device according to the invention.
Figure 41A:
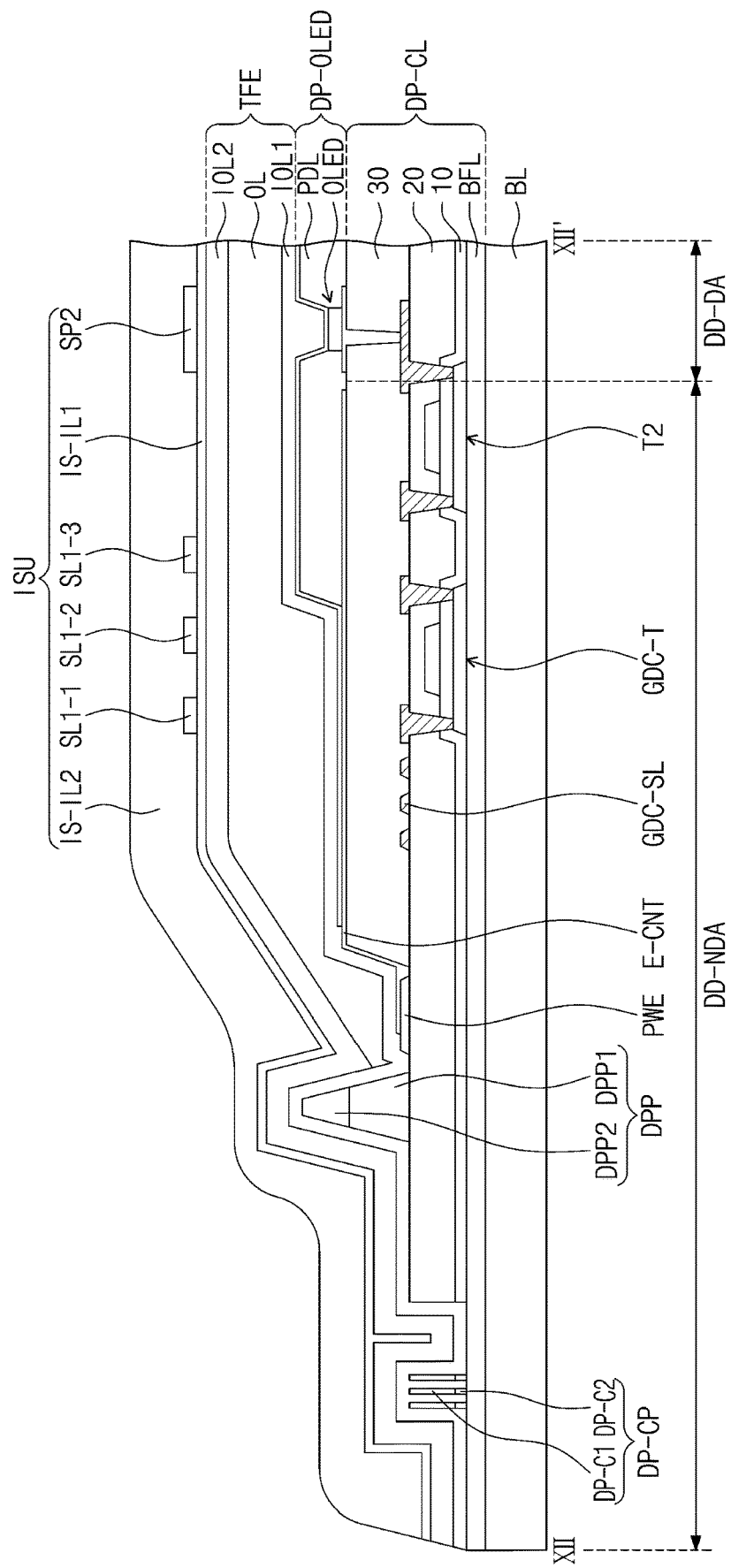
FIG. 41A is a cross-sectional view taken along line XII-XII' of FIG. 40B.
Figure 41B:
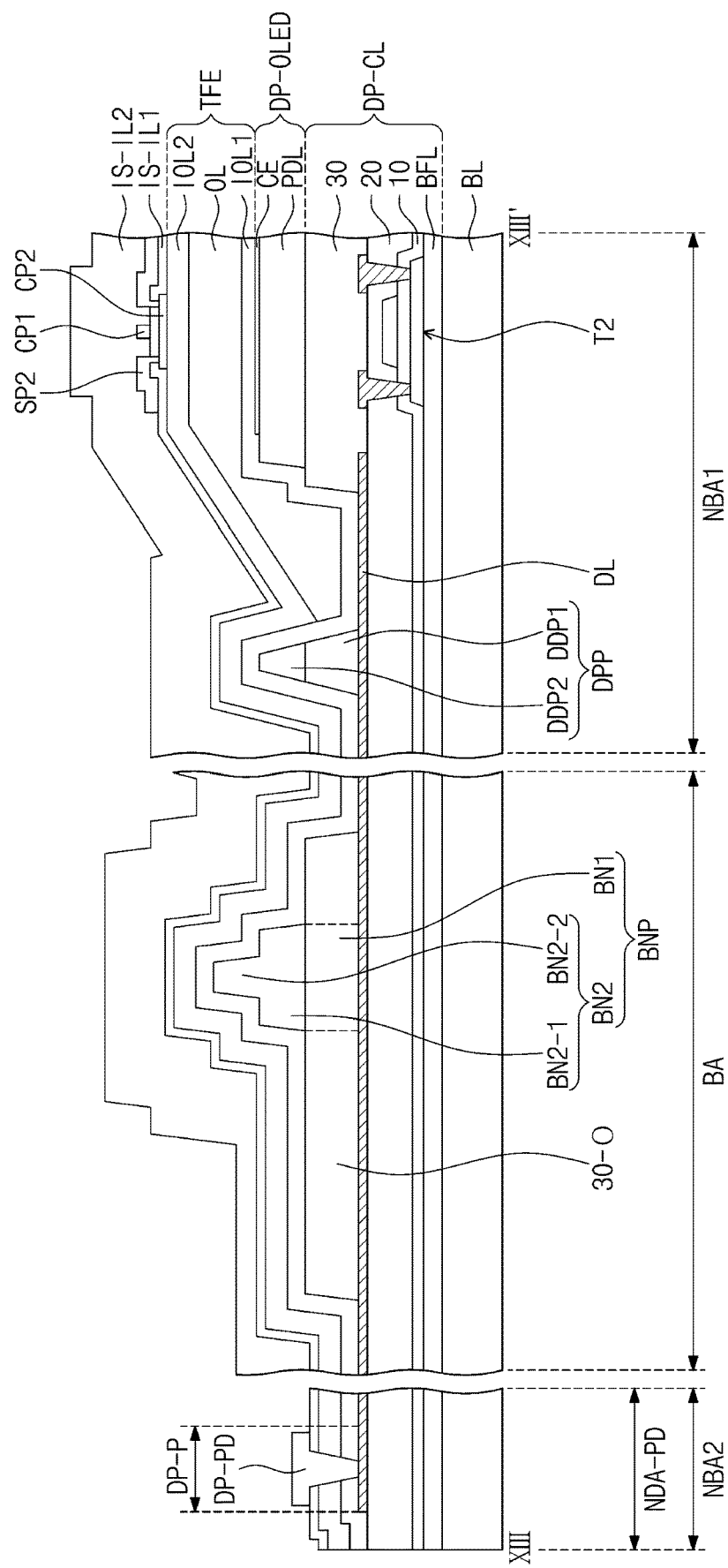
FIGS. 41B and 41C are cross-sectional views taken along line XIII-XIII' of FIG. 40B.
Figure 41C:
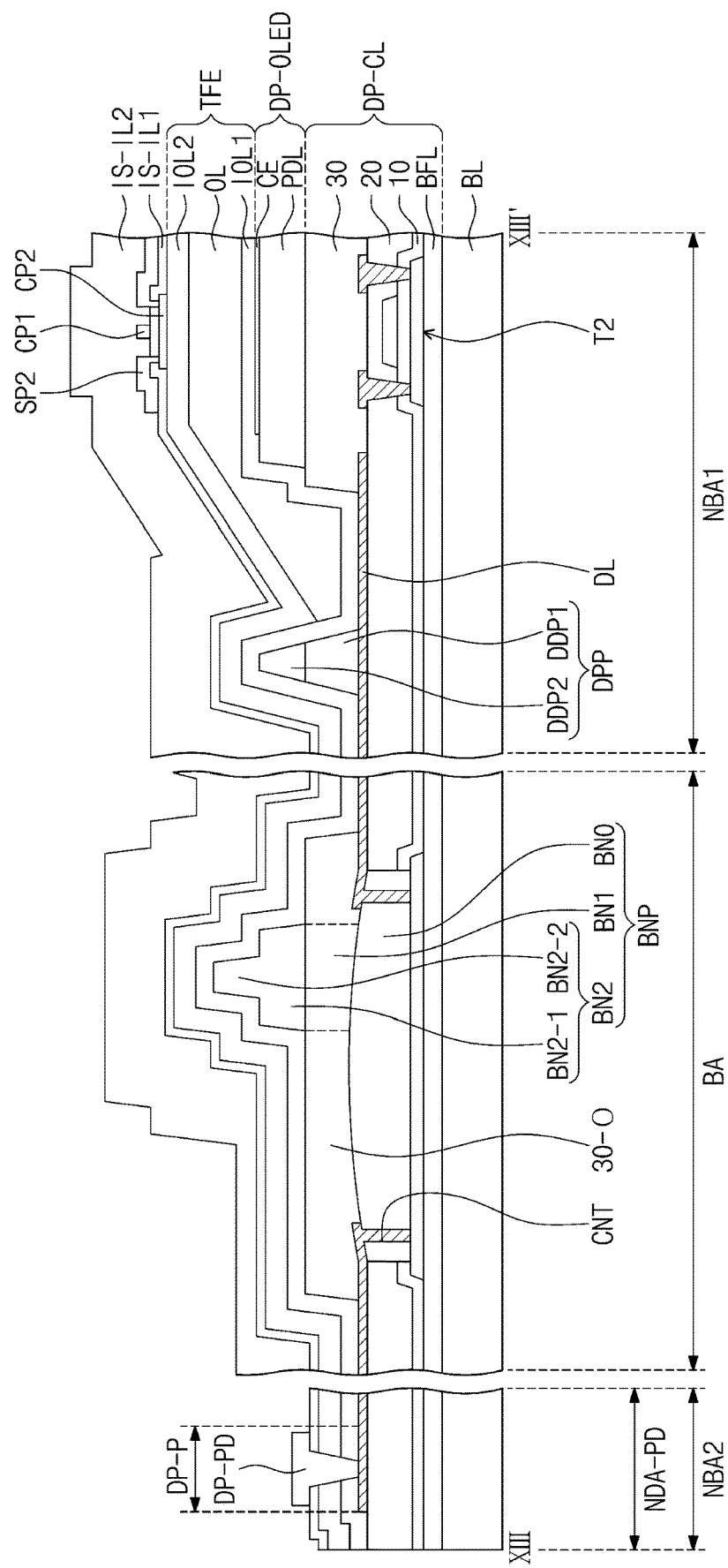

FIG. 40A is a perspective view showing a display device DD according to an exemplary embodiment of the invention. FIG. 40B is a plan view showing a display device DD according to an exemplary embodiment of the invention. FIG. 41A is a cross-sectional view taken along line XII-XII' of FIG. 40B to show the display device DD. FIGS. 41B and 41C are cross-sectional views taken along line XIII-XIII' of FIG. 40B to show the display device DD. Hereinafter, the display device DD according to the exemplary embodiment of the invention will be described in detail with reference to FIGS. 40A and 40B.

FIG. 40A is a perspective view showing an enlarged view of FIG. 38B. The display device DD includes a display panel DP and an input sensing unit ISU. The display device DD further includes a protective member PF. Although not shown separately, the display device DD may further include an anti-reflection unit and/or a window unit.

A base layer BL, a circuit element layer DP-CL, and a thin film encapsulation layer TFE of the display panel DP overlap a first non-bending area NBA1, a second non-bending area NBA2, and a bending area BA. A display element layer DP-OLED of the display panel DP overlaps the first non-bending area NBA1. The input sensing unit ISU overlaps the first non-bending area NBA1, the second non-bending area NBA2, and the bending area BA.

The protective member PF is disposed on a lower surface of the base layer BL and overlaps the first non-bending area NBA1 and the second non-bending area NBA2. The protective member PF may include a first protective member PF and a second protective member PF separated from the first protective member PF. The first protective member PF and the second protective member PF respectively overlap the first non-bending area NBA1 and the second non-bending area NBA2 and face each other while being bent.

FIG. 40B shows additional components of the display panel DP when compared to the display panel DP shown in FIG. 40A and components of an input sensing unit ISU in one plan view. The display device DD described hereinafter may be applied to the flat-type display device DD shown in FIG. 1 and the folding-type display device DD shown in FIGS. 37A to 37C, but the bending-type display device DD shown in FIGS. 38A to 39 will be described as a representative example. In particular, the bending-type display device DD shown in FIGS. 38A and 38B will be mainly described.

As shown in FIG. 40B, the display device DD may include one or more of a dam part DPP, a crack dam part DP-CP, and a bank BNP. The dam part DPP may extend along an edge of the display area DD-DA. The dam part DPP and the crack damp part DP-CP are disposed in the first non-bending area NBA1, and the bank BNP is disposed in the bending area BA.

The dam part DPP may surround the display area DD-DA. A portion of the dam part DPP may be substantially parallel to the pad area NDA-PD. The crack dam part DP-CP may be disposed along an outside of the dam part DPP and may extend along a direction (e.g., the first direction DR1 in the illustrated exemplary embodiment) crossing the bank BNP.

FIG. 40B shows two groups of crack dam parts DP-CP spaced apart from each other in the second direction DR2. Each of the two groups of crack dam parts DP-CP includes three crack dam parts DP-CP, for example. The bank BNP may extend along a direction substantially parallel to the bending axis BX (refer to FIG. 38B), i.e., along the second direction DR2.

The display device DD shown in FIG. 40B includes the display panel DP shown in FIG. 4A, but the display device DD may include the display panel DP shown in FIG. 4B. In this case, the chip mounting area NDA-TC (refer to FIG. 4B) may be disposed in the second non-bending area NBA2.

As shown in FIGS. 41A and 41B, a driving circuit GDC (refer to FIG. 4A) included in the circuit element layer DP-CL is disposed in the non-display area DD-NDA. The driving circuit GDC includes at least one transistor GDC-T provided through the same process as a second transistor T2 that serves as a transistor of a pixel. The driving circuit GDC may include signal lines GDC-SL disposed in the same layer as an input electrode of the second transistor T2. The driving circuit GDC may be a scan driving circuit and may further include a signal line disposed in the same layer as a control electrode of the second transistor T2.

A power electrode PWE providing the second source voltage ELVSS (refer to FIG. 5) is disposed outside the scan driving circuit GDC. The power electrode PWE may receive the second source voltage ELVSS from an extern source. A connection electrode E-CNT is disposed on an intermediate organic layer 30. The connection electrode E-CNT connects the power electrode PWE and a second electrode CE. The connection electrode E-CNT is provided through the same process as the first electrode AE (refer to FIG. 6), and thus the connection electrode E-CNT may include the same layer structure and the same material as those of the first electrode AE. The connection electrode E-CNT and the first electrode AE may have the same thickness.

FIGS. 41A and 41B show a thin film encapsulation layer TFE having the shape described with reference to FIG. 8A as a representative example. A first encapsulation inorganic layer IOL1 and a second encapsulation inorganic layer IOL2 are entirely disposed over the display area DP-DA and the non-display area DP-NDA. In addition, FIG. 41B shows a cross-section of the pad area described with reference to FIG. 13B. The first encapsulation inorganic layer IOL1, the second encapsulation inorganic layer IOL2, and the first insulating layer IS-IL1 are disposed between the pad part DL-P and the signal pad DP-PD.

As shown in FIGS. 41A and 41B, the dam part DPP may have a multi-layer structure. A lower portion DPP1 may be provided together with the intermediate organic layer 30, and an upper portion DPP2 may be provided together with a pixel definition layer PDL. The damp part DPP prevents a liquid organic material from being spread out of intermediate inorganic layers 10 and 20 when an encapsulation organic layer OL is provided. The encapsulation organic layer OL may be provided by providing the liquid organic material on the first encapsulation inorganic layer IOL1 using an inkjet method, and in this case, the dam part DPP defines a boundary of an area in which the liquid organic material is disposed.

The crack dam part DP-CP may include a first layer DP-C1 and a second layer DP-C2. The first layer DP-C1 has the same thickness as the first intermediate inorganic layer 10 and includes the same material as that of the first intermediate inorganic layer 10. The second layer DP-C2 has the same thickness as the second intermediate inorganic layer 20 and includes the same material as that of the second intermediate inorganic layer 20.

When an external impact is applied to an edge of the display device DD, the crack dam part DP-CP breaks and absorbs the energy of the impact. Accordingly, the external impact may be prevented from being transferred to the display area DD-DA.

The bank BNP may have a multi-layer structure. A first insulating pattern BN1 may be provided together with the intermediate organic layer 30, and a second insulating pattern BN2 may be provided together with the pixel definition layer PDL. The first insulating pattern BN1 and the second insulating pattern BN2 may include an organic material. The second insulating pattern BN2 has a stepped shape and includes a first part BN2-1 and a second part BN2-2 integrally provided with the first part BN2-1. The bank BNP has a height higher than the damp DPP by a height of the second part BN2-2. The bank BNP may support a mask used to form the encapsulation inorganic layers IOL1 and IOL2 (refer to FIGS. 8D and 8F).

The circuit element layer DP-CL may further include an outer organic layer 30-O connected to the bank BNP. The outer organic layer 30-O includes a first insulating pattern provided together with the intermediate organic layer 30. Although not shown separately, the outer organic layer 30-O may have a multi-layer structure. The outer organic layer 30-O may further include a second insulating pattern provided together with the pixel definition layer PDL. In FIG. 41B, the bending area BA is defined to be longer than the outer organic layer 30-O, but the bending area BA may be defined to be shorter than the outer organic layer 30-O. The size of the bending area BA may be determined by a radius of curvature.

The intermediate organic layer 30 and the damp part DPP are spaced apart from each other, and the dam part DPP and the bank BNP are spaced apart from each other. The organic material is not disposed between the intermediate organic layer 30, the dam part DPP, and the bank BNP. The first encapsulation inorganic layer IOL1 may contact the second encapsulation inorganic layer IOL2 in areas between the intermediate organic layer 30, the dam part DPP, and the bank BNP. In FIG. 41B, a portion of the data line DL is disposed between the first encapsulation inorganic layer IOL1 and the second intermediate inorganic layer 20. The first encapsulation inorganic layer IOL1 may contact the second intermediate inorganic layer 20 in an area in which the data line DL is not disposed when viewed in a plan view.

In the illustrated exemplary embodiment, the data line DL is disposed on the second intermediate inorganic layer 20, but it should not be limited thereto or thereby. As shown in FIG. 41C, the portion of the data line DL overlapped with the bending area BA may be disposed on a buffer layer BFL. The portion of the data line DL overlapped with the bending area BA may be electrically connected to a portion of the data line DL not overlapped with the bending area BA through contact holes CNT. The portion of the data line DL disposed on the buffer layer BFL may be provided through the same process as the control electrode of the second transistor T2. The portion of the data line DL disposed on the buffer layer BFL may be disposed adjacent to a neutral surface occurring in the bending area BA when the bending area BA is bent.

In addition, the first intermediate inorganic layer 10 and a portion of the second intermediate inorganic layer 20, e.g., a portion overlapped with the bending area BA, may be removed. The organic material may be filled in the area from which the above-mentioned layers are removed. The organic material may be defined as a dummy insulating pattern BNO. In the exemplary embodiment of the invention, a portion of the buffer layer BFL may further be removed. Accordingly, the inorganic material may be minimized in the bending area BA, and the inorganic layer may be prevented from being cracked even though a stress occurs during the bending of the display panel DP.

Figure 42:
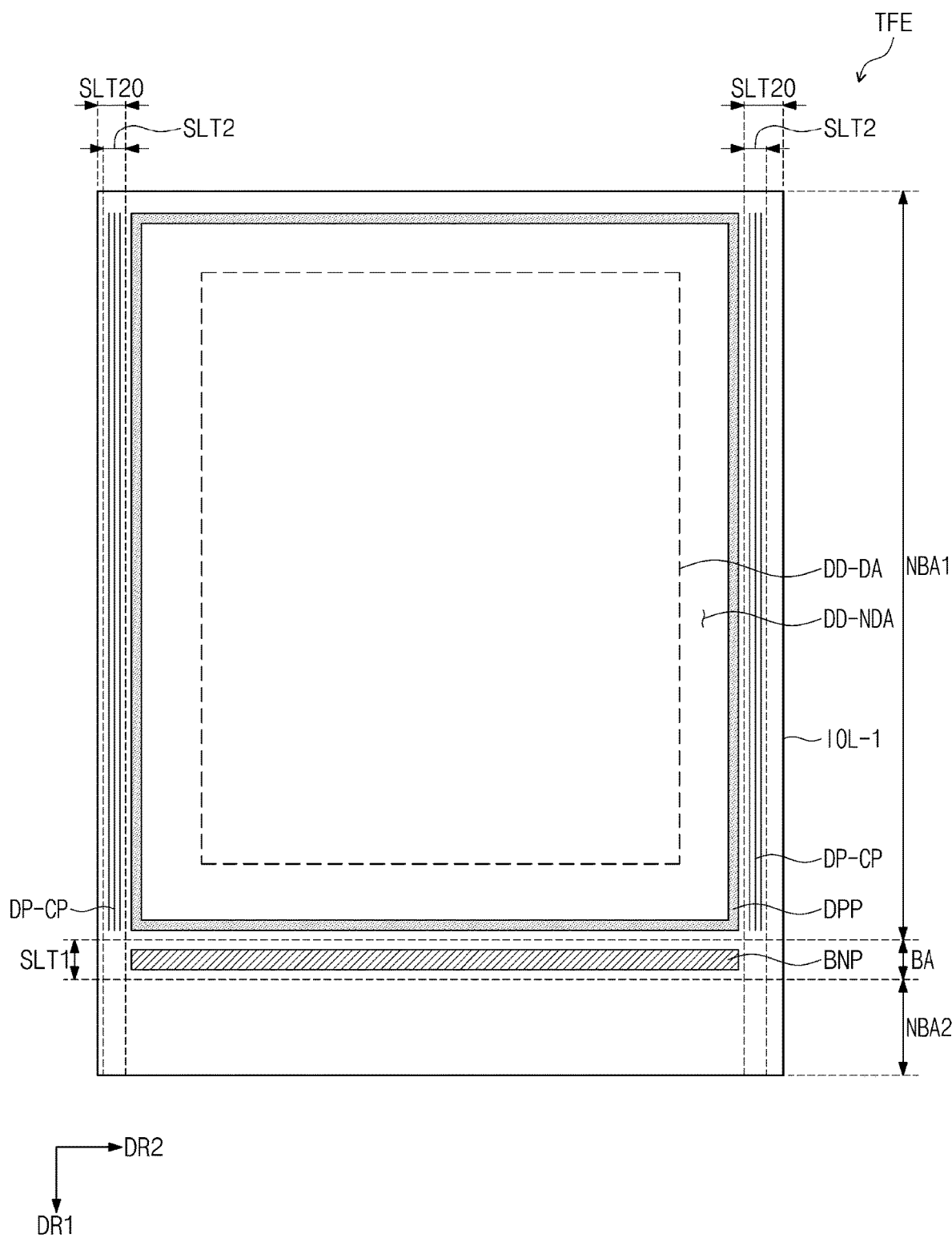
FIG. 42 is a plan view showing an exemplary embodiment of a thin film encapsulation layer applied to a display device according to the invention.
Figure 43A:
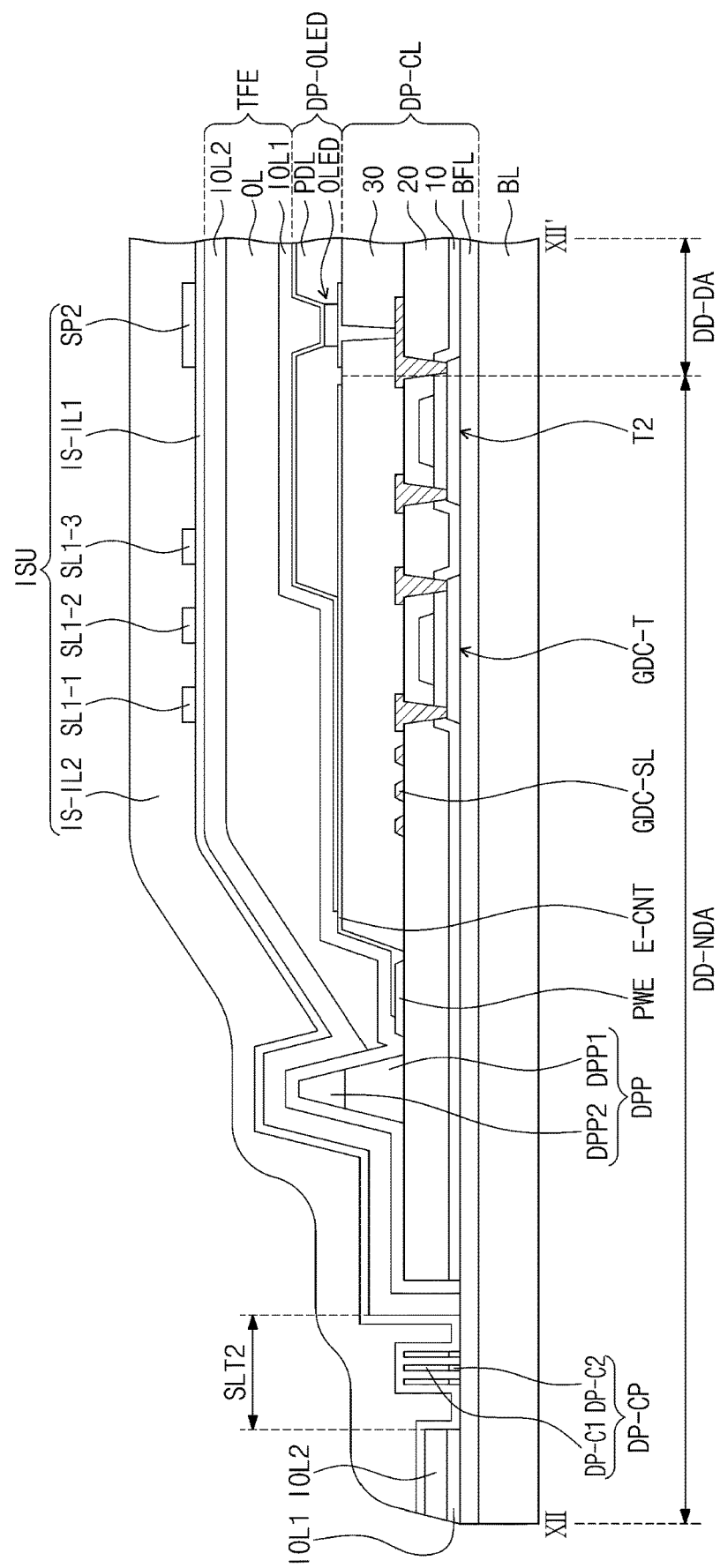
FIG. 43A is a cross-sectional view showing a display device corresponding to FIG. 41A.
Figure 43B:
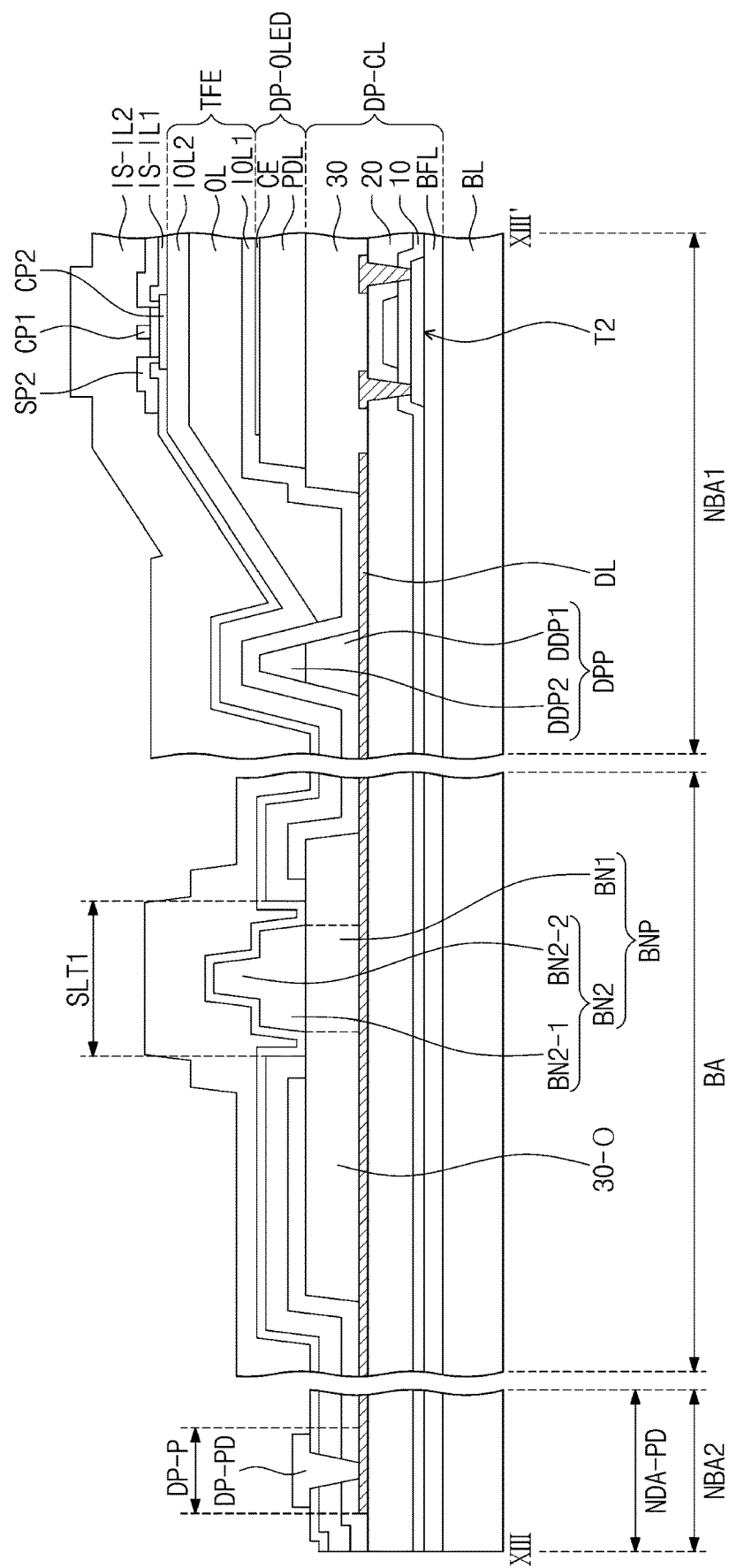
FIG. 43B is a cross-sectional view showing a display device corresponding to FIG. 41B.

FIG. 42 is a plan view showing a thin film encapsulation layer TFE applied to a display device DD according to an exemplary embodiment of the invention. FIG. 43A is a cross-sectional view showing a display device DD corresponding to FIG. 41A. FIG. 43B is a cross-sectional view showing a display device DD corresponding to FIG. 41B. In FIGS. 42, 43A, and 43B, different features from the display device DD described with reference to FIGS. 40A to 41C will be mainly described.

In FIG. 42, a dam part DPP, a crack dam part DP-CP, and a bank BNP are shown to overlap the thin film encapsulation layer TFE. The thin film encapsulation layer TFE includes opening areas SLT1, SLT2, and SLT20 provided therein. The opening areas SLT1, SLT2, and SLT20 may be defined by removing at least one encapsulation inorganic layer of the thin film encapsulation layer TFE. The opening areas SLT1, SLT2, and SLT20 may be provided by etching portions of the entirely-provided encapsulation inorganic layer.

The first opening area SLT1 may entirely overlap the bank BNP. The first opening area SLT1 may reduce the stress occurring in the bending area BA during the bending of the bending area BA. In the exemplary embodiment of the invention, the first opening area SLT1 may be substantially the same as the bending area BA.

The second opening area SLT2 may entirely overlap the crack dam part DP-CP. The second opening area SLT2 may prevent an external impact from being transferred to the display area DD-DA through the thin film encapsulation layer TFE. In the exemplary embodiment of the invention, the second opening area SLT2 may expand to an edge of the display device DD as the third opening area SLT20.

FIGS. 43A and 43B show the first opening area SLT1 and the second opening area SLT2 defined in the first and second encapsulation inorganic layers IOL1 and IOL2 as a representative example. Although not shown in the drawings, an opening area corresponding to the first opening area SLT1 may be defined through an insulating layer including an inorganic material (particularly, the first insulating layer IS-IL1) of the first insulating layer IS-IL1 and the second insulating layer IS-IL2. This is to reduce a stress occurring in the inorganic layers disposed in the bending area BA during the bending of the bending area BA.

Although not shown separately, opening areas may be defined in the thin film encapsulation layer TFE to reduce the stress occurring during the bending of the bending areas BA2 and BA3 shown in FIG. 39.

Figure 44:
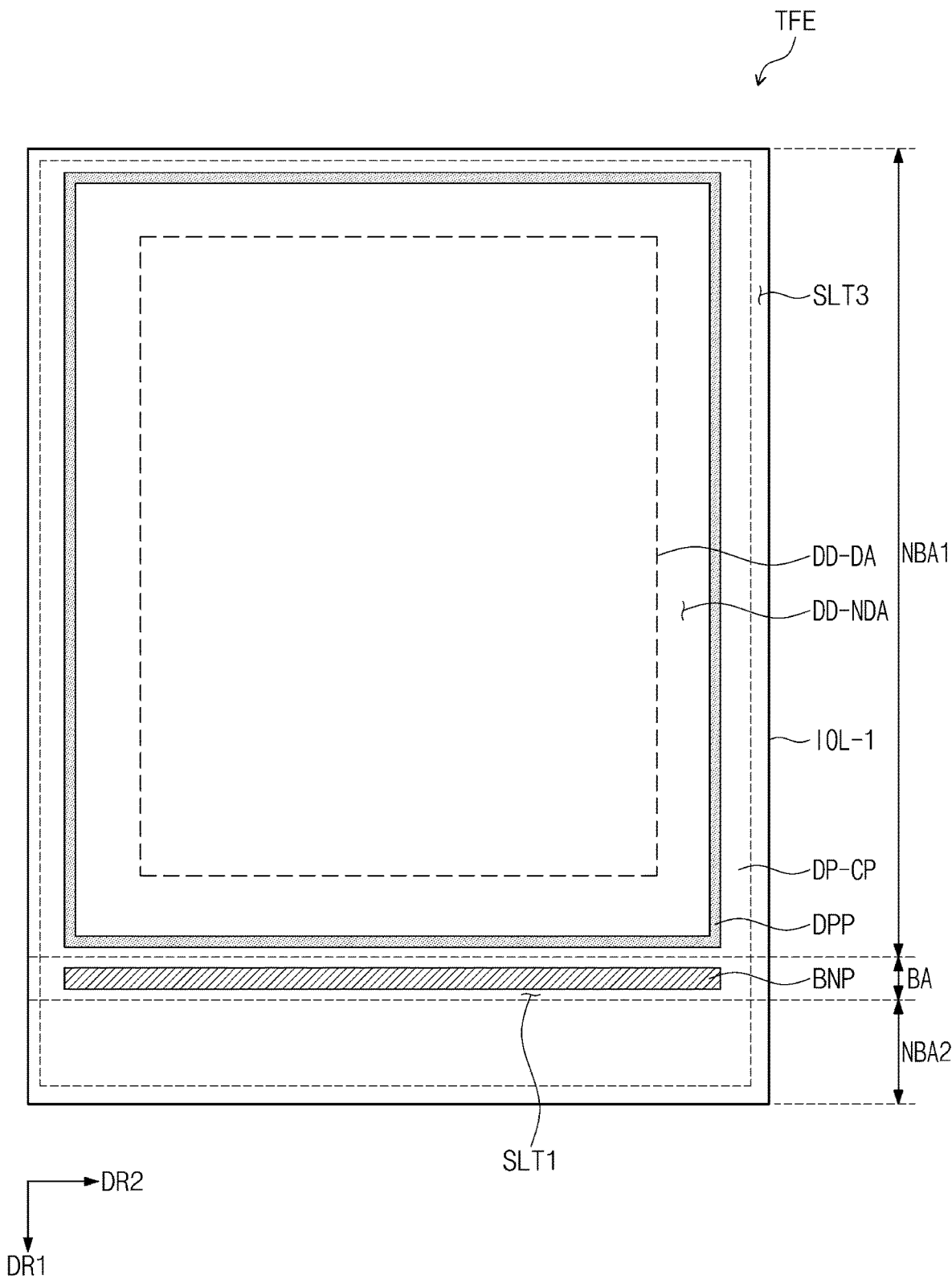
FIG. 44 is a plan view showing an exemplary embodiment of a thin film encapsulation layer applied to a display device according to the invention.

FIG. 44 is a plan view showing a thin film encapsulation layer TFE applied to a display device DD according to an exemplary embodiment of the invention. In FIG. 44, different features from the display device DD described with reference to FIGS. 40A to 43B will be mainly described.

An opening area SLT3 may be defined in the thin film encapsulation layer TFE. The opening area SLT3 is defined through at least one encapsulation inorganic layer of the thin film encapsulation layer TFE and defined along an edge of the at least one encapsulation inorganic layer. As described with reference to FIGS. 7E and 7H, the cell areas DP-C are separated from each other by cutting the mother substrate MS after the manufacturing process is completed, and the opening area SLT3 may be provided by taking into account a cutting margin. Due to the opening area SLT3, an interference caused by a laser beam or a knife used to cut the mother substrate MS may be prevented.

The opening area SLT3 may have a width greater than tens of micrometers. In an exemplary embodiment, the width of the opening area SLT3 may be smaller than about 200 micrometers (μm), for example. Preferably, the width of the opening area SLT3 may be within a range from about 100 μm to about 150 μm, for example.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

Therefore, the disclosed subject matter should not be limited to any single embodiment described herein, and the scope of the invention shall be determined according to the attached claims.

What is claimed is:

1. A display device comprising:
   a display panel comprising a display area and a non-display area; and
   an input sensing unit disposed on the display panel, the display panel comprising:
     a base layer;
     a first signal line overlapped with the display area and the non-display area and connected to a transistor disposed in the display area;
     a light emitting element comprising a first electrode, a second electrode disposed on the first electrode, and a light emitting layer disposed between the first electrode and the second electrode;
     a first encapsulation inorganic layer disposed on the second electrode and overlapped with the display area and the non-display area; and
     a signal pad electrically connected to the first signal line, disposed on the first encapsulation inorganic layer and disposed in the non-display area,
   wherein the signal pad is connected to the first signal line through a first contact hole defined through the first encapsulation inorganic layer.

2. The display device of claim 1, wherein the input sensing unit is directly disposed on the display panel and comprises:
   a sensing electrode;
   a second signal line connected to the sensing electrode; and
   at least one insulating layer overlapped with the display area and the non-display area.

3. The display device of claim 2, wherein the display panel further comprises a dummy pad disposed in the non-display area, the second signal line comprises a line part overlapped with the display area and the non-display area and a pad part connected to the line part and overlapped with the dummy pad, and the at least one insulating layer is disposed between the dummy pad and the pad part of the second signal line.

4. The display device of claim 3, wherein the pad part of the second signal line is connected to the dummy pad through a second contact hole defined through the first encapsulation inorganic layer and the at least one insulating layer.

5. The display device of claim 4, wherein the dummy pad is disposed in a same layer as the first signal line.

6. The display device of claim 2, wherein the at least one insulating layer is disposed between the signal pad and the first signal line, and the first contact hole further penetrates through the at least one insulating layer.

7. The display device of claim 2, wherein the signal pad is disposed in a same layer as the second signal line.

8. The display device of claim 2, wherein the sensing electrode comprises a first sensing electrode and a second sensing electrode crossing the first sensing electrode, each of the first sensing electrode and the second sensing electrode comprises sensor parts and connection parts each of which connects the sensor parts adjacent to each other, and the connection parts of the first sensing electrode are connected to the adjacent sensor parts of the first sensing electrode through second contact holes defined through the at least one insulating layer.

9. The display device of claim 2, wherein the display panel further comprises a dummy pad disposed in the non-display area, the second signal line comprises a line part overlapped with the display area and the non-display area and a pad part connected to the line part and overlapped with the dummy pad, the pad part of the second signal line is connected to the dummy pad through a second contact hole defined through the first encapsulation inorganic layer, and the at least one insulating layer is not overlapped with the pad part of the second signal line.

10. The display device of claim 2, wherein the sensing electrode has a mesh shape.

11. The display device of claim 2, wherein the sensing electrode comprises a first sensing electrode and a second sensing electrode crossing the first sensing electrode, and the at least one insulating layer is disposed between the first sensing electrode and the second sensing electrode.

12. The display device of claim 2, wherein the input sensing unit further comprises a dummy electrode overlapped with the sensing electrode.

13. The display device of claim 2, wherein the sensing electrode comprises first sensing electrodes and second sensing electrodes respectively corresponding to the first sensing electrodes, each of the second sensing electrodes comprises a plurality of sensor parts disposed in a same layer as the first sensing electrodes and disposed to be spaced apart from each other, and
the second signal line comprises first line parts disposed in a same layer as the first sensing electrodes and connected to the first sensing electrodes and the sensor parts, and second line parts disposed on a different layer from the first sensing electrodes and connected to some first line parts connected to the sensor parts among the first line parts through second contact holes defined through the at least one insulating layer.

14. The display device of claim 2, wherein the sensing electrode is disposed in a same layer as the second signal line, and the at least one insulating layer directly covers the sensing electrode and the second signal line.

15. The display device of claim 1, further comprising an anti-reflection unit to reduce a reflectance of an external light, wherein the anti-reflection unit is disposed on the first encapsulation inorganic layer.

16. The display device of claim 1, wherein the first encapsulation inorganic layer is entirely disposed on the base layer.

17. The display device of claim 1, wherein the display panel further comprises:
a second encapsulation inorganic layer disposed on the first encapsulation inorganic layer; and
an encapsulation organic layer overlapped with the display area and disposed between the first encapsulation inorganic layer and the second encapsulation inorganic layer.

18. The display device of claim 1, wherein the input sensing unit comprises:
a first sensing electrode comprising first sensor parts and first connection parts connecting the first sensor parts, the first sensing electrode being disposed on a base surface defined on the display panel; and
a second sensing electrode comprising second sensor parts and second connection parts connecting the second sensor parts, the second sensing electrode being disposed on the base surface defined on the display panel,
wherein the first sensor parts are disposed in a same layer as the second sensor parts, one of the first connection parts and the second connection parts is disposed in a same layer as the first sensor parts, and the first connection parts cross the second connection parts such that an insulating layer is disposed between the first connection parts and the second connection parts.

19. The display device of claim 1, wherein the input sensing unit is directly disposed on the display panel and comprises:
a sensing electrode having a mesh shape; and
a second signal line connected to the sensing electrode, the second signal line comprises a layer comprising a same material as that of the sensing electrode.

20. The display device of claim 1, wherein the input sensing unit comprises at least one insulating layer comprising a polymer, first sensing electrodes, and second sensing electrodes insulated from the first sensing electrodes while crossing the first sensing electrodes, and
the at least one insulating layer insulates the first sensing electrodes from the second sensing electrodes.

21. The display device of claim 1, further comprising a polarizing film disposed on the display panel, wherein the input sensing unit comprises a base film and sensing electrodes disposed on at least one surface of the base film, and the polarizing film is disposed between the display panel and the input sensing unit.

22. The display device of claim 1, further comprising a polarizing film disposed on the display panel, wherein the input sensing unit comprises a base film and sensing electrodes disposed on at least one surface of the base film, and the input sensing unit is disposed between the display panel and the polarizing film.

23. The display device of claim 1, further comprising a polarizing film disposed on the display panel, wherein the input sensing unit comprises a base film and sensing electrodes disposed on a lower surface of the base film, and the polarizing film is disposed between the display panel and the input sensing unit.

24. The display device of claim 1, further comprising a polarizing film disposed on the display panel, wherein the input sensing unit comprises a base film, a base insulating layer disposed on the base film, and sensing electrodes disposed on the base insulating layer, and the input sensing unit is disposed between the display panel and the polarizing film.

25. The display device of claim 1, further comprising a polarizing film disposed on the display panel, wherein the input sensing unit comprises a base film, sensing electrodes disposed on a lower surface of the base film, and signal lines connected to the sensing electrodes, the input sensing unit is disposed between the display panel and the polarizing film, and pad parts of the signal lines are electrically connected to input pads of the display panel by a conductive member.

26. The display device of claim 1, wherein the input sensing unit comprises a sensing electrode disposed on a base surface defined on the display panel and an insulating layer disposed on one side of an upper side or a lower side of the sensing electrode, the insulating layer comprises a high-refractive index insulating layer and a low-refractive index insulating layer, and the low-refractive index insulating layer is disposed more adjacent to the sensing electrode than the high-refractive index insulating layer.

27. A display device comprising:
    a display panel comprising a first area, a second area, and a third area disposed between the first area and the second area in a plan view in an unfolded state and having a curvature in a folded state; and
    an input sensing unit disposed on the display panel, the display panel comprising:
        a base layer overlapped with the first area, the second area, and the third area;
        a first signal line overlapped with the first area, the second area, and the third area and connected to a transistor disposed in the first area;
        a light emitting element disposed in the first area and comprising a first electrode, a second electrode disposed on the first electrode, and a light emitting layer disposed between the first electrode and the second electrode;
        an encapsulation inorganic layer disposed on the second electrode and overlapped with the first area and the second area; and
        a signal pad electrically connected to the first signal line and disposed in the second area, wherein the signal pad is connected to the first signal line through a contact hole defined through the encapsulation inorganic layer.

28. The display device of claim 27, wherein the input sensing unit comprises:
    a sensing electrode disposed in the first area;
    a second signal line connected to the sensing electrode and overlapped with the first area, the second area, and the third area; and
    at least one insulating layer overlapped with the first area, the second area, and the third area, and the input sensing unit is directly disposed on the display panel.

29. The display device of claim 27, wherein the display panel further comprises a bank disposed in the third area and comprising a plurality of organic insulating patterns stacked one another, the bank extends in a direction substantially parallel to a bending axis defined in the third area, and an opening area is defined through the encapsulation inorganic layer to correspond to the bank.

30. The display device of claim 27, wherein the first area comprises a display area and a non-display area disposed adjacent to the display area, the display panel further comprises a dam part disposed in the non-display area, and the display area is disposed inside the dam part.

31. The display device of claim 30, wherein the display panel further comprises crack dam parts disposed outside the dam part, the crack dam parts extend in a direction in which the first signal line extends, and an opening area is defined though the encapsulation inorganic layer to overlap the crack dam parts.

32. A method of manufacturing a display device, the method comprising:
    forming a first conductive pattern on an encapsulation inorganic layer of a display panel, the encapsulation inorganic layer of the display panel overlapped with a display area and a non-display area of the display panel;
    forming an insulating layer on the encapsulation inorganic layer to overlap the display area and the non-display area of the display panel and cover the first conductive pattern;
    defining a first contact hole to expose the first conductive pattern;
    defining a second contact hole disposed in the non-display area of the display panel to expose a dummy pad disposed under the encapsulation inorganic layer; and
    providing a second conductive pattern on the insulating layer to be connected to the first conductive pattern and the dummy pad.

33. The method of claim 32, wherein the defining the first contact hole and the defining the second contact hole are performed by a same process.

34. The method of claim 32, wherein the second conductive pattern comprises a signal pad connected to the dummy pad through the second contact hole in the providing the second conductive pattern.

35. The method of claim 32, wherein the defining the first contact hole comprises:
    removing a portion of the insulating layer, which overlaps the first conductive pattern, and the defining the second contact hole comprises:
    removing a portion of the insulating layer, which overlaps the dummy pad; and
    removing a portion of the encapsulation inorganic layer, which overlaps the dummy pad.

36. The method of claim 35, wherein the removing the portion of the insulating layer, which overlaps the first conductive pattern, and the removing the portion of the insulating layer, which overlaps the dummy pad, are performed by a same process.

37. The method of claim 32, wherein the first conductive pattern comprises first connection parts, and the second conductive pattern comprises first sensor parts each being connected to corresponding first connection parts of the first connection parts through the first contact hole, second connection parts crossing the first connection parts, and second sensor parts connected to the second connection parts.

* * * * *